US006252281B1

(12) United States Patent
Yamamoto et al.

(10) Patent No.: US 6,252,281 B1
(45) **Date of Patent: *Jun. 26, 2001**

(54) SEMICONDUCTOR DEVICE HAVING AN SOI SUBSTRATE

(75) Inventors: Tadashi Yamamoto, Yokkaichi; Shizuo Sawada, Urawa, both of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/612,456

(22) Filed: Mar. 7, 1996

(30) Foreign Application Priority Data

Mar. 27, 1995 (JP) ........................................ 7-092000
Mar. 27, 1995 (JP) ........................................ 7-092001
Dec. 21, 1995 (JP) ........................................ 7-332930

(51) Int. Cl.[7] .......................... H01L 27/01; H01L 27/12; H01L 27/108

(52) U.S. Cl. .......................... 257/350; 257/347; 257/296

(58) Field of Search ............................ 257/347, 350, 257/351, 382, 384, 296, 306, 355, 506, 371

(56) References Cited

U.S. PATENT DOCUMENTS 4,489,478 * 12/1984 Sakurai ................................ 257/350
4,989,057 * 1/1991 Lu ........................................ 257/350
5,102,809 * 4/1992 Eklund et al. ........................ 257/350
5,371,401 * 12/1994 Kurita .................................. 257/350
5,406,102 * 4/1995 Oashi .................................. 257/347
5,463,238 * 10/1995 Takahashi et al. .................. 257/351
5,495,439 * 2/1996 Morihara .............................. 257/350
5,519,243 * 5/1996 Kikuda et al. ........................ 257/371
5,534,722 * 7/1996 Takasu et al. ........................ 257/347
5,608,248 * 3/1997 Ohno .................................... 257/350
5,740,099 * 4/1998 Tanigawa ............................ 257/350
5,952,694 * 9/1999 Miyawaki et al. .................. 257/347

FOREIGN PATENT DOCUMENTS 63-175476 * 7/1988 (JP) ...................................... 257/382
2-222574 * 9/1990 (JP) ...................................... 257/382
4-130764 * 5/1992 (JP) ...................................... 257/350

* cited by examiner

*Primary Examiner*—Steven Loke
(74) *Attorney, Agent, or Firm*—Banner & Witcoff, Ltd.

(57) ABSTRACT

Silicon oxide layers are provided in a substrate. That part of the silicon oxide layer which is located in a memory cell section MC has a thickness. That part of the silicon oxide layer which is located in a peripheral circuit section PC has a thickness, which is less than the thickness. The memory cell section MC has transistors, each having a source region and a drain region which contact the silicon oxide layer. The peripheral circuit section PC has transistors, each having a source region and a drain region which are spaced apart from the silicon oxide layer. The transistors of the peripheral circuit section PC are provided in well regions. A back-gate bias is applied to the transistors of the peripheral circuit section PC through impurity layers.

42 Claims, 70 Drawing Sheets

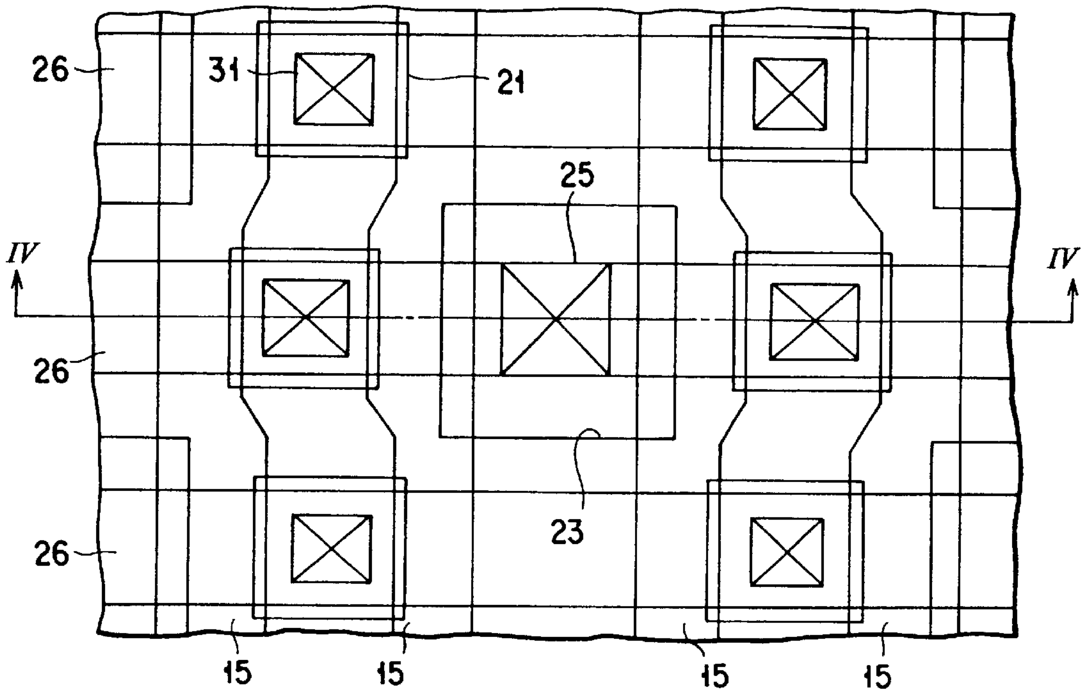
F I G. 3
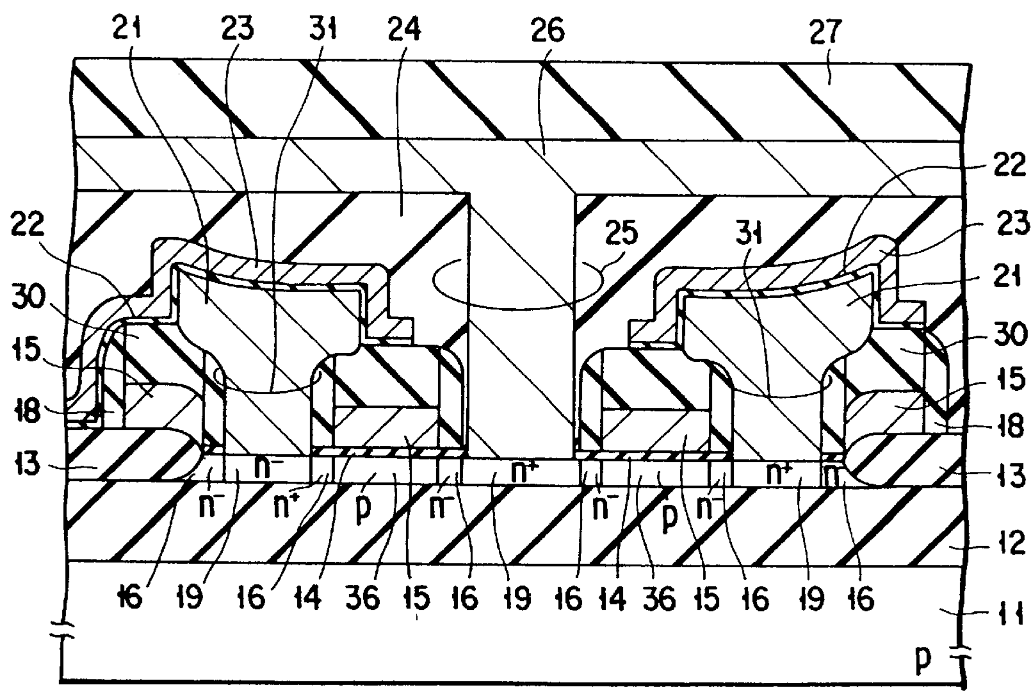
F I G. 4

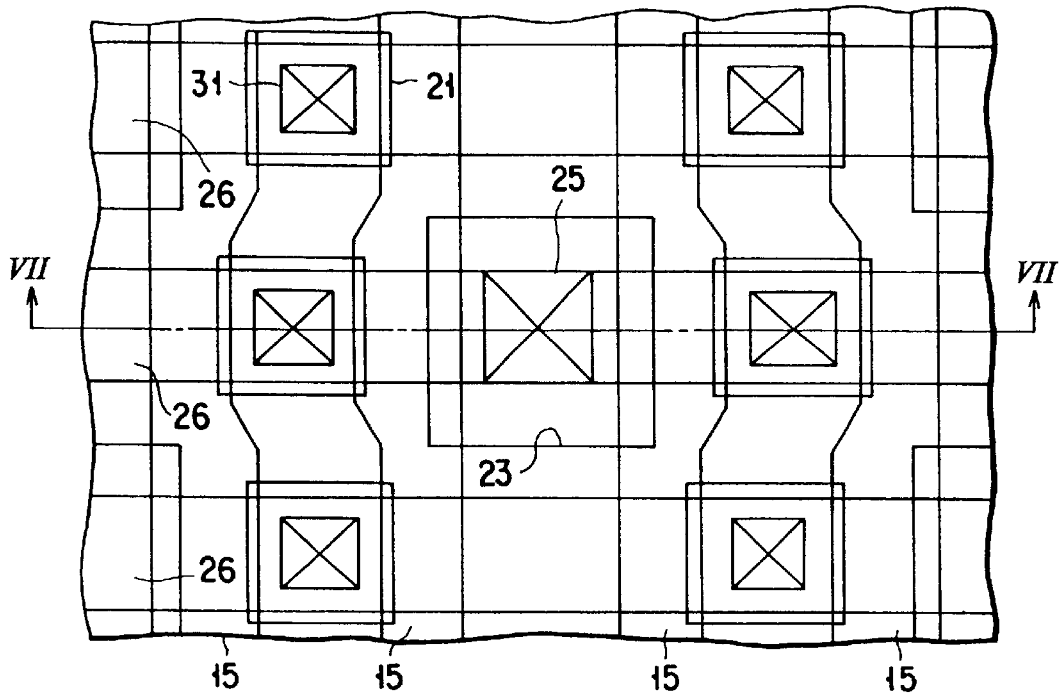
F I G. 7
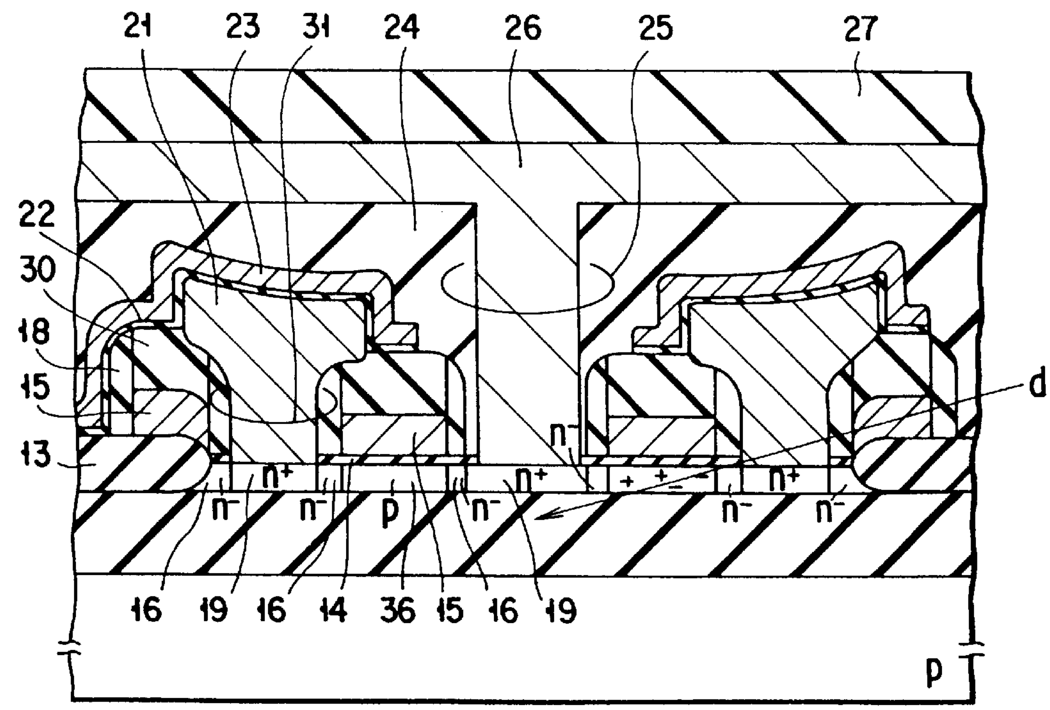
F I G. 8

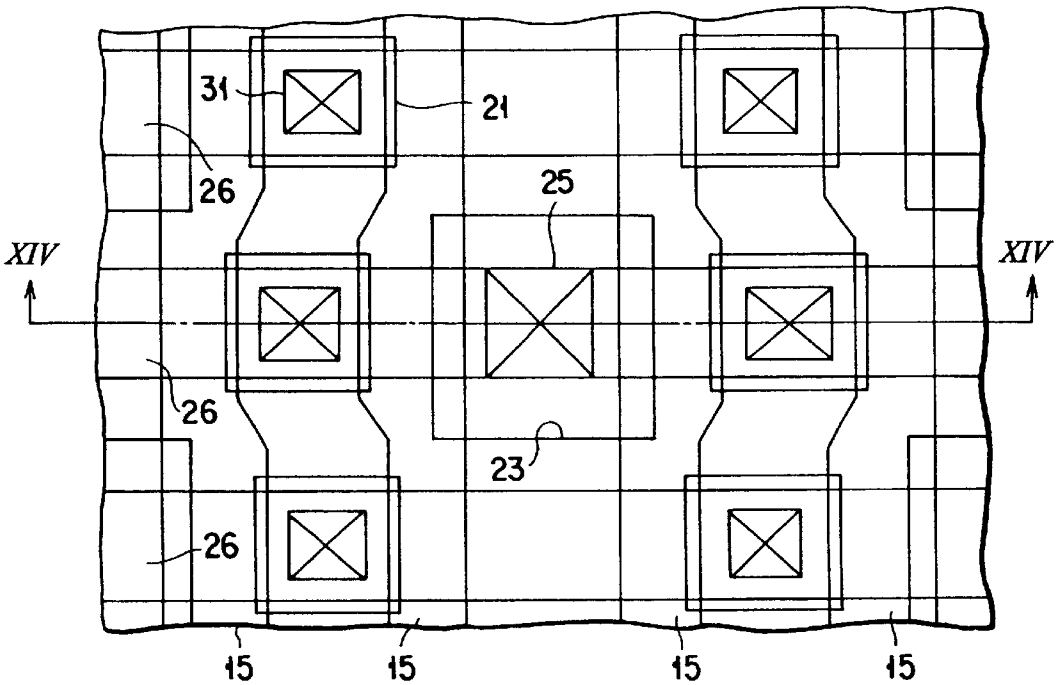
F I G. 13
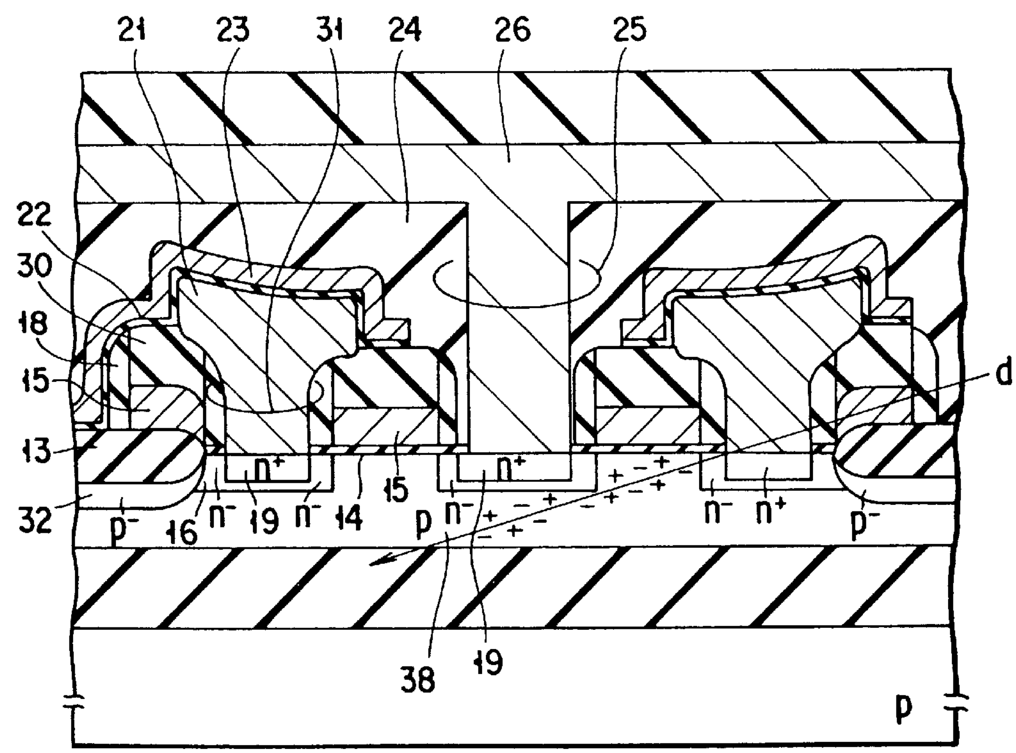
F I G. 14

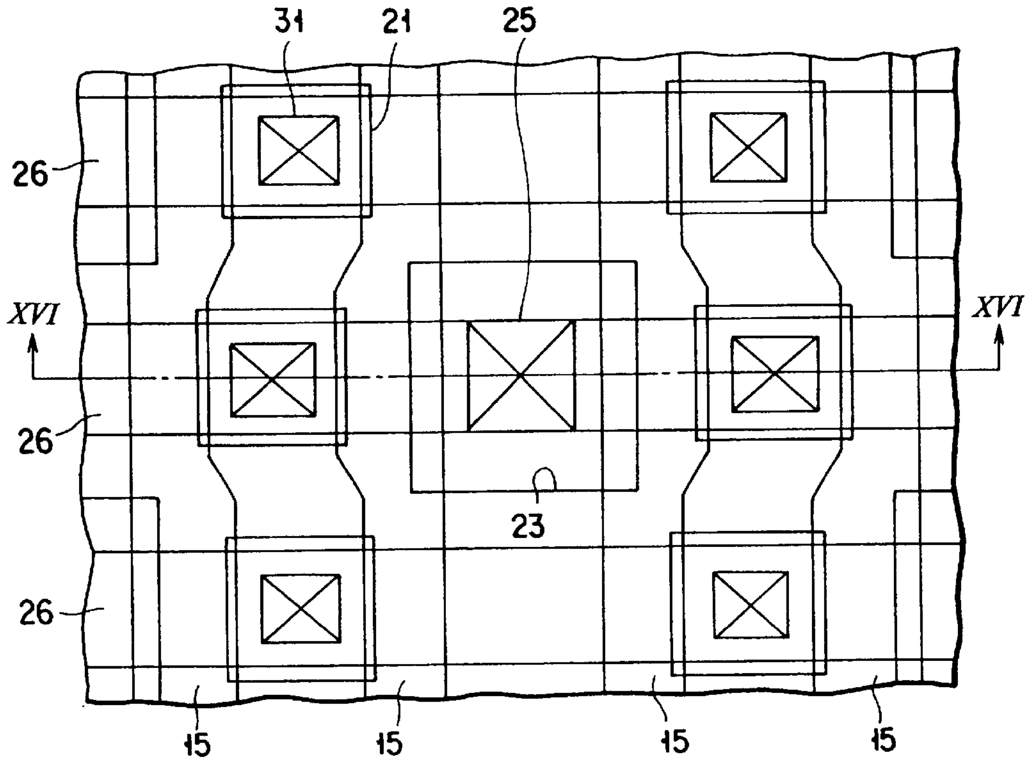
F I G. 15
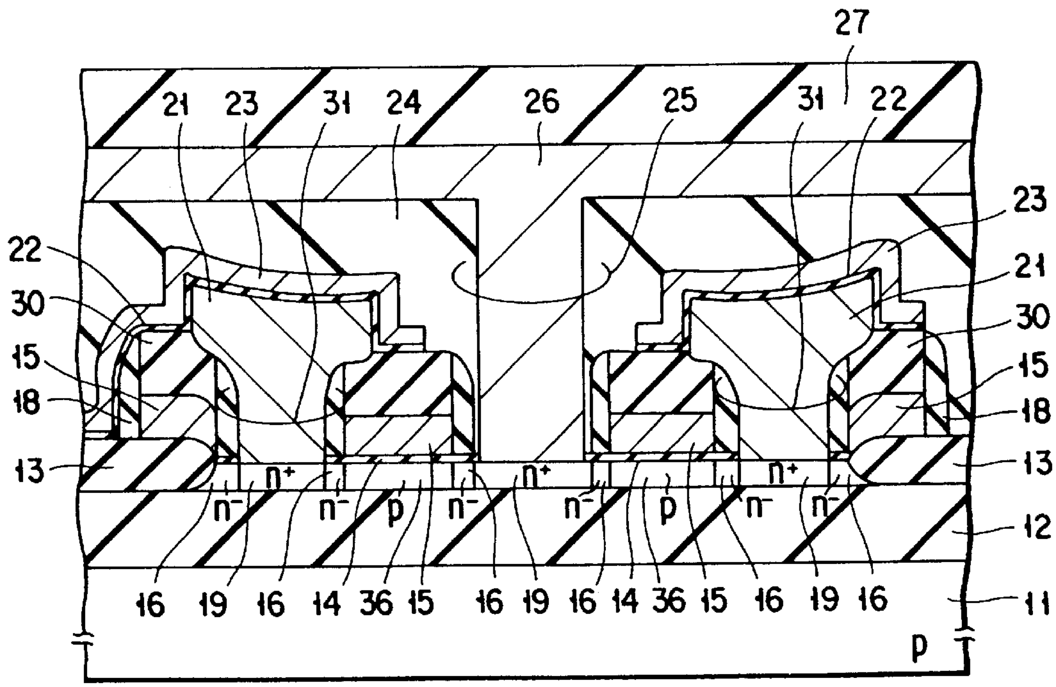
F I G. 16

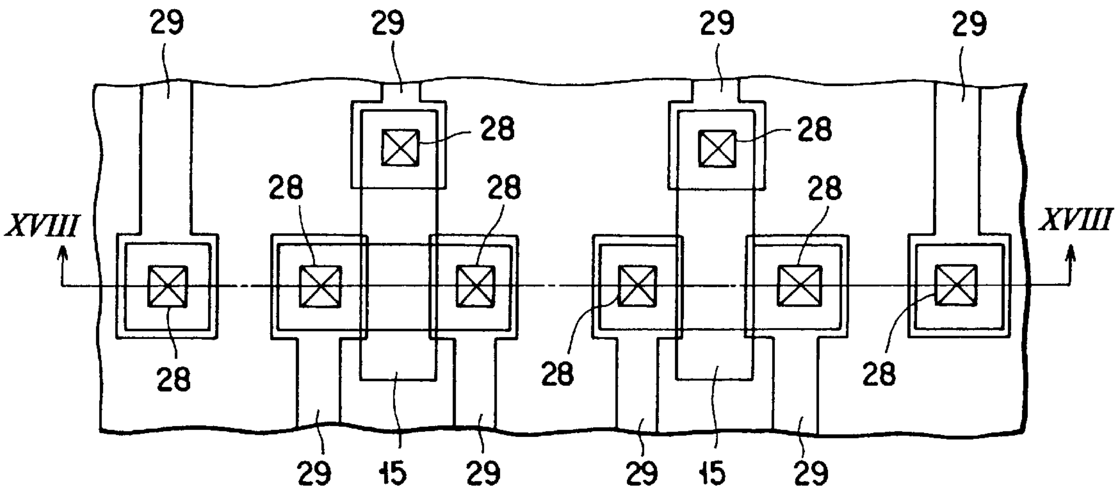
F I G. 17
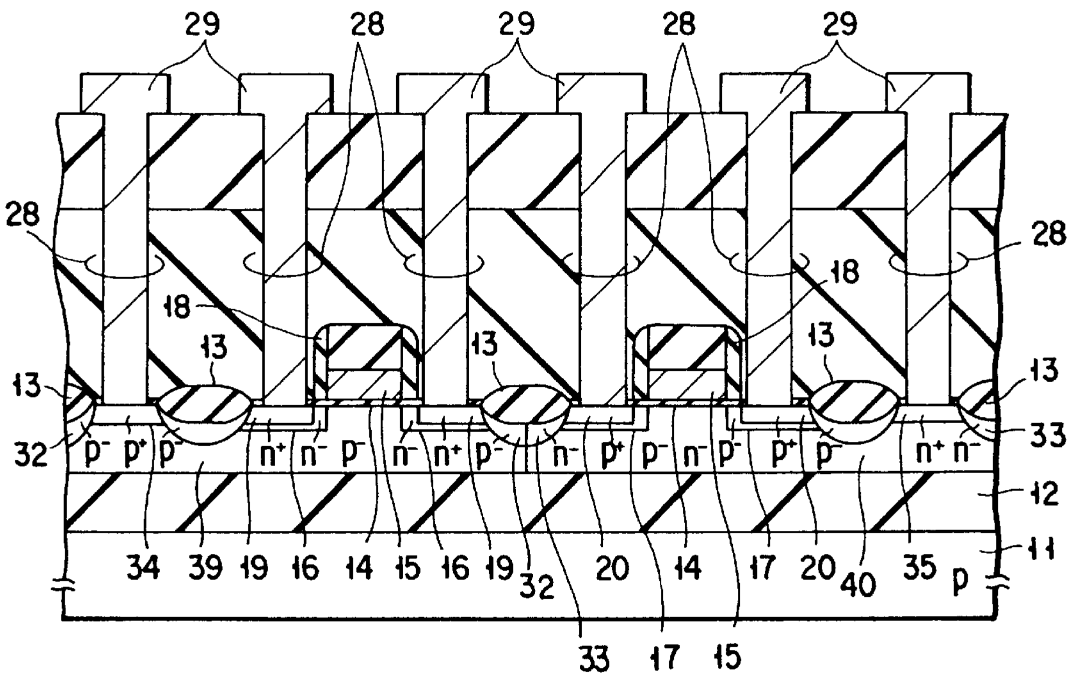
F I G. 18

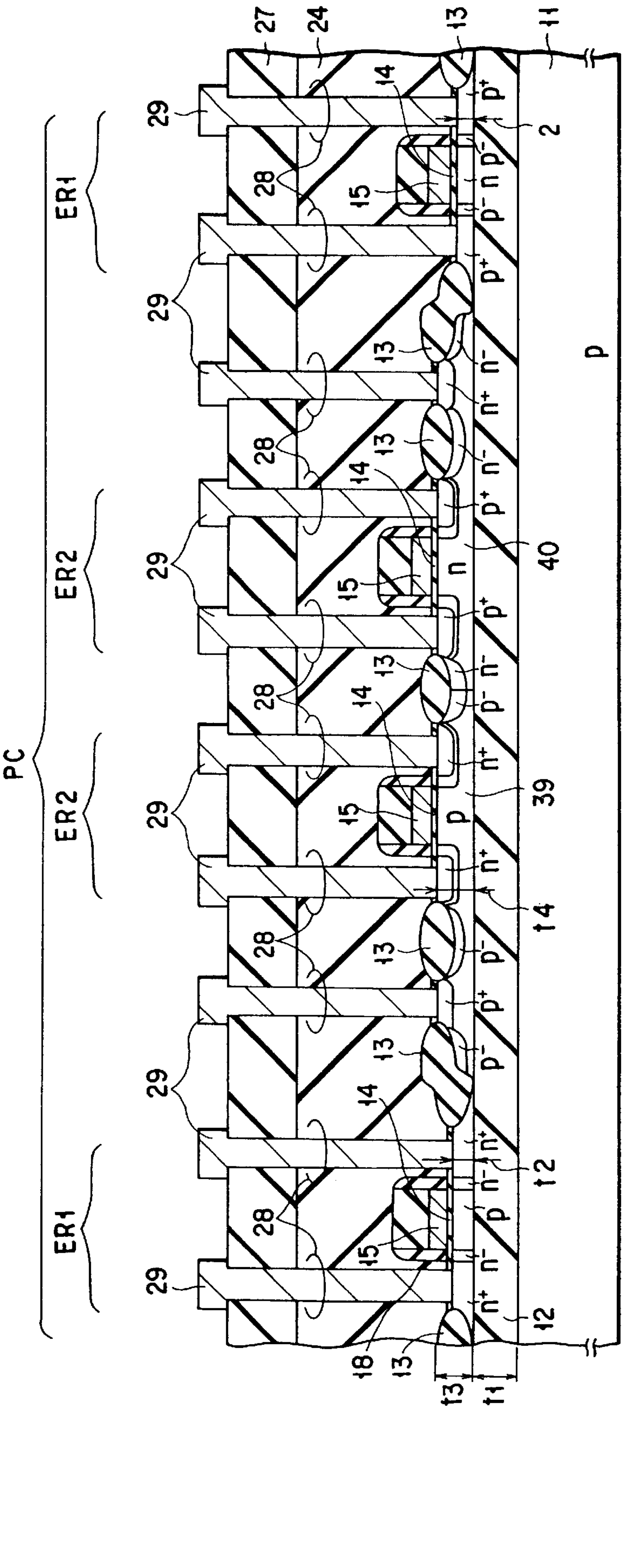
F I G. 45

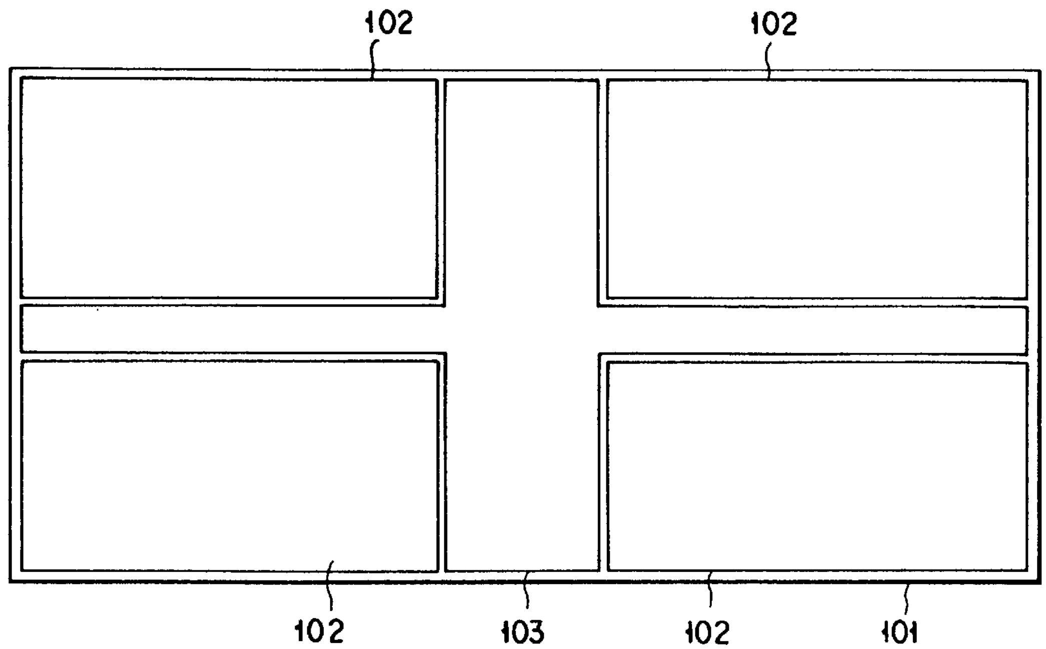
F I G. 54
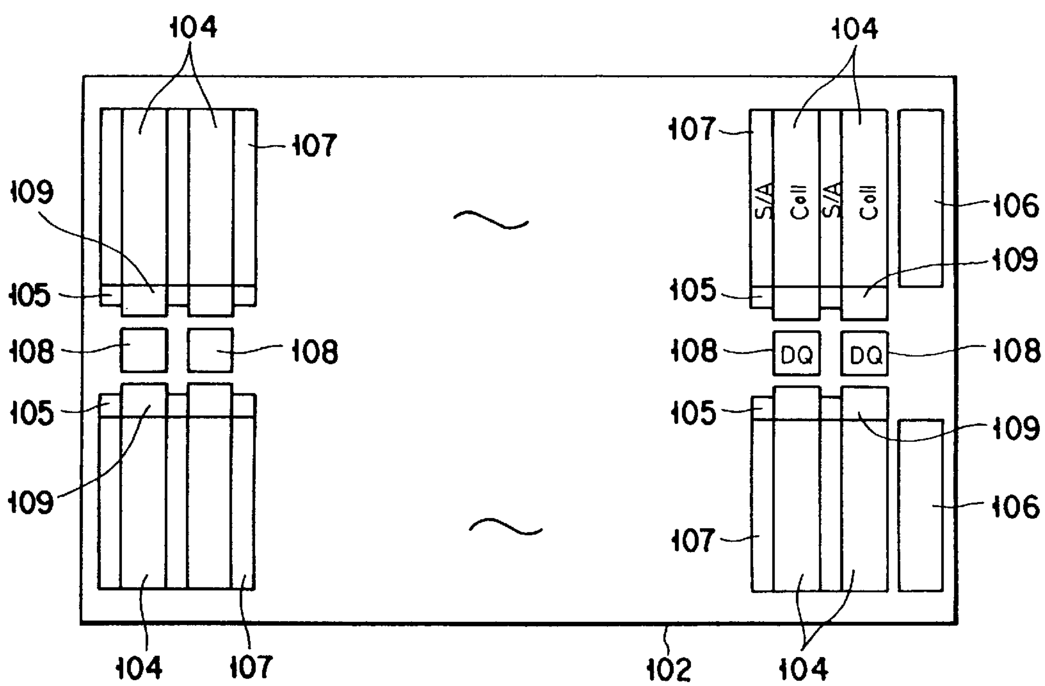
F I G. 55

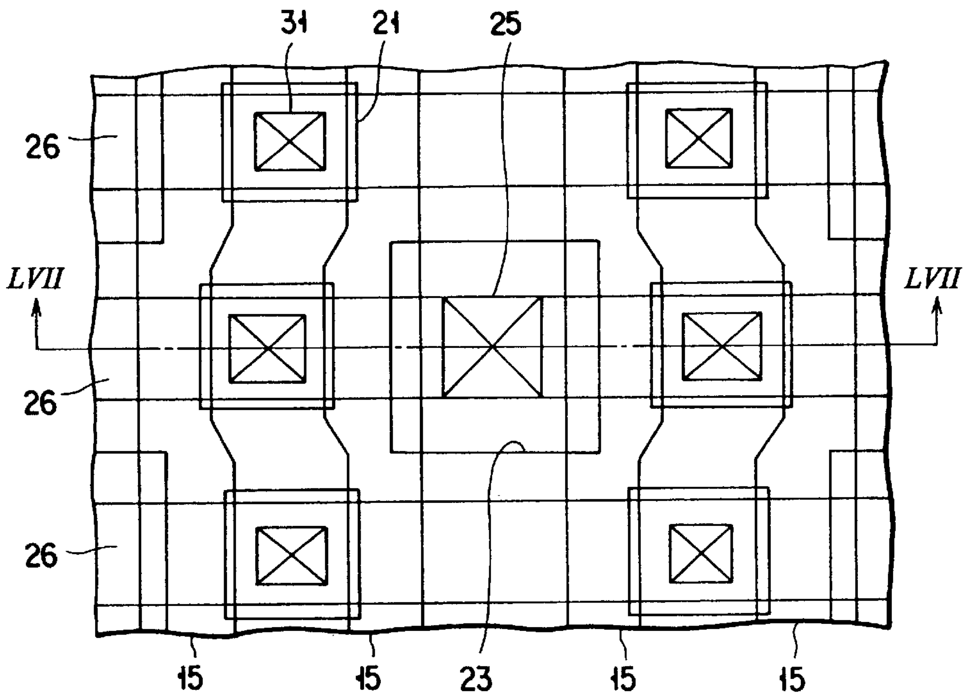
F I G. 56
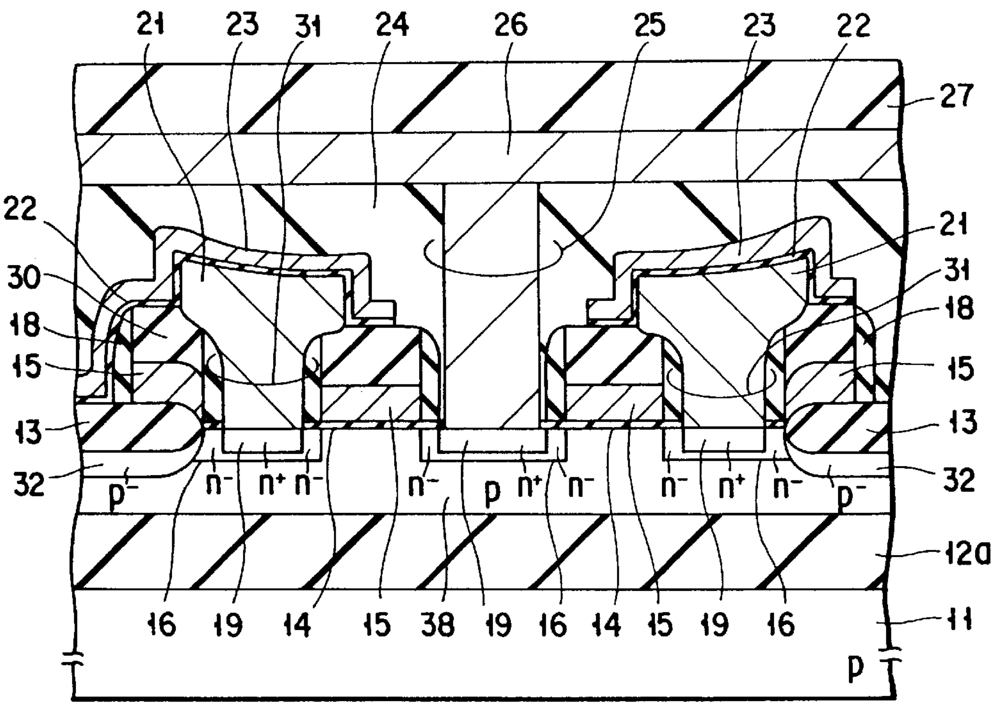
F I G. 57

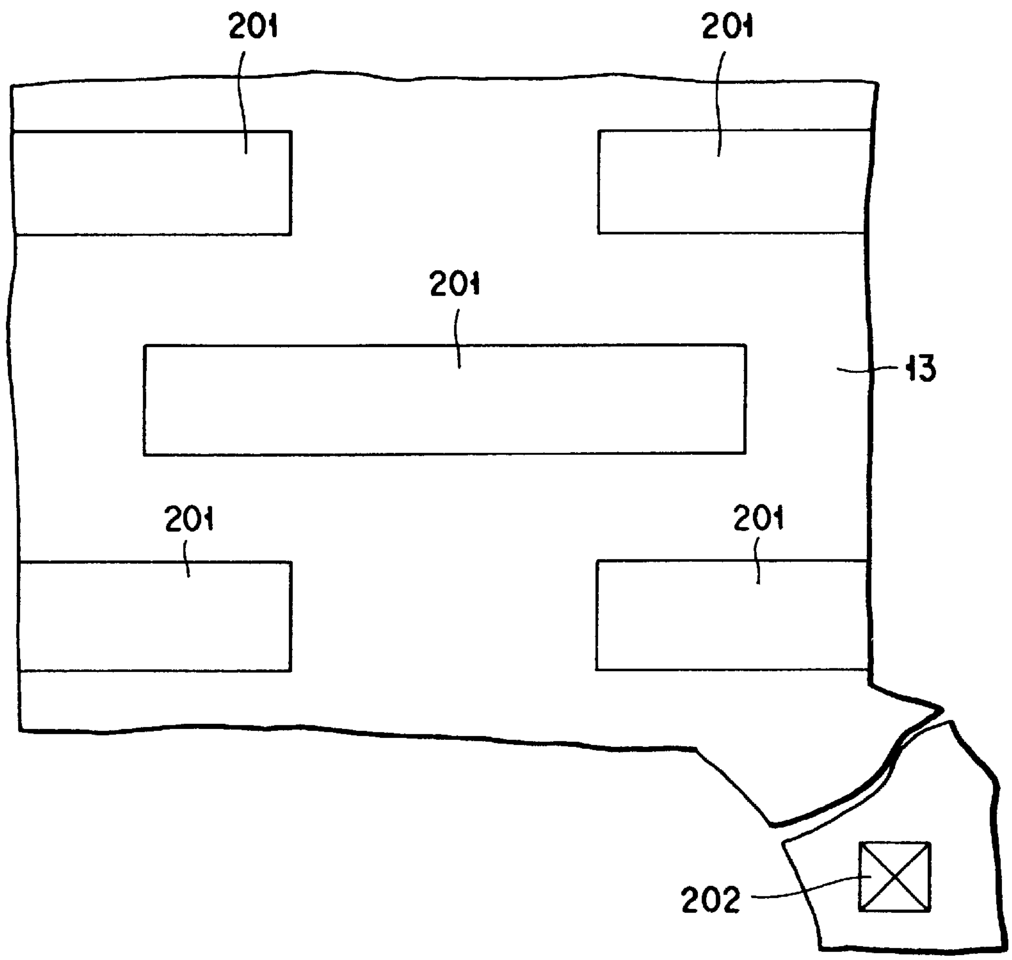
F I G. 58

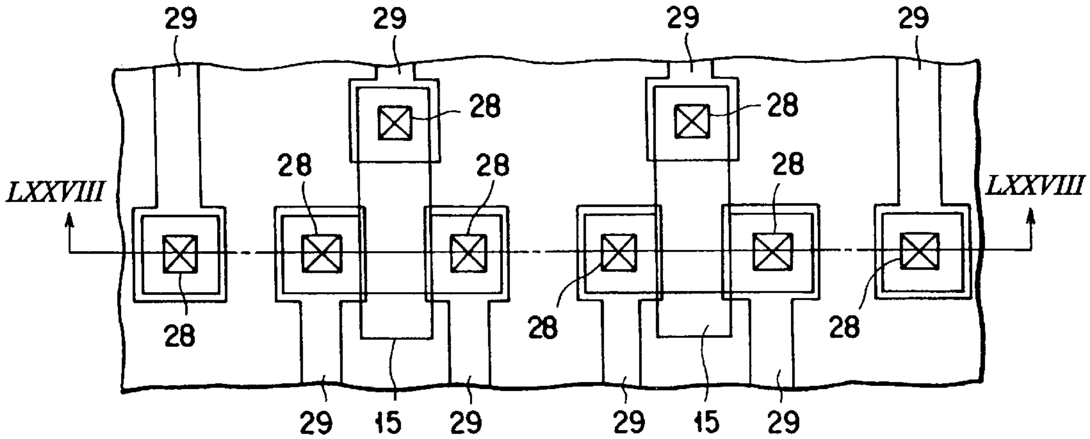
F I G. 77
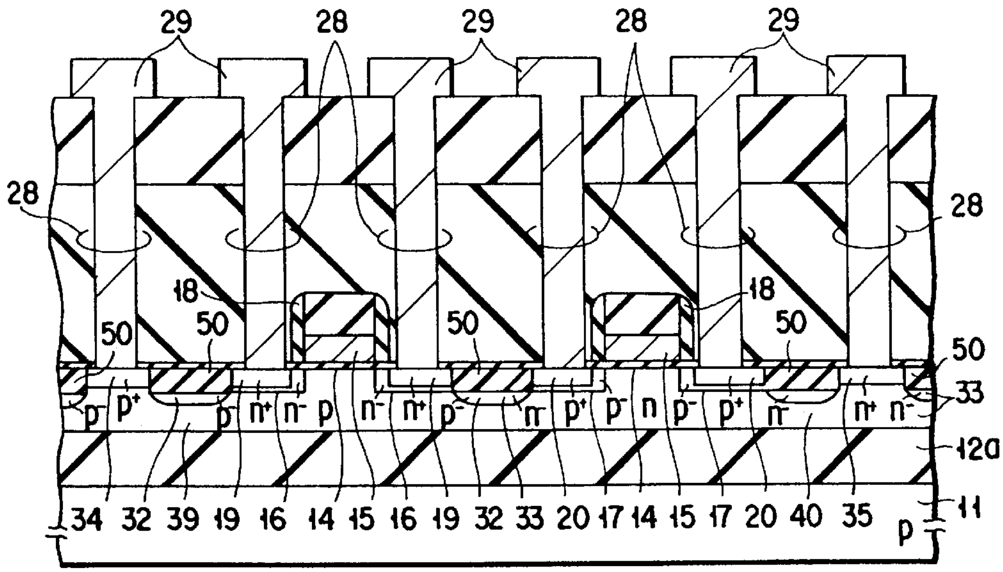
F I G. 78

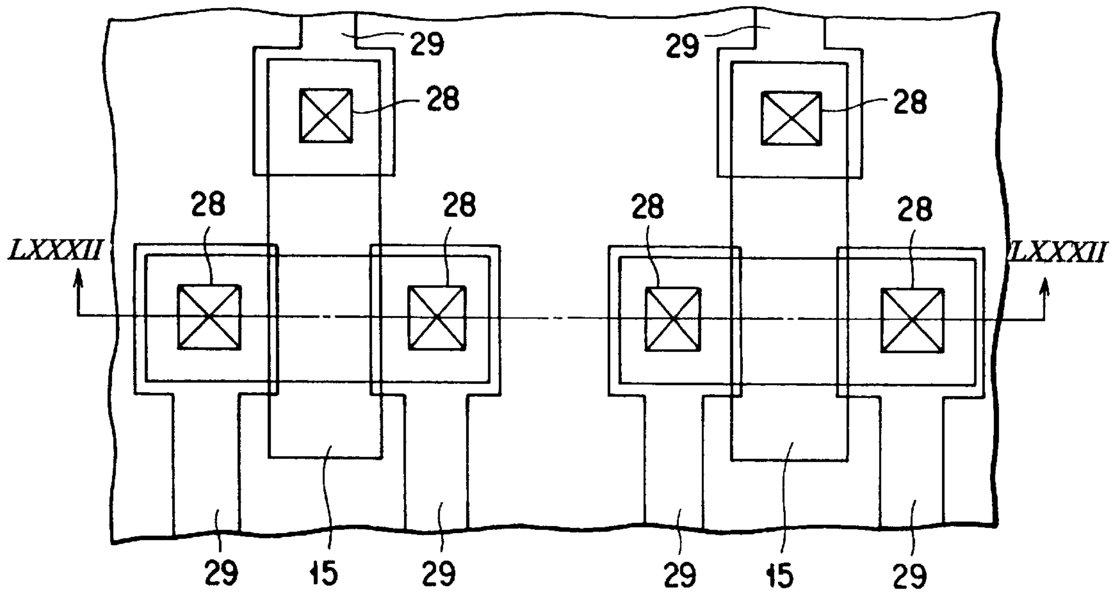
F I G. 81
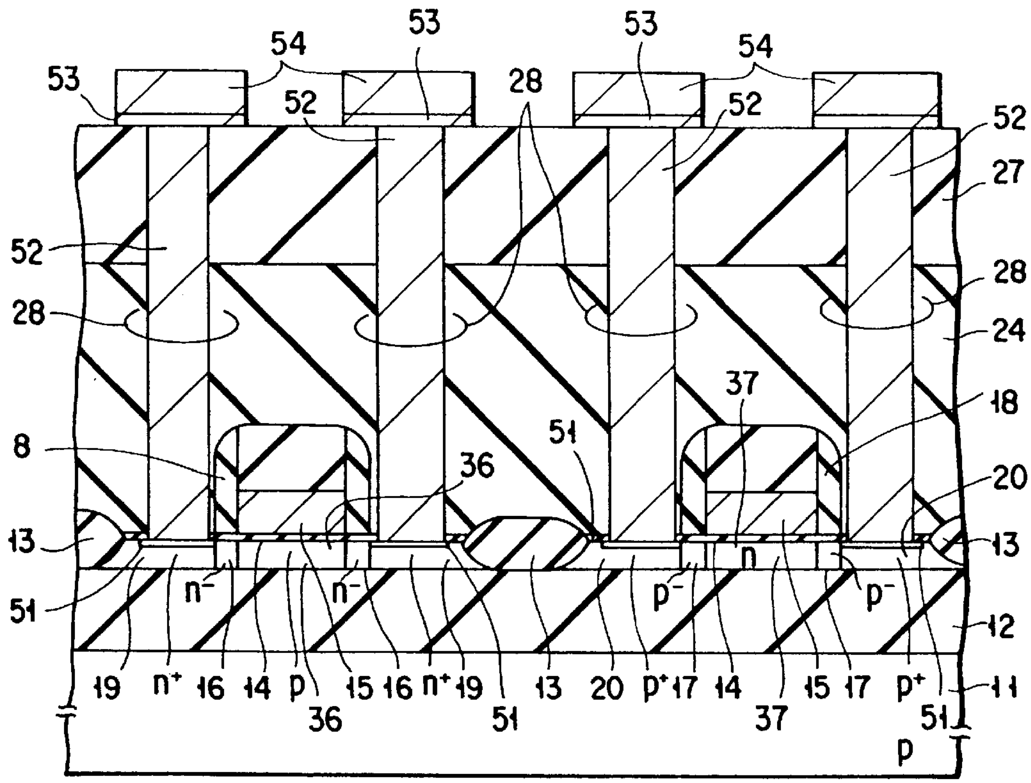
F I G. 82

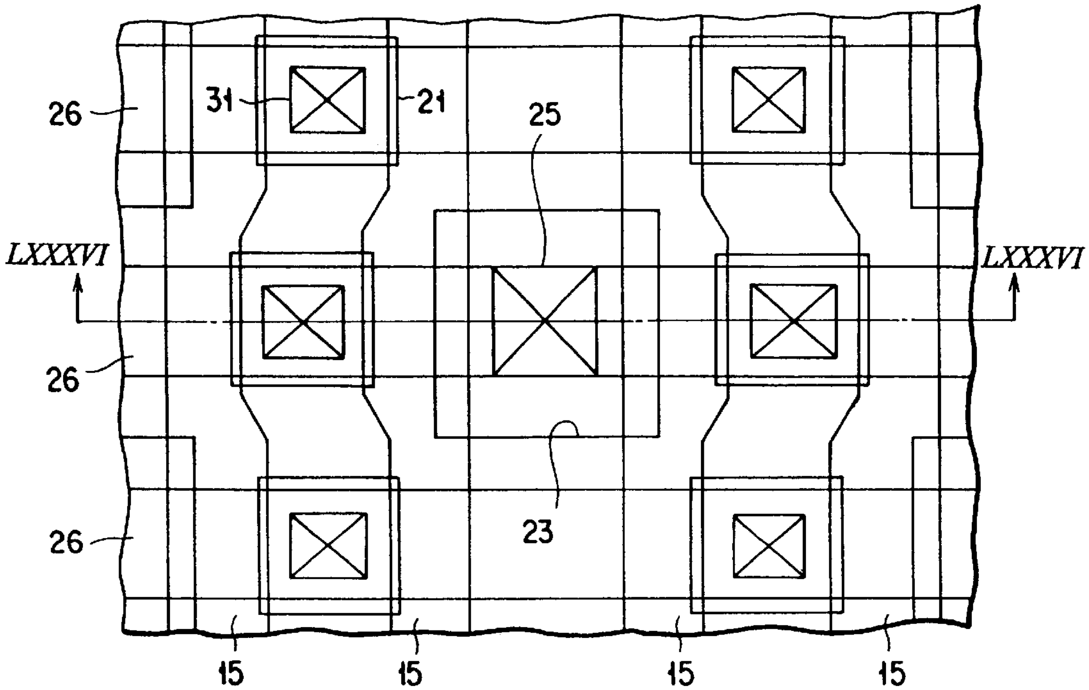
F I G. 85
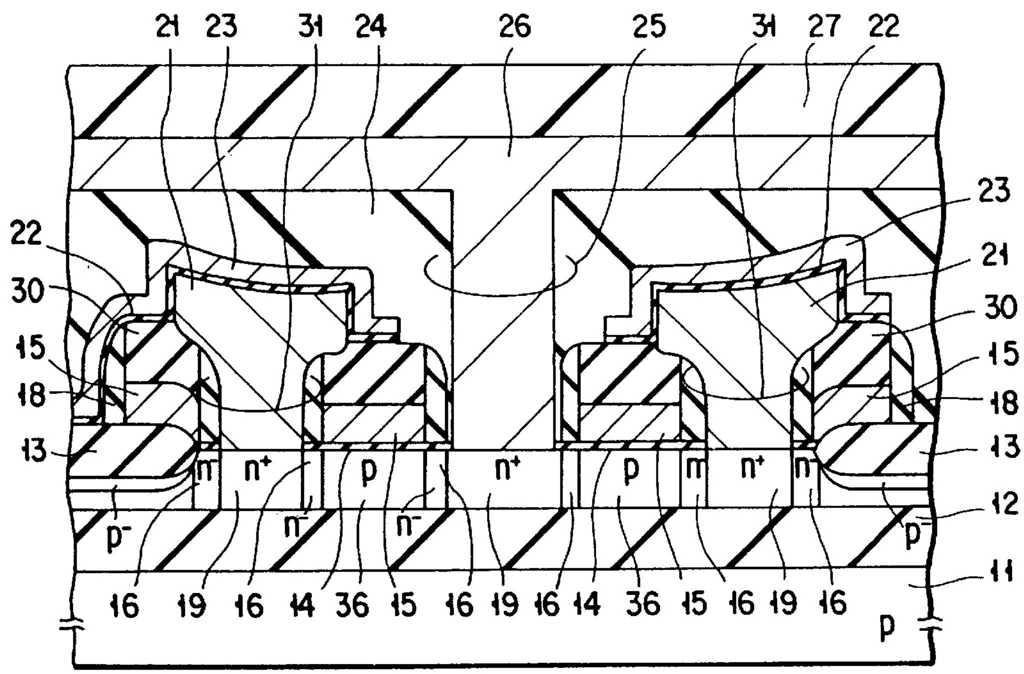
F I G. 86

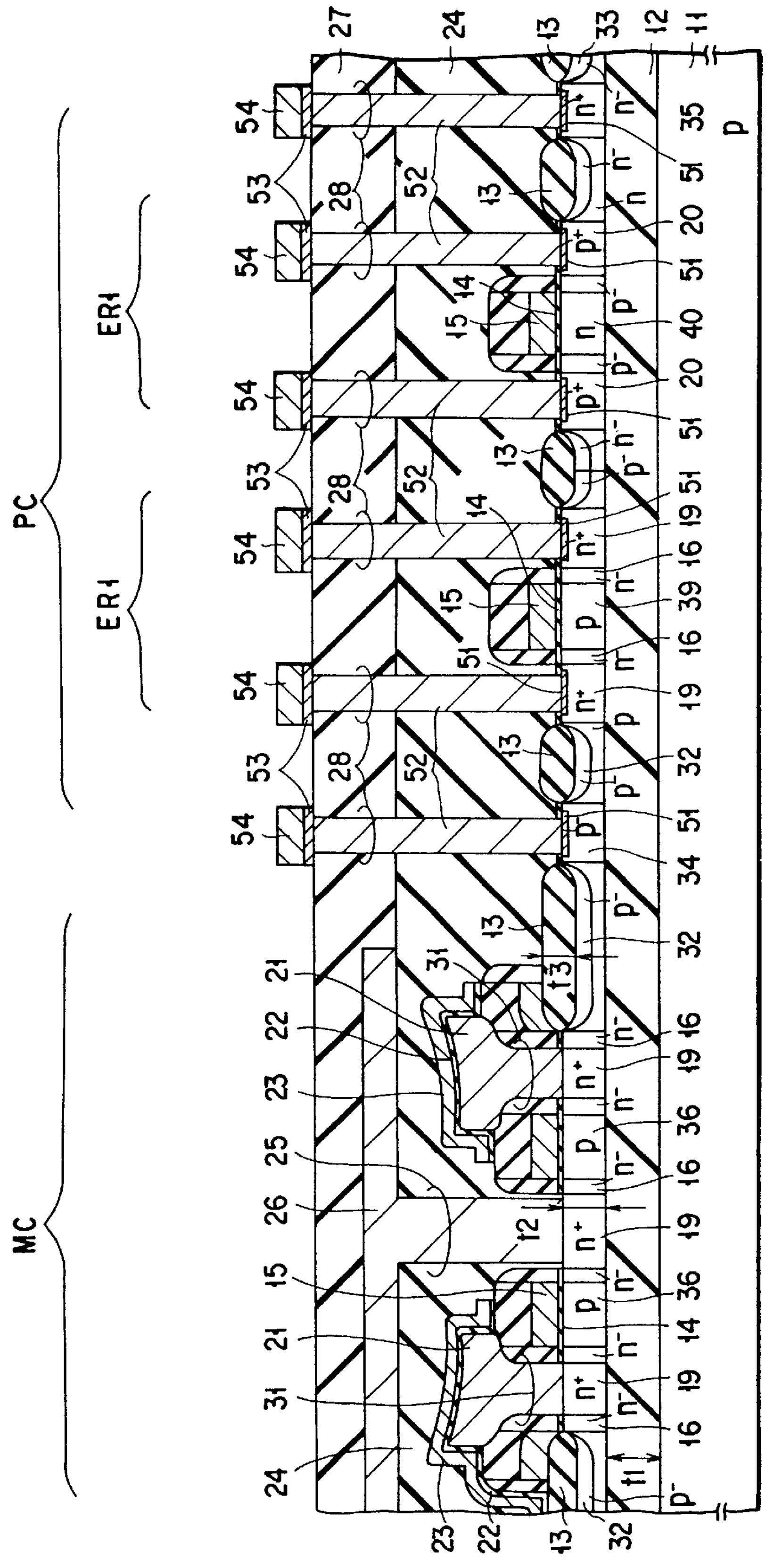
F I G. 91

SEMICONDUCTOR DEVICE HAVING AN SOI SUBSTRATE

BACKGROUND OF THE INVENTION

1. Field of the Invention

The present invention relates to a semiconductor device having an SOI (Silicon-on-Insulator) substrate.

2. Description of the Related Art

The utmost objective in the field of semiconductor devices is to increase the integration density of the devices. It is demanded that the integration density of a dynamic RAM (hereinafter referred to as "DRAM") be increased to impart to the DRAM a storage capacity of 4 megabits, 16 megabits and more bits.

The higher the integration density of a DRAM, the smaller the capacitance of the memory cells. Inadequate capacitance of the memory cells results in an increase in soft error. Each memory cell of most large-capacity DRAMs recently developed has a capacitor of so-called stack structure. This is because a capacitor of this structure has a large diffusion layer and therefore causes almost no soft error.

FIGS. 97 to 100 show a conventional DRAM which incorporates capacitors of stacked structure. More correctly, FIGS. 97 and 98 illustrate the memory cell section of the DRAM, and FIGS. 99 and 100 the peripheral circuit section of the DRAM.

The memory cell section will be first described. As shown in FIGS. 97 and 98, a field oxide film 13 is provided on the surface of the p-type silicon substrate 11. The film 13 has openings, through which some surface regions of the substrate 11 are exposed. These surface regions are element regions (i.e., source-drain-gate regions). Those surface regions of the substrate 11 which are located right below the filed oxide film 13 are $p^-$-type impurity regions 32 which serve as channel stoppers.

Two memory cells are provided in each element region and share one drain region. Each memory cell is comprised of one MOS transistor and one capacitor. The MOS transistor has a gate electrode 15, source and drain regions 19, and low impurity concentration regions 16. A gate insulating film 14 is interposed between the silicon substrate 11 and the gate electrode 15. The capacitor has a storage node 21, a capacitor insulating film 22 and a plate electrode 23. The storage node 21 contacts the source region of the MOS transistor. The plate electrode 23 covers all silicon substrate 11, but limited portion of the drain region of the MOS transistor. A bit line 26 is connected to the drain region of the MOS transistor. As shown in FIG. 97, the bit line 26 extends straight, at right angles to a word line (i.e., the gate electrode 15 of the MOS transistor).

The peripheral circuit section will now be described. As shown in FIGS. 99 and 100, a field oxide film 13 is provided on the p-type silicon substrate 11. The film 13 has openings, through which some surface regions of the substrate 11 are exposed. These surface regions are element regions (i.e., source-drain-gate regions). Those surface regions of the substrate 11 which are located right below the field oxide film 13 are $p^-$-type impurity regions 32 and n-type impurity regions 33, which serve as channel stoppers.

In some of the element regions of the peripheral circuit section, there are provided n-channel MOS transistors. In the remaining element regions of the peripheral circuit region, there are provided p-channel MOS transistors.

Each n-channel MOS transistor has a gate electrode 15, source and drain regions 19, and low impurity concentration regions 16. A gate insulating film 14 is interposed between the silicon substrate 11 and the gate electrode 15.

Similarly, each p-channel MOS transistor has a gate electrode 15, source and drain regions 20, and low impurity concentration regions 17. A gate insulating film 14 is interposed between the silicon substrate 11 and the gate electrode 15.

How the RAM shown in FIGS. 97 to 100 is manufactured will be explained.

First, the field oxide film 13 is formed on the silicon substrate 11. A resist pattern is then formed on the field oxide film 13. Using the resist pattern as a mask, boron is ion-implanted into the silicon substrate 11, forming a p-type impurity region 39 in the surface of the substrate 11. Further, using the resist pattern as a mask, phosphorus is ion-implanted into the silicon substrate 11, forming an n-type impurity region 40 in the surface of the substrate 11.

Next, a gate insulating film 14, a phosphorus-containing polysilicon film, and a TEOS film are formed one upon another, on the resultant structure. A resist pattern is formed on the TEOS film. Using this resist pattern as mask, the TEOS film and the polysilicon film are etched, thereby forming gate electrodes 15.

A resist pattern is then formed on the resultant structure. Using this resist pattern and the gate electrodes 15 as masks, phosphorus is ion-implanted into the n-channel MOS transistor regions of the structure. At the same time, using the resist pattern as a mask, boron is ion-implanted into the p-channel MOS transistor regions of the structure.

Then, the structure is annealed, thereby forming n-type impurity regions 16 and p-type impurity regions 17, all having low impurity concentration. A spacer 18 is formed on the sides of each gate electrode 15. Using the resist pattern again as a mask, arsenic is ion-implanted into the n-channel MOS transistor regions. Using the resist pattern as mask, boron is ion-implanted into the p-channel MOS transistor regions. Further, the structure is subjected to thermal oxidation, thus forming source and drain of $n^+$-type and source and drain regions 20, of $p^+$-type.

The storage nodes 21 of capacitors are formed on the source regions of the n-channel MOS transistors of the memory cell section. Capacitor insulating films 22 (e.g., a two-layered film consisting of an oxide film and a nitride film) are formed on the storage nodes 21. A phosphorus-containing polysilicon film is formed on the upper surface of the resultant structure.

Thereafter, those parts of the polysilicon film which are located on the drain regions of the n-type MOS transistors provided in the memory cell section are removed, thereby forming the plate electrodes 23 of the capacitors. A BPSG film 24 is then formed on the upper surface of the resultant structure. Contact holes 25 are made in those parts of the BPSG film which contact the drain regions of the n-channel MOS transistors of the memory cell section. On the BPSG film 24, bit lines 26 are formed, connected to the drain regions of the n-channel MOS transistors of the memory cell section.

An inter-layer insulating film 27 is formed on the upper surface of the structure. Contact holes 28 are made in those parts of the BPSG film 24 and inter-layer insulating film 27 which are located on the source and drain regions 19, and source and drain regions 20 of the MOS transistors provided in the peripheral circuit section. Metal wires 29 are formed on the inter-layer insulating film 27. The wires 29 are connected to the source and drain regions 19, and source and drain regions 20 of the MOS transistors.

Thereafter, an inter-layer insulating film, other metal wires and a passivation film are formed, and pads are then formed. The DRAM is thereby manufactured.

The conventional DRAM is disadvantageous in the following respects:

(1) The capacitance of the junction between the source regions and drain region of each MOS transistor increases in proportion to the integration density, making it difficult to read data from the DRAM at high speed.

(2) The higher the integration density, the greater is the possibility that soft error is made in the memory cell section. The residual radioactive element (U, Th or the like) in any semiconductor film undergoes alpha decay, emitting $\alpha$ rays as shown in FIGS. 101 and 102. The a rays enter the silicon substrate 11, generating hole-electron pairs therein. The electrons of these pairs may move into the capacitor-of a memory cell storing data "1" (i.e., no electrons accumulated in the capacitor). When the electrons in the capacitor increase to a number greater than a specific value, the data "1", stored in the memory cell inevitably changes to data "0" (a sufficient number of electrons accumulated in the capacitor).

(3) It is difficult to apply, as is often desired, a back-gate bias to the switching MOS transistor of each memory cell and to the MOS transistors constituting some of the peripheral circuits (e.g., sense amplifiers). Unless a back-gate bias is applied to any MOS transistor used in, for example, a sense amplifier, the threshold voltage of the transistor will become unstable due to substrate-floating effect. This effect reduces the data-reading tolerance of the DRAM.

(4) A metal silicide layer is provided between the source-drain region of any MOS transistor and a metal wire (electrode) in a peripheral circuit, in order to decrease the contact resistance so that the peripheral circuit may operate fast. This layer is likely to pass through the source-drain region, increasing the leakage current remarkably and ultimately increasing the power consumption.

Accordingly, a first object of the present invention is to provide a DRAM memory cell section which has high integration density, which consumes but a little power, and which scarcely makes soft error.

A second object of the invention is to provide means for applying, whenever necessary, a back-gate bias to the MOS transistors used in the memory cells of a DRAM or the MOS transistors incorporated in some of the peripheral circuits of the DRAM.

A third object of this invention is to provide means for applying a back-gate bias to MOS transistors which require the back-gate bias and applying no backgate bias to MOS transistors which do not require the back-gate bias, thereby to reduce the junction capacitance of these MOS transistors.

A fourth object of the present invention is to provide a metal silicide layer between the source-drain region and a metal wire (electrode), such that the layer would not pass through the source-drain region.

A fifth object of the invention is to provide means for reducing the junction capacitance of MOS transistors which requires no back-gate bias and for improving the performance of an input protecting circuit.

SUMMARY OF THE INVENTION

To attain the objects mentioned above, there are provided the following semiconductor devices according to the present invention:

A first semiconductor device comprising: an insulating layer; a semiconductor layer provided on the insulating layer and comprised of at least a first part having a first thickness and a second part having a second thickness; a first element provided in the first part of the semiconductor layer; and a second element provided in the second part of the semiconductor layer.

A semiconductor device similar to the first semiconductor device, in which the insulating layer has a flat upper surface, the first part of the semiconductor layer defines a recess, and the second part of the semiconductor layer defines a projection. Alternatively, the semiconductor layer may have a flat upper surface, that portion of the insulating layer which is located right below the first part of the semiconductor layer may define a projection, and that portion of the insulating layer which is located right below the second part of the semiconductor layer may define a recess.

A second semiconductor device comprising: a semiconductor layer comprised of at least a first part and a second part and having an upper surface; a first element provided in the first part of the semiconductor layer; and a second element provided in the second part of the semiconductor layer.

A semiconductor device similar to the second semiconductor device, which further comprises an insulating film provided on the upper surface of the semiconductor layer and in the first part of the semiconductor layer. The insulating film isolates the first element and the second element from each other. Its lower surface contacts the insulating layer at the first part of the semiconductor layer and spaced apart from the insulating layer at the second part of the semiconductor layer.

A semiconductor device similar to the second semiconductor device, wherein the first part of the semiconductor layer has an element region completely surrounded by the insulating layer and the insulating film. The insulating film may be a field oxide film formed by LOCOS method or an insulating film provided in a trench made in the semiconductor layer.

A semiconductor device similar to the second semiconductor device, wherein memory cells are provided in the first part of the semiconductor layer, and a peripheral circuit including a sense amplifier is provided in the second part of the semiconductor layer. The memory cells may comprise a MOS transistor and a stacked capacitor each, and the peripheral circuit may comprises MOS transistors. The MOS transistor of each memory cell has a source region and a drain region, each having a lower surface which contacts the insulting layer. Each MOS transistor of the peripheral circuit has a source region and a drain region, each having a lower surface which is spaced apart from the insulating layer. Alternatively, the MOS transistors of the memory cells have a source region and a drain region each, which are located at a prescribed depth, and the MOS transistors of the peripheral circuit have a source region and a drain region each, which are located at that prescribed depth.

A semiconductor device similar to the second semiconductor device, wherein at least memory cells and a sense amplifier are provided in the second part of the semiconductor layer, and a peripheral circuit other than the sense amplifier is provided in the first part of the semiconductor layer. The memory cells comprise a MOS transistor and a stacked capacitor each, the sense amplifier comprises MOS transistors, and the peripheral circuit comprises MOS transistors. The MOS transistors of the memory cells have a source region and a drain region each, which have lower surfaces spaced apart from the insulating layer. The MOS transistors of the sense amplifier has a source region and a drain region each, which have lower surfaces spaced apart from the insulating layer. The MOS transistors of the peripheral circuit have a source region and a drain region each, which have lower surfaces contacting the insulating layer. Alternatively, the MOS transistors of the memory cells have a source region and a drain region each, which are located at a prescribed depth, and the MOS transistors of the sense amplifier have a source region and a drain region each, which are located at that prescribed depth, and the MOS transistors of the peripheral circuit have a source region and a drain region each, which are located also at that prescribed depth.

A semiconductor device similar to the second semiconductor device, wherein a first peripheral circuit is provided in the first part of the semiconductor layer, and a second peripheral circuit including a sense amplifier is provided in the second part of the semiconductor layer. The first peripheral circuit may comprise MOS transistors, each having a source region and a drain region which have lower surfaces contacting the insulating layer, and the second peripheral circuit may comprise MOS transistors, each having a source region and a drain region which have lower surfaces spaced apart from the insulating layer. Alternatively, the MOS transistors of the first peripheral circuit have a source region and a drain region each, which are located at a prescribed depth, and the MOS transistors of the second peripheral circuit have a source region and a drain region each, which are located at that prescribed depth.

A semiconductor device similar to the second semiconductor device, further comprising a well region provided in the second part of the semiconductor layer, and a plurality of element regions provided in the well region. An electrode may be provided for applying a predetermined potential to the well region, whereby a back-gate bias is applied to MOS transistors provided in the element regions. The device may further comprises an input protecting circuit provided in the semiconductor layer. The device may further comprises MOS transistors provided in the first part of the semiconductor layer, each having a source region and a drain region, a metal layer provided on the source and drain regions of the MOS transistors, and a metal silicide layer provided between the metal layer and the source and drain regions of the MOS transistors, the source and drain regions of each MOS transistor having a lower surface each, which contacts the insulating layer. The MOS transistors constitute a peripheral circuit.

A third semiconductor device comprising: an insulating layer; a semiconductor layer provided on the insulating layer; a first MOS transistor provided on the semiconductor layer and having a source region and a drain region which are located at a first depth; and a second MOS transistor provided on the semiconductor layer and having a source region and a drain region which are located at a second depth.

A semiconductor device similar to the third semiconductor device, in which the insulating layer has a flat upper surface, and the source and drain regions of each of the MOS transistors are located at different levels.

A semiconductor device similar to the third semiconductor device, further comprising an insulating film provided on the upper surface of the semiconductor layer, isolating the first MOS transistor and the second MOS transistor from each other and having a lower surface spaced apart from the insulating layer. The insulating film may be a field oxide film formed by LOCOS method or an insulting film provided in a trench made in the semiconductor layer.

A semiconductor device similar to the third semiconductor device, in which the source and drain regions of the first MOS transistor have a lower surface each, which contacts the insulating layer, and the source and drain regions of the second MOS transistor have a lower surface each, which are spaced apart from the insulating layer. The first MOS transistor may constitute a part of a memory cell, and the second MOS transistor may constitute a peripheral circuit. The semiconductor layer may have a well region, the first MOS transistor may be provided in the well region, and a predetermined potential may be applied to the well region. The memory cell may be one having a stacked capacitor. Alternatively, the first MOS transistor may constitute a part of a peripheral circuit including a sense amplifier, the semiconductor layer may have a well region, the first MOS transistor may be provided in the well region, and a predetermined potential may be applied to the well region. The device may further comprising a metal layer provided on the source and drain regions of the first MOS transistor, and a metal silicide layer provided between the metal silicide layer and the source and drain regions of the first MOS transistor.

A fourth semiconductor device comprising: an insulating layer; a semiconductor layer provided on the insulating layer and having a recess; a first MOS transistor provided on the semiconductor layer and having a source region and a drain region which have upper surfaces located in the recess and which have lower surfaces contacting the insulating layer; and a second MOS transistor provided on the semiconductor layer and having a source region and a drain region which have lower surfaces spaced apart from the insulating layer.

A semiconductor device similar to the fourth semiconductor device, wherein the first and second MOS transistors have a gate electrode each, and that part of the semiconductor layer which is located below the gate electrode of the first MOS transistor is as thick as that part of the semiconductor layer which is located below the gate electrode of the second MOS transistor. The source and drain regions of the first MOS transistor are located at a prescribed depth, and the source and drain regions of the second MOS transistor are located at that prescribed depth.

A semiconductor device similar to the fourth semiconductor device, wherein the source and drain regions of the first MOS transistor is comprised of a first part and a second part each, the first part has a high impurity concentration, is located in the recess of the semiconductor layer and has a lower surface contacting the insulating layer, and the second part has a low impurity concentration, and surrounds the first part and has a lower surface spaced apart from the insulating layer.

A semiconductor device similar to the fourth semiconductor device, further comprising a metal layer provided on the source and drain regions of the first MOS transistor, and a metal silicide layer provided between the metal layer and the source and drain regions of the second MOS transistor.

A semiconductor device similar to the fourth semiconductor device, further comprising an insulating film provided on the upper surface of the semiconductor layer, isolating the first MOS transistor and the second MOS transistor from each other and having a lower surface spaced apart from the insulating layer. The insulating film may be a field oxide film formed by LOCOS method. The semiconductor layer may have a trench, and the insulating film may be provided in the trench.

A semiconductor device similar to the fourth semiconductor device, wherein the first MOS transistor constitutes a part of a memory cell, and the second MOS transistor constitutes a peripheral circuit. The semiconductor layer may have a well region, the first MOS transistor may be provided in the well region, and a predetermined potential may e applied to the well region. The memory cell may be one having a stacked capacitor.

A semiconductor device similar to the fourth semiconductor device, wherein the first MOS transistor constitutes a part of a peripheral circuit including a sense amplifier. The semiconductor layer may have a well region, the first MOS transistor may be provided in the well region, and a predetermined potential may be applied to the well region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a plan view illustrating in detail the memory cell section of the DRAM shown in FIG. 1;

FIG. 4 is a sectional view taken along line IV—IV in FIG. 3;

FIG. 7 is a plan view for explaining how soft error may be occur in the memory cell section shown in FIGS. 3 and 4;

FIG. 8 is a sectional view taken along line VIII—VIII in FIG. 7;

FIG. 13 is a plan view for explaining how soft error may be occur in the memory cell section shown in FIGS. 9 and 10;

FIG. 14 is a sectional view taken along line XIV—XIV in FIG. 13;

FIG. 15 is a plan view illustrating the memory cell section of a DRAM according to a first embodiment of the second aspect of the present invention;

FIG. 16 is a sectional view taken along line XVI—XVI in FIG. 15;

FIG. 17 is a plan view showing the peripheral circuit section of the DRAM according to the first embodiment of the second aspect of the invention;

FIG. 18 is a sectional view taken along line XVIII—XVIII in FIG. 17;

FIG. 45 is a detailed sectional view showing the peripheral circuit section of the DRAM illustrated in FIG. 44;

FIG. 54 is a floor plan of a DRAM which is a first embodiment of the third aspect of the present invention;

FIG. 55 is a floor plan of the core block 102 illustrated in FIG. 54;

FIG. 56 is a plan view of the memory cell section of the DRAM shown in FIGS. 54 and 55;

FIG. 57 is a sectional view, taken along line LVII—LVII in FIG. 56;

FIG. 58 is a diagram explaining how to apply a back-gate bias to the memory cell section of the DRAM shown in FIGS. 54 and 55;

FIG. 77 is a plan view showing in detail the peripheral circuit section of the DRAM shown in FIGS. 71 and 72;

FIG. 78 is a sectional view taken along line LXXVIII—LXXVIII in FIG. 77;

FIG. 81 is another plan view illustrating in detail the peripheral circuit section of the DRAM according to a fifth aspect of the invention;

FIG. 82 is a sectional view taken along line LXXXII—LXXXII in FIG. 81;

FIG. 85 is a plan view illustrating in detail the memory cell section of the DRAM shown in FIGS. 83 and 84;

FIG. 86 is a sectional view taken along line LXXXVI—LXXXVI in FIG. 85;

FIG. 91 is a plan view showing in detail the memory cell section and peripheral circuit section of the DRAM according to a seventh aspect of the present invention;

DETAILED DESCRIPTION OF THE PREFERRED EMBODIMENTS

Semiconductor devices according to the present invention will be described, with reference to the accompanying drawings.

First Aspect of the Invention

First, semiconductor devices according to the first aspect of the invention will be described. These semiconductor devices are DRAMs each having a SOI substrate, i.e., a substrate which comprises an insulating layer and a thin silicon layer provided on the insulating layer.

Figure 1:
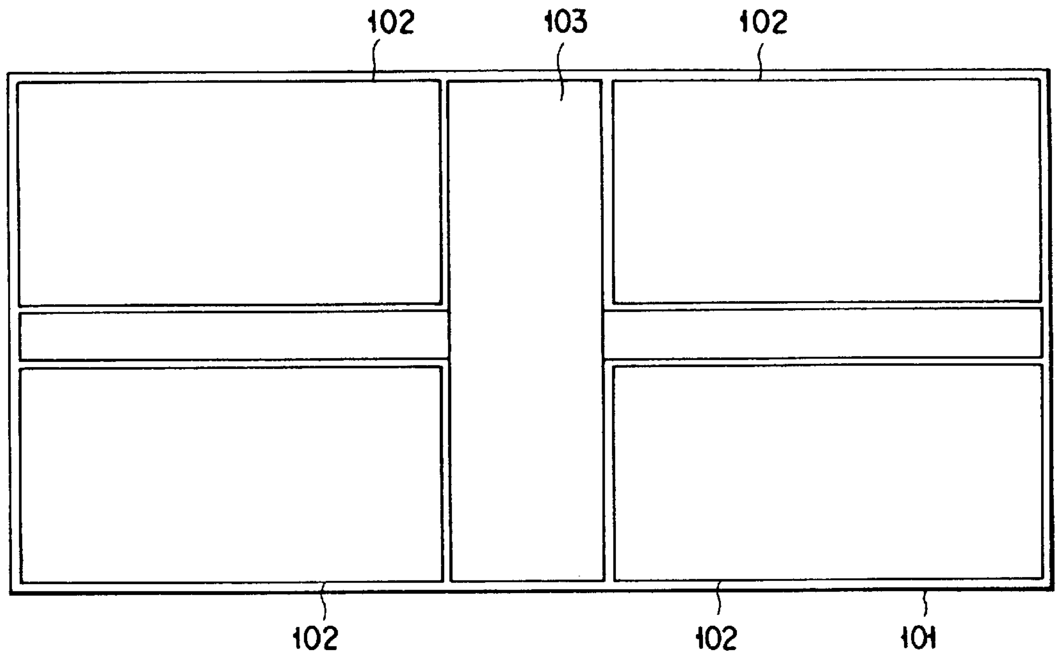
FIG. 1 is a plan view of a DRAM according to a first embodiment of the first aspect of the present invention.
Figure 2:
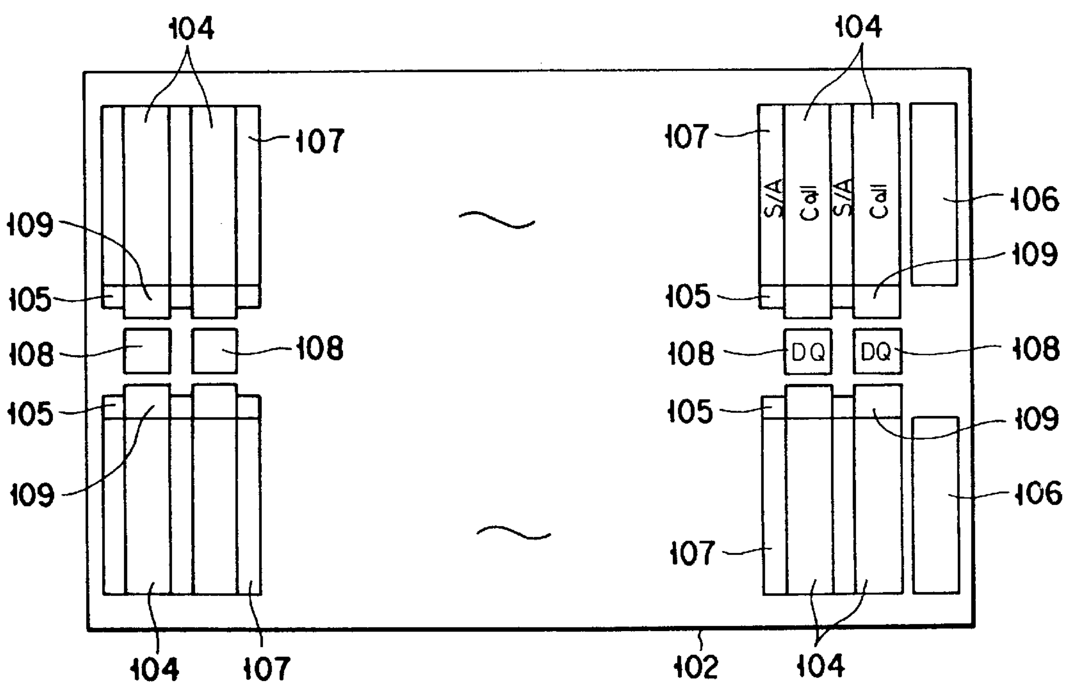
FIG. 2 is a diagram showing in detail the core block shown in FIG. 1.
Figure 5:
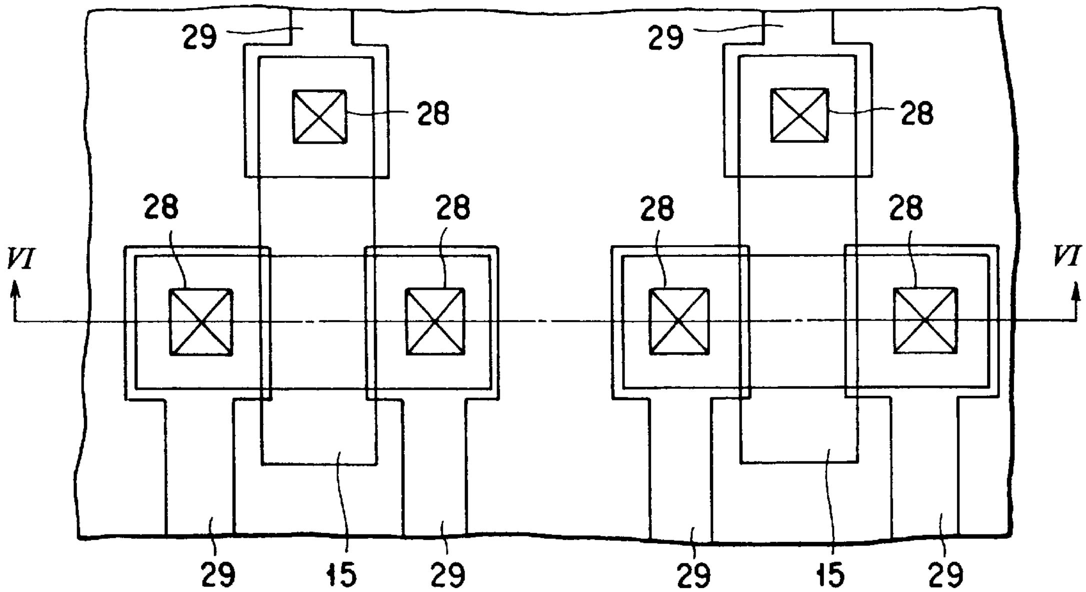
FIG. 5 is a plan view showing in detail the peripheral circuit section of the RAM shown in FIG. 1.
Figure 6:
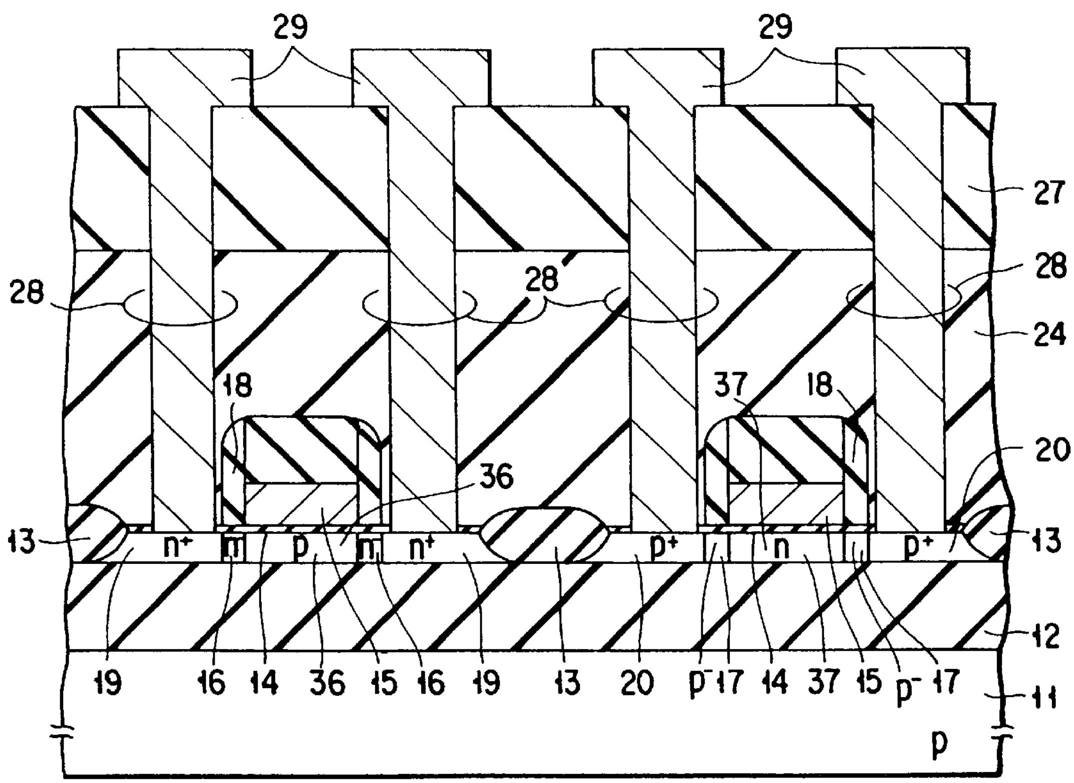
FIG. 6 is a sectional view taken along line VI—VI in FIG. 5.

FIGS. 1 to 6 show a 64 mega bits (MB) DRAM according to the first embodiment according to the first aspect of the present invention. More precisely, FIG. 1 is a floor plan of the DRAM; FIG. 2 is a floor plan of the 16 MB core block shown in FIG. 1; FIG. 3 shows in detail the memory cell section of the DRAM; FIG. 4 is a sectional view taken along line IV—IV in FIG. 3; FIG. 5 shows in detail the peripheral circuit section of the DRAM; and FIG. 6 is a sectional view taken along line VI—VI in FIG. 5.

As shown in FIG. 1, the 64 MB DRAM comprises four core blocks 102 and a peripheral circuit section 103, all provided on a semiconductor chip 101. The section 103 includes an I/O (Input/Output) buffer, a back-gate bias generating circuit, input/output pads and the like. As seen from FIG. 2, each core block 102 is comprised of a memory cell section 104 and a peripheral circuit. (The section 104 includes redundant memory cells.) The peripheral circuit section includes a row decoder 105, a column decoder 106, a sense amplifier 107, a DQ buffer 108 and a redundant circuit 109. (The DQ buffer 108 includes a circuit for driving the DQ line.)

The memory cell section 104 will be described in detail, with reference to FIGS. 3 and 4.

As shown in FIG. 4, a silicon oxide layer 12 having a prescribed thickness is formed in the surface of a p-type silicon substrate 11. Above the silicon oxide layer 12 there is provided a field oxide film 13. The film 13 has openings (only one shown in FIG. 4), which expose some parts of the silicon oxide layer 12. Element regions (i.e., source-drain-gate regions) are provided on the exposed parts of the silicon oxide layer 12.

Two memory cells are formed in each element region. Each memory cell has one MOS transistor and one capacitor. The MOS transistor has a gate electrode 15, source and drain regions 19, and low impurity concentration regions 16. The two memory cells share a drain region 19. A p-type semiconductor region 36 is provided right below the gate electrode 15. A gate insulating film 14 is interposed between the electrode 15 and the semiconductor region 36. The semiconductor region 36 contacts the silicon oxide film 12, at its lower surface. The source and drain regions 19, and low impurity concentration regions 16 contact the silicon oxide layer 12, at their lower surfaces.

The capacitor of each memory cell has a storage node 21, a capacitor insulating film 22 and a plate electrode 23. The storage node 21 contacts the source region of the MOS transistor. The plate electrode 23 covers the silicon substrate 11; it has an opening located above the drain region 19, common to the two memory cells formed in each element region.

Bit lines 26 are connected to the drain regions of the MOS transistors. As illustrated in FIG. 3, the bit lines 26 extend straight, intersecting at right angles to the word lines (i.e., the gate electrodes 15 of the MOS transistors).

The peripheral circuit section will be described in detail, with reference to FIGS. 5 and 6.

As shown in FIG. 6, a silicon oxide layer 12 having a prescribed thickness is formed in the surface of the p-type silicon substrate 11. Above the silicon oxide layer 12 there is provided a field oxide film 13. The film 13 has openings (only two shown in FIG. 6), which expose some parts of the silicon oxide layer 12. Element regions (i.e., source-drain-gate regions) are provided on the exposed parts of the silicon oxide layer 12.

In some of the element regions of the peripheral circuit section, there are provided n-channel MOS transistors. In the remaining element regions of the peripheral circuit region, there are provided p-channel MOS transistors.

Each n-channel MOS transistor has a gate electrode 15, source and drain regions 19, and low impurity concentration regions 16. A p-type semiconductor region 36 is provided right below the gate electrode 15. A gate insulating film 14 is interposed between the electrode 15 and the semiconductor region 36. The p-type semiconductor region 36 contacts, at its lower surface, the silicon oxide layer 12. So do the source and drain regions 19, and low impurity concentration regions 16.

Similarly, each p-channel MOS transistor has a gate electrode 15, source and drain regions 20, and low impurity concentration regions 17. An n-type semiconductor region 37 is provided right below the gate electrode 15. A gate insulating film 14 is interposed between the electrode 15 and the semiconductor region 37. The n-type semiconductor region 37 contacts, at its lower surface, the silicon oxide layer 12. So do the source and drain regions 20, and low impurity concentration regions 17.

How the RAM shown in FIGS. 3 to 6 is manufactured will be explained.

At first, oxygen is ion-implanted into the p-type silicon substrate 11 under specific conditions. The structure obtained is subjected to thermal oxidation. A plate-shaped silicon oxide layer 12 is thereby formed to a prescribed thickness, in the surface of the silicon substrate 11. A field oxide film 13 is then formed on the silicon oxide film 12, by means of LOCOS method.

Then, boron is ion-implanted into the silicon layer provided on the silicon oxide layer 12, by using a resist pattern as mask, thereby forming p-type impurity regions 36, 38 and 39. Phosphorus is ion-implanted into the silicon layer, by using a resist pattern as mask, thereby forming n-type impurity regions 37 and 40.

Next, a gate insulating film 14, a phosphorus-containing polysilicon film, and a TEOS film are sequentially formed on the resultant structure. Using a resist pattern as mask, the TEOS film and the polysilicon film are etched. Gate electrodes 15 are thereby formed. Using the gate electrodes 15 and a resist pattern as masks, phosphorus is ion-implanted into n-channel MOS transistor regions. Similarly, using the resist pattern, boron is ion-implanted into p-channel MOS transistor regions.

Thereafter, the resultant structure is annealed, whereby $n^-$-type impurity regions 16 and $p^-$-type impurity regions 17, all having a low impurity concentration, are formed. A spacer 18 is formed on the sides of each gate electrode 15. Using a resist pattern as mask, arsenic is ion-implanted into the n-channel MOS transistor regions. Using the resist pattern as mask, boron is ion-implanted into the p-channel MOS transistor regions. Further, the structure is subjected to thermal oxidation, thus forming source and drain regions 19, of $n^+$-type and source and drain regions 20, of $p^+$-type.

The storage nodes 21 of capacitors are formed on the source regions of the n-channel MOS transistors of the memory cell section. Capacitor insulating films 22 (e.g., a two-layered film consisting of an oxide film and a nitride film) are formed on the storage nodes 21. A phosphorus-containing polysilicon film is formed on the upper surface of the resultant structure.

Thereafter, those parts of the polysilicon film which are located on the drain regions of the n-type MOS transistors provided in the memory cell section are removed, thereby forming the plate electrodes 23 of the capacitors. A BPSG film 24 is then formed on the upper surface of the resultant structure. Contact holes 25 are made in those parts of the BPSG film which contact the drain regions of the n-channel MOS transistors of the memory cell section. On the BPSG film 24, bit lines 26 are formed, connected to the drain regions of the n-channel MOS transistors of the memory cell section.

An inter-layer insulating film 27 is formed on the upper surface of the structure. Contact holes 28 are made in those parts of the BPSG film 24 and inter-layer insulating film 27 which are located on the source and drain regions 19 and source and drain regions 20, of the MOS transistors provided in the peripheral circuit section. Metal wires 29 are formed on the inter-layer insulating film 27. The wires 29 are connected to the source and drain regions 19 and source and drain regions 20 of the MOS transistors.

Thereafter, an inter-layer insulating film, other metal wires and a passivation film are formed, and pads are then formed. The DRAM is thereby manufactured.

The silicon oxide layer 12 is sufficiently thin. The field oxide film 13 and the source and drain regions 19 contact, at their lower surfaces, the silicon oxide layer 12. Therefore, the DRAM according to the first aspect of the present invention is advantageous in the following respects:

First, the capacitance of the junction between the source and drain regions of each MOS transistor is reduced, rendering it possible to read data from the DRAM at high speed. This capacitance, which influences the switching speed of the MOS transistor greatly, is provided the p-type impurity region 36, on the one hand, and the low impurity concentration regions 16, the source and drain regions 19, on the other hand.

Secondly, soft error is hardly made in the memory cell section. The residual radioactive element (U, Th or the like) in any semiconductor film undergoes alpha decay, emitting a rays. The a rays enter the silicon substrate, generating hole-electron pairs therein. The electrons of these pairs may move into the capacitor of a memory cell storing data 11111 (i.e., no electrons accumulated in the capacitor). When the electrons in the capacitor increase to a number greater than a specific value, the data “1” stored in the memory cell inevitably changes to data “O” (a sufficient number of electrons accumulated in the capacitor). Far less hole-electron pairs are generated in the silicon substrate than the electrons which should be accumulated in the capacitor to hold data 110,11 because the silicon layer on the silicon oxide film 12 is very thin as shown in FIGS. 7 and B. Thus, soft error is prevented.

In the memory cell section, the silicon layer on the silicon oxide layer 12 is thin. In the peripheral circuit section, too, the silicon layer on the silicon oxide layer 12 is thin.

Further, in the peripheral circuit section, too, the field oxide film 13 and the source and drain regions 19 and 20 of the MOS transistors contact the silicon oxide layer 12 at their lower surfaces as shown in FIGS. 5 and 6. The p-type semiconductor regions 36 or the n-type semiconductor regions 37, located right below the gate electrodes 15, are isolated from one another by the silicon oxide film 12 and the field oxide layer 13. To apply a back-gate bias to each MO S transistor, a contact hole and a bias-applying electrode should be provided for the MOS transistor. Hence, it is practically impossible to apply a back-gate to the MOS transistors provided in the peripheral circuit section.

Figure 9:
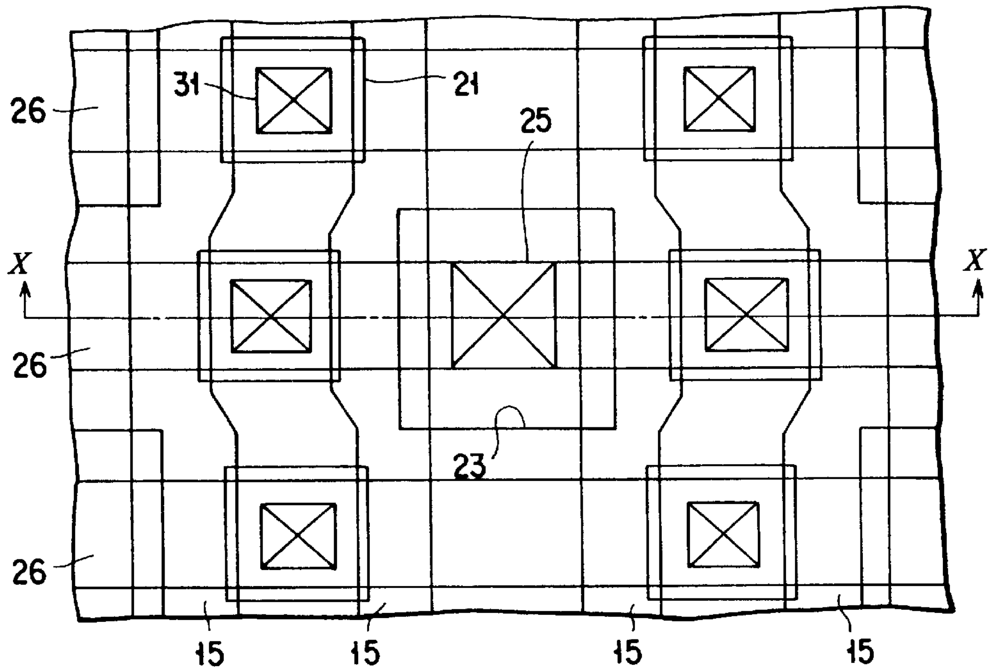
FIG. 9 is a plan view showing in detail the memory cell section of a DRAM according to a second embodiment of the first aspect of the invention.
Figure 10:
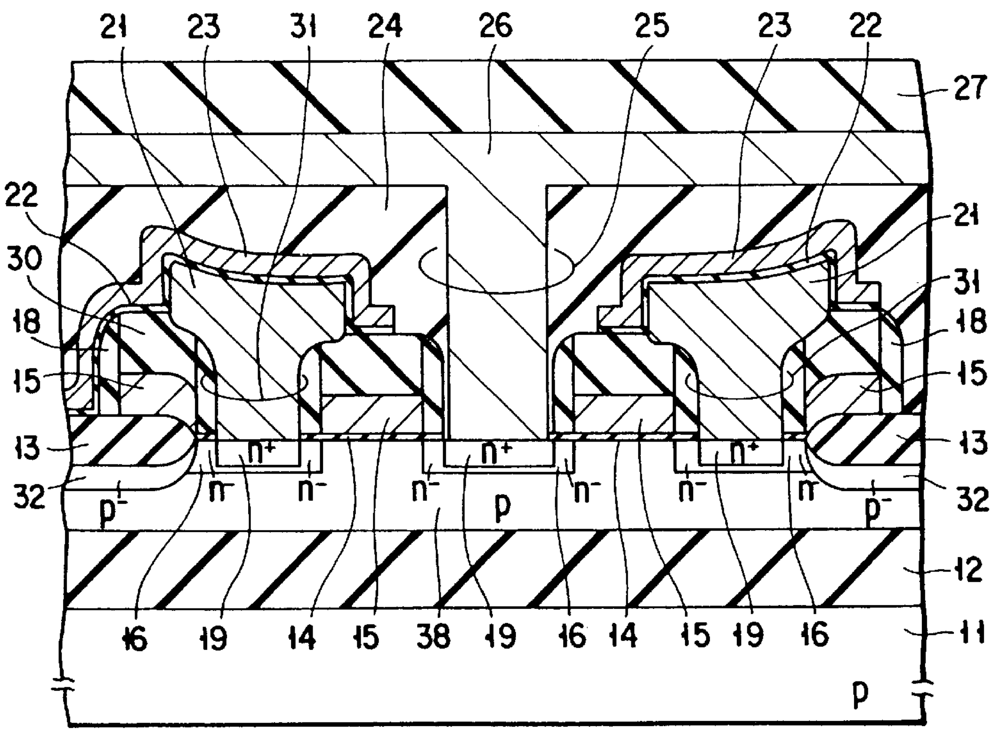
FIG. 10 is a sectional view taken along line X—X in FIG. 9.
Figure 11:
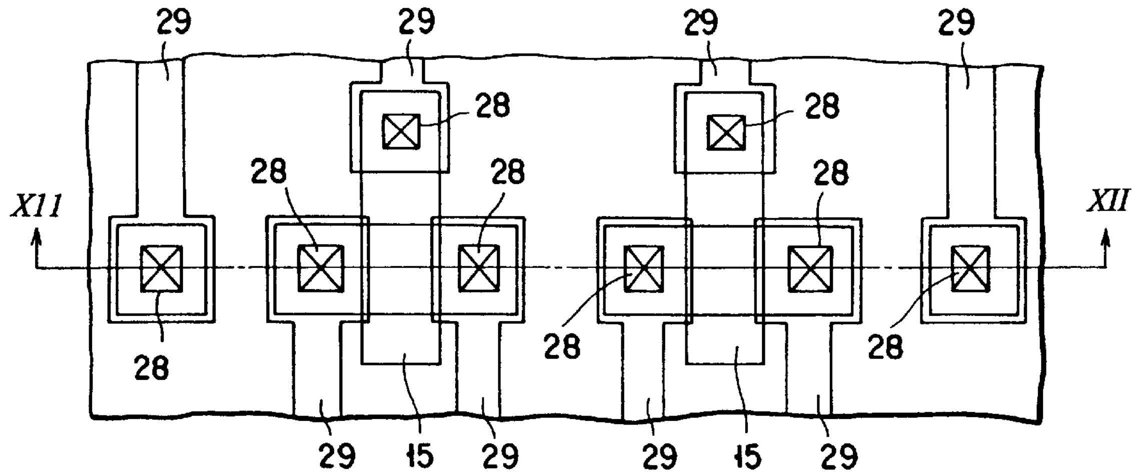
FIG. 11 is a plan view illustrating in detail the peripheral circuit section of the DRAM according to the second embodiment of the first aspect of the invention.
Figure 12:
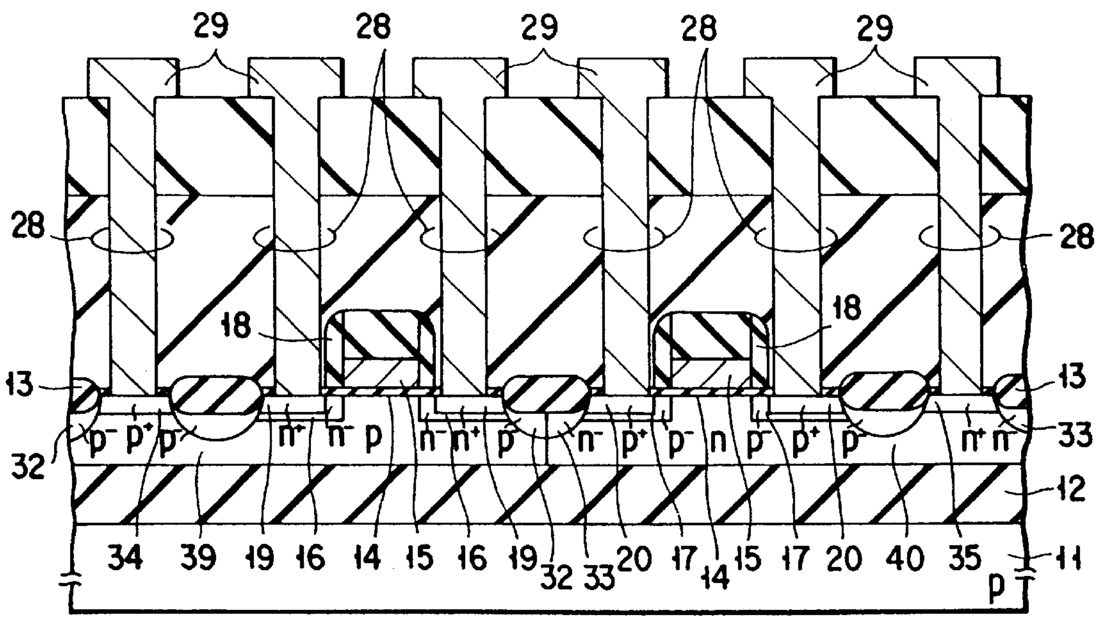
FIG. 12 is a sectional view taken along line XII—XII in FIG. 11.

FIGS. 9 to 12 show a 64 MB DRAM according to the second embodiment according to the first aspect of the present invention. More specifically, FIG. 9 is a plan view showing the memory cell section of the DRAM, FIG. 10 is a sectional view taken along line X—X in FIG. 9, FIG. 11 is a plan view illustrating the peripheral circuit section of the DRAM, and FIG. 12 is a sectional view taken along line XII—XII in FIG. 11.

The memory cell section will be first described, with reference to FIGS. 9 and 10.

As shown in FIG. 9, a plate-shaped silicon oxide layer 12 having a prescribed thickness is formed in the surface of a p-type silicon substrate 11. Above the silicon oxide layer 12 there is provided a field oxide film 13. The film 13 does not contact the silicon oxide layer 12. The film 13 has openings (only one shown in FIG. 4), which expose some parts of the silicon oxide layer 12. Element regions (i.e., source-drain-gate regions) are provided on the exposed parts of the silicon oxide layer 12.

Two memory cells are formed in each element region. Each memory cell has one MOS transistor and one capacitor. The MOS transistor has a gate electrode 15, source and drain regions 19, and low impurity concentration regions 16. The two memory cells share a drain region 19. The MOS transistor is provided in a p-type semiconductor region 38.

A gate insulating film 14 is interposed between the electrode 15 and the semiconductor region 38. The source and drain regions 19, and low impurity concentration regions 16, do not contact the silicon oxide layer 12, at their lower surfaces.

The capacitor of each memory cell has a storage node 21, a capacitor insulating film 22 and a plate electrode 23. The storage node 21 contacts the source region of the MOS transistor. The plate electrode 23 covers the silicon substrate 11; it has an opening located above the drain region 19, common to the two memory cells formed in each element region.

Bit lines 26 are connected to the drain regions of the MOS transistors. As seen from FIG. 9, the bit lines 26 extend straight, intersecting at right angles to the word lines (i.e., the gate electrodes 15 of the MOS transistors).

The peripheral circuit section will now be described, with reference to FIGS. 11 and 12.

As shown in FIG. 12, a silicon oxide layer 12 having a prescribed thickness is formed in the p-type silicon substrate 11. Above the silicon oxide layer 12 there is provided a field oxide film 13. The film 13 has openings, which expose some parts of the silicon oxide layer 12. Element regions (i.e., source-drain-gate regions) are provided on the exposed parts of the silicon oxide layer 12.

In some of the element regions of the peripheral circuit section, there are provided n-channel MOS transistors. In the remaining element regions of the peripheral circuit region, there are provided p-channel MOS transistors.

Each n-channel MOS transistor has a gate electrode 15, source and drain regions 19, and low impurity concentration regions 16. The n-channel MOS transistor is provided in a p-type semiconductor region 39. A gate insulating film 14 is interposed between the gate electrode 15 and the semiconductor region 39. Therefore, the source and drain region 19, and low impurity concentration regions 16 do not contact, at their lower surfaces, the silicon oxide layer 12.

Similarly, each p-channel MOS transistor has a gate electrode 15, source and drain region 20, and low impurity concentration regions 17. The p-channel MOS transistor is provided in an n-type semiconductor region 40. A gate insulating film 14 is interposed between the gate electrode 15 and the semiconductor region 40. Hence, the source and drain regions 20, and low impurity concentration regions 17, do not contact, at their lower surfaces, the silicon oxide layer 12.

The DRAM shown in FIGS. 9 to 12 can be manufactured by the same method as the DRAM illustrated in FIGS. 3 to 6.

In the DRAM shown in FIGS. 9 to 12, the silicon oxide layer 12 is sufficiently thin and neither the source nor drain regions 19 of each MOS transistor which constitutes a memory cell, jointly with another identical MOS transistor, contacts at its lower surface the silicon oxide layer 12. In the peripheral circuit section, a plurality of n-channel MOS transistors are provided in the p-type semiconductor (well) region 39 and a plurality of p-channel MOS transistors are provided in the n-type semiconductor (well) region 40, as is illustrated in FIGS. 11 and 12. A $p^+$-type impurity region 34 is provided in the p-type semiconductor region 39, and an n+-type impurity region 35 is provided in the p-type semiconductor region 39. Through the region 34 a back-gate bias can be applied to the MOS transistor provided in the p-type semiconductor region 39. Through the region 35 a back-gate bias can be applied to the MOS transistor provided in the n-type semiconductor region 40.

In the memory cell section, too, the source and drain regions 19, and low impurity concentration regions 16 of each MOS transistor do not contact, at their lower surfaces, the silicon oxide layer 12 as illustrated in FIGS. 9 and 10. Therefore, a back-gate bias can be applied to the MOS transistors constituting the memory cells, thereby not to cause substrate floating effect which would render the threshold voltage of the MOS transistors unstable.

Furthermore, soft error is hardly made in the memory cell section. The residual radioactive element (U, Th or the like) in any semiconductor film undergoes alpha decay, emitting a rays. The a rays enter the silicon substrate, generating hole-electron pairs therein. The electrons of these pairs may move into the capacitor of a memory cell storing data “1” (i.e., no electrons accumulated in the capacitor). When the electrons in the capacitor increase to a number greater than a specific value, the data I’ll, stored in the memory cell inevitably changes to data “O” (an adequate number of electrons accumulated in the capacitor). Far less hole-electron pairs are generated in the silicon substrate than the electrons which should be accumulated in the capacitor to hold data 110,11 because the silicon layer on the silicon oxide film 12 is very thin as shown in FIGS. 13 and 14. Thus, soft error is prevented.

Second Aspect of the Invention

Semiconductor devices according to the second aspect of the present invention will be described. These semiconductor devices are DRAMs each having a SOI substrate which is characterized in that at least two silicon layers different in thickness are provided on an insulating layer.

Figure 19:
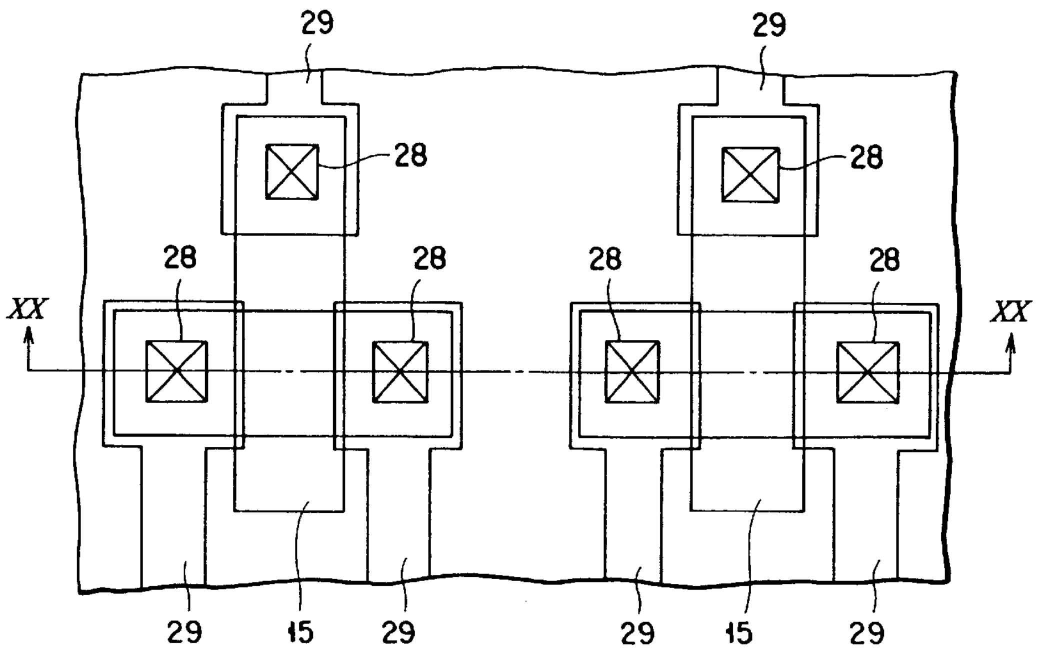
FIG. 19 is a plan view showing the peripheral circuit section in greater detail.
Figure 20:
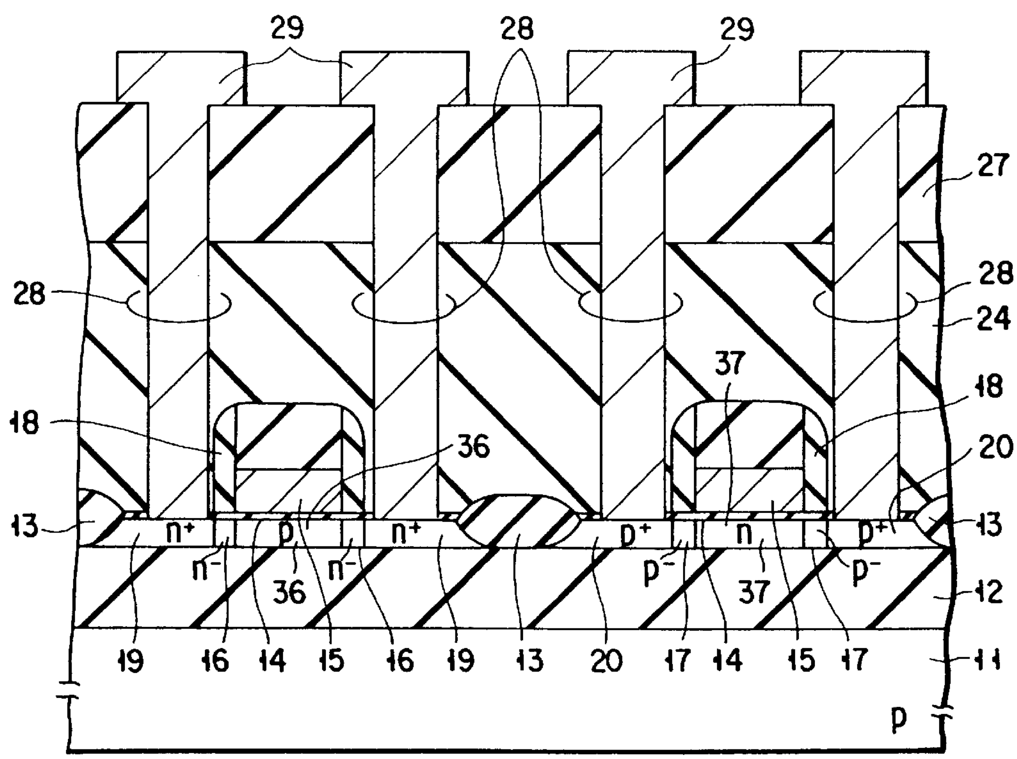
FIG. 20 is a sectional view taken along line XX—XX in FIG. 20.
Figure 21:
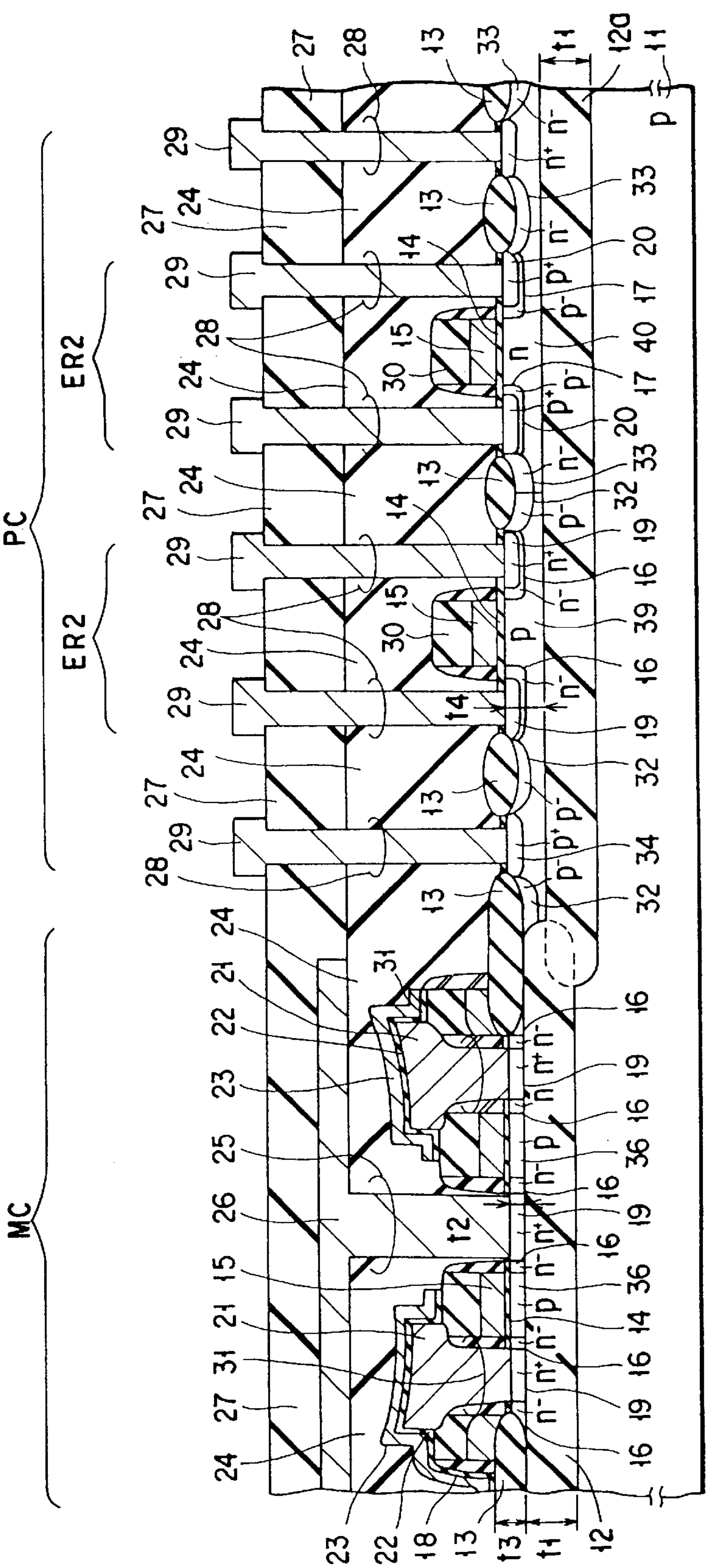
FIG. 21 is a sectional view showing both the memory cell section and peripheral circuit section of the DRAM.
Figure 22:
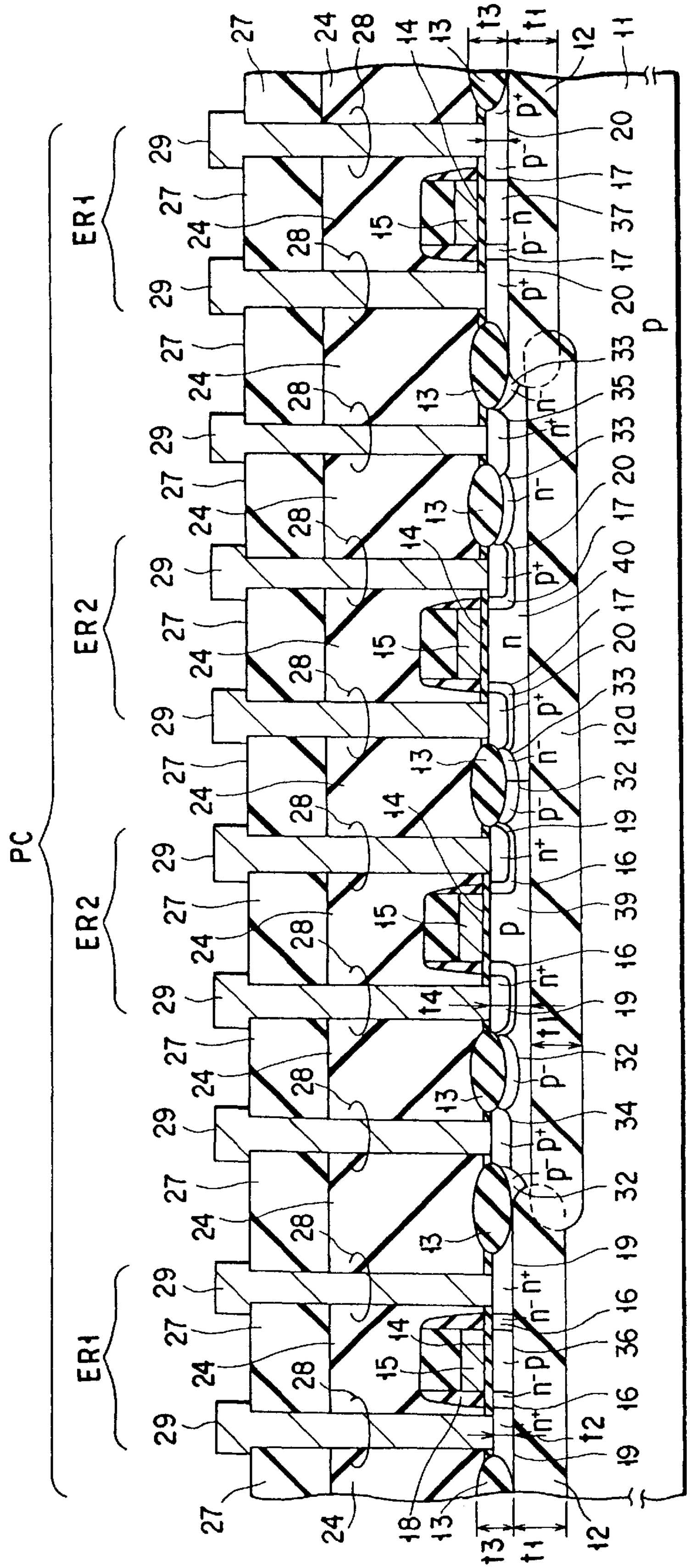
FIG. 22 is another sectional view showing the peripheral circuit section of the DRAM.
Figure 23:
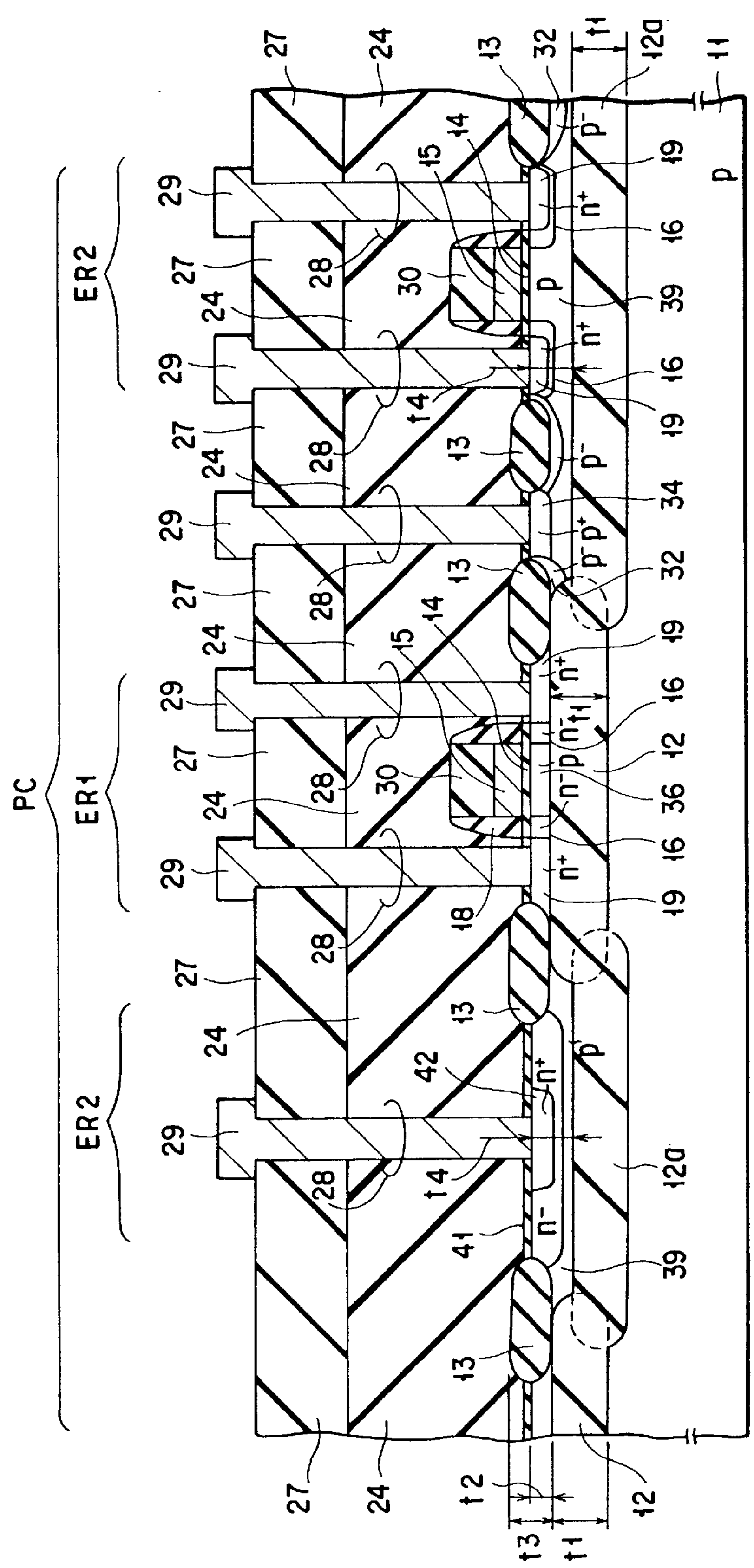
FIG. 23 is another sectional view illustrating the peripheral circuit section of the DRAM.

FIGS. 15 to 23 show a 64 mega bits (MB) DRAM according to the first embodiment according to the second aspect of the present invention. More precisely, FIG. 15 is a plan view illustrating the memory cell section MC of the DRAM; FIG. 16 is a sectional view taken along line XVI—XVI in FIG. 15; FIGS. 17 and 19 show the peripheral circuit section PC of the DRAM; FIG. 18 is a sectional view taken along line XVIII—XVIII in FIG. 17; FIG. 20 is a sectional view taken along line XX—XX in FIG. 20; FIG. 21 is sectional view showing both the memory cell section MC and the peripheral circuit section PC; and FIGS. 22 and 23 illustrate the peripheral circuit section PC in greater detail.

The memory cell section MC will be first described, with reference to FIGS. 15 and 16.

As shown in FIG. 16, a plate-shaped silicon oxide layer 12 having a prescribed thickness t.1 . . . (e.g., about 0.4 $\mu$m) is formed in a p-type silicon substrate 11. The layer 12 is provided in the entire memory cell section MC. Its upper surface is parallel to that of the silicon substrate 11 and located at a predetermined depth t2 (e.g., about 0.1 $\mu$m) from the upper surface of the substrate 11. This means that the substrate 11 includes silicon layers (element regions) which are provided on the silicon oxide layer 12 and which have a thickness of t2.

A field oxide film 13 having a prescribed thickness (e.g., about 0.2 $\mu$m) is formed on the silicon oxide layer 12. The element regions of the memory cell section MC are isolated from one another, each contacting the silicon oxide film 12 at the lower surface and surrounded by the field oxide film 13.

Two memory cells are provided in each element region. Each memory cell has one MOS transistor and one capacitor. The MOS transistor has a gate electrode 15, source and drain regions 19, and low impurity concentration regions 16. A p-type semiconductor region 36 is provided right below the gate electrode 15. A gate insulating film 14 is interposed between the electrode 15 and the semiconductor region 36. The p-type semiconductor region 36 contacts, at its lower surface, the silicon oxide layer 12. So do the source and drain regions 19, and low impurity concentration regions 16. The two memory cells share a drain region 19.

The capacitor of each memory cell has a storage node 21, a capacitor insulating film 22 and a plate electrode 23. The storage node 21 extends through a contact hole 31 and contacts the source region of the MOS transistor. The plate electrode 23 covers the silicon substrate 11; it has an opening located above the drain region 19 common to the two memory cells formed in each element region.

Bit lines 26 are connected to the drain regions of the MOS transistors. As seen from FIG. 15, the bit lines 26 extend straight, intersecting at right angles to the word lines (i.e., the gate electrodes 15 of the MOS transistors.

The source and drain regions 19, and low impurity concentration regions 16 of the MOS transistor of each memory cell are very thin. Further, all components of the MOS transistor, but the channel region (the p-type semiconductor region 36) and the contact, have all sides contacting the insulating layers. Therefore, virtually no junction capacitance exists, and virtually no junction leakage current flows. This enables the memory cell section MC to operate at high speed, consuming less power than otherwise. In addition, soft error is hardly made in the memory cell section MC.

Since the possibility of soft error is low, it is easy to impart a sufficient capacitance to the capacitor. Even if the capacitor of each memory cell is of stacked structure, it can be so thin that the silicon substrate has, if any, low stepped portions on its surface.

The peripheral circuit section PC will now be described, with reference to FIGS. 17 to 20.

Plate-shaped silicon oxide layers 12 and 12' (only the layer 12 shown in FIGS. 18 and 20) having a prescribed thickness t.1. (e.g., about 0.4 $\mu$m) are formed in the p-type silicon substrate 11.

The upper surface of the silicon oxide layer 12 is parallel to that of the silicon substrate 11 and located at a predetermined depth t2 (e.g., about 0.1 $\mu$m) from the upper surface of the substrate 11. This means that the substrate 11 includes silicon layers (element regions) which are provided on the silicon oxide layer 12 and which have a thickness of t2.

The upper surface of the silicon oxide layer **12*a* is parallel to that of the silicon substrate 11 and located at a predetermined depth t4 (e.g., about 0.25 $\mu$m) from the upper surface of the substrate 11. This means that the substrate 11 includes silicon layers (element regions) which are provided on the silicon oxide layer 12*a* and which have a thickness of t4**.

A field oxide film 13 having a prescribed thickness (e.g., about 0.2 $\mu$m) is formed on the silicon oxide layer 12 and above the silicon oxide layer **12*a*. Namely, the film 13 contacts the silicon oxide layer 12 and does not contact the silicon oxide layer 12*a***. Thus, the peripheral circuit section PC has two types of element regions.

The element regions ER1 of the first type are isolated from one another as shown in FIGS. 21 to 23, completely surrounded by the silicon oxide film 12 and the field oxide film 13. Provided in the element region ER1 are MOS transistors to which a back-gate bias need not be applied.

The element regions ER2 of the second type are surrounded by the field oxide film 13. Some of the element regions ER2 are provided in a p-type semiconductor region 39. The remaining element regions ER2 are provided in an n-type semiconductor region 40. Provided in the element regions ER2 are MOS transistors to which a back-gate bias must be applied and which constitute sense amplifiers, DQ-line driving circuits and operational amplifiers.

A $p^-$-type impurity region 32 and an $n^-$-type impurity region 33 are provided near the lower surface of the field oxide film 13 formed above the silicon oxide layer 12. Both impurity regions 32 and 33 are used as channel stoppers. The impurity region 33 can be dispensed with.

In some of the element regions provided on the silicon oxide layer 12, there are provided n-channel MOS transistors. In the remaining element regions formed on the silicon oxide layer 12, there are provided p-channel MOS transistors.

Each n-channel MOS transistor has a gate electrode 15, source and drain regions 19, and low impurity concentration regions 16. A p-type semiconductor region 36 is provided right below the gate electrode 15. A gate insulating film 14 is interposed between the gate electrode 15 and the semiconductor region 36. The semiconductor region 36 contacts, at its lower surface, the silicon oxide layer 12. The source and drain regions 19, and low impurity concentration regions 16 contact, at their lower surfaces, the silicon oxide layer 12.

Similarly, each p-channel MOS transistor has a gate electrode 15, source and drain regions 20, and low impurity concentration region 17. An n-type semiconductor region 37 is provided right below the gate electrode 15. A gate insulating film 14 is interposed between the gate electrode 15 and the semiconductor region 37. The semiconductor region 37 contacts, at its lower surface, the silicon oxide layer 12. The source and drain regions 20, and low impurity concentration regions 17 contact, at their lower surfaces, the silicon oxide layer 12.

The source and drain regions 19, and low impurity concentration regions 16 of the MOS transistor of each memory cell are very thin. Further, all components of the MOS transistor, but the channel region (the p-type semiconductor region 36) and the contact, have all sides contacting the insulating layers. Therefore, the parasitic capacitance is low, whereby the MOS transistor operates at high speed, consuming only a little power.

The MOS transistors provided in the element regions formed on the silicon oxide layer 12 are of the type to which a back-gate bias need not be applied. This is because these MOS transistors are surrounded by the insulating layer and, hence, isolated from one another.

In some of the element regions on the silicon oxide layer 12*a,* there are provided n-channel MOS transistors. In the remaining element regions formed on the silicon oxide layer 12*a,* there are provided p-channel MOS transistors.

Each n-channel MOS transistor is provided in the p-type semiconductor (well) region 39. It has agate electrode 15, source and drain regions 19, and low impurity concentration regions 16. A gate insulating film 14 is provided right below the gate electrode 15. Therefore, the source and drain regions 19, and low impurity concentration region 16 do not contact, at their lower surfaces, the silicon oxide layer 12*a*.

Similarly, each p-channel MOS transistor is provided in the n-type semiconductor (well) region 40. It has a gate electrode 15, source and drain regions 20, and low impurity concentration regions 17. A gate insulating film 14 is provided right below the gate electrode 15. Hence, the source and drain regions 20, and low impurity concentration regions 17 do not contact, at their lower surfaces, the silicon oxide layer 12*a*.

Thus, the p-type semiconductor (well) region 39 includes a plurality of n-channel MOS transistors which are provided on the silicon oxide layer 12*a*. To these n-channel MOS transistors there can be applied a backgate bias, because a $p^+$-type impurity region 34 is provided in the p-type semiconductor region 39. Also, the n-type semiconductor (well) region 40 includes a plurality of p-channel MOS transistors which are provided on the silicon oxide layer 12*a*. To these p-channel MOS transistors there can be applied a backgate bias, because an $n^+$-type impurity region 35 is provided in the n-type semiconductor region 40.

An input protecting circuit can be formed in one of the element regions provided on the silicon oxide layer 12*a*. The input protecting circuit comprises, for example, a diode. More correctly, it comprises an $n^-$-type impurity region 41 and an $n^+$-type impurity region 42. The impurity region 41 is formed in the p-type semiconductor region 39, and the impurity region 42 is formed in the impurity region 41. The $n^-$-type impurity region 41 can be made thick enough to impart an adequate sheet resistance to the input protecting circuit.

How the RAM shown in FIGS. 21 to 23 is manufactured will be explained, with reference to FIGS. 24 to 27.

Figure 24:
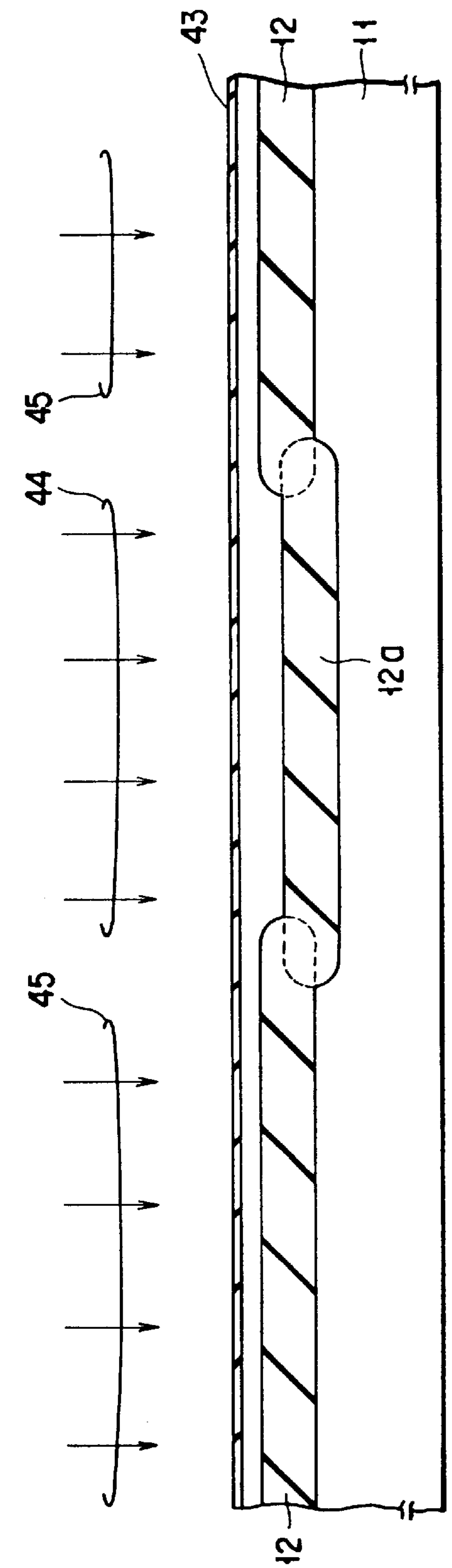
FIGS. 24 to 27 are sectional views explaining a method of manufacturing the DRAM shown in FIGS. 21 to 23.

First, as shown in FIG. 24, oxygen ions 44 are implanted into specified regions (only one shown) of the peripheral circuit section PC, in a dose of about $2\times10^{18}$ $cm^{-2}$ under acceleration energy of about 250 keV. Further, oxygen ions 45 are implanted into the entire memory cell section MC and also into other specified regions of the peripheral circuit section PC, in a dose of about $2\times10^{18}$ $cm^{-2}$ under acceleration energy of about 150 keV. Each region into which oxygen ions are implanted under the acceleration energy of about 250 keV overlaps two adjacent regions into which oxygen ions are implanted under the acceleration energy of about 150 keV.

The resultant structure is annealed in an $N_2$ atmosphere, for example at about 1450° C. for about 30 minutes. Plate-shaped silicon oxide layers 12 and 12*a,* each having a thickness of about 0.4 μm, are thereby formed in the silicon substrate 11. Due to the different acceleration energies applied to form the layers 12 and 12*a,* the silicon layer on each silicon oxide layer 12 differs in thickness from the silicon layer on each silicon oxide layer 12*a*. For instance, the former is about 0.1 μm thick, and the latter is about 0.25 μm.

Figure 25:
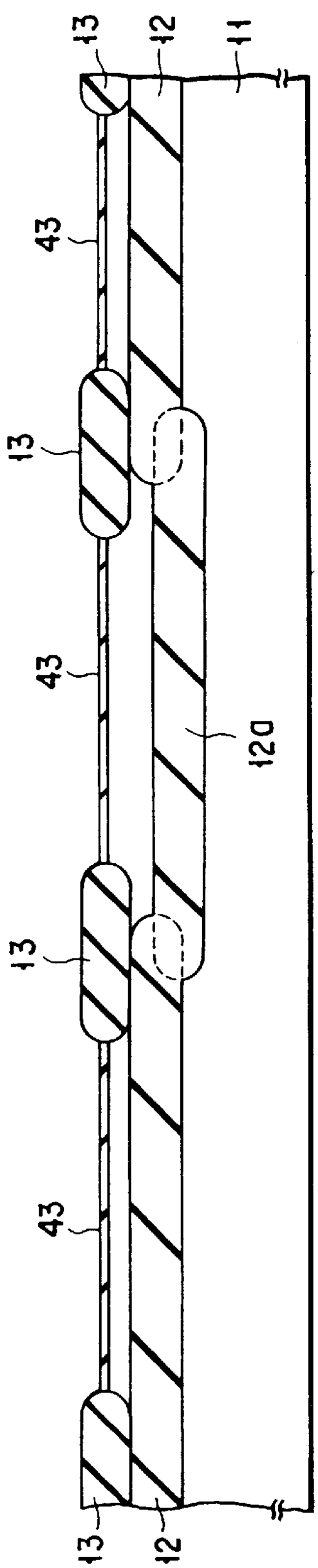

Next, as shown in FIG. 25, a field oxide film 13 about 0.2 μm thick is formed by LOCOS method on the silicon oxide layers 12 and above the silicon oxide layers 12*a*. Thus, the film 13 contacts the silicon oxide layers 12 and does not contact the silicon oxide layers 12*a.*

Figure 26:
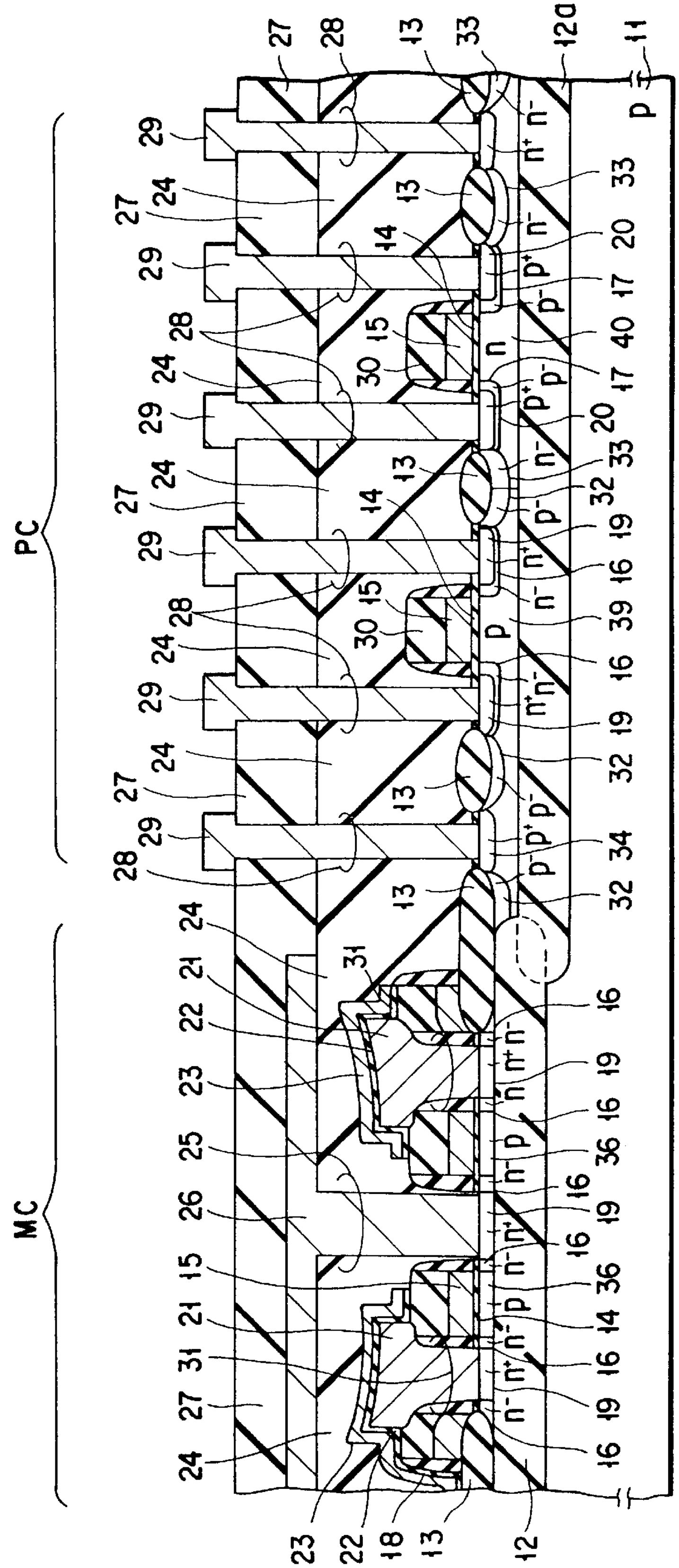
Figure 27:
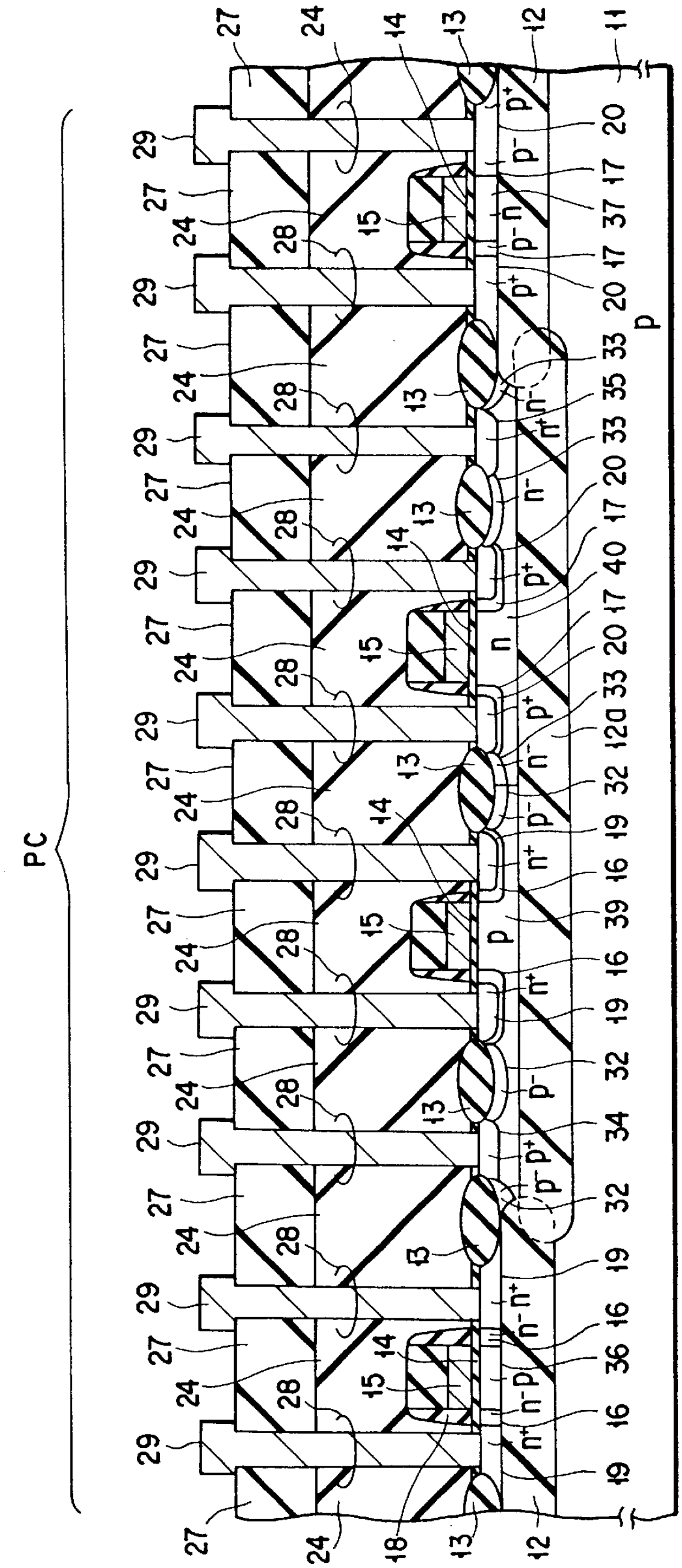

As shown in FIGS. 26 and 27, boron ions are implanted into those parts of the silicon layer which are located on the silicon oxide layers 12, using a resist pattern as a mask. P-type impurity regions 36, 38 and 39 are thereby formed. Further, phosphorus ions are implanted into those parts of the silicon layer which are located on the silicon oxide layer 12*a,* using a resist pattern as a mask. N-type impurity regions 37 and 40 are thereby formed.

A gate insulating film 14, a phosphorus-containing polysilicon film, and a TEOS film 30 are formed on the resultant structure, one after another. Using a resist pattern as mask, the TEOS film 30 and the polysilicon film are etched, forming gate electrodes 15.

Then, using the resist pattern and the gate electrodes 15 as masks, phosphorus ions are implanted into the n-channel MOS transistor regions. Similarly, using the resist pattern as mask, boron ions are implanted into the p-channel MOS transistor regions.

The resultant structure is annealed, thereby forming low impurity concentration regions 16 of $n^-$-type and low impurity concentration regions 17 of $p^-$-type. These regions 16 and 17 have a surface impurity concentration of $1\times10^{18}$ to $1\times10^{20}$ cm$^{-3}$. A spacer 18 is then formed on the sides of each gate electrode 15. Using a resist pattern as a mask, arsenic is ion-implanted into the n-channel MOS transistor regions, and boron is ion-implanted into the p-channel MOS transistor regions. Further, the structure is subjected to thermal oxidation, thus forming source and drain regions 19 of $n^+$-type and source and drain regions 20 of $p^+$-type. These regions 19 and 20 have a surface impurity concentration of $1\times10^{19}$ to $1\times10^{20}$ cm$^{-3}$.

Contact holes 31 are formed which expose the source regions of the n-channel MOS transistors formed in the memory cell section MC. Storage nodes 21 of capacitors are formed, each having a thickness of about 0.2 μm and extending through the contact holes 31 to the source regions of the n-channel MOS transistors. Then, a capacitor insulating film 22 about 0.01 μm thick is formed on each storage node 21. (The film 22 is, for example, a two-layered film consisting of an oxide film and a nitride film.) A polysilicon layer containing phosphorus and having a thickness of, for example, about 0.1 μm, is formed on the upper surface of the resultant structure. Those parts of the poly-silicon layer which are located on the drain regions of the n-channel MOS transistor of the memory cell section MC are removed, thereby forming the plate electrodes 23 of capacitors.

A BPSG film 24 is formed on the upper surface of the structure. Contact holes 25 are made in the BPSG film 24, exposing the drain regions of the n-channel MOS transistors of the memory cell section MC. Bit lines 26 are formed on the BPSG film 24 and in the contact holes 25. The bit lines 26 are connected to the drain regions of the n-channel MOS transistors.

An inter-layer insulating film 27 is formed on the upper surface of the resultant structure. Contact holes 28 are formed in the BPSG film 24 and inter-layer insulating film 27 of the peripheral circuit section PC. The contact holes 28 expose the source and drain regions 19 and source and drain regions 20 of the MOS transistors of the section PC. Metal wires 29 are formed on the inter-layer insulating film 27 and in the contact holes 28. The wires 29 are therefore connected to the source and drain regions 19, and source and drain regions 20 of the MOS transistors.

Thereafter, an inter-layer insulating film, other metal wires and a passivation film are formed, and pads are then formed. The DRAM is thereby manufactured.

The DRAM thus manufactured, i.e., a semiconductor device which is the first embodiment of the second aspect of the invention, is characterized in two respects. First, its memory cell section has high integration density, consumes but a little power, and scarcely makes soft error. Second, its peripheral circuit section has MOS transistors to which a back-gate bias can be applied.

Furthermore, the junction capacitance of each MOS transistor to which no back-gate bias needs to be applied can be reduced. In addition, the performance of the input protecting circuit can be improved.

Figure 28:
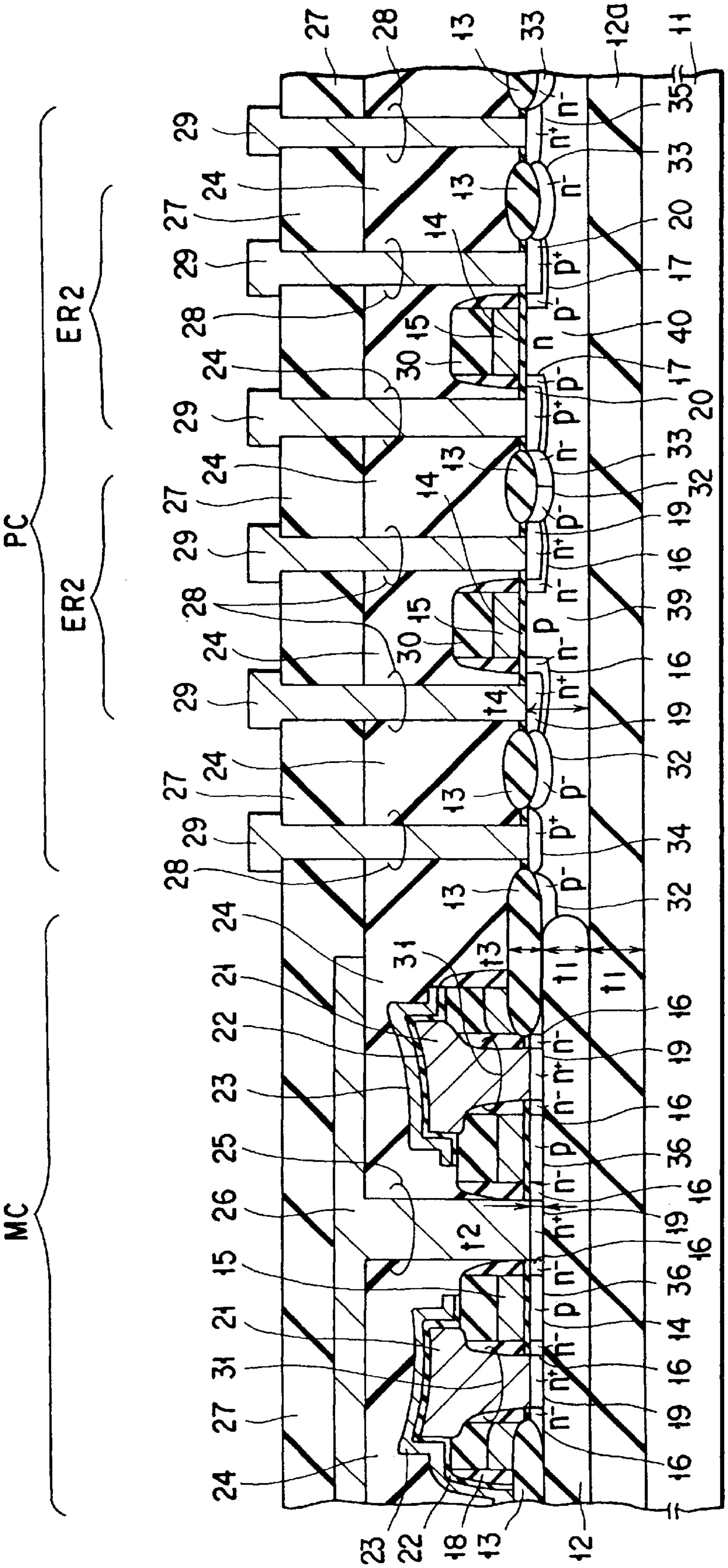
FIG. 28 is a sectional view illustrating both the memory cell section and peripheral circuit section of a DRAM according to a second embodiment of the present invention.
Figure 29:
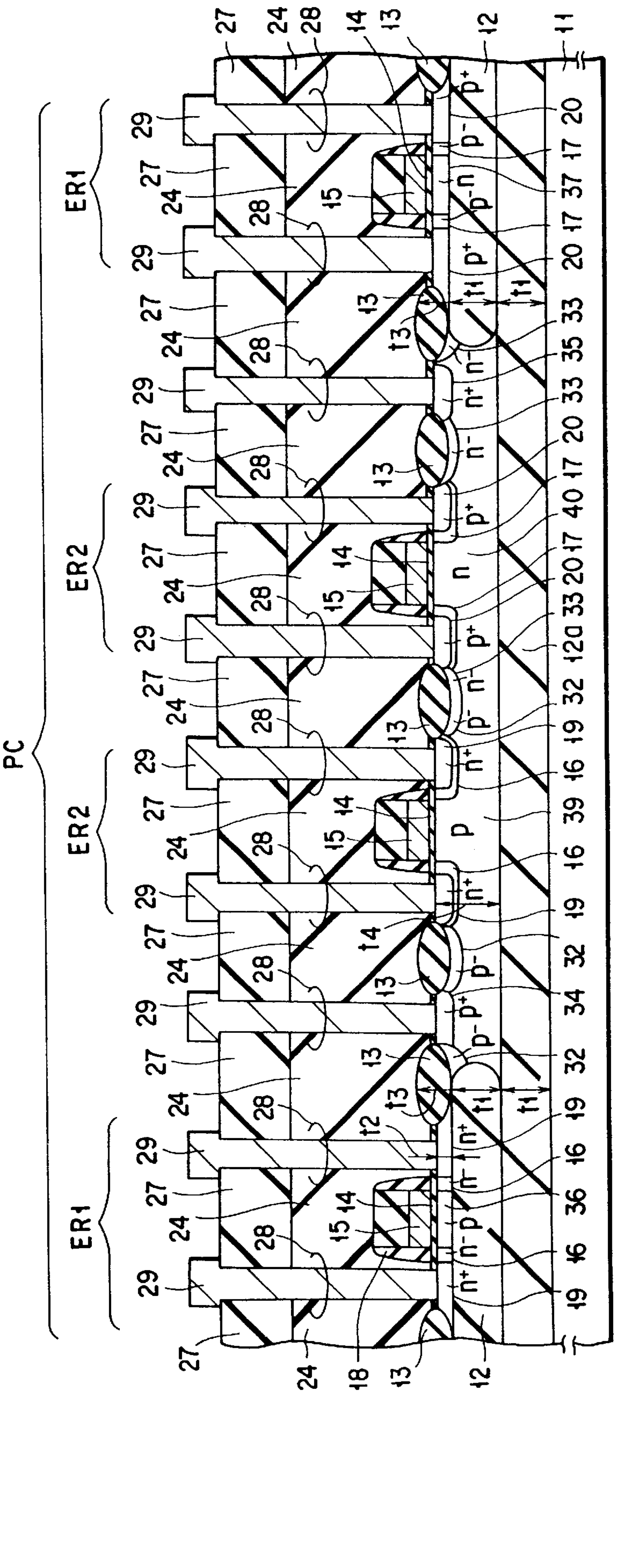
FIG. 29 is a detailed sectional view showing the peripheral circuit section of the DRAM illustrated in FIG. 28.
Figure 30:
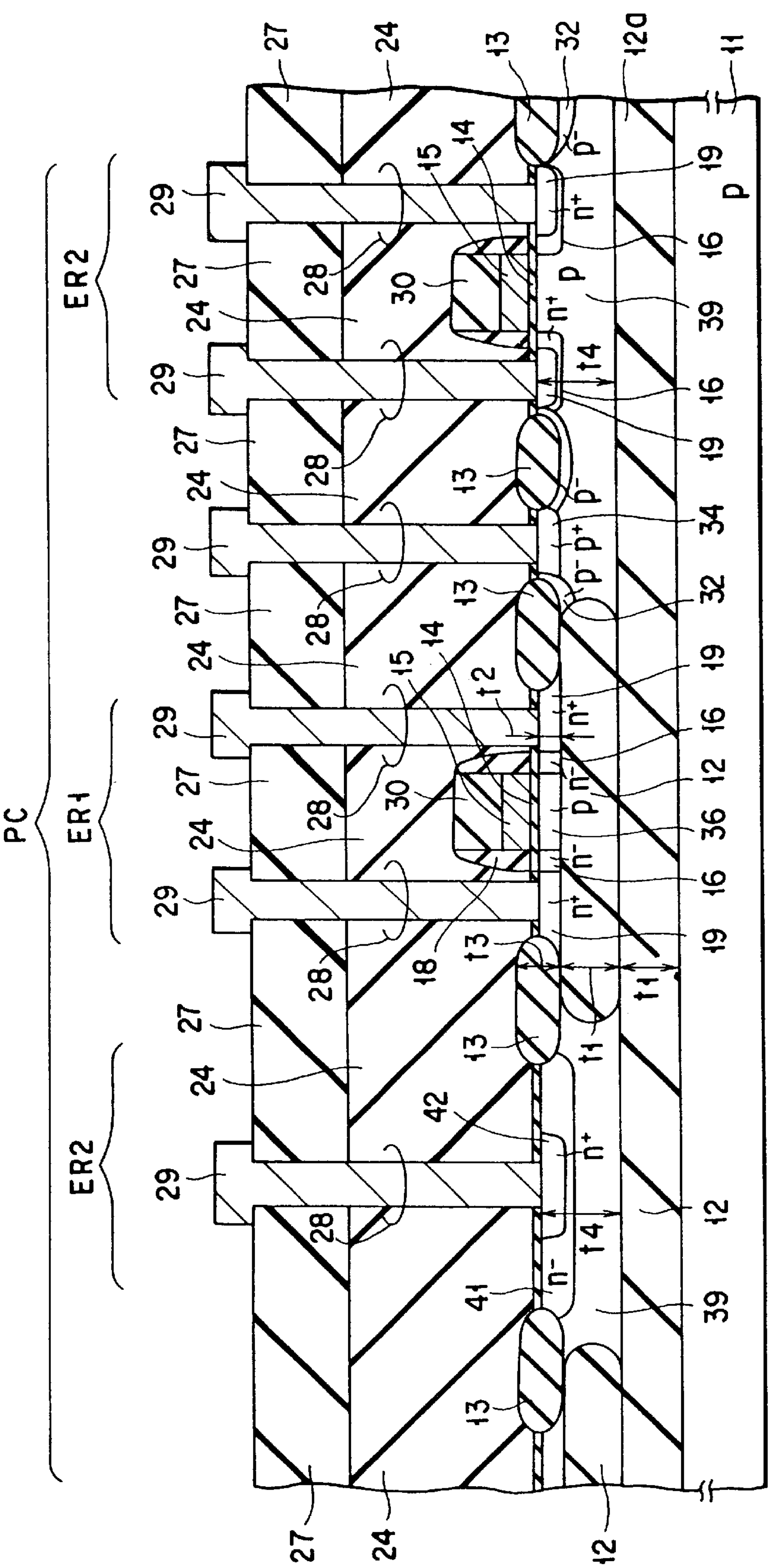
FIG. 30 is a detailed sectional view showing the peripheral circuit section of the DRAM illustrated in FIG. 28.

FIGS. 28 to 30 show a DRAM according to the second embodiment according to the second aspect of this invention. The DRAM has a memory cell section MC and a peripheral circuit section PC.

The memory cell section MC will be first described, with reference to FIG. 28.

As shown in FIG. 28, plate-shaped silicon oxide layers 12 and 12*a,* each having a prescribed thickness t.1. (e.g., about 0.4 μm), are formed one upon another in the surface of a p-type silicon substrate 11. The layers 12 and 12*a* are provided in the entire memory cell section MC and contact each other. The upper surface of the layer 12 is parallel to that of the silicon substrate 11 and located at a predetermined depth t2 (e.g., about 0.1 μm) from the upper surface of the substrate 11. This means that the substrate 11 includes silicon layers (element regions) which are provided on the silicon oxide layer 12 and which have a thickness of t2.

A field oxide film 13 having a prescribed thickness t3 (e.g., about 0.2 μm) is formed on the silicon oxide layer 12. The element regions of the memory cell section MC are isolated from one another, each contacting the silicon oxide film 12 at the lower surface and surrounded by the field oxide film 13.

Two memory cells are provided in each element region. Each memory cell has one MOS transistor and one capacitor. The MOS transistor has a gate electrode 15, source and drain regions 19, and low impurity concentration regions 16. A p-type semiconductor region 36 is provided right below the gate electrode 15. A gate insulating film 14 is interposed between the electrode 15 and the semiconductor region 36. The p-type semiconductor region 36 contacts, at its lower surface, the silicon oxide layer 12. So do the source and drain regions 19, and low impurity concentration regions 16. The two memory cells share a drain region 19.

The capacitor of each memory cell has a storage node 21, a capacitor insulating film 22 and a plate electrode 23. The storage node 21 extends through a contact hole 31 and contacts the source region of the MOS transistor. The plate electrode 23 covers the silicon substrate 11; it has an opening located above the drain region 19 common to the two memory cells formed in each element region.

Bit lines 26 are connected to the drain regions of the MOS transistors. As seen from FIG. 15, the bit lines 26 extend straight, intersecting at right angles to the word lines (i.e., the gate electrodes 15 of the MOS transistors.

The source and drain regions 19, and low impurity concentration regions 16 of the MOS transistor of each memory cell are very thin. Further, all components of the MOS transistor, but the channel region (the p-type semiconductor region 36) and the contact, have all sides contacting the insulating layers. Therefore, virtually no junction capacitance exists, and virtually no junction leakage current flows. This enables the memory cell section MC to operate at high speed, consuming less power than otherwise. In addition, soft error is hardly made in the memory cell section MC.

Thanks to the low possibility of soft error, it is easy to impart a sufficient capacitance to the capacitor. Even if the capacitor of each memory cell is of stacked structure, it can be so thin that the silicon substrate has, if any, low stepped portions on its surface.

The peripheral circuit section PC will now be described, with reference to FIG. 28.

Plate-shaped silicon oxide layers 12 and 12*a* having a prescribed thickness t.1. (e.g., about 0.4 μm) are formed in the p-type silicon substrate 11.

The upper surface of the silicon oxide layer 12 is parallel to that of the silicon substrate 11 and located at a predetermined depth t2 (e.g., about 0.1 μm) from the upper surface of the substrate 11. Hence, the substrate 11 includes silicon layers (element regions) which are provided on the silicon oxide layer 12 and which have a thickness of t2.

The upper surface of the silicon oxide layer 12*a* is parallel to that of the silicon substrate 11 and located at a predetermined depth t4 (e.g., about 0.5 μm) from the upper surface of the substrate 11. This means that the substrate 11 includes silicon layers (element regions) which are provided on the silicon oxide layer 12*a* and which have a thickness of t4 (=2t1+t2).

A field oxide film 13 having a prescribed thickness t3 (e.g., about 0.2 μm) is formed on the silicon oxide layer 12 and above the silicon oxide layer 12*a*. Namely, the film 13 contacts the silicon oxide layer 12 and does not contact the silicon oxide layer 12*a*. Thus, the peripheral circuit section PC has two types of element regions.

The element regions ER1 of the first type are isolated from one another, completely surrounded by the silicon oxide film 12 and the field oxide film 13. Provided in the element region ER1 are MOS transistors to which a back-gate bias need not be applied.

The element regions ER2 of the second type are surrounded by the field oxide film 13. Some of the element regions ER2 are provided in a p-type semiconductor region 39. The remaining element regions ER2 are provided in an n-type semiconductor region 40. Provided in the element regions ER2 are MOS transistors to which a back-gate bias must be applied and which constitute sense amplifiers, DQ-line driving circuits and operational amplifiers.

A $p^-$-type impurity region 32 and an $n^-$-type impurity region 33 are provided near the lower surface of the field oxide film 13 formed above the silicon oxide layer 12. Both impurity regions 32 and 33 are used as channel stoppers. The impurity region 33 can be dispensed with.

In some of the element regions provided on the silicon oxide layer 12, there are provided n-channel MOS transistors. In the remaining element regions formed on the silicon oxide layer 12, there are provided p-channel MOS transistors.

Each n-channel MOS transistor has a gate electrode 15, source and drain regions 19, and low impurity concentration regions 16. A p-type semiconductor region 36 is provided right below the gate electrode 15. A gate insulating film 14 is interposed between the gate electrode 15 and the semiconductor region 36. The semiconductor region 36 contacts, at its lower surface, the silicon oxide layer 12. The source and drain regions 19, and low impurity concentration regions 16 contact, at their lower surfaces, the silicon oxide layer 12.

Similarly, each p-channel MOS transistor has a gate electrode 15, source regions 20, and low impurity concentration regions 17. An n-type semiconductor region 37 is provided right below the gate electrode 15. A gate insulating film 14 is interposed between the gate electrode 15 and the semiconductor region 37. The semiconductor region 37 contacts, at its lower surface, the silicon oxide layer 12. The source and drain regions 20 and low impurity concentration regions 17 contact, at their lower surfaces, the silicon oxide layer 12.

The source and drain regions 19, and low impurity concentration regions 16 of the MOS transistor provided in each element region on the silicon oxide layer 12 are very thin, Further, all components of the MOS transistor, but the channel region (the p-type semiconductor region 36) and the contact, have all sides contacting the insulating layers. Therefore, the parasitic capacitance is low, whereby the MOS transistor operates at high speed, consuming only a little power.

The MOS transistors provided in the element regions formed on the silicon oxide layer 12 are of the type to which a back-gate bias need not be applied. This is because these MOS transistors are surrounded by the insulating layer and, hence, isolated from one another.

In some of the element regions provided on the silicon oxide layer 12*a,* there are provided n-channel MOS transistors. In the remaining element regions provided on the silicon oxide layer 12*a,* there are provided p-channel MOS transistors.

Each n-channel MOS transistor is provided in the p-type semiconductor (well) region 39. It has a gate electrode 15, source and drain regions 19, and low impurity concentration regions 16. A gate insulating film 14 is provided right below the gate electrode 15. Therefore, the source and drain regions 19, and low impurity concentration regions 16 do not contact, at their lower surfaces, the silicon oxide layer 12*a*.

Similarly, each p-channel MOS transistor is provided in the n-type semiconductor (well) region 40. It has a gate electrode 15, source and drain regions 20, and low impurity concentration regions 17. A gate insulating film 14 is provided right below the gate electrode 15. Hence, the source and drain regions 20, and low impurity concentration regions 17 do not contact, at their lower surfaces, the silicon oxide layer 12*a*.

Thus, the p-type semiconductor (well) region 39 includes a plurality of n-channel MOS transistors which are provided on the silicon oxide layer 12*a*. To these n-channel MOS transistors there can be applied a backgate bias, because a $p^+$-type impurity region 34 is provided in the p-type semiconductor region 39. Also, the n-type semiconductor (well) region 40 includes a plurality of p-channel MOS transistors which are provided on the silicon oxide layer 12*a*. To these p-channel MOS transistors there can be applied a backgate bias, because an $n^+$-type impurity region 35 is provided in the n-type semiconductor region 40.

An input protecting circuit can be formed in one of the element regions provided on the silicon oxide layer 12*a*. The input protecting circuit comprises, for example, a diode. More correctly, it comprises an $n^-$-type impurity region 41 and an $n^+$-type impurity region 42. The impurity region 41 is formed in the p-type semiconductor region 39, and the impurity region 42 is formed in the impurity region 41. The $n^-$-type impurity region 41 can be made thick enough to impart an adequate sheet resistance to the input protecting circuit.

How the RAM shown in FIGS. 28 to 30 is manufactured will be explained, with reference to FIGS. 31 to 36.

Figure 31:
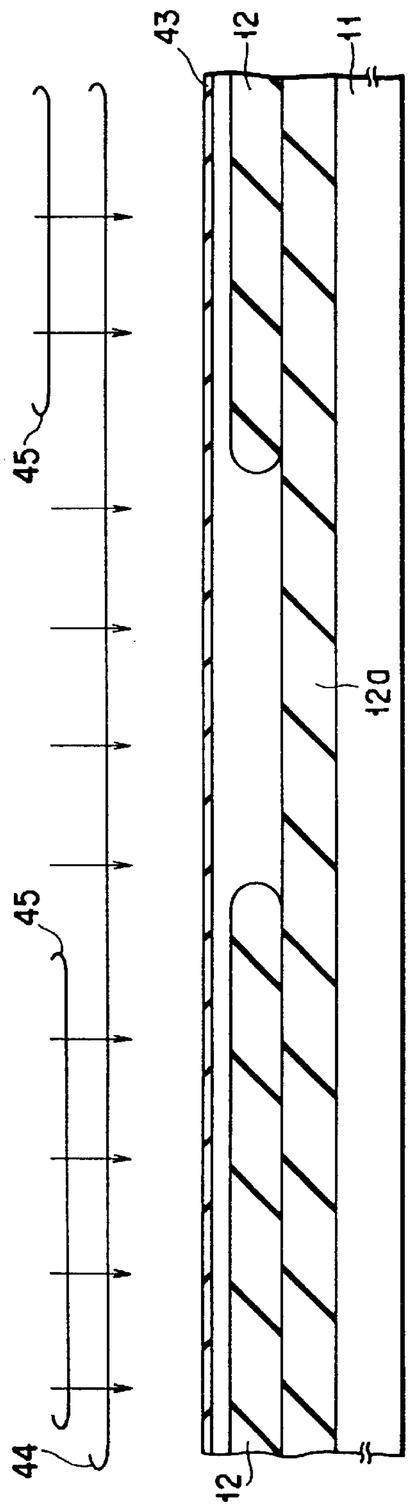
FIGS. 31 to 36 are sectional views explaining a method of manufacturing the DRAM shown in FIGS. 28 to 30.

At first, as shown in FIG. 31, oxygen ions 44 are implanted into the entire peripheral circuit section PC and the entire peripheral circuit section PC, in a dose of about $2\times10^{18}$ $cm^{-2}$ under acceleration energy of about 300 keV. Also, oxygen ions 45 are implanted into the entire memory cell section MC and also into some specified regions of the peripheral circuit section PC, in a dose of about $2\times10^{18}$ $cm^{-2}$ under acceleration energy of about 150 keV.

The resultant structure is annealed in an $N_2$ atmosphere, for example at about 1350° C. for about 30 minutes. Plate-shaped silicon oxide layers 12 and 12*a,* each having a thickness of about 0.4 $\mu$m, are thereby formed in the silicon substrate 11. Due to the different acceleration energies applied to form the layers 12 and 12*a,* the silicon layer on each silicon oxide layer 12 differs in thickness from the silicon layer on each silicon oxide layer 12*a*. For instance, the former is about 0.1 $\mu$m thick, and the latter is about 0.5 $\mu$m.

Figure 32:
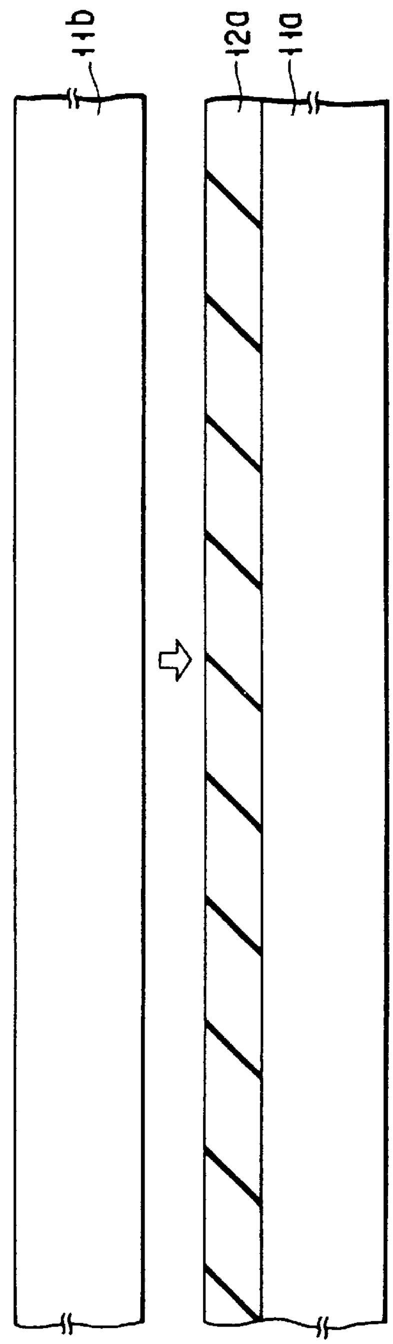
Figure 33:
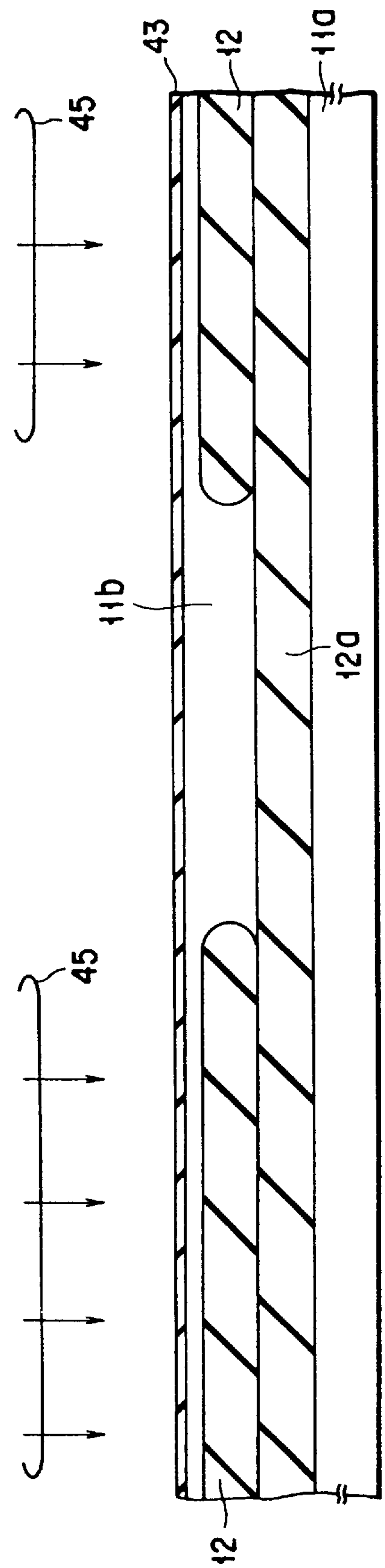

The step of manufacturing the DRAM, or the structure illustrated in FIG. 31, may be replaced by the step shown in FIGS. 32 and 33. The step of FIGS. 32 and 33 will be explained.

First, as shown in FIG. 32, a silicon oxide layer 12*a* is formed on a p-type silicon substrate 11. Next, a p-type silicon substrate 11*b* is bonded to the silicon oxide layer 12*a*. The silicon substrate 11*b* is polished into a silicon layer having a prescribed thickness t4 (e.g., about 0.5 $\mu$m). Then, oxygen ions 45 are implanted into the entire memory cell section MC and some specified regions of the peripheral circuit section PC, in a dose of about $2\times10^{18}$ $cm^{-2}$ under acceleration energy of about 150 keV.

The structure obtained is annealed in an $N_2$ atmosphere, for example at about 1350° C. for about 30 minutes. Plate-shaped silicon oxide layers 12, each having a thickness of about 0.4 μm, are thereby formed in the silicon substrate 11. The silicon oxide layers 12 contact the silicon oxide layer 12*a*. Due to the different acceleration energies applied to form the layers 12 and 12*a,* the silicon layer on each silicon oxide layer 12 differs in thickness from the silicon layer on each silicon oxide layer 12*a*. For instance, the former is about 0.1 g m thick, and the latter is abut 0.5 μm.

Figure 34:
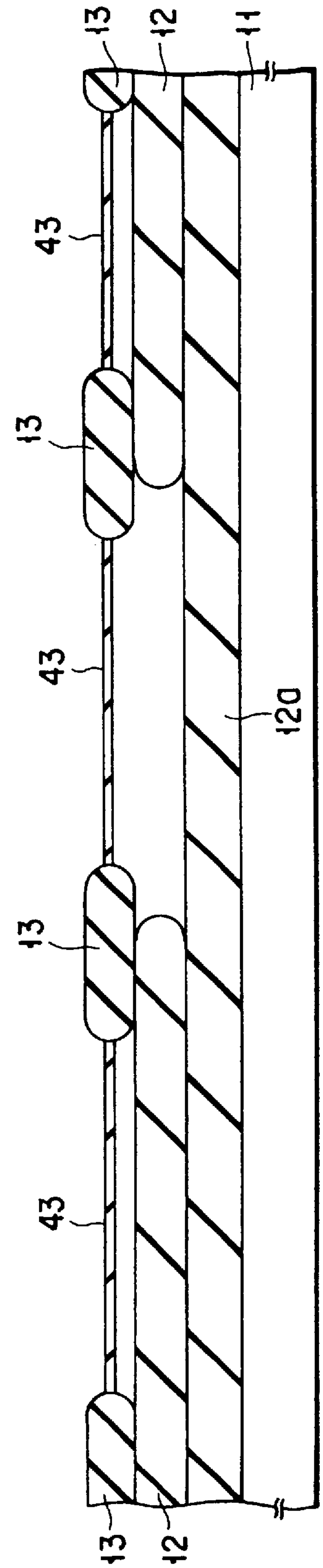

Thereafter, as shown in FIG. 34, a field oxide film 13 about 0.2 μm thick is formed by LOCOS method on the silicon oxide layers 12 and above the silicon oxide layer 12*a*. Thus, the film 13 contacts the silicon oxide layer 12 and does not contact the silicon oxide layer 12*a*.

Figure 35:
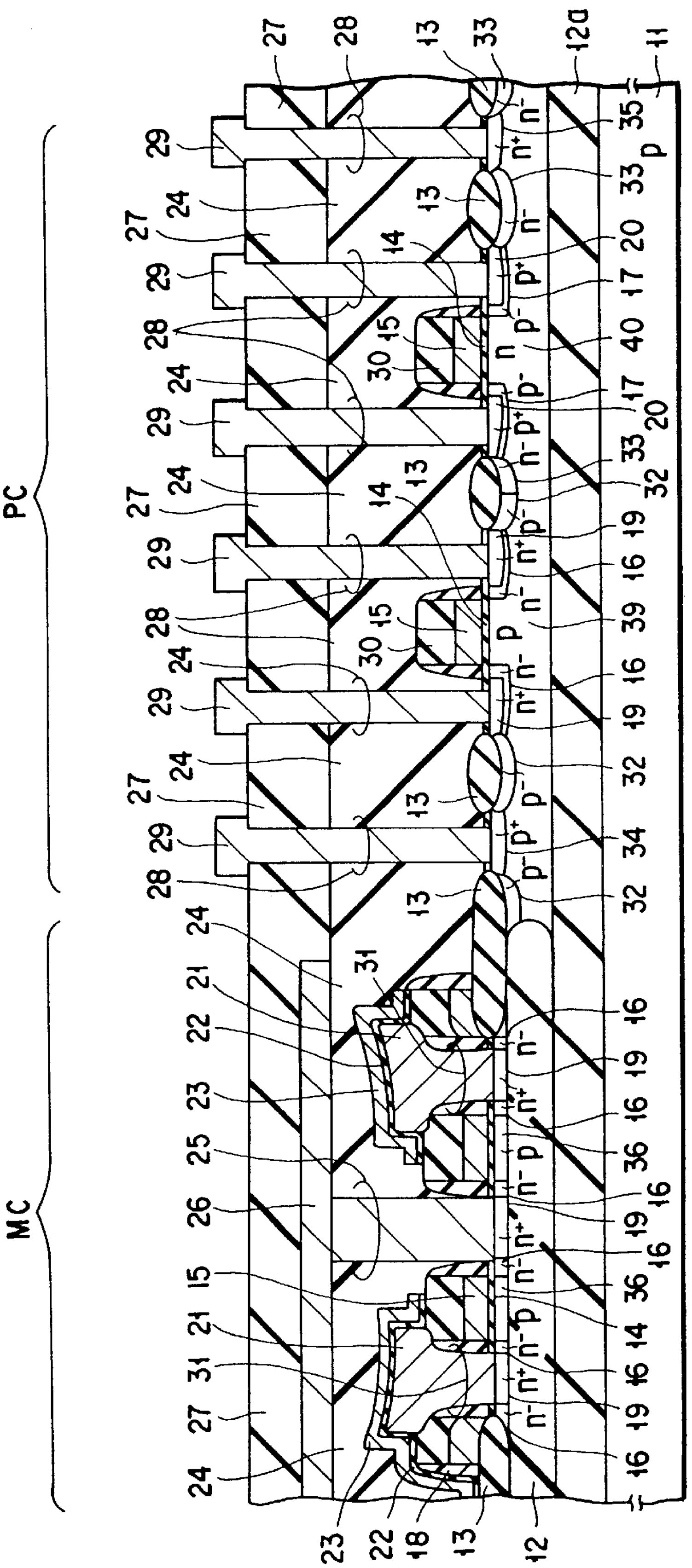
Figure 36:
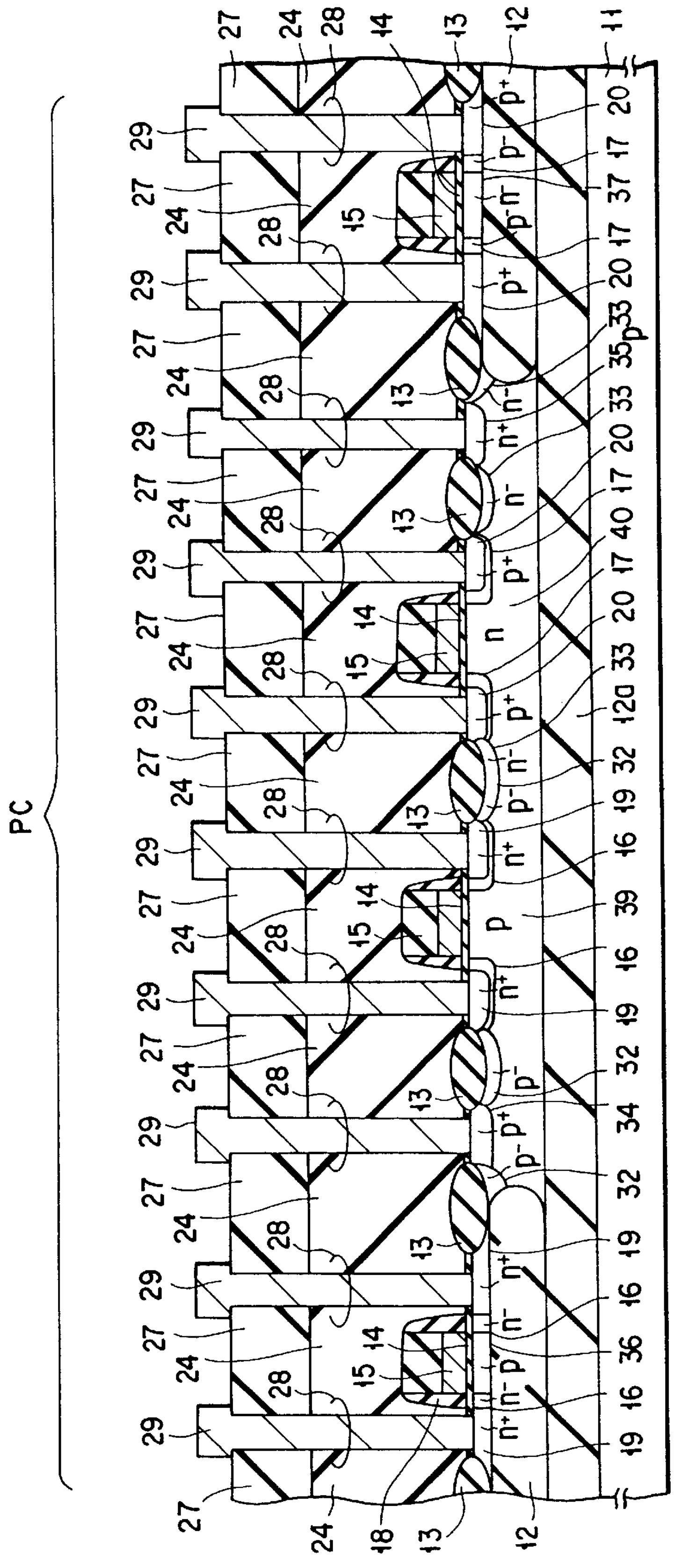

As shown in FIGS. 35 and 36, boron ions are implanted into those parts of the silicon layer which are located on the silicon oxide layers 12, using a resist pattern as mask. P-type impurity regions 36, 38 and 39 are thereby formed. Further, phosphorus ions are implanted into those parts of the silicon layer which are located on the silicon oxide layer 12*a,* using a resist pattern as mask. N-type impurity regions 37 and 40 are thereby formed.

A gate insulating film 14, a phosphorus-containing polysilicon film, and a TEOS film 30 are formed on the resultant structure, one after another. Using a resist pattern as a mask, the TEOS film 30 and the polysilicon film are etched, forming gate electrodes 15.

Then, using the resist pattern and the gate electrodes 15 as masks, phosphorus ions are implanted into the n-channel MOS transistor regions. Similarly, using the resist pattern as mask, boron ions are implanted into the p-channel MOS transistor regions.

The resultant structure is annealed, forming low impurity concentration regions 16, of $n^-$-type and low impurity concentration regions 17 of $p^-$-type. These regions 16 and 17 have surface impurity concentration of $1\times10^{18}$ to $1\times10^{20}$ $cm^{-3}$. A spacer 18 is then formed on the sides of each gate electrode 15. Using a resist pattern as a mask, arsenic is ion-implanted into the n-channel MOS transistor regions, and boron is ion-implanted into the p-channel MOS transistor regions. Further, the structure is subjected to thermal oxidation, thus forming source and drain regions 19 of $n^+$-type and source and drain regions 20, of $p^+$-type. These regions 19 and 20, have a surface impurity concentration of $1\times10^{19}$ to $1\times10^{20}$ $cm^{-3}$.

Contact holes 31 are formed which expose the source regions of the n-channel MOS transistors formed in the memory cell section MC. Storage nodes 21 of capacitors are formed, each having a thickness of about 0.2 μm and extending through the contact holes 31 to the source regions of the n-channel MOS transistors. Then, a capacitor insulating film 22 about 0.01 μm thick is formed on each storage node 21. (The film 22 is, for example, a two-layered film consisting of an oxide film and a nitride film.) A polysilicon layer containing phosphorus and having a thickness of, for example, about 0.1 μm, is formed on the upper surface of the resultant structure. Those parts of the polysilicon layer which are located on the drain regions of the n-channel MOS transistor of the memory cell section MC are removed, thereby forming the plate electrodes 23 of capacitors.

A BPSG film 24 is formed on the upper surface of the structure. Contact holes 25 are made in the BPSG film 24, exposing the drain regions of the n-channel MOS transistors of the memory cell section MC. Bit lines 26 are formed on the BPSG film 24 and in the contact holes 25. The bit lines 26 are connected to the drain regions of the n-channel MOS transistors.

An inter-layer insulating film 27 is formed on the upper surface of the resultant structure. Contact holes 28 are formed in the BPSG film 24 and inter-layer insulating film 27 of the peripheral circuit section PC. The contact holes 28 expose the source and drain regions 19 and source and drain regions 20 of the MOS transistors of the section PC. Metal wires 29 are formed on the inter-layer insulating film 27 and in the contact holes 28. The wires 29 are therefore connected to the source and drain regions 19 and source and drain regions 20 of the MOS transistors.

Thereafter, an inter-layer insulating film, other metal wires and a passivation film are formed, and pads are then formed. The DRAM is thereby manufactured.

The DRAM thus manufactured, i.e., a semiconductor device which is the second embodiment of the second aspect of the invention, is characterized in two respects. First, its memory cell section has high integration density, consumes but a little power, and scarcely makes soft error. Second, its peripheral circuit section has MOS transistors to which a back-gate bias can be applied.

Further, the junction capacitance of each MOS transistor to which no back-gate bias needs to be applied can be reduced. Still further, the performance of the input protecting circuit can be improved.

Figure 37:
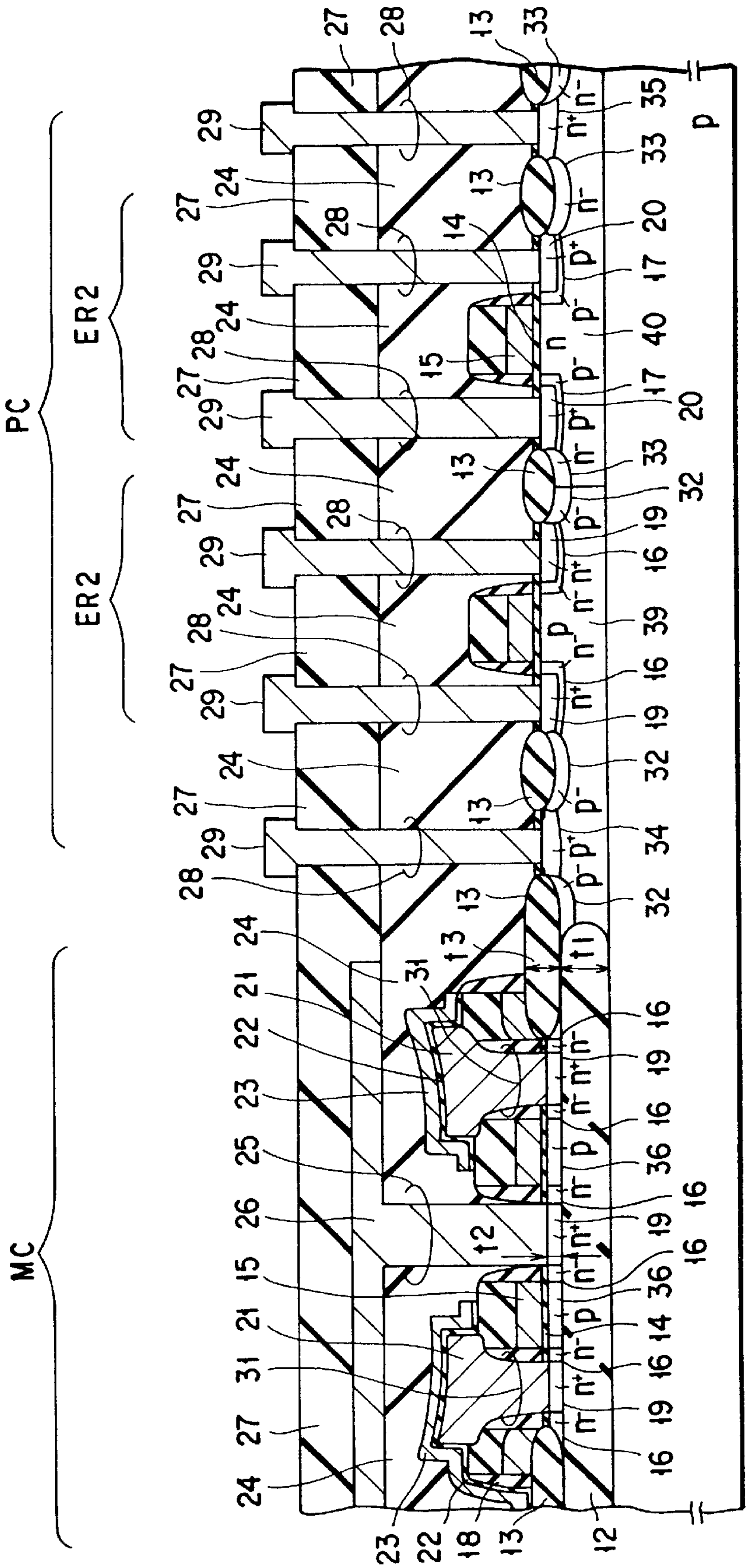
FIG. 37 is a sectional view illustrating both the memory cell section and peripheral circuit section of a DRAM according to a third embodiment of the present invention.
Figure 38:
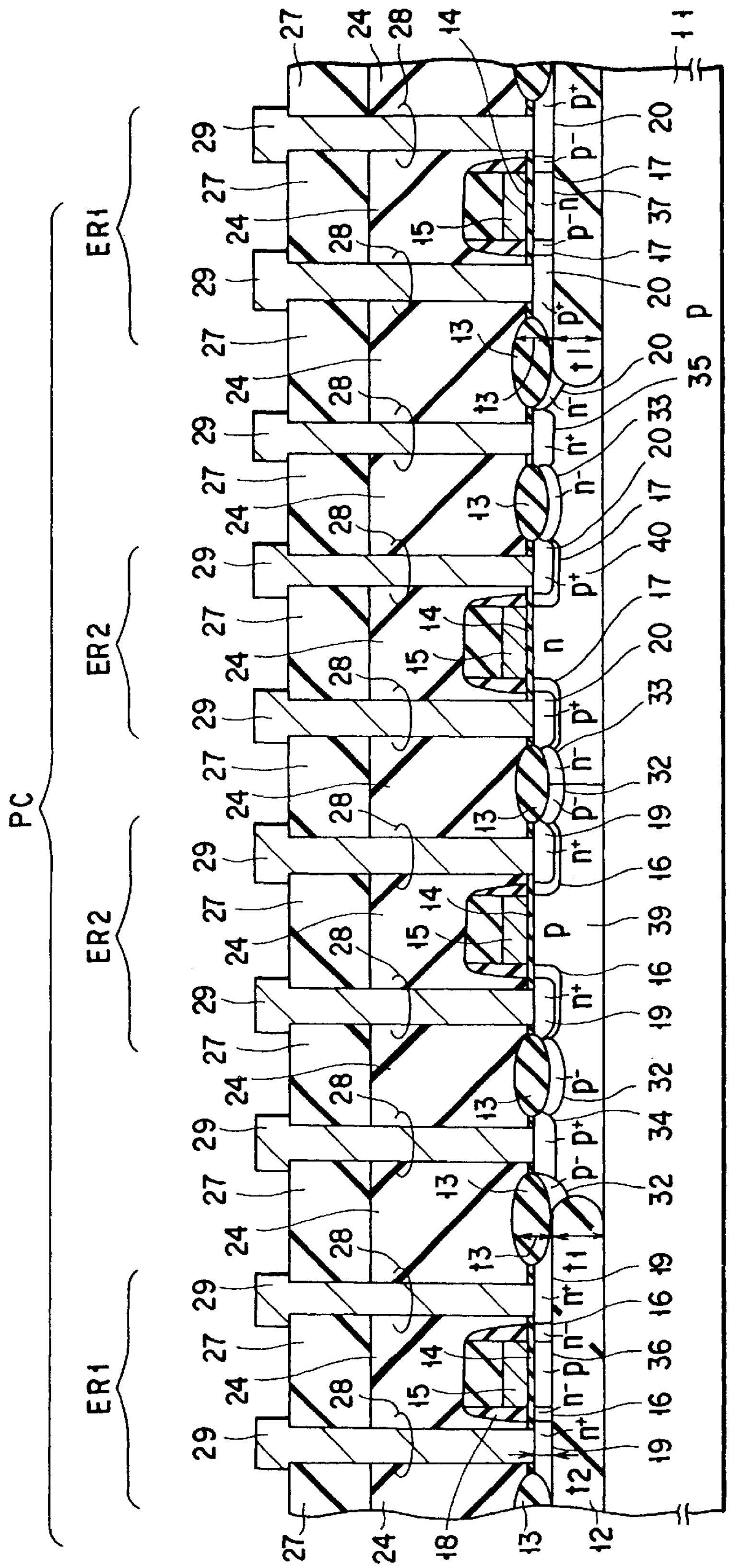
FIG. 38 is a detailed sectional view showing the peripheral circuit section of the DRAM illustrated in FIG. 37.
Figure 39:
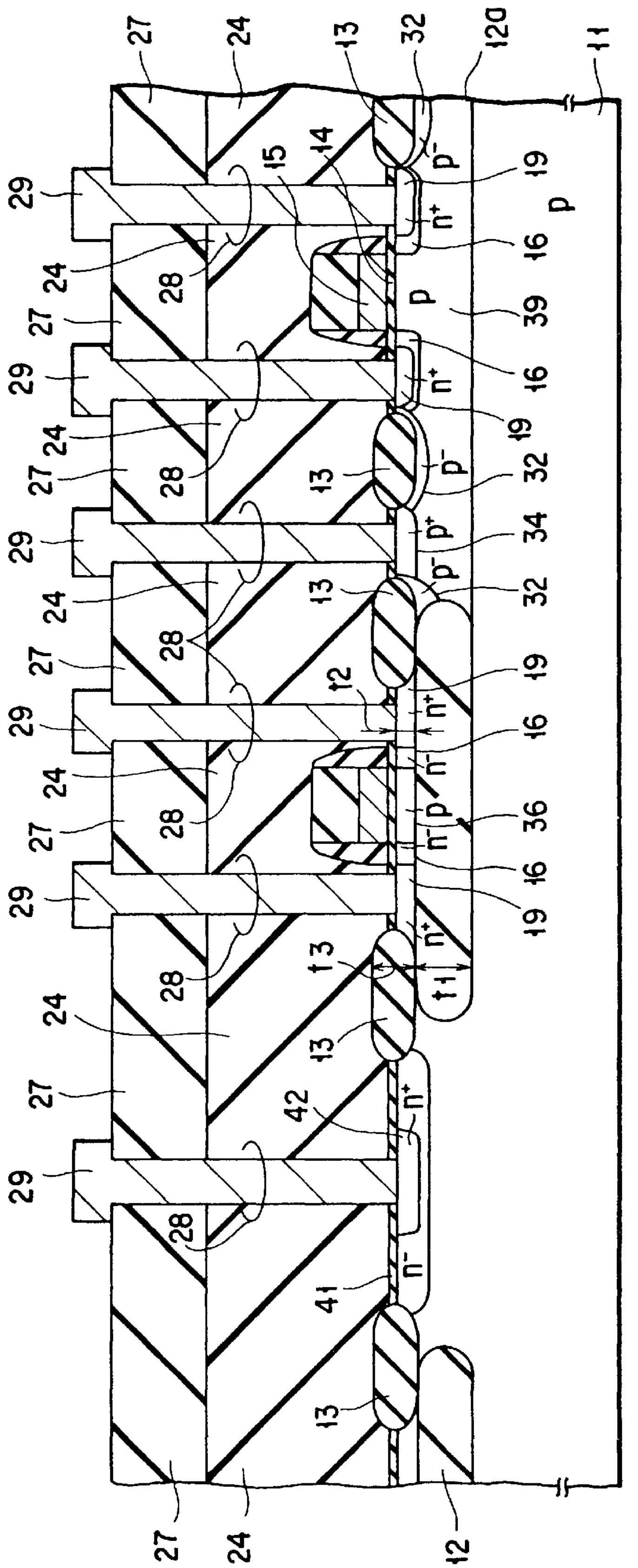
FIG. 39 is a detailed sectional view showing the peripheral circuit section of the DRAM illustrated in FIG. 37.

FIGS. 37 to 39 show a DRAM according to the third embodiment according to the second aspect of the present invention. The DRAM has a memory cell section MC and a peripheral circuit section PC.

The memory cell section MC will be first described, with reference to FIG. 37.

As shown in FIG. 37, a plate-shaped silicon oxide layer 12 having a prescribed thickness t.1. (e.g., about 0.4 μm) is formed in a p-type silicon substrate 11. The layer 12 is provided in the entire memory cell section MC. The upper surface of the layer 12 is parallel to that of the silicon substrate 11 and located at a predetermined depth t2 (e.g., about 0.1 μm) from the upper surface of the substrate 11. This means that the substrate 11 includes a silicon layer (element regions) which is provided on the silicon oxide layer 12 and which has a thickness of t2.

A field oxide film 13 having a prescribed thickness t3 (e.g., about 0.2 μm) is formed on the silicon oxide layer 12. The element regions of the memory cell section MC are isolated from one another, each contacting the silicon oxide film 12 at the lower surface and surrounded by the field oxide film 13.

Two memory cells are provided in each element region. Each memory cell has one MOS transistor and one capacitor. The MOS transistor has a gate electrode 15, source and drain regions 19, and low impurity concentration regions 16. A p-type semiconductor region 36 is provided right below the gate electrode 15. A gate insulating film 14 is interposed between the electrode 15 and the semiconductor region 36. The p-type semiconductor region 36 contacts, at its lower surface, the silicon oxide layer 12. So do the source and drain regions 19, and low impurity concentration regions 16. The two memory cells share a drain region 19.

The capacitor of each memory cell has a storage node 21, a capacitor insulating film 22 and a plate electrode 23. The storage node 21 extends through a contact hole 31 and contacts the source region of the MOS transistor. The plate electrode 23 covers the silicon substrate 11; it has an opening located above the drain region 19, common to the two memory cells formed in each element region.

Bit lines 26 are connected to the drain regions of the MOS transistors. The bit lines 26 extend straight, intersecting at right angles to the word lines (i.e., the gate electrodes 15 of the MOS transistors.

The source and drain regions 19, and low impurity concentration regions 16 of the MOS transistor of each memory cell are very thin. Further, all components of the MOS transistor, but the channel region (the p-type semiconductor region 36) and the contact, have all sides contacting the insulating layers. Therefore, virtually no junction capacitance exists, and virtually no junction leakage current flows. This enables the memory cell section MC to operate at high speed, consuming less power than otherwise. Furthermore, soft error is hardly made in the memory cell section MC.

Since the possibility of soft error is low, it is easy to impart a sufficient capacitance to the capacitor. Even if the capacitor of each memory cell is of stacked structure, it can be so thin that the silicon substrate has, if any, low stepped portions on its surface.

The peripheral circuit section PC will now be described, with reference to FIGS. 37, 38 and 39.

A plate-shaped silicon oxide layer 12 having a prescribed thickness t.1. (e.g., about 0.4 μm) is formed in the p-type silicon substrate 11.

The upper surface of the silicon oxide layer 12 is parallel to that of the silicon substrate 11 and located at a predetermined depth t2 (e.g., about 0.1 μm) from the upper surface of the substrate 11. Hence, the substrate 11 includes silicon layers (element regions) which are provided on the silicon oxide layer 12 and which have a thickness of t2. A field oxide film 13 having a prescribed thickness t3 (e.g., about 0.2 μm) is formed on the silicon oxide layer 12. Namely, the film 13 contacts the silicon oxide layer 12. Thus, the peripheral circuit section PC has two types of element regions.

The element regions ER1 of the first type are isolated from one another, completely surrounded by the silicon oxide film 12 and the field oxide film 13. Provided in the element region ER1 are MOS transistors to which a back-gate bias need not be applied.

The element regions ER2 of the second type are surrounded by the field oxide film 13. Some of the element regions ER2 are provided in a p-type semiconductor region 39. The remaining element regions ER2 are provided in an n-type semiconductor region 40. Provided in the element regions ER2 are MOS transistors to which a back-gate bias must be applied and which constitute sense amplifiers, DQ-line driving circuits and operational amplifiers.

A $p^-$-type impurity region 32 and an $n^-$-type impurity region 33 are provided near the lower surface of the field oxide film 13 formed above the silicon oxide layer 12. Both impurity regions 32 and 33 are used as channel stoppers. The impurity region 33 can be dispensed with.

In some of the element regions provided on the silicon oxide layer 12, there are provided n-channel MOS transistors. In the remaining element regions formed on the silicon oxide layer 12, there are provided p-channel MOS transistors.

Each n-channel MOS transistor has a gate electrode 15, source regions 19, and a low impurity concentration regions 16. A p-type semiconductor region 36 is provided right below the gate electrode 15. A gate insulating film 14 is interposed between the gate electrode 15 and the semiconductor region 36. The semiconductor region 36 contacts, at its lower surface, the silicon oxide layer 12. The source and drain regions 19, and low impurity concentration regions 16, contact, at their lower surfaces, the silicon oxide layer 12.

Similarly, each p-channel MOS transistor has a gate electrode 15, source and drain regions 20, and low impurity concentration regions 17. An n-type semiconductor region 37 is provided right below the gate electrode 15. A gate insulating film 14 is interposed between the gate electrode 15 and the semiconductor region 37. The semiconductor region 37 contacts, at its lower surface, the silicon oxide layer 12. The source and drain regions 20, and low impurity concentration regions 17 contact, at their lower surfaces, the silicon oxide layer 12.

The source and drain regions 19, and low impurity concentration regions 16 of the MOS transistor provided in each element region on the silicon oxide layer 12 are very thin. Further, all components of the MOS transistor, but the channel region (the p-type semiconductor region 36) and the contact, have all sides contacting the insulating layers. Therefore, the parasitic capacitance is low, whereby the MOS transistor operates at high speed, consuming only a little power.

The MOS transistors provided in the element regions formed on the silicon oxide layer 12 are of the type to which a back-gate bias need not be applied. This is because these MOS transistors are surrounded by the insulating layer and, hence, isolated from one another.

In some of the element regions below which the silicon oxide layer 12 is not located, there are provided n-channel MOS transistors. In the remaining element regions below which the silicon oxide layer 12 is not provided, there are provided p-channel MOS transistors.

Each n-channel MOS transistor is provided in the p-type semiconductor (well) region 39. It has a gate electrode 15, source and drain regions 19, and low impurity concentration regions 16. A gate insulating film 14 is provided right below the gate electrode 15. Therefore, the source and drain regions 19, and low impurity concentration regions 16, do not contact, at their lower surfaces, the silicon oxide layer 12.

Similarly, each p-channel MOS transistor is provided in the n-type semiconductor (well) region 40. It has a gate electrode 15, source and drain regions 20, and low impurity concentration regions 17. A gate insulating film 14 is provided right below the gate electrode 15. Hence, the source and drain regions 20, and low impurity concentration regions 17, do not contact, at their lower surfaces, the silicon oxide layer 12.

Thus, the p-type semiconductor (well) region 39 includes a plurality of n-channel MOS transistors which are provided in the element regions on the silicon oxide layer 12. To these n-channel MOS transistors there can be applied a back-gate bias, because a $p^+$-type impurity region 34 is provided in the p-type semiconductor region 39. Also, the n-type semiconductor (well) region 40 includes a plurality of p-channel MOS transistors which are provided in the element regions on the silicon oxide layer 12. To these p-channel MOS transistors there can be applied a back-gate bias, because an $n^+$-type impurity region 35 is provided in the n-type semiconductor region 40.

An input protecting circuit can be formed in one of the element regions provided on the silicon oxide layer 12. The input protecting circuit comprises, for example, a diode. More correctly, it comprises an $n^-$-type impurity region 41 and an $n^+$-type impurity region 42. The impurity region 41 is formed in the p-type semiconductor substrate 11 (FIG. 39), and the impurity region 42 is formed in the impurity region 41. The $n^-$-type impurity region 41 can be made thick enough to impart an adequate sheet resistance to the input protecting circuit.

How the RAM shown in FIGS. 37 to 39 is manufactured will be explained, with reference to FIGS. 40 to 43.

Figure 40:
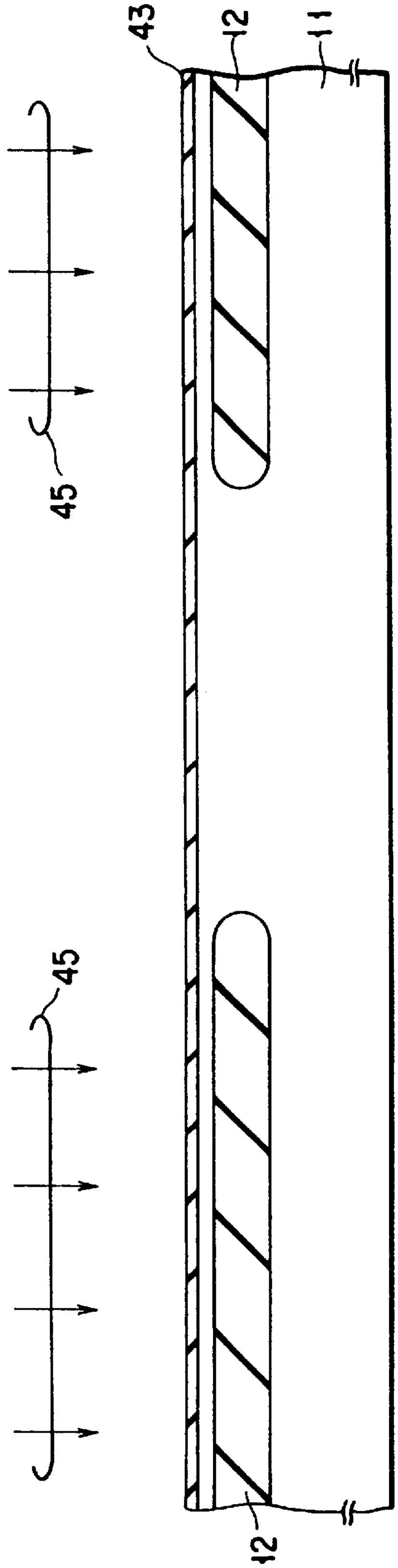
FIGS. 40 to 43 are sectional views explaining a method of manufacturing the DRAM shown in FIGS. 37 to 39.

First, as shown in FIG. 40, oxygen ions 44 are implanted into specified regions of the memory cell section MC and into specified regions of the peripheral circuit section PC, in a dose of about $2\times10^{18}$ $cm^{-2}$ under acceleration energy of about 150 KeV.

Figure 41:
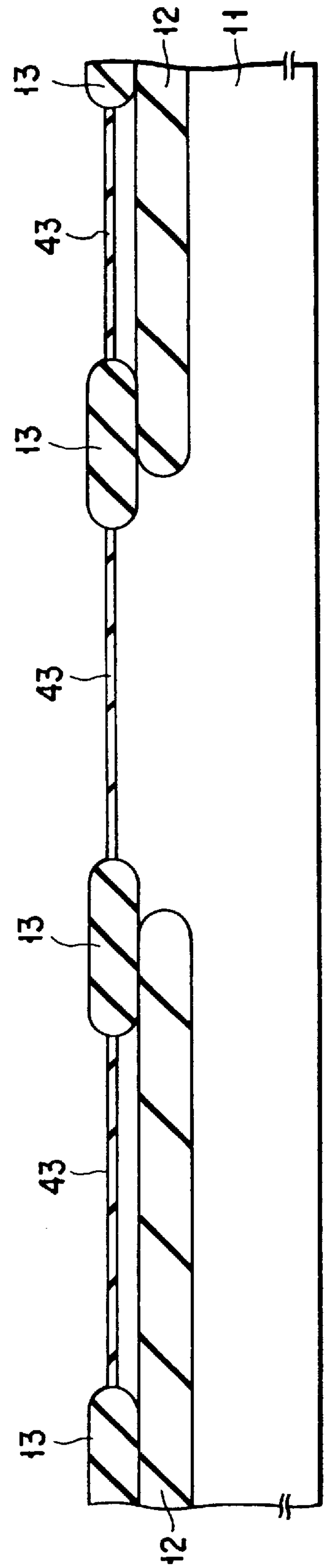

The structure obtained is annealed in an $N_2$ atmosphere, for example at about 1350° C. for about 30 minutes. Plate-shaped silicon oxide layers 12, each having a thickness of about 0.4 $\mu$m, are thereby formed in the silicon substrate 11 at the depth of about 0.1 $\mu$m. Hence, a silicon layer having a thickness of about 0.1 $\mu$m is provided on each silicon oxide layer. Next, as shown in FIG. 41, p-type semiconductor region 39 and an n-type semiconductor region 40 are formed at specific positions in the peripheral circuit section PC. A field oxide film 13 about 0.2 $\mu$m thick is then formed by the LOCOS method on the silicon oxide layers 12. Thus, the film 13 contacts the silicon oxide layer 12.

Figure 42:
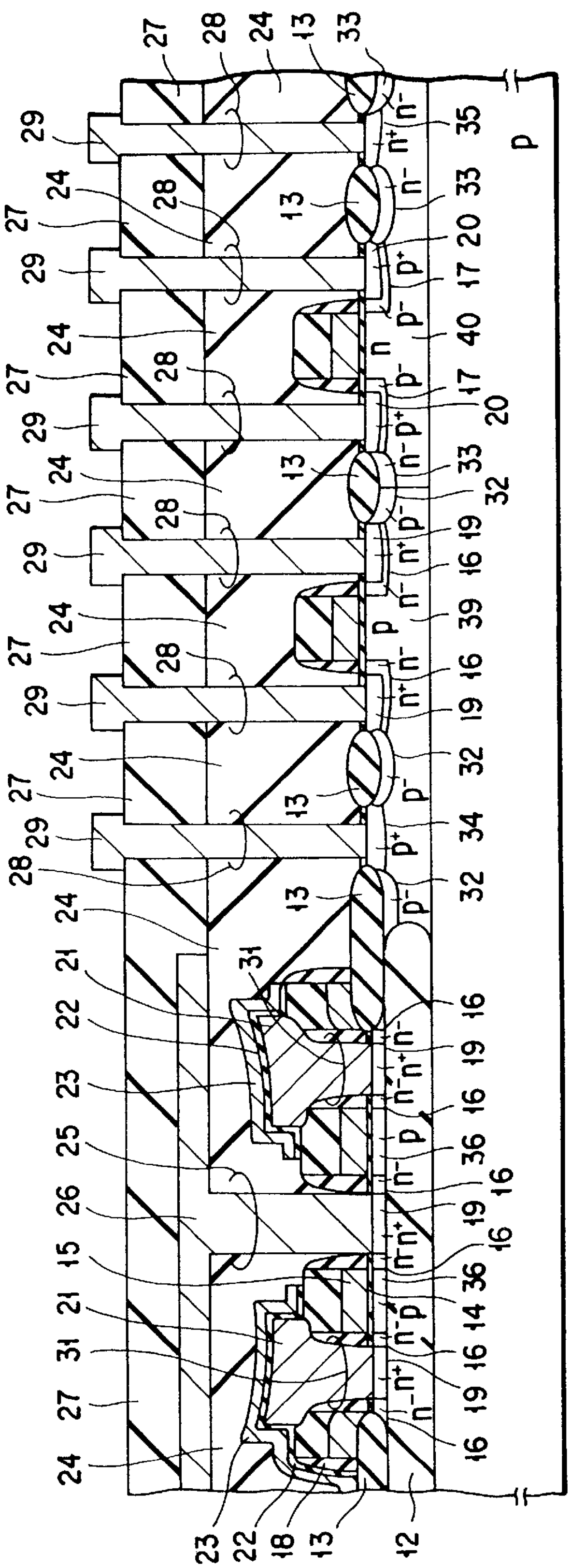
Figure 43:
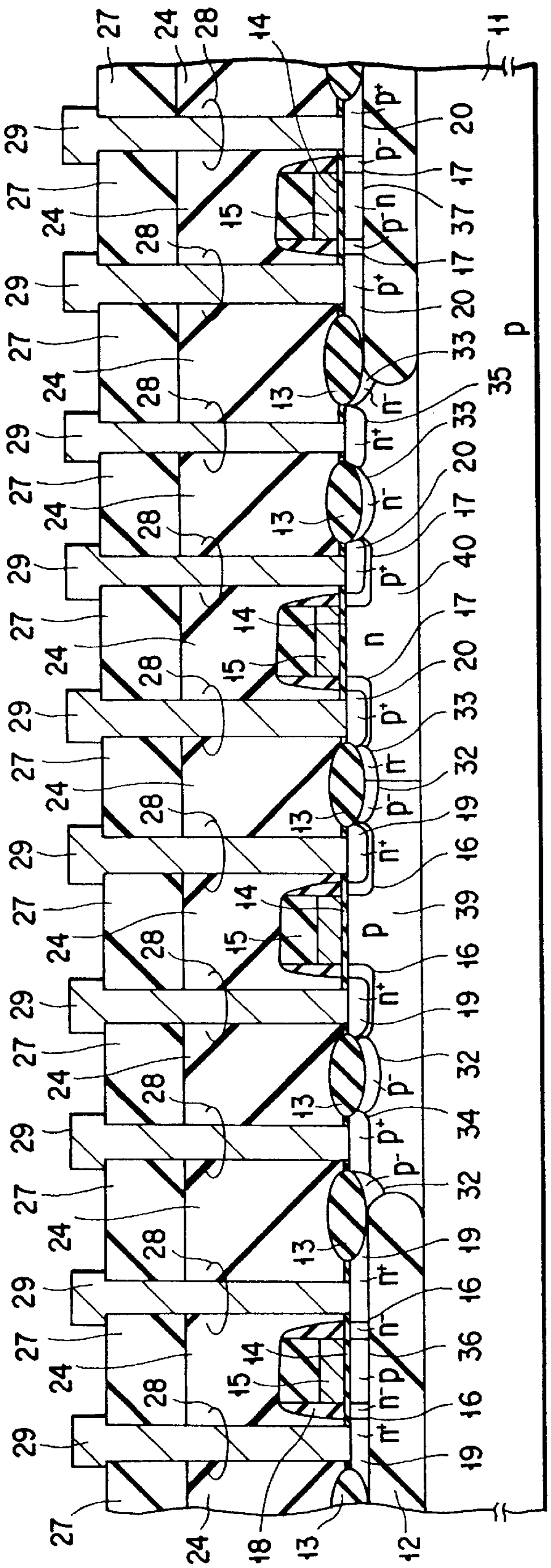

Boron ions are implanted into those parts of the silicon layer which are located on the silicon oxide layers 12, using a resist pattern as a mask. P-type impurity regions 36, 38 and 39 are thereby formed as shown in FIGS. 42 and 43. Further, phosphorus ions are implanted into the silicon layers which are located on the silicon oxide layers 12, using a resist pattern as a mask. N-type impurity regions 37 and 40 are thereby formed.

Agate insulating film 14, a phosphorus-containing poly-silicon film, and a TEOS film 30 are formed on the resultant structure, one after another. Using a resist pattern as mask, the TEOS film 30 and the polysilicon film are etched, forming gate electrodes 15.

Then, using the resist pattern and the gate electrodes 15 as masks, phosphorus ions are implanted into the n-channel MOS transistor regions. Similarly, using the resist pattern as mask, boron ions are implanted into the p-channel MOS transistor regions.

The resultant structure is annealed, forming low impurity concentration regions 16 of $n^-$-type and low impurity concentration regions 17 of $p^-$-type. These regions 16 and 17 have surface impurity concentration of $1\times10^{18}$ to $1\times10^{20}$ $cm^{-3}$. A spacer 18 is then formed on the sides of each gate electrode 15. Using a resist pattern as a mask, arsenic is ion-implanted into the n-channel MOS transistor regions, and boron is ion-implanted into the p-channel MOS transistor regions.

Further, the structure is subjected to thermal oxidation, thus forming source and drain regions 19 of $n^+$-type and source and drain regions 20 of $p^+$-type. These regions 19 and 20 have a surface impurity concentration of $1\times10^{19}$ to $1\times10^{20}$ $cm^{-3}$.

Contact holes 31 are formed which expose the source regions of the n-channel MOS transistors formed in the memory cell section MC. Storage nodes 21 of capacitors are formed, each having a thickness of about 0.2 $\mu$m and extending through the contact holes 31 to the source regions of the n-channel MOS transistors. Then, a capacitor insulating film 22 about 0.01 $\mu$m thick is formed on each storage node 21. (The film 22 is, for example, a two-layered film consisting of an oxide film and a nitride film.) A polysilicon layer containing phosphorus and having a thickness of, for example, about 0.1 $\mu$m, is formed on the upper surface of the resultant structure. Those parts of the poly-silicon layer which are located on the drain regions of the n-channel MOS transistor of the memory cell section MC are removed, thereby forming the plate electrodes 23 of capacitors.

A BPSG film 24 is formed on the upper surface of the structure. Contact holes 25 are made in the BPSG film 24, exposing the drain regions of the n-channel MOS transistors of the memory cell section MC. Bit lines 26 are formed on the BPSG film 24 and in the contact holes 25. The bit lines 26 are connected to the drain regions of the n-channel MOS transistors.

An inter-layer insulating film 27 is formed on the upper surface of the resultant structure. Contact holes 28 are formed in the BPSG film 24 and inter-layer insulating film 27 of the peripheral circuit section PC. The contact holes 28 expose the source and drain regions 19, and source and drain regions 20 of the MOS transistors of the section PC. Metal wires 29 are formed on the inter-layer insulating film 27 and in the contact holes 28. The wires 29 are therefore connected to the source and drain regions 19 and source and drain regions 20 of the MOS transistors.

Thereafter, an inter-layer insulating film, other metal wires and a passivation film are formed, and pads are then formed. The DRAM is thereby manufactured.

The DRAM thus manufactured, i.e., a semiconductor device which is the third embodiment of the second aspect of the invention, is characterized two respects. First, its memory cell section has high integration density, consumes but a little power, and scarcely makes soft error. Second, its peripheral circuit section has MOS transistors to which a back-gate bias can be applied.

Further, the junction capacitance of each MOS transistor to which no back-gate bias needs to be applied can be reduced. Still further, the performance of the input protecting circuit can be improved.

Figure 44:
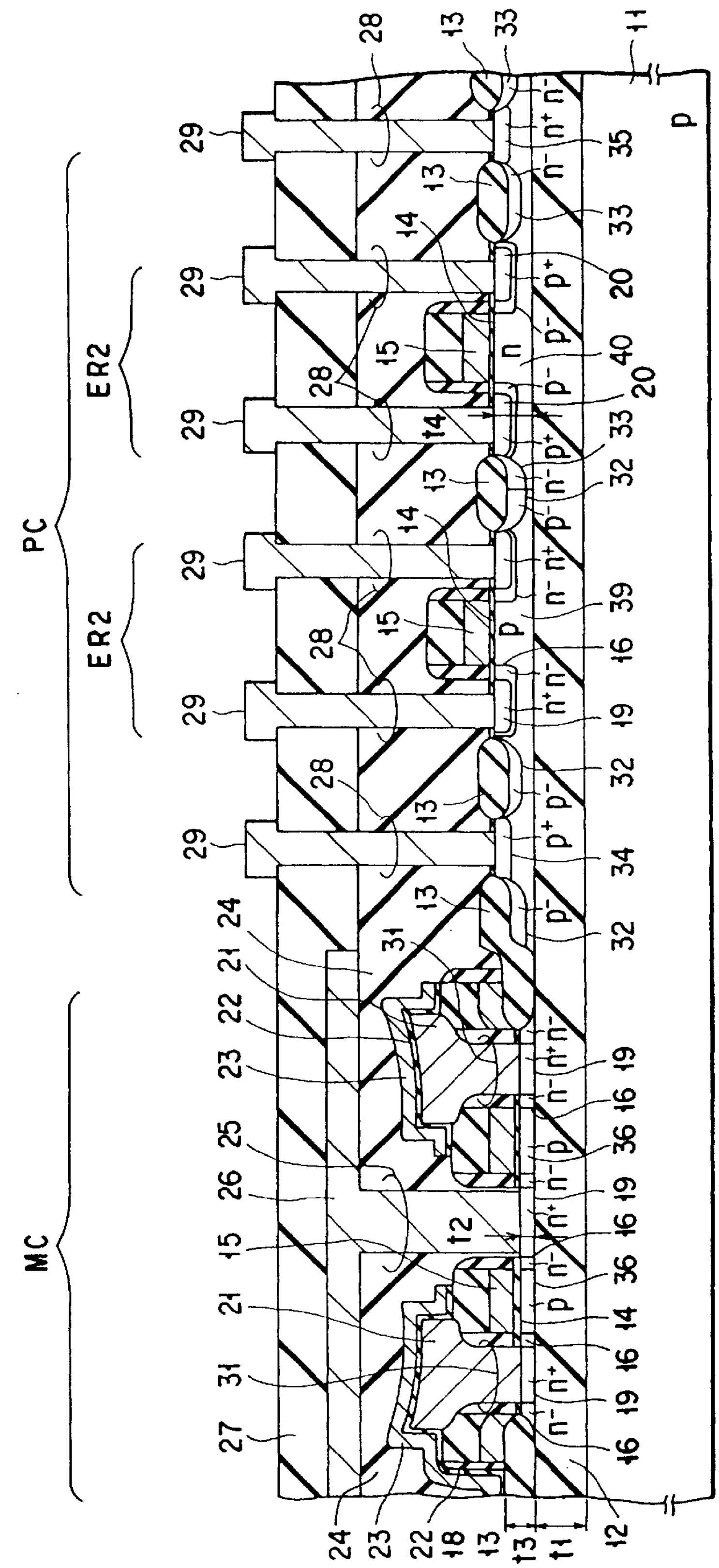
FIG. 44 is a sectional view illustrating both the memory cell section and peripheral circuit section of a DRAM according to a fourth embodiment of the present invention.
Figure 46:
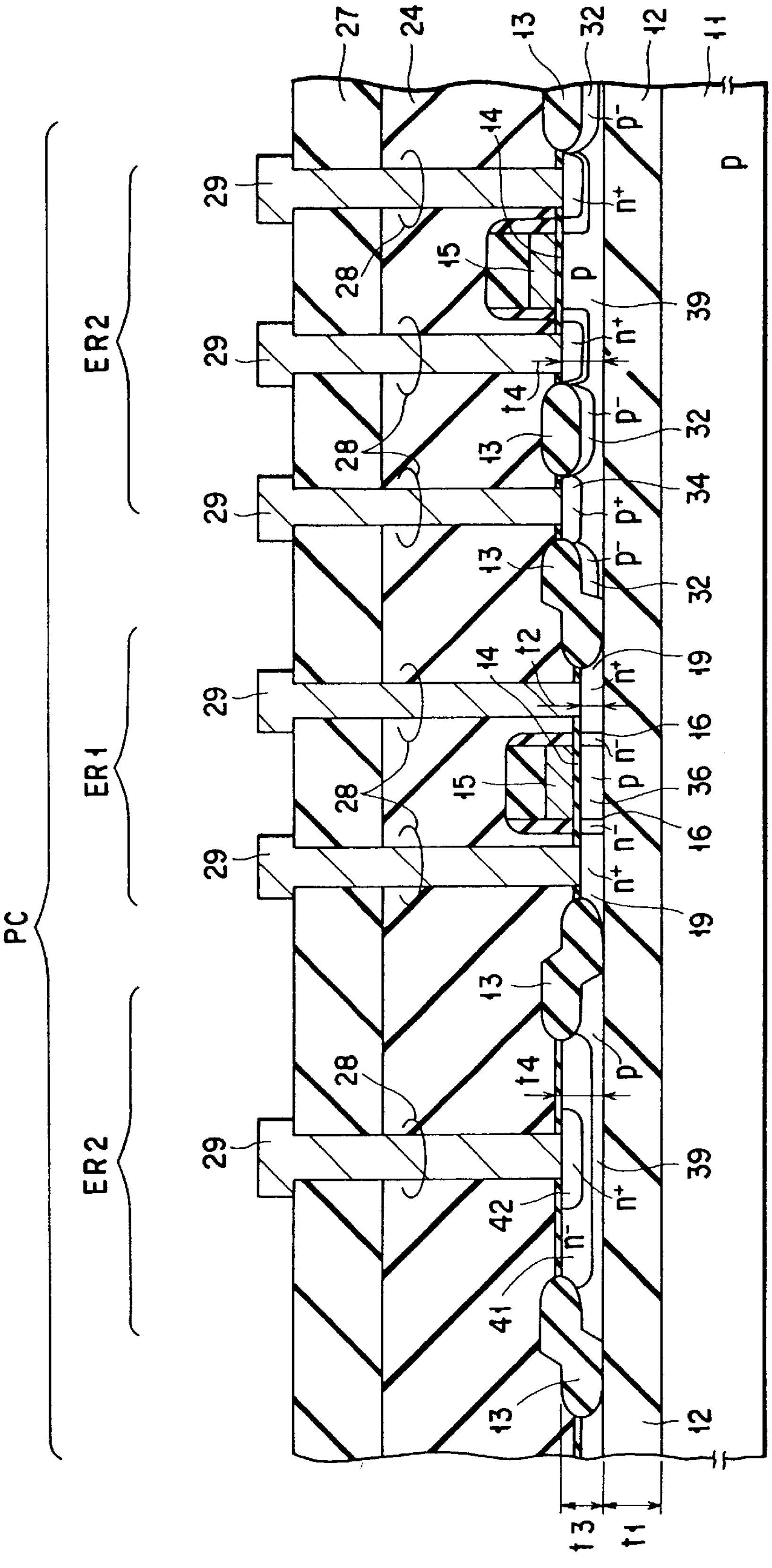
FIG. 46 is a detailed sectional view showing the peripheral circuit section of the DRAM illustrated in FIG. 44.

FIGS. 44 to 46 illustrate a DRAM according to the fourth embodiment according to the second aspect of the invention. The DRAM has a memory cell section MC and a peripheral circuit section PC.

The memory cell section MC will be first described, with reference to FIG. 44.

As shown in FIG. 44, a plate-shaped silicon oxide layer 12, having a prescribed thickness t.1. (e.g., about 0.4 $\mu$m) is formed in a p-type silicon substrate 11. The layer 12 is provided in the entire memory cell section MC. The upper surface of the layer 12 is parallel to that of the silicon substrate 11 and located at a predetermined depth t2 (e.g., about 0.1 $\mu$m) from the upper surface of the substrate 11. This means that the substrate 11 includes a silicon layer (element regions) which is provided on the silicon oxide layer 12 and which has a thickness of t2.

A field oxide film 13 having a prescribed thickness t3 (e.g., about 0.2 $\mu$m) is formed on the silicon oxide layer 12. The element regions of the memory cell section MC are isolated from one another, each contacting the silicon oxide film 12 at the lower surface and surrounded by the field oxide film 13.

Two memory cells are provided in each element region. Each memory cell has one MOS transistor and one capacitor. The MOS transistor has a gate electrode 15, source and drain regions 19, and low impurity concentration region 16. A p-type semiconductor region 36 is provided right below the gate electrode 15. Agate insulating film 14 is interposed between the electrode 15 and the semiconductor region 36. The p-type semiconductor region 36 contacts, at its lower surface, the silicon oxide layer 12. So do the source and drain regions 19, and low impurity concentration regions 16. The two memory cells share a drain region 19.

The capacitor of each memory cell has a storage node 21, a capacitor insulating film 22 and a plate electrode 23. The storage node 21 extends through a contact hole 31 and contacts the source region of the MOS transistor. The plate electrode 23 covers the silicon substrate 11; it has an opening located above the drain region 19, common to the two memory cells formed in each element region.

Bit lines 26 are connected to the drain regions of the MOS transistors. The bit lines 26 extend straight, intersecting at right angles to the word lines (i.e., the gate electrodes 15 of the MOS transistors.

The source and drain regions 19, and low impurity concentration regions 16 of the MOS transistor of each memory cell are very thin. Further, all components of the MOS transistor, but the channel region (the p-type semiconductor region 36) and the contact, have all sides contacting the insulating layers. Hence, virtually no junction capacitance exists, and virtually no junction leakage current flows. This enables the memory cell section MC to operate at high speed, consuming less power than otherwise. Further, soft error is hardly made in the memory cell section MC.

Since the possibility of soft error is low, it is easy to impart a sufficient capacitance to the capacitor. Even if the capacitor of each memory cell is of stacked structure, it can be so thin that the silicon substrate has, if any, low stepped portions on its surface.

The peripheral circuit section PC will now be described, with reference to FIGS. 44, 45 and 46.

A plate-shaped silicon oxide layer 12 having a prescribed thickness t.1. (e.g., about 0.4 μm) is formed in the p-type silicon substrate 11. The layer 12 is in the same plane as the silicon oxide layer 12 of the memory cell section MC.

The upper surface of the silicon oxide layer 12 is parallel to that of the silicon substrate 11 and located at a predetermined depth t4 (e.g., about 0.25 μm) from the upper surface of the substrate 11. Hence, the substrate 11 includes silicon layers (element regions) which are provided on the silicon oxide layer 12 and which have a thickness of t4. Some of the silicon layers (element regions) have their upper surfaces at a level higher than the upper surfaces of the silicon layers (element regions) of the memory cell section MC, while the remaining silicon layers (element regions) have their upper surfaces at the same level as the upper surfaces of the silicon layers (element regions) of the memory cell section MC.

A field oxide film 13 having a prescribed thickness t3 (e.g., about 0.2 μm) is formed partly on the silicon oxide layer 12 and partly above the layer 12. Namely, some parts of the film 13 contact the silicon oxide layer 12, whereas the other parts of the film 13 do not contact the silicon oxide layer 12. Thus, the peripheral circuit section PC has two types of element regions.

The element regions ER1 of the first type are isolated from one another, completely surrounded by the silicon oxide film 12 and the field oxide film 13. Provided in the element region ER1 are MOS transistors to which a back-gate bias need not be applied.

The element regions ER2 of the second type are surrounded by the field oxide film 13. Some of the element regions ER2 are provided in a p-type semiconductor region 39. The remaining element regions ER2 are provided in an n-type semiconductor region 40. Provided in the element regions ER2 are MOS transistors to which a back-gate bias must be applied and which constitute sense amplifiers, DQ-line driving circuits and operational amplifiers.

A $p^-$-type impurity region 32 and an $n^-$-type impurity region 33 are provided near the lower surface of the field oxide film 13 formed above the silicon oxide layer 12. Both impurity regions 32 and 33 are used as channel stoppers. The impurity region 33 can be dispensed with.

In some of the element regions provided on the silicon oxide layer 12, there are provided n-channel MOS transistors. In the remaining element regions formed on the silicon oxide layer 12, there are provided p-channel MOS transistors.

Each n-channel MOS transistor has a gate electrode 15, source and drain regions 19, and low impurity concentration regions 16. A p-type semiconductor region 36 is provided right below the gate electrode 15. A gate insulating film 14 is interposed between the gate electrode 15 and the semiconductor region 36. The semiconductor region 36 contacts, at its lower surface, the silicon oxide layer 12. The source and drain regions 19, and low impurity concentration regions 16, contact, at their lower surfaces, the silicon oxide layer 12.

Similarly, each p-channel MOS transistor has a gate electrode 15, source and drain regions 20, and low impurity concentration regions 17. An n-type semiconductor region 37 is provided right below the gate electrode 15. A gate insulating film 14 is interposed between the gate electrode 15 and the semiconductor region 37. The semiconductor region 37 contacts, at its lower surface, the silicon oxide layer 12. The source and drain regions 20, and low impurity concentration regions 17 contact, at their lower surfaces, the silicon oxide layer 12.

The source and drain regions 19, and low impurity concentration regions 16, of the MOS transistor provided in each element region on the silicon oxide layer 12 are very thin. Further, all components of the MOS transistor, but the channel region (the p-type semiconductor region 36) and the contact, have all sides contacting the insulating layers. Therefore, the parasitic capacitance is low, whereby the MOS transistor operates at high speed, consuming only a little power.

The MOS transistors provided in the element regions formed on the silicon oxide layer 12 are of the type to which a back-gate bias need not be applied. This is because these MOS transistors are surrounded by the insulating layer and, hence, isolated from one another.

In some of the element regions surrounded by the field oxide film 13 only, there are provided n-channel MOS transistors. In the remaining element regions surrounded by the film 13 only, there are provided p-channel MOS transistors.

Each n-channel MOS transistor is provided in the p-type semiconductor (well) region 39. It has a gate electrode 15, source and drain region 19 and low impurity concentration regions 16. A gate insulating film 14 is provided right below the gate electrode 15. Therefore, the source and drain regions 19, and low impurity concentration regions 16 do not contact, at their lower surfaces, the silicon oxide layer 12.

Similarly, each p-channel MOS transistor is provided in the n-type semiconductor (well) region 40. It has a gate electrode 15, source and drain regions 20 and low impurity concentration regions 17. A gate insulating film 14 is provided right below the gate electrode 15. Hence, the source and drain regions 20 and low impurity concentration regions 17 do not contact, at their lower surfaces, the silicon oxide layer 12.

Thus, the p-type semiconductor (well) region 39 includes a plurality of n-channel MOS transistors which are provided in the element regions on the silicon oxide layer 12. To these n-channel MOS transistors there can be applied a back-gate bias, because a $p^+$-type impurity region 34 is provided in the p-type semiconductor region 39. Also, the n-type semiconductor (well) region 40 includes a plurality of p-channel MOS transistors which are provided in the element regions on the silicon oxide layer 12. To these p-channel MOS transistors there can be applied a back-gate bias, because an $n^+$-type impurity region 35 is provided in the n-type semiconductor region 40.

An input protecting circuit can be formed in one of the element regions surrounded by the field oxide film 13 only. The input protecting circuit comprises, for example, a diode. More correctly, it comprises an $n^-$-type impurity region 41 and an $n^+$-type impurity region 42. The impurity region 41 is formed in the p-type semiconductor region 39, and the impurity region 42 is formed in the impurity region 41. The $n^-$-type impurity region 41 can be made thick enough to impart an adequate sheet resistance to the input protecting circuit.

How the RAM shown in FIGS. 44 to 46 is manufactured will be explained, with reference to FIGS. 47 to 53.

Figure 47:
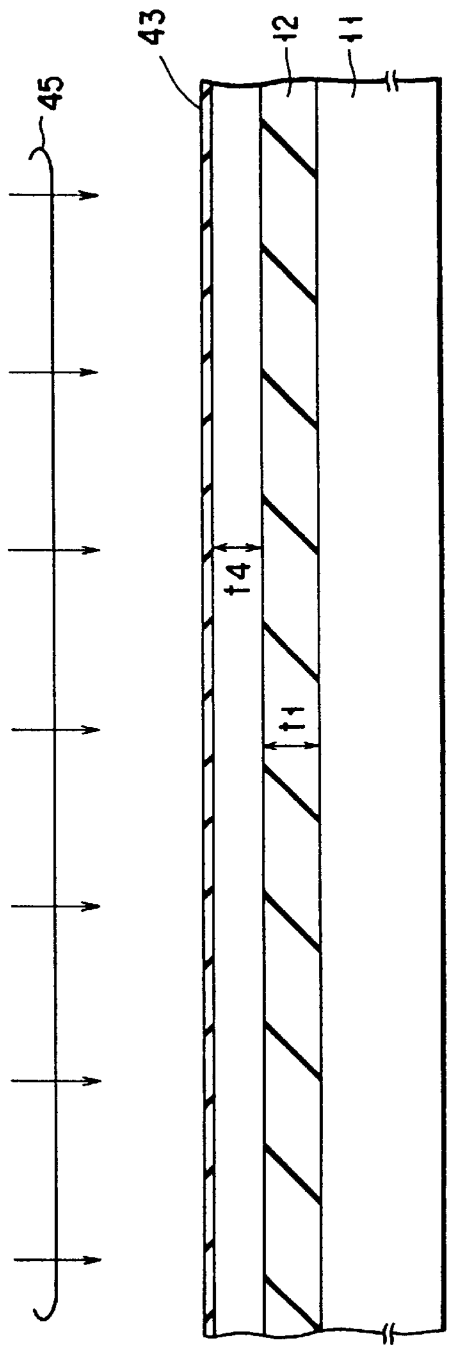
FIGS. 47 to 53 are sectional views explaining a method of manufacturing the DRAM shown in FIGS. 44 to 46.

At first, as shown in FIG. 47, oxygen ions 45 are implanted into the entire memory cell section MC and the entire peripheral circuit section PC, in a dose of about $2\times10^{18}$ $cm^{-2}$ under acceleration energy of about 250 KeV.

The structure obtained is annealed in an $N_2$ atmosphere, for example at about 1350° C. for about 30 minutes. A plate-shaped silicon oxide layer 12 having a thickness of about 0.4 $\mu$m, is thereby formed in the silicon substrate 11 at the depth of about 0.25 $\mu$m. Hence, a silicon layer having a thickness of about 0.25 $\mu$m is provided on each silicon oxide layer. The step of manufacturing the DRAM, or the structure illustrated in FIG. 47, may be replaced by the step shown in FIGS. 32 and 33. The step of FIGS. 32 and 33 will be explained.

Figure 48:
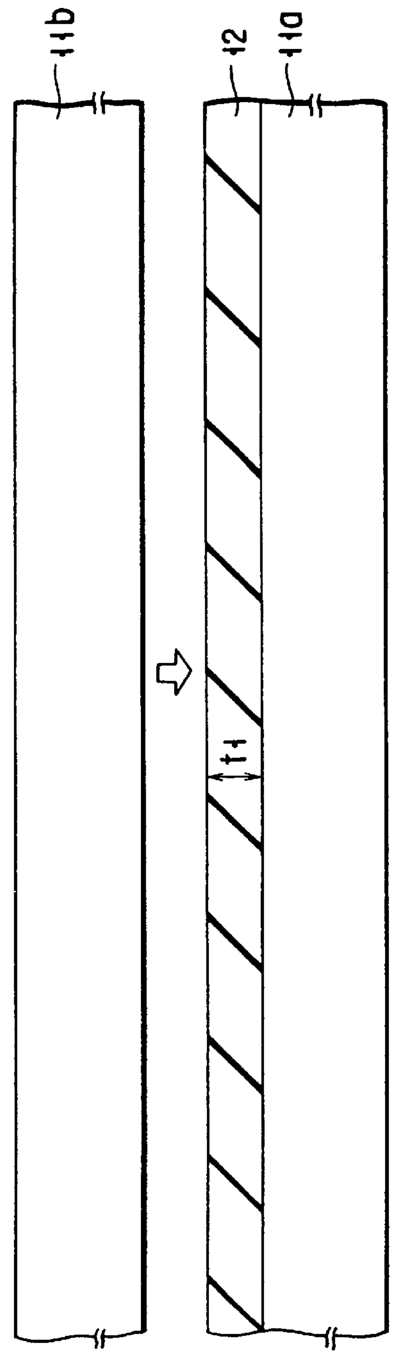
Figure 49:
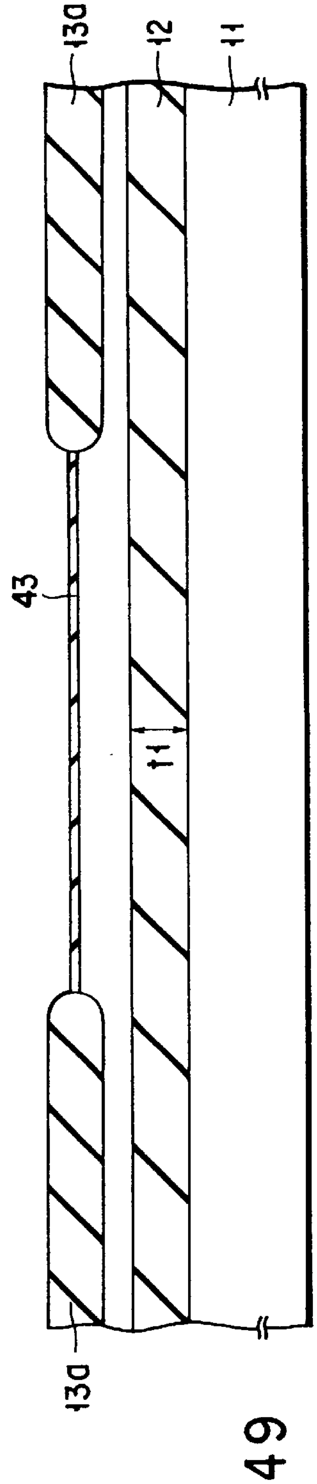

First, as shown in FIG. 48, a silicon oxide layer 12 is formed on a p-type silicon substrate 11. Next, a p-type silicon substrate 11*b* is bonded to the silicon oxide layer 12. The silicon substrate 11*b* is polished into a silicon layer having a prescribed thickness t4 (e.g., about 0.25 $\mu$m). Then, field oxide films 13*a* having a thickness of about 0.3 $\mu$m are formed by the LOCOS method above the silicon oxide layer 12. The field oxide films 13*a* therefore do not contact the silicon oxide film 12.

Figure 50:
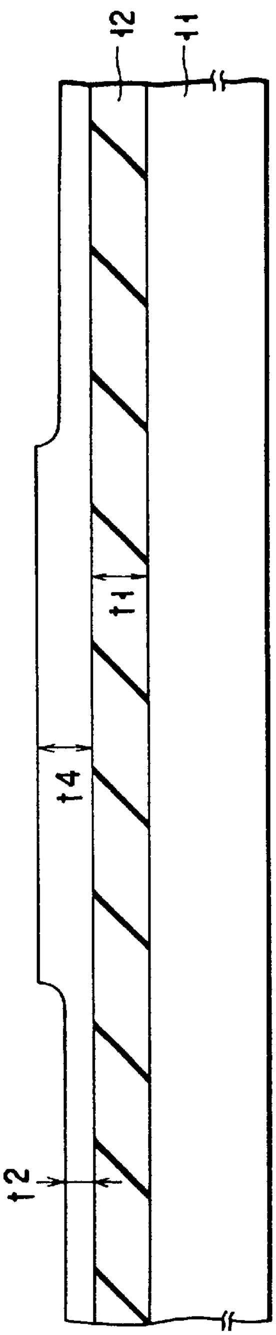

Thereafter, as shown in FIG. 50, the field oxide films 13*a* are removed by means of wet process. As a result, the silicon layer (element regions) on the silicon oxide layer 12 has portions having a thickness t2 (e.g., about 0.1 $\mu$m) and portions having a thickness t4 (e.g., about 0.25 $\mu$m).

Figure 51:
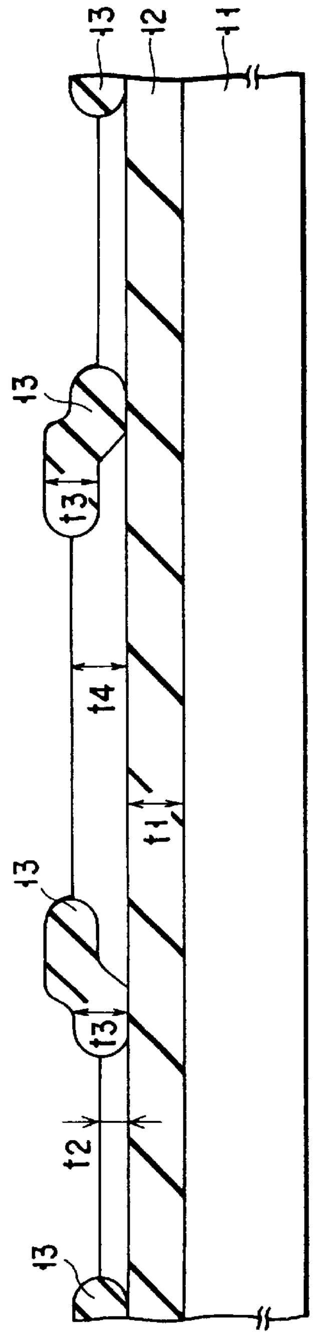

Next, as shown in FIG. 51, field oxide films 13 having a thickness t3 of about 0.2 $\mu$m are formed by the LOCOS method on the silicon oxide layer 12. That portion of each field oxide film 13 which is formed in that portion of the silicon layer which has the thickness t2 contacts the silicon oxide layer 12. By contrast, that portion of each field oxide film 13 which is formed in that portion of the silicon layer which has the thickness t4 does not contact the silicon oxide layer 12.

Figure 52:
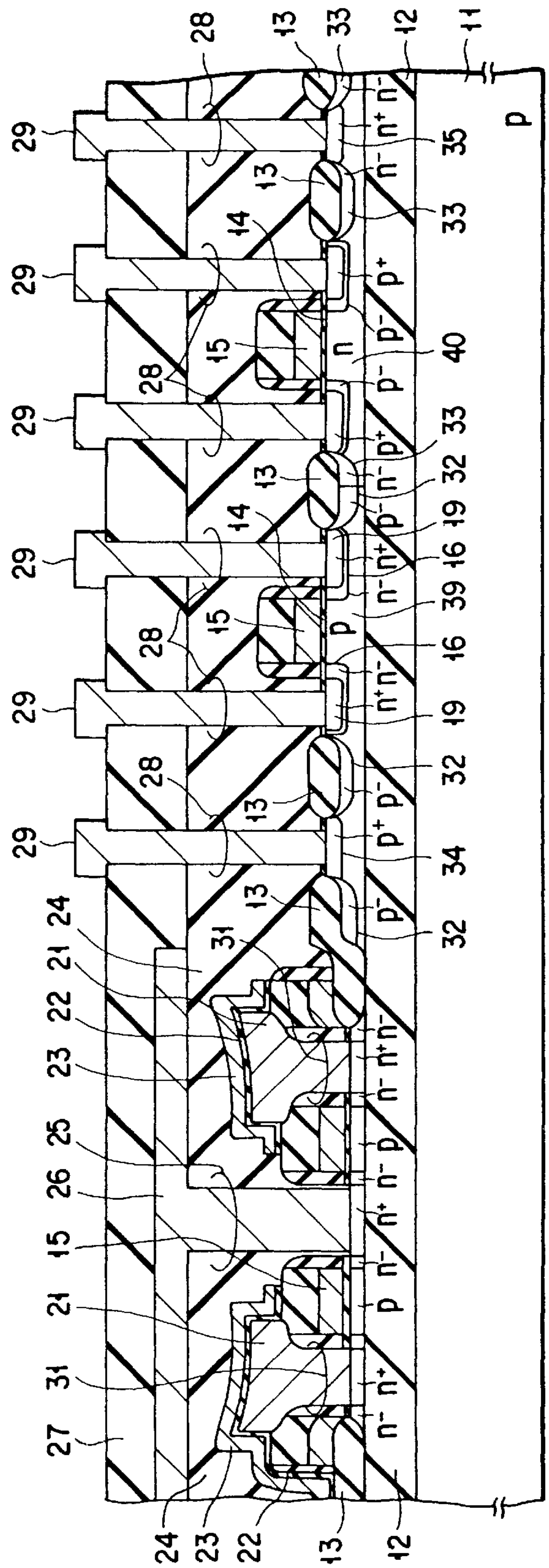
Figure 53:
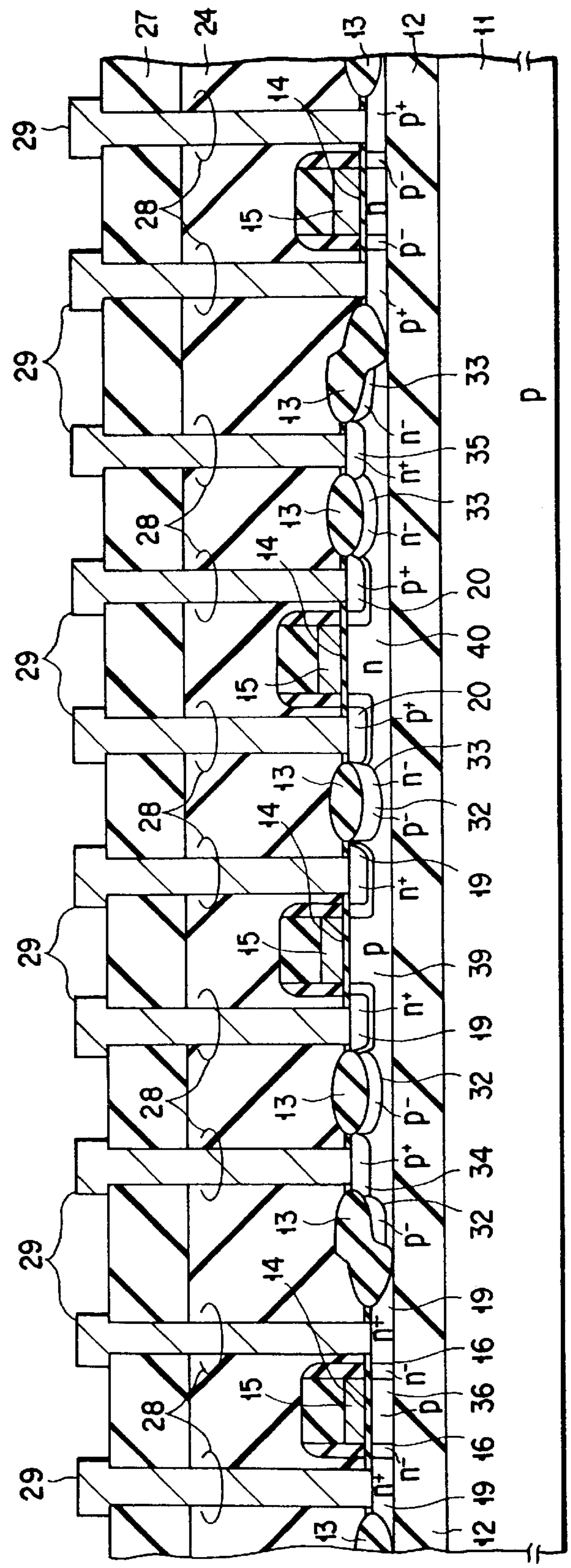

Then, boron ions are implanted into those parts of the silicon layer which are located on the silicon oxide layers 12, using a resist pattern as mask. P-type impurity regions 36, 38 and 39 are thereby formed as illustrated in FIGS. 52 and 53. Further, phosphorus ions are implanted into the silicon layers which are located on the silicon oxide layers 12, using a resist pattern as a mask. N-type impurity regions 37 and 40 are thereby formed.

A gate insulating film 14, a phosphorus-containing polysilicon film, and a TEOS film 30 are formed on the resultant structure, one after another. Using a resist pattern as a mask, the TEOS film 30 and the polysilicon film are etched, forming gate electrodes 15.

Further, using the resist pattern and the gate electrodes 15 as masks, phosphorus ions are implanted into the n-channel MOS transistor regions. Similarly, using the resist pattern as a mask, boron ions are implanted into the p-channel MOS transistor regions.

The resultant structure is annealed, forming low impurity concentration regions 16 of $n^-$-type and low impurity concentration regions 17 of $p^-$-type. These regions 16 and 17, have a surface impurity concentration of $1\times10^{18}$ to $1\times10^{20}$ $cm^{-3}$. A spacer 18 is then formed on the sides of each gate electrode 15. Using a resist pattern as a mask, arsenic is ion-implanted into the n-channel MOS transistor regions, and boron is ion-implanted into the p-channel MOS transistor regions.

The structure obtained is subjected to thermal oxidation, thus forming source and drain regions 19 of n+-type and source and drain regions 20 of p+-type. These regions 19 and 20 have a surface impurity concentration of $1\times10^{19}$ to $1\times10^{20}$ $cm^{-3}$.

Contact holes 31 are formed which expose the source regions of the n-channel MOS transistors formed in the memory cell section MC. Storage nodes 21 of capacitors are formed, each having a thickness of about 0.2 $\mu$m and extending through the contact holes 31 to the source regions of the n-channel MOS transistors. Then, a capacitor insulating film 22 about 0.01 $\mu$m thick is formed on each storage node 21. (The film 22 is, for example, a two-layered film consisting of an oxide film and a nitride film.) A polysilicon layer containing phosphorus and having a thickness of, for example, about 0.1 $\mu$m, is formed on the upper surface of the resultant structure. Those parts of the polysilicon layer which are located on the drain regions of the n-channel MOS transistor of the memory cell section MC are removed, thereby forming the plate electrodes 23 of capacitors.

A BPSG film 24 is formed on the upper surface of the structure. Contact holes 25 are made in the BPSG film 24, exposing the drain regions of the n-channel MOS transistors of the memory cell section MC. Bit lines 26 are formed on the BPSG film 24 and in the contact holes 25. The bit lines 26 are connected to the drain regions of the n-channel MOS transistors.

An inter-layer insulating film 27 is formed on the upper surface of the resultant structure. Contact holes 28 are formed in the BPSG film 24 and inter-layer insulating film 27 of the peripheral circuit section PC. The contact holes 28 expose the source and drain regions 19 and source and drain regions 20 of the MOS transistors of the section PC. Metal wires 29 are formed on the inter-layer insulating film 27 and in the contact holes 28. The wires 29 are therefore connected to the source and drain regions 19 and source and drain regions 20 of the MOS transistors.

Thereafter, an inter-layer insulating film, other metal wires and a passivation film are formed, and pads are then formed. The DRAM is thereby manufactured.

The DRAM thus manufactured, i.e., a semiconductor device which is the fourth embodiment of the second aspect of the invention, is characterized in two respects. First, its memory cell section has high integration density, consumes but a little power, and scarcely makes soft error. Second, its peripheral circuit section has MOS transistors to which a back-gate bias can be applied.

Moreover, the junction capacitance of each MOS transistor to which no back-gate bias needs to be applied can be reduced. Still further, the performance of the input protecting circuit can be improved.

Third Aspect of the Invention

Semiconductor devices according to the third aspect of the present invention will be described. These semiconductor devices are DRAMs each having a SOI substrate which comprises an insulating layer and at least two silicon layers different in thickness and provided on the insulating layer.

Figure 59:
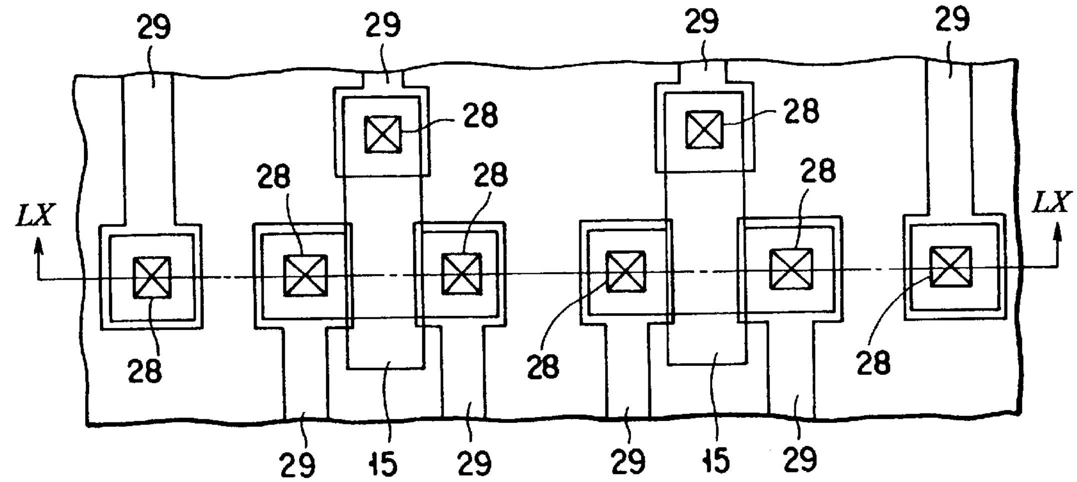
FIG. 59 is a plan view showing in detail the peripheral circuit section of the DRAM shown in FIGS. 54 and 55.
Figure 60:
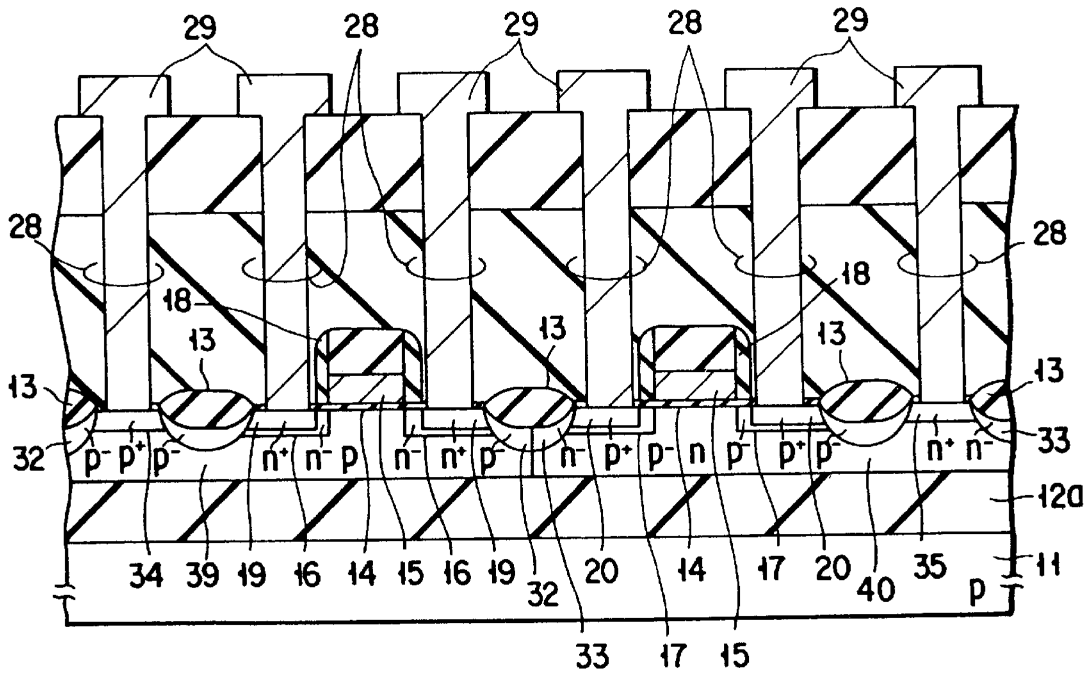
FIG. 60 is a sectional view, taken along line LX—LX in FIG. 59.
Figure 61:
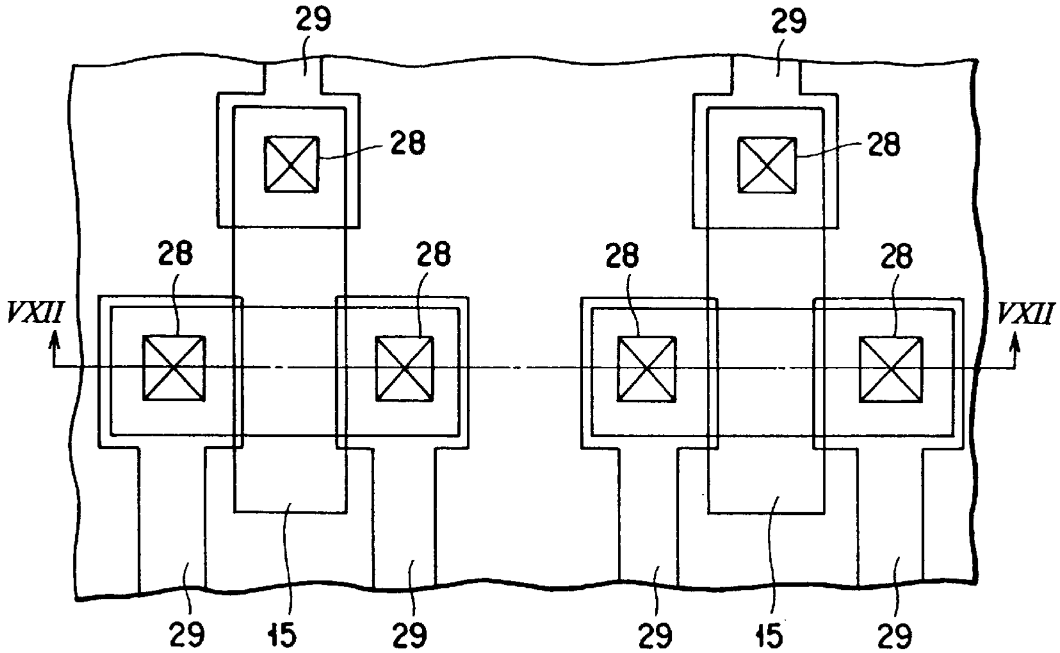
FIG. 61 is another plan view showing in detail the peripheral circuit section of the DRAM shown in FIGS. 54 and 55.
Figure 62:
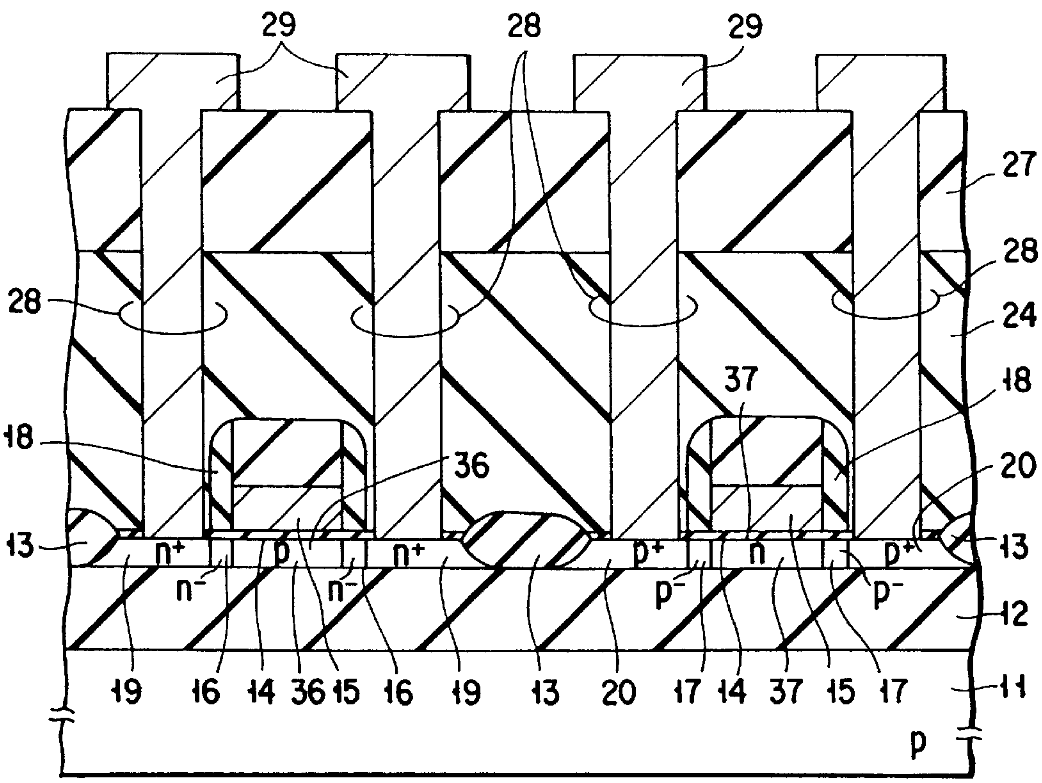
FIG. 62 is a sectional view, taken along line LXII—LXII in FIG. 61.
Figure 63:
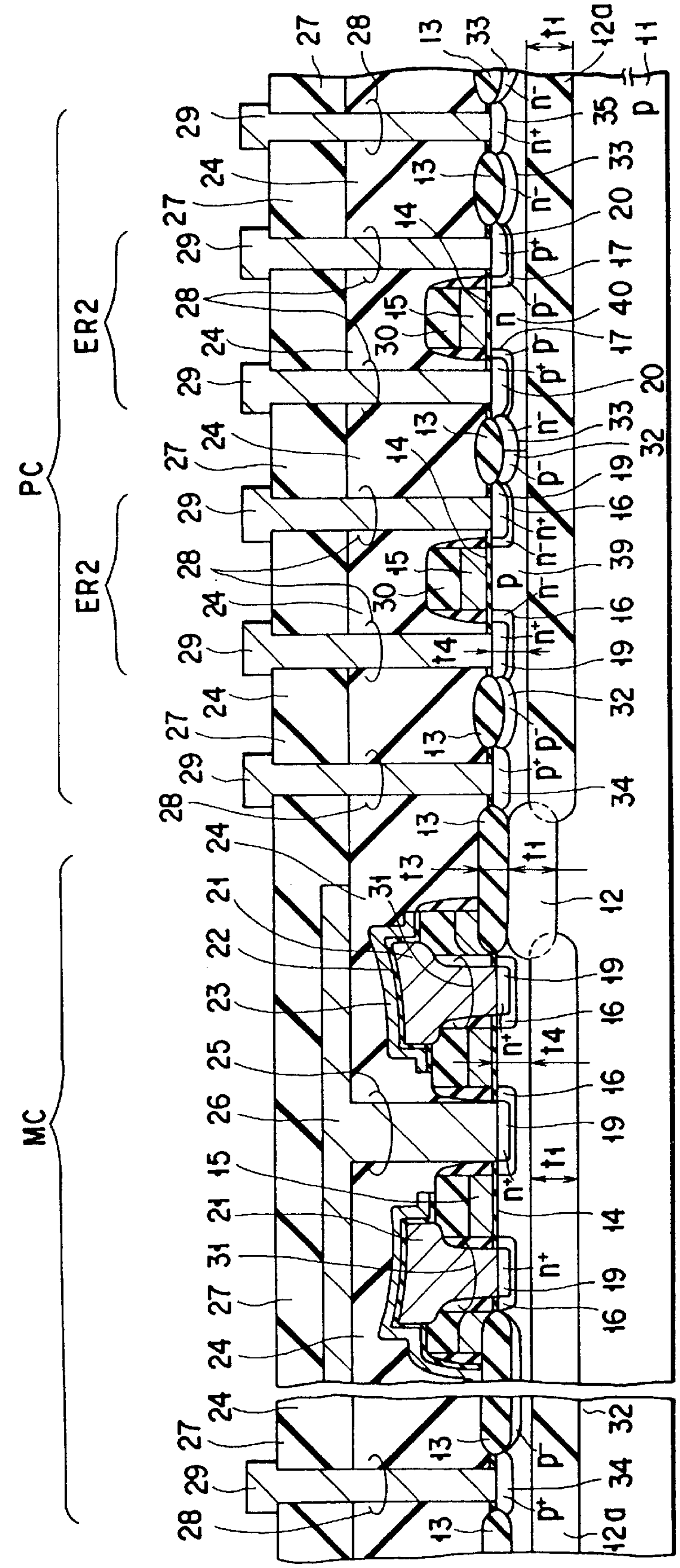
FIG. 63 is a sectional view showing both the memory cell section MC and the peripheral circuit section of the DRAM shown in FIGS. 54 and 55.
Figure 64:
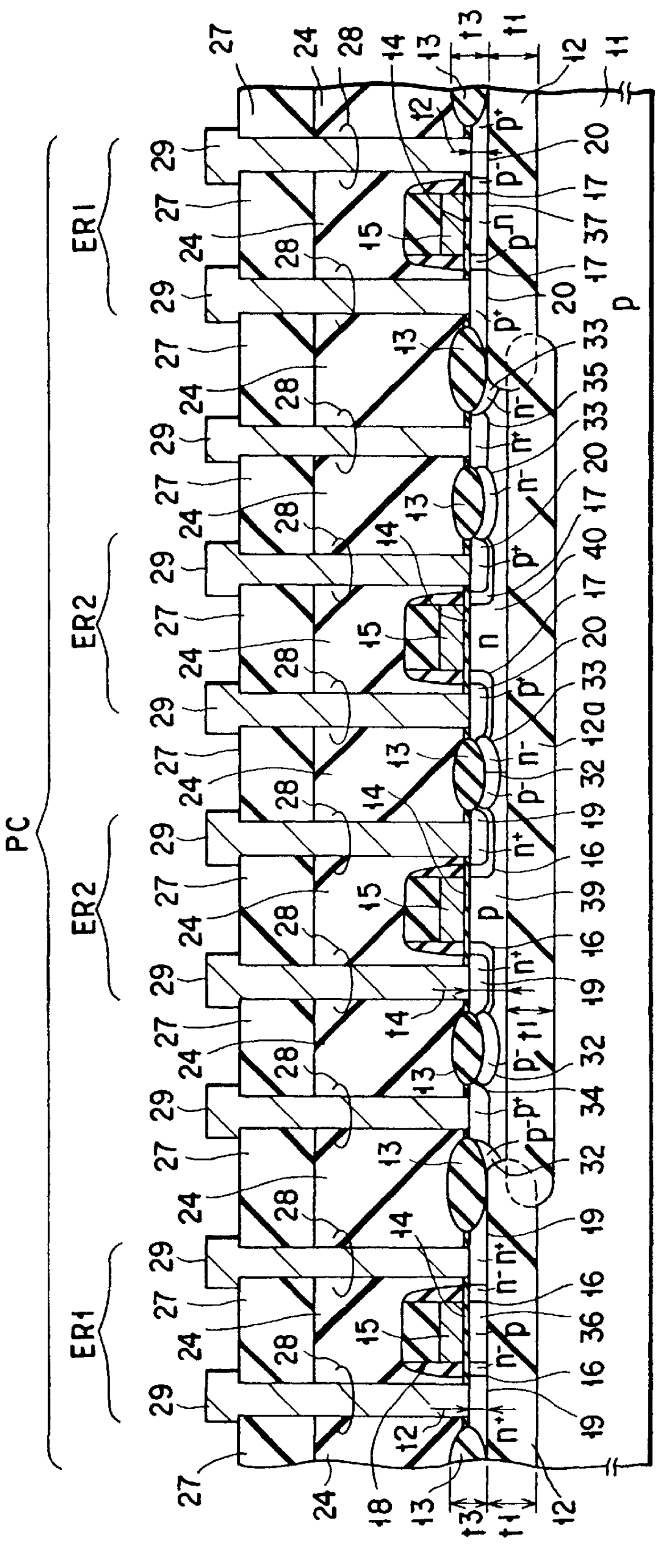
FIG. 64 illustrates in greater detail the peripheral circuit section of the DRAM shown in FIGS. 54 and 55.

FIGS. 54 to 64 show a 64 mega bits (MB) DRAM according to the first embodiment according to the third aspect of the invention. More precisely, FIG. 54 is a floor plan of the 64 MB DRAM; FIG. 55 is a floor plan of a 16 MB core block incorporated in the DRAM; FIG. 56 is a plan view of the memory cell section; FIG. 57 is a sectional view of the memory cell section, taken along line LVII—LVII in FIG. 56; FIG. 58 is a diagram explaining how to apply a back-gate bias to the memory cell section; FIGS. 59 and 61 show the peripheral circuit section (FIGS. 54 and 55) in more detail; FIG. 60 is a sectional view, taken along line LX—LX in FIG. 59; FIG. 62 is a sectional view, taken along line LXII—LXII in FIG. 61; FIG. 63 is a sectional view showing both the memory cell section MC and the peripheral circuit section PC; and FIG. 64 illustrates the peripheral circuit section in greater detail.

As shown in FIG. 54, the 64 MB DRAM comprises four core blocks 102 and a peripheral circuit section 103, all provided on a semiconductor chip 101. The section 103 includes an I/O (Input/Output) buffer, a back-gate bias generating circuit, input/output pads and the like. As seen from FIG. 55, each core block 102 is comprised of a memory cell section 104 and a peripheral circuit. (The section 104 includes redundant memory cells.) The peripheral circuit section includes a row decoder 105, a column decoder 106, a sense amplifier 107, a DQ buffer 108 and a redundant circuit 109. (The DQ buffer 108 includes a circuit for driving the DQ line.)

The memory cell section MC will be described in detail, with reference to FIGS. 56 and 57.

As shown in FIG. 57, a plate-shaped silicon oxide layer 12*a,* having a prescribed thickness t.1. (e.g., about 0.4 μm) is formed in the p-type silicon substrate 11. The layer 12*a* is provided in the entire memory cell section MC. The upper surface of the layer 12*a* is parallel to that of the silicon substrate 11 and located at a predetermined depth t4 (e.g., about 0.25 μm) from the upper surface of the substrate 11. This means that the substrate 11 includes a silicon layer (element regions) which is provided on the silicon oxide layer 12*a* and which has a thickness of t4.

A field oxide film 13 having a prescribed thickness t3 (e.g., about 0.2 μm) is formed on the silicon oxide layer 12*a*. The element regions of the memory cell section MC are isolated from one another, each contacting the silicon oxide film 12*a* at the lower surface and surrounded by the field oxide film 13.

Two memory cells are provided in each element region. Each memory cell has one MOS transistor and one capacitor. The MOS transistor has a gate electrode 15, a source and drain regions 19, and low impurity concentration regions 16. The MOS transistor is provided in a p-type semiconductor region 38. A gate insulating film 14 is interposed between the silicon substrate 11 and the semiconductor region 38. The source and drain regions 19 and low impurity concentration regions 16 do not contact the silicon oxide layer 12*a* at their lower surfaces. The two memory cells share a drain region 19.

The capacitor of each memory cell has a storage node 21, a capacitor insulating film 22 and a plate electrode 23. The storage node 21 extends through a contact hole 31 and contacts the source region of the MOS transistor. The plate electrode 23 covers the silicon substrate 11; it has an opening located above the drain region 19 common to the two memory cells formed in each element region.

Bit lines 26 are connected to the drain regions of the MOS transistors. The bit lines 26 extend straight, intersecting at right angles to the word lines (i.e., the gate electrodes 15 of the MOS transistors.

The source and drain regions 19, and low impurity concentration regions 16 of the MOS transistor of each memory cell are very thin. The memory cell section MC can therefore operate, scarcely making soft error. Thanks to the low possibility of soft error, it is easy to impart a sufficient capacitance to the capacitor. Hence, the capacitor of each memory cell can be so thin that the silicon substrate has, if any, low stepped portions on its surface, even if it is of stacked structure.

The peripheral circuit section PC will now be described, with reference to FIGS. 59 to 64.

As shown in FIGS. 63 and 64, plate-shaped silicon oxide layers 12 and 12*a* having a prescribed thickness t.1. (e.g., about 0.4 μm) are formed in the p-type silicon substrate 11.

The upper surface of the silicon oxide layer 12 is parallel to that of the silicon substrate 11 and located at a predetermined depth t2 (e.g., about 0.1 μm) from the upper surface of the substrate 11. Hence, the substrate 11 includes silicon layers (element regions) which are provided on the silicon oxide layer 12 and which have a thickness of t2.

The upper surface of the silicon oxide layer 12*a* is parallel to that of the silicon substrate 11 and located at a predetermined depth t4 (e.g., about 0.25 μm) from the upper surface of the substrate 11. This means that the substrate 11 includes silicon layers (element regions) which are provided on the silicon oxide layer 12*a* and which have a thickness of t4.

A field oxide film 13 having a prescribed thickness t3 (e.g., about 0.2 μm) is formed on the silicon oxide layer 12 and above the silicon oxide layer 12*a*. Namely, the film 13 contacts the silicon oxide layer 12 and does not contact the silicon oxide layer 12*a*. Thus, the peripheral circuit section PC has two types of element regions.

The element regions ER1 of the first type are isolated from one another, completely surrounded by the silicon oxide film 12 and surrounded by the field oxide film 13. Provided in the element region ER1 are MOS transistors to which a back-gate bias need not be applied.

The element regions ER2 of the second type are surrounded by the field oxide film 13. Some of the element regions ER2 are provided in a p-type semiconductor region 39. The remaining element regions ER2 are provided in an n-type semiconductor region 40. Provided in the element regions ER2 are MOS transistors to which a back-gate bias must be applied and which constitute sense amplifiers, DQ-line driving circuits and operational amplifiers.

A $p^-$-type impurity region 32 and an $n^-$-type impurity region 33 are provided near the lower surface of the field oxide film 13 formed above the silicon oxide layer 12. Both impurity regions 32 and 33 are used as channel stoppers. The impurity region 33 can be dispensed with.

In some of the element regions completely surrounded by the silicon oxide layer 12 and the field oxide film 13, there are provided n-channel MOS transistors. In the remaining element regions formed on the silicon oxide layer 12, there are provided p-channel MOS transistors.

Each n-channel MOS transistor has a gate electrode 15, source and drain regions 19 and low impurity concentration regions 16. A p-type semiconductor region 36 is provided right below the gate electrode 15. A gate insulating film 14 is interposed between the gate electrode 15 and the semiconductor region 36. The semiconductor region 36 contacts, at its lower surface, the silicon oxide layer 12. So do the source and drain region 19 and low impurity concentration regions 16.

Similarly, each p-channel MOS transistor has a gate electrode 15, source and drain regions 20 and low impurity concentration regions 17. An n-type semiconductor region 37 is provided right below the gate electrode 15. A gate insulating film 14 is interposed between the gate electrode 15 and the semiconductor region 37. The semiconductor region 37 contacts, at its lower surface, the silicon oxide layer 12. So do the source and drain regions 20 and low impurity concentration regions 17.

The source and drain regions 19, and low impurity concentration regions 16 of the MOS transistor provided in each element region on the silicon oxide layer 12 are very thin. Further, all components of the MOS transistor, but the channel region (the p-type semiconductor region 36) and the contact, have all sides contacting the insulating layers. Therefore, the parasitic capacitance is low, whereby the MOS transistor operates at high speed, consuming only a little power.

The MOS transistors provided in the element regions formed on the silicon oxide layer 12 are of the type to which a back-gate bias need not be applied. This is because these MOS transistors are isolated from one another, completely surrounded by the silicon oxide layer 12 and the field oxide film 13.

In some of the element regions provided on the silicon oxide layer 12*a,* there are provided n-channel MOS transistors. In the remaining element regions provided on the silicon oxide layer 12*a,* there are provided p-channel MOS transistors.

Each n-channel MOS transistor is provided in the p-type semiconductor (well) region 39. It has a gate electrode 15, source regions 19, and low impurity concentration regions 16. A gate insulating film 14 is provided right below the gate electrode 15. Therefore, the source and drain regions 19 and low impurity concentration regions 16 do not contact, at their lower surfaces, the silicon oxide layer 12*a*.

Similarly, each p-channel MOS transistor is provided in the n-type semiconductor (well) region 40. It has a gate electrode 15, source and drain region 20 and low impurity concentration regions 17. A gate insulating film 14 is provided right below the gate electrode 15. Hence, the source and drain regions 20 and low impurity concentration regions 17 do not contact, at their lower surfaces, the silicon oxide layer 12*a*.

Thus, the p-type semiconductor (well) region 39 includes a plurality of n-channel MOS transistors which are provided on the silicon oxide layer 12*a*. To these n-channel MOS transistors there can be applied a backgate bias, because a p+-type impurity region 34 is provided in the p-type semiconductor region 39. Also, the n-type semiconductor (well) region 40 includes a plurality of p-channel MOS transistors which are provided on the silicon oxide layer 12*a*. To these p-channel MOS transistors there can be applied a backgate bias, because an n+-type impurity region 35 is provided in the n-type semiconductor region 40.

An input protecting circuit can be formed in one of the element regions provided on the silicon oxide layer 12*a*. The input protecting circuit comprises, for example, a diode. More correctly, it comprises an $n^-$-type impurity region 41 and an $n^+$-type impurity region 42. The impurity region 41 is formed in the p-type semiconductor region 39, and the impurity region 42 is formed in the impurity region 41. The $n^-$-type impurity region 41 can be made thick enough to impart an adequate sheet resistance to the input protecting circuit.

The DRAM shown in FIGS. 56 to 64 can be manufactured by the same method as the DRAM illustrated in FIGS. 21 to 23.

The DRAM, i.e., a semiconductor device which is the first embodiment of the third aspect of this invention, is characterized in three respects. First, its memory cell section has high integration density, consumes but a little power, and scarcely makes soft error, and has MOS transistors to which a back-gate bias can be applied. Second, in the peripheral circuit section, as shown in FIG. 58, a back-gate bias can be applied to some of the MOS transistors, and the junction capacitance of the other MOS transistor to which no back-gate bias needs to be applied can be reduced. The element regions 201 shown in FIG. 58 are electrically connected to each other by a p-type semiconductor layer. Therefore, a back-gate bias can be applied to MOS transistors provided in the element regions 201 since a contact portion 202 is provided which contacts the p-type semiconductor layer. Third, the performance of the input protecting circuit can be improved.

Figure 65:
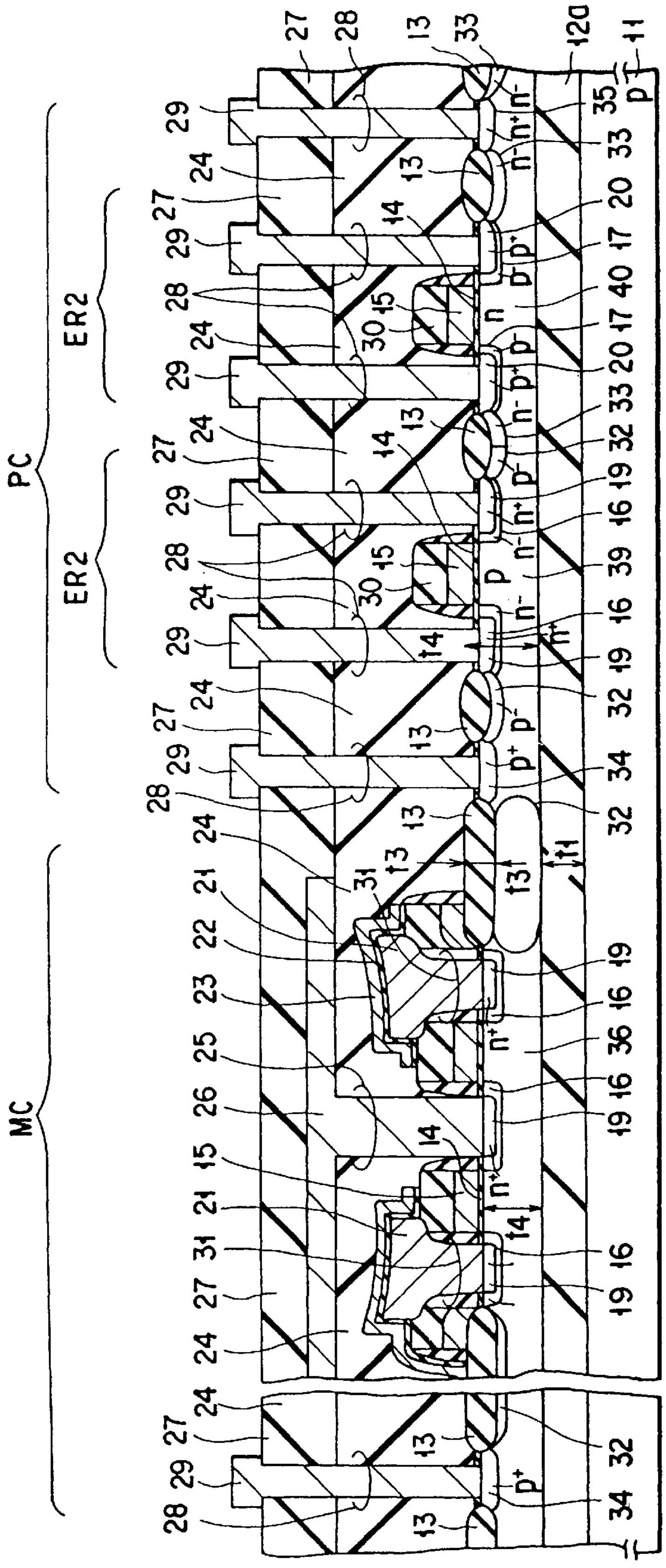
FIG. 65 is a sectional view showing both the memory cell section and the peripheral circuit section of a DRAM according to a second embodiment of the third aspect of the invention.
Figure 66:
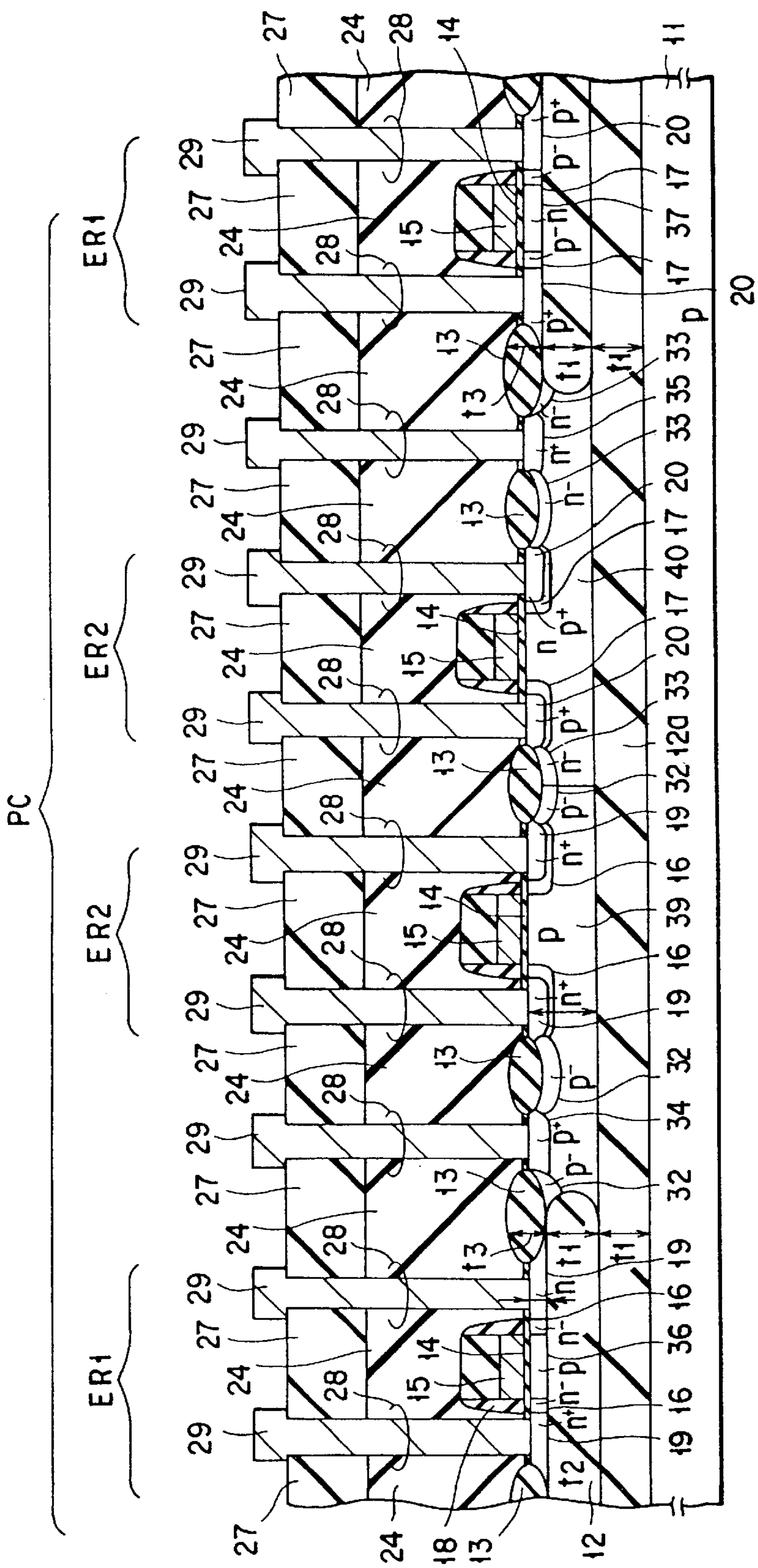
FIG. 66 is a sectional view showing the peripheral circuit section of the DRAM which is the second embodiment of the third aspect of the invention.

FIGS. 65 and 66 show a DRAM according to the second embodiment according to the third aspect of the invention. The DRAM has a memory cell section MC and a peripheral circuit section PC.

The memory cell section MC will be first described, with reference to FIG. 65.

As shown in FIG. 65, a plate-shaped silicon oxide layer 12*a* having a prescribed thickness t.1. (e.g., about 0.4 μm) is formed in a p-type silicon substrate 11. The layer 12*a* is provided in the entire memory cell section MC. The upper surface of the layer 12*a* is parallel to that of the silicon substrate 11 and located at a predetermined depth t4 (e.g., about 0.25 μm) from the upper surface of the substrate 11. This means that the substrate 11 includes a silicon layer (element regions) which is provided on the silicon oxide layer 12 and which has a thickness of t4.

A field oxide film 13 having a prescribed thickness t3 (e.g., about 0.2 μm) is formed above the silicon oxide layer 12*a*. That is, the film 13 does not contact the silicon oxide layer 12*a*. The element regions of the memory cell section MC are electrically connected by a p-type semiconductor region 36, though they are surrounded by the field oxide film 13.

Two memory cells are provided in each element region. Each memory cell has one MOS transistor and one capacitor. The MOS transistor has a gate electrode 15, source and drain regions 19 and low impurity concentration regions 16. A gate insulating film 14 is interposed between the gate electrode 15 and the semiconductor region 36. The source and drain regions 19, and low impurity concentration regions 16, do not contact the silicon oxide layer 12*a,* at their lower surfaces. The two memory cells share a drain region 19.

The capacitor of each memory cell has a storage node 21, a capacitor insulating film 22 and a plate electrode 23. The storage node 21 extends through a contact hole 31 and contacts the source region of the MOS transistor. The plate electrode 23 covers the silicon substrate 11; it has an opening located above the drain region 19, common to the two memory cells formed in each element region.

Bit lines 26 are connected to the drain regions of the MOS transistors. The bit lines 26 extend straight, intersecting at right angles to the word lines (i.e., the gate electrodes 15 of the MOS transistors.

The source and drain regions 19 and low impurity concentration regions 16, of the MOS transistor of each memory cell are very thin. Therefore, soft error is hardly made in the memory cell section MC. Since the possibility of soft error is low, it is easy to impart a sufficient capacitance to the capacitor. Even if the capacitor of each memory cell is of stacked structure, it can be so thin that the silicon substrate has, if any, low stepped portions on its surface.

The peripheral circuit section PC will be described, with reference to FIGS. 65 and 66.

As shown in FIGS. 65 and 66, plate-shaped silicon oxide layers 12 and 12*a* having a prescribed thickness t.1. (e.g., about 0.4 μm) are formed in the p-type silicon substrate 11.

The upper surface of the silicon oxide layer 12 is parallel to that of the silicon substrate 11 and located at a predetermined depth t2 (e.g., about 0.1 μm) from the upper surface of the substrate 11. Hence, the substrate 11 includes silicon layers (element regions) which are provided on the silicon oxide layer 12 and which have a thickness of t2.

The upper surface of the silicon oxide layer 12*a* is parallel to that of the silicon substrate 11 and located at a predetermined depth t4 (e.g., about 0.25 μm) from the upper surface of the substrate 11. This means that the substrate 11 includes silicon layers (element regions) which are provided on the silicon oxide layer 12*a* and which have a thickness of t4 (=t.1.+t2).

A field oxide film 13 having a prescribed thickness t3 (e.g., about 0.2 μm) is formed on the silicon oxide layer 12 and above the silicon oxide layer 12*a*. Namely, the film 13 contacts the silicon oxide layer 12 and does not contact the silicon oxide layer 12*a*. Thus, the peripheral circuit section PC has two types of element regions.

The element regions ER1 of the first type are isolated from one another, completely surrounded by the silicon oxide film 12 and the field oxide film 13. Provided in the element region ER1 are MOS transistors to which a back-gate bias need not be applied.

The element regions ER2 of the second type are surrounded by the field oxide film 13. Some of the element regions ER2 are provided in a p-type semiconductor region 39. The remaining element regions ER2 are provided in an n-type semiconductor region 40. Provided in the element regions ER2 are MOS transistors to which a back-gate bias must be applied and which constitute sense amplifiers, DQ-line driving circuits and operational amplifiers.

A $p^-$-type impurity region 32 and an $n^-$-type impurity region 33 are provided near the lower surface of the field oxide film 13 formed above the silicon oxide layer 12*a*. Both impurity regions 32 and 33 are used as channel stoppers. The impurity region 33 can be dispensed with.

In some of the element regions provided on the silicon oxide layer 12, there are provided n-channel MOS transistors. In the remaining element regions formed on the silicon oxide layer 12, there are provided p-channel MOS transistors.

Each n-channel MOS transistor has a gate electrode 15, source and drain regions 19 and low impurity concentration regions 16. A p-type semiconductor region 36 is provided right below the gate electrode 15. A gate insulating film 14 is interposed between the gate electrode 15 and the semiconductor region 36. The semiconductor region 36 contacts, at its lower surface, the silicon oxide layer 12. So do the source and drain regions 19 and low impurity concentration regions 16.

Similarly, each p-channel MOS transistor has a gate electrode 15, source and drain regions 20 and low impurity concentration regions 17. An n-type semiconductor region 37 is provided right below the gate electrode 15. A gate insulating film 14 is interposed between the gate electrode 15 and the semiconductor region 37. The semiconductor region 37 contacts, at its lower surface, the silicon oxide layer 12. So do the source and drain regions 20 and low impurity concentration regions 17.

The source and drain regions 19, and low impurity concentration regions 16, of the MOS transistor provided in each element region on the silicon oxide layer 12 are very thin. Further, all components of the MOS transistor, but the channel region (the p-type semiconductor region 36) and the contact, have all sides contacting the insulating layers. Therefore, the parasitic capacitance is low, whereby the MOS transistor operates at high speed, consuming only a little power.

The MOS transistors provided in the element regions formed on the silicon oxide layer 12 are of the type to which no back-gate bias need is applied. This is because these MOS transistors are surrounded by the insulating layer and, hence, isolated from one another.

In some of the element regions provided on the silicon oxide layer 12*a,* there are provided n-channel MOS transistors. In the remaining element regions provided on the silicon oxide layer 12*a,* there are provided p-channel MOS transistors.

Each n-channel MOS transistor is provided in the p-type semiconductor (well) region 39. It has a gate electrode 15, source and drain region 19 and low impurity concentration regions 16. A gate insulating film 14 is provided right below the gate electrode 15. Hence, the source and drain regions 19, and low impurity concentration regions 16, do not contact, at their lower surfaces, the silicon oxide layer 12*a*.

Similarly, each p-channel MOS transistor is provided in the n-type semiconductor (well) region 40. It has a gate electrode 15, source and drain regions 20 and low impurity concentration regions 17. A gate insulating film 14 is provided right below the gate electrode 15. Hence, the source and drain regions 20 and low impurity concentration regions 17 do not contact, at their lower surfaces, the silicon oxide layer 12*a*.

Thus, the p-type semiconductor (well) region 39 includes a plurality of n-channel MOS transistors which are provided on the silicon oxide layer 12*a*. To these n-channel MOS transistors there can be applied a backgate bias, because a p+-type impurity region 34 is provided in the p-type semiconductor region 39. Also, the n-type semiconductor (well) region 40 includes a plurality of p-channel MOS transistors which are provided on the silicon oxide layer 12*a*. To these p-channel MOS transistors there can be applied a backgate bias, because an n+-type impurity region 35 is provided in the n-type semiconductor region 40.

An input protecting circuit can be formed in one of the element regions provided on the silicon oxide layer 12*a*. The input protecting circuit comprises, for example, a diode. More correctly, it comprises an n-type impurity region 41 and an n+-type impurity region 42. The impurity region 41 is formed in the p-type semiconductor region 39, and the impurity region 42 is formed in the impurity region 41. The $n^-$-type impurity region 41 can be made thick enough to impart an adequate sheet resistance to the input protecting circuit.

The DRAM shown in FIGS. 65 and 66 can be manufactured by the same method as the DRAM illustrated in FIGS. 28 to 30.

The DRAM, i.e., a semiconductor device which is the second embodiment of the third aspect of this invention, is characterized three respects. First, its memory cell section has high integration density, consumes but a little power, and scarcely makes soft error, and has MOS transistors to which a back-gate bias can be applied. Furthermore, in the peripheral circuit section, a back-gate bias can be applied to some of the MOS transistors, and the junction capacitance of the other MOS transistor to which no back-gate bias needs to be applied can be reduced. Moreover, the performance of the input protecting circuit can be improved.

Figure 67:
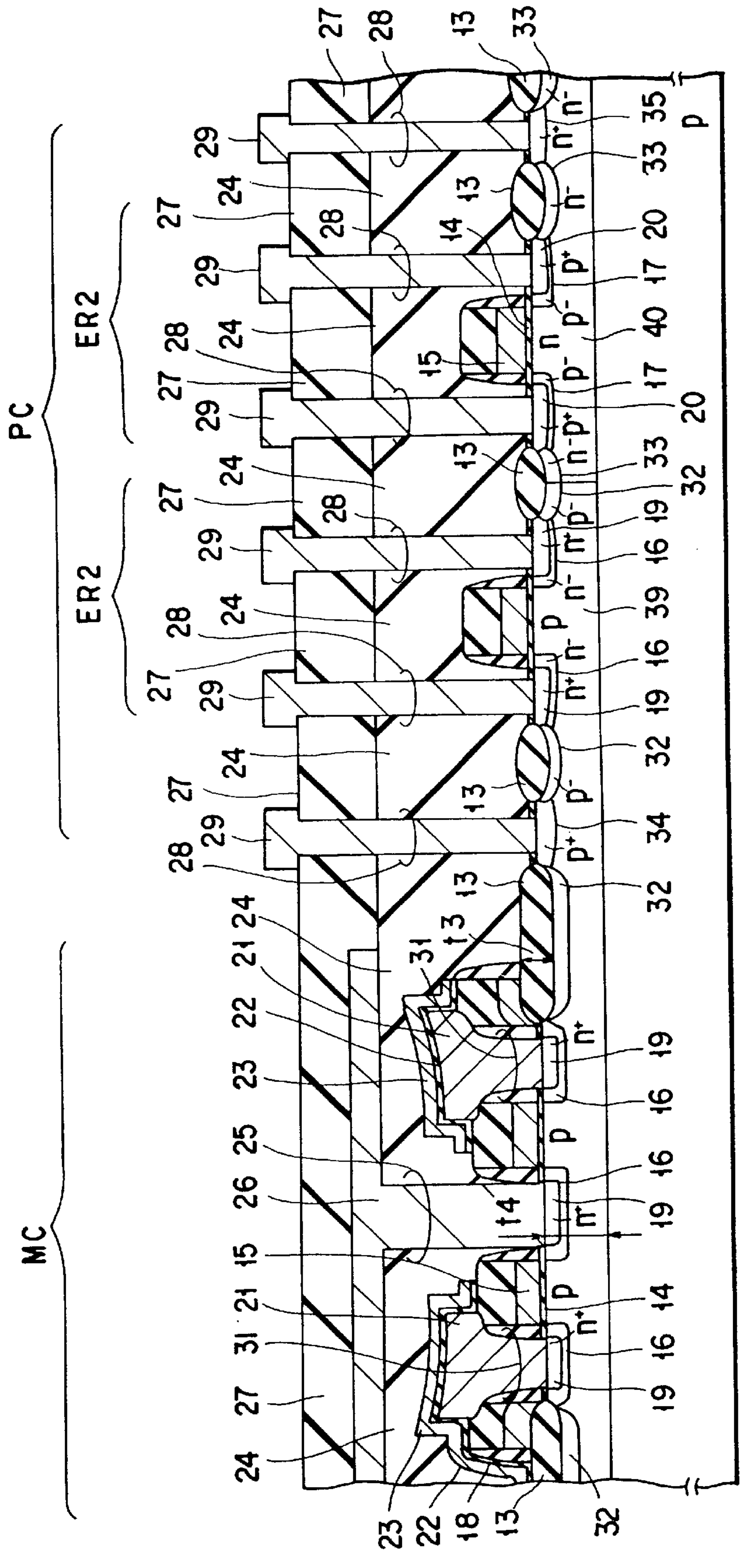
FIG. 67 is a sectional view showing both the memory cell section and the peripheral circuit section of a DRAM according to a third embodiment of the third aspect of the invention.
Figure 68:
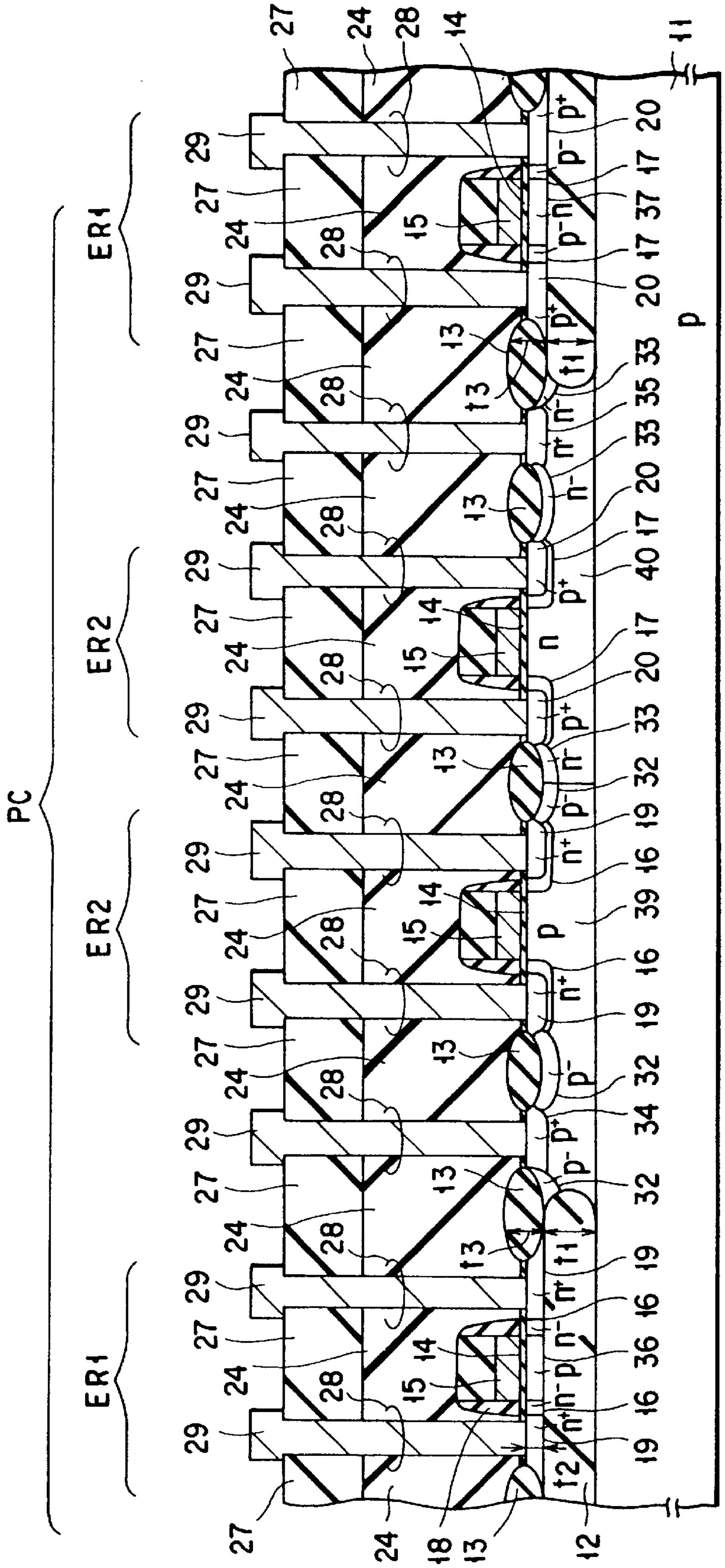
FIG. 68 is a sectional view showing the peripheral circuit section of the DRAM which is the third embodiment of the third aspect of the invention.

FIGS. 67 and 68 show a DRAM according to the third embodiment according to the third aspect of the present invention. The DRAM has a memory cell section MC and a peripheral circuit section PC.

The memory cell section MC will be first described, with reference to FIG. 67.

As shown in FIG. 67, a p-type semiconductor region (p-type well region) 39 is formed in the surface of a p-type silicon substrate 11. The region 39 is provided in the entire memory cell section MC and has a thickness of, for example, about 0.4 μm.

A field oxide film 13 having a prescribed thickness t3 (e.g., about 0.2 μm) is formed on the p-type semiconductor region 39. The element regions of the memory cell section MC are electrically connected by a p-type semiconductor region 36, though they are surrounded by the field oxide film 13.

Two memory cells are provided in each element region. Each memory cell has one MOS transistor and one capacitor. The MOS transistor has a gate electrode 15, source and drain regions 19 and low impurity concentration regions 16. A gate insulating film 14 is interposed between the gate electrode 15 and the semiconductor region 36. The two memory cells share a drain region 19.

The capacitor of each memory cell has a storage node 21, a capacitor insulating film 22 and a plate electrode 23. The storage node 21 extends through a contact hole 31 and contacts the source region of the MOS transistor. The plate electrode 23 covers the silicon substrate 11; it has an opening located above the drain region 19 common to the two memory cells formed in each element region.

Bit lines 26 are connected to the drain regions of the MOS transistors. The bit lines 26 extend straight, intersecting at right angles to the word lines (i.e., the gate electrodes 15 of the MOS transistors.

The p-type semiconductor region 39 of the memory cell section MC is very thin. Therefore, soft error is hardly made in the memory cell section MC. Since the possibility of soft error is low, it is easy to impart a sufficient capacitance to the capacitor. Even if the capacitor of each memory cell is of stacked structure, it can be so thin that the silicon substrate has, if any, low stepped portions on its surface.

The peripheral circuit section PC will be described, with reference to FIGS. 67 and 68.

As shown in FIGS. 67 and 68, a plate-shaped silicon oxide layer 12 having a prescribed thickness t.1. (e.g., about 0.4 μm) is formed in the surface of the p-type silicon substrate 11.

The upper surface of the silicon oxide layer 12 is parallel to that of the silicon substrate 11 and located at a predetermined depth t2 (e.g., about 0.1 μm) from the upper surface of the substrate 11. Hence, the substrate 11 includes silicon layers (element regions) which are provided on the silicon oxide layer 12 and which have a thickness of t2. A field oxide film 13 having a prescribed thickness t3 (e.g., about 0.2 μm) is formed on the silicon oxide layer 12. Namely, the film 13 contacts the silicon oxide layer 12. Thus, the peripheral circuit section PC has two types of element regions.

The element regions ER1 of the first type are isolated from one another, completely surrounded by the silicon oxide film 12 and the field oxide film 13. Provided in the element region ER1 are MOS transistors to which a back-gate bias need not be applied.

The element regions ER2 of the second type are surrounded by the field oxide film 13. Some of the element regions ER2 are provided in a p-type semiconductor region 39. The remaining element regions ER2 are provided in an n-type semiconductor region 40. Provided in the element regions ER2 are MOS transistors to which a back-gate bias must be applied and which constitute sense amplifiers, DQ-line driving circuits and operational amplifiers.

A $p^-$-type impurity region 32 and an n-type impurity region 33 are provided near the lower surface of the field oxide film 13 formed on the silicon oxide layer 12. Both impurity regions 32 and 33 are used as channel stoppers. The impurity region 33 can be dispensed with.

In some of the element regions provided on the silicon oxide layer 12, there are provided n-channel MOS transistors. In the remaining element regions formed on the silicon oxide layer 12, there are provided p-channel MOS transistors.

Each n-channel MOS transistor has a gate electrode 15, source and drain regions 19 and low impurity concentration regions 16. A p-type semiconductor region 36 is provided right below the gate electrode 15. A gate insulating film 14 is interposed between the gate electrode 15 and the semiconductor region 36. The semiconductor region 36 contacts, at its lower surface, the silicon oxide layer 12. So do the source and drain regions 19, and low impurity concentration region 16.

Similarly, each p-channel MOS transistor has a gate electrode 15, source and drain regions 20, and low impurity concentration regions 17. An n-type semiconductor region 37 is provided right below the gate electrode 15. A gate insulating film 14 is interposed between the gate electrode 15 and the semiconductor region 37. The semiconductor region 37 contacts, at its lower surface, the silicon oxide layer 12. So do the source and drain regions 20 and low impurity concentration regions 17.

The source and drain regions 19 and low impurity concentration regions 16, of the MOS transistor provided in each element region on the silicon oxide layer 12 are very thin. Further, all components of the MOS transistor, but the channel region (the p-type semiconductor region 36) and the contact, have all sides contacting the insulating layers. Therefore, the parasitic capacitance is low, whereby the MOS transistor operates at high speed, consuming only a little power.

The MOS transistors provided in the element regions formed on the silicon oxide layer 12 are of the type to which no back-gate bias need is applied. This is because these MOS transistors are isolated from one another, completely surrounded by the silicon oxide layer 12 and the field oxide film 13.

In some of the element regions located above the silicon oxide layer 12, there are provided n-channel MOS transistors. In the remaining element regions provided above the silicon oxide layer 12, there are provided p-channel MOS transistors.

Each n-channel MOS transistor is provided in the p-type semiconductor (well) region 39. It has a gate electrode 15, source and drain regions 19, and low impurity concentration regions 16. A gate insulating film 14 is provided right below the gate electrode 15. Hence, the source and drain regions 19 and low impurity concentration regions 16, do not contact, at their lower surfaces, the silicon oxide layer **12*a***.

Similarly, each p-channel MOS transistor is provided in the n-type semiconductor (well) region 40. It has a gate electrode 15, source and drain region 20 and low impurity concentration regions 17. A gate insulating film 14 is provided right below the gate electrode 15. Hence, the source and drain regions 20 and low impurity concentration regions 17, do not contact, at their lower surfaces, the silicon oxide layer **12*a***.

Thus, the p-type semiconductor (well) region 39 includes a plurality of n-channel MOS transistors which are provided on the silicon oxide layer 12. To these n-channel MOS transistors there can be applied a backgate bias, because a p+-type impurity region 34 is provided in the p-type semiconductor region 39. Also, the n-type semiconductor (well) region 40 includes a plurality of p-channel MOS transistors which are provided on the silicon oxide layer 12. To these p-channel MOS transistors there can be applied a backgate bias, because an n+-type impurity region 35 is provided in the n-type semiconductor region 40.

A input protecting circuit can be formed in one of the element regions provided on the silicon oxide layer 12*a*. The input protecting circuit comprises, for example, a diode. More correctly, it comprises an $n^-$-type impurity region 41 and an $n^+$-type impurity region 42. The impurity region 41 is formed in the p-type semiconductor region 39, and the impurity region 42 is formed in the impurity region 41. The $n^-$-type impurity region 41 can be made thick enough to impart an adequate sheet resistance to the input protecting circuit.

The DRAM shown in FIGS. 67 and 68 can be manufactured by the same method as the DRAM illustrated in FIGS. 37 to 38.

The DRAM, i.e., a semiconductor device which is the third embodiment of the third aspect of this invention, is characterized in three respects. First, its memory cell section has high integration density, consumes but a little power, and scarcely makes soft error, and has MOS transistors to which a back-gate bias can be applied. Second, in the peripheral circuit section, a back-gate bias can be applied to some of the MOS transistors, and the junction capacitance of the other MOS transistor to which no back-gate bias needs to be applied can be reduced. Third, the performance of the input protecting circuit can be improved.

Figure 69:
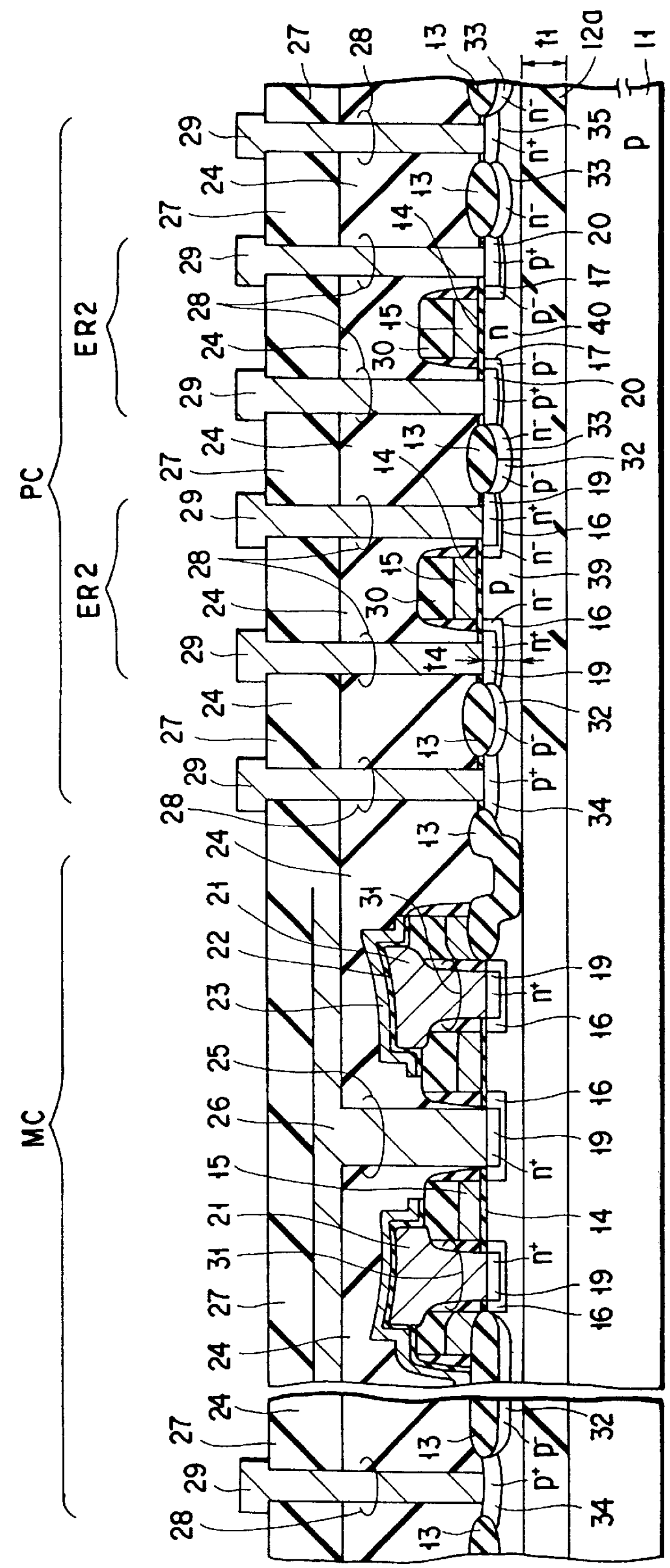
FIG. 69 is a sectional view showing both the memory cell section and the peripheral circuit section of a DRAM according to a fourth embodiment of the third aspect of the invention.
Figure 70:
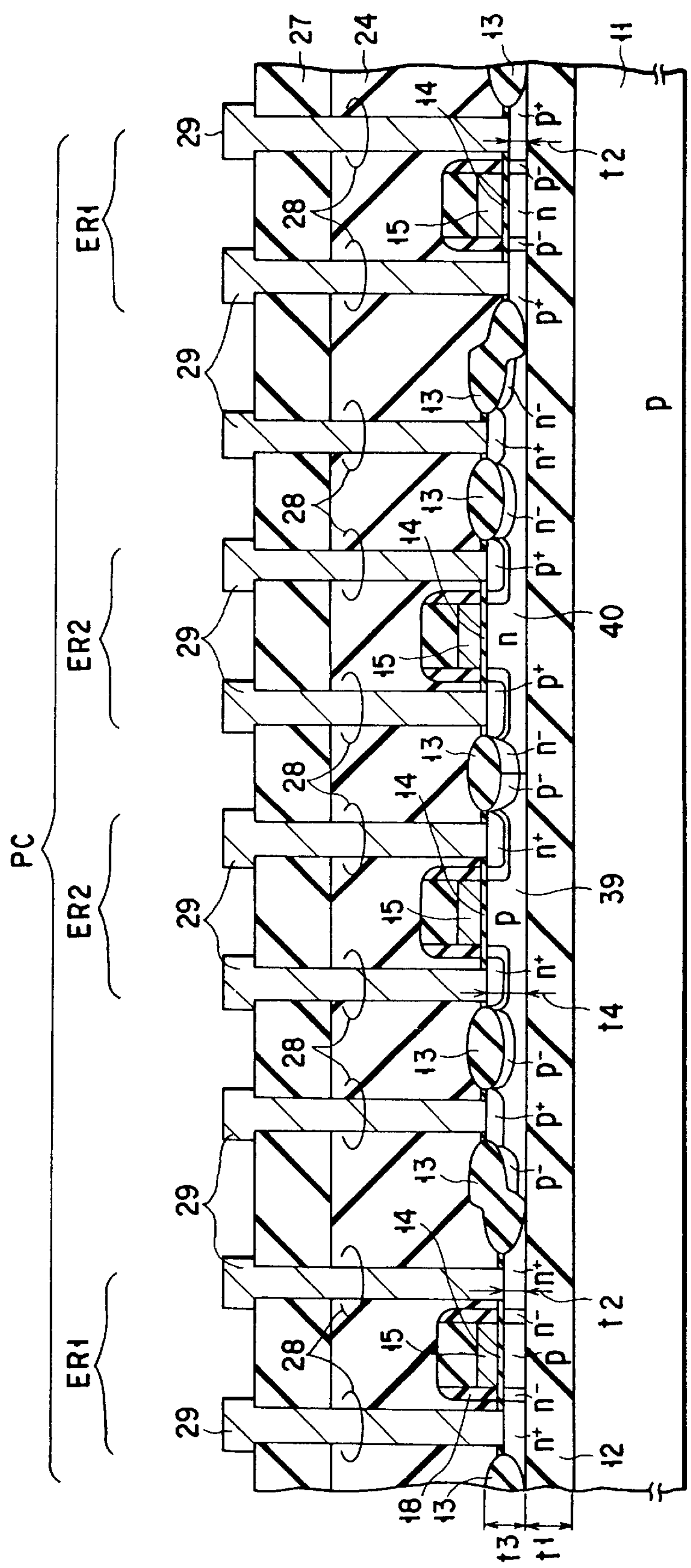
FIG. 70 is a sectional view showing the peripheral circuit section of the DRAM which is the fourth embodiment of the third aspect of the invention.

FIGS. 69 and 70 show a DRAM according to the fourth embodiment according to the third aspect of the present invention. The DRAM has a memory cell section MC and a peripheral circuit section PC.

The memory cell section MC will be first described, with reference to FIG. 69.

As shown in FIG. 69, a plate-shaped silicon oxide layer 12 having a thickness t.1. (e.g., about 0.4 μm) is formed in a p-type silicon substrate 11. The silicon oxide layer 12 is provided in the entire memory cell section MC. The upper surface of the layer 12 is parallel to the surface of the silicon substrate 11 and located at a predetermined depth t4 (e.g., about 0.25 μm). This means that the substrate 11 includes silicon layers (element regions) which are provided on the silicon oxide layer 12 and which have a thickness of t4.

A field oxide film 13 having a prescribed thickness t3 (e.g., about 0.2 μm) is formed above the silicon oxide layer 12. The film 13 therefore does not contact the silicon oxide layer 12. The element regions of the memory cell section MC are electrically connected by a p-type semiconductor region 36, though they are surrounded by the filed oxide film 13.

Two memory cells are provided in each element region. Each memory cell has one MOS transistor and one capacitor. The MOS transistor has a gate electrode 15, source and drain region 19, and low impurity concentration regions 16. A gate insulating film 14 is interposed between the gate electrode 15 and the semiconductor region 36. The gate electrode 15, source and drain regions 19, and low impurity concentration regions 16, do not contact, at their lower surfaces, the silicon oxide layer 12. The two memory cells share a drain region 19.

The capacitor of each memory cell has a storage node 21, a capacitor insulating film 22 and a plate electrode 23. The storage node 21 extends through a contact hole 31 and contacts the source region of the MOS transistor. The plate electrode 23 covers the silicon substrate 11; it has an opening located above the drain region 19, common to the two memory cells formed in each element region.

Bit lines 26 are connected to the drain regions of the MOS transistors. The bit lines 26 extend straight, intersecting at right angles to the word lines (i.e., the gate electrodes 15 of the MOS transistors.

The p-type semiconductor region 39 of the memory cell section MC is very thin. Therefore, soft error is hardly made in the memory cell section MC. Because of the low possibility of soft error, it is easy to impart a sufficient capacitance to the capacitor. Hence, the capacitor of each memory cell can be so thin that-the silicon substrate has but low stepped portions on its surface, even if the capacitor of each memory cell is of stacked structure.

The peripheral circuit section PC will be described, with reference to FIGS. 69 and 70.

As shown in FIGS. 69 and 70, a plate-shaped silicon oxide layer 12 having a prescribed thickness t.1. (e.g., about 0.4 μm) is formed in the p-type silicon substrate 11. The silicon oxide layer 12 formed in the peripheral circuit section PC is formed in the same plane as the silicon oxide layer 12, provided in the memory cell section MC.

The upper surface of the silicon oxide layer 12 is parallel to that of the silicon substrate 11 and located at a predetermined depth t4 (e.g., about 0.25 μm) from the upper surface of the substrate 11. Hence, the substrate 11 includes silicon layers (element regions) which are provided on the silicon oxide layer 12 and which have a thickness of t4.

Some of the silicon layers (element regions) in the peripheral circuit section PC have their upper surfaces located above the upper surfaces of the silicon layers (element regions) provided in the memory cell section MC. The upper surfaces of the remaining silicon layers in the section PC have their upper surfaces located in the same plane as the upper surfaces of the silicon layers provided in the memory cell section MC.

A field oxide film 13 having a prescribed thickness t3 (e.g., about 0.2 μm) is formed on the silicon oxide layer 12. A part of the film 13 contacts the silicon oxide layer 12, and the remaining part of the film 13 does not contact the silicon oxide layer 12*a*.

Therefore, the peripheral circuit section PC has two types of element regions.

The element regions ERI of the first type are isolated from one another, completely surrounded by the silicon oxide film 12 and the field oxide film 13. Provided in the element region ER1 are MOS transistors to which a back-gate bias need not be applied.

The element regions ER2 of the second type are surrounded by the field oxide film 13. Some of the element regions ER2 are provided in a p-type semiconductor region 39. The remaining element regions ER2 are provided in an n-type semiconductor region 40. Provided in the element regions ER2 are MOS transistors to which a back-gate bias must be applied and which constitute sense amplifiers, DQ-line driving circuits and operational amplifiers.

A $p^-$-type impurity region 32 and an $n^-$-type impurity region 33 are provided near the lower surface of the field oxide film 13 formed on the silicon oxide layer 12. Both impurity regions 32 and 33 are used as channel stoppers. The impurity region 33 can be dispensed with.

In some of the element regions completely surrounded by the silicon oxide layer 12 and the field oxide film 13, there are provided n-channel MOS transistors. In the remaining element regions formed on the silicon oxide layer 12, there are provided p-channel MOS transistors.

Each n-channel MOS transistor has a gate electrode 15, source and drain regions 19, and low impurity concentration regions 16. A p-type semiconductor region 36 is provided right below the gate electrode 15. A gate insulating film 14 is interposed between the gate electrode 15 and the semiconductor region 36. The semiconductor region 36 contacts, at its lower surface, the silicon oxide layer 12. So do the source and drain regions 19, and low impurity concentration regions 16.

Similarly, each p-channel MOS transistor has a gate electrode 15, source and drain regions 20, and low impurity concentration regions 17. An n-type semiconductor region 37 is provided right below the gate electrode 15. A gate insulating film 14 is interposed between the gate electrode 15 and the semiconductor region 37. The semiconductor region 37 contacts, at its lower surface, the silicon oxide layer 12. So do the source and drain regions 20 and low impurity concentration regions 17.

The source and drain regions 19 and low impurity concentration regions 16 of the MOS transistor provided in each element region on the silicon oxide layer 12 are very thin. Further, all components of the MOS transistor, but the channel region (the p-type semiconductor region 36) and the contact, have all sides contacting the insulating layers. Therefore, the parasitic capacitance is low, whereby the MOS transistor operates at high speed, consuming only a little power.

The MOS transistors completely surrounded by the silicon oxide layer 12 and the field oxide film 13 are of the type to which no back-gate bias need is applied to them. This is because these MOS transistors are isolated from one another, completely surrounded by the silicon oxide layer 12 and the field oxide film 13.

In some of the element regions located above the silicon oxide layer 12, there are provided n-channel MOS transistors. In the remaining element regions provided above the silicon oxide layer 12, there are provided p-channel MOS transistors.

Each n-channel MOS transistor is provided in the p-type semiconductor (well) region 39. It has a gate electrode 15, source and drain regions 19 and low impurity concentration regions 16. A gate insulating film 14 is provided right below the gate electrode 15. Hence, the source and drain region 19 and low impurity concentration regions 16, do not contact, at their lower surfaces, the silicon oxide layer 12.

Similarly, each p-channel MOS transistor is provided in the n-type semiconductor (well) region 40. It has a gate electrode 15, source and drain region 20 and low impurity concentration regions 17. A gate insulating film 14 is provided right below the gate electrode 15. Hence, the source and drain regions 20 and low impurity concentration regions 17, do not contact, at their lower surfaces, the silicon oxide layer 12.

Thus, the p-type semiconductor (well) region 39 includes a plurality of n-channel MOS transistors which are provided on the silicon oxide layer 12. To these n-channel MOS transistors there can be applied a backgate bias, because a p+-type impurity region 34 is provided in the p-type semiconductor region 39. Also, the n-type semiconductor (well) region 40 includes a plurality of p-channel MOS transistors which are provided on the silicon oxide layer 12. To these p-channel MOS transistors there can be applied a backgate bias, because an n+-type impurity region 35 is provided in the n-type semiconductor region 40.

An input protecting circuit can be formed in one of the element regions surrounded by the field oxide film 13 only. The input protecting circuit comprises, for example, a diode. More correctly, it comprises an $n^-$-type impurity region 41 and an $n^+$-type impurity region 42. The impurity region 41 is formed in the p-type semiconductor region 39, and the impurity region 42 is formed in the impurity region 41. The $n^-$-type impurity region 41 can be made thick enough to impart an adequate sheet resistance to the input protecting circuit.

The DRAM shown in FIGS. 69 and 70 can be manufactured by the same method as the DRAM illustrated in FIGS. 44 to 46.

The DRAM, i.e., a semiconductor device which is the fourth embodiment of the third aspect of this invention, is characterized in three respects. First, its memory cell section has high integration density, consumes but a little power, and scarcely makes soft error, and has MOS transistors to which a back-gate bias can be applied. Second, in the peripheral circuit section, a back-gate bias can be applied to some of the MOS transistors, and the junction capacitance of the other MOS transistor to which no back-gate bias needs to be applied can be reduced. Third, the performance of the input protecting circuit can be improved.

Fourth Aspect of the Invention

Semiconductor devices according to the fourth aspect of the present invention will be described. These are semiconductor devices each having an STI (Shallow Trench Isolation) substrate in which elements are isolated by trenches.

Figure 71:
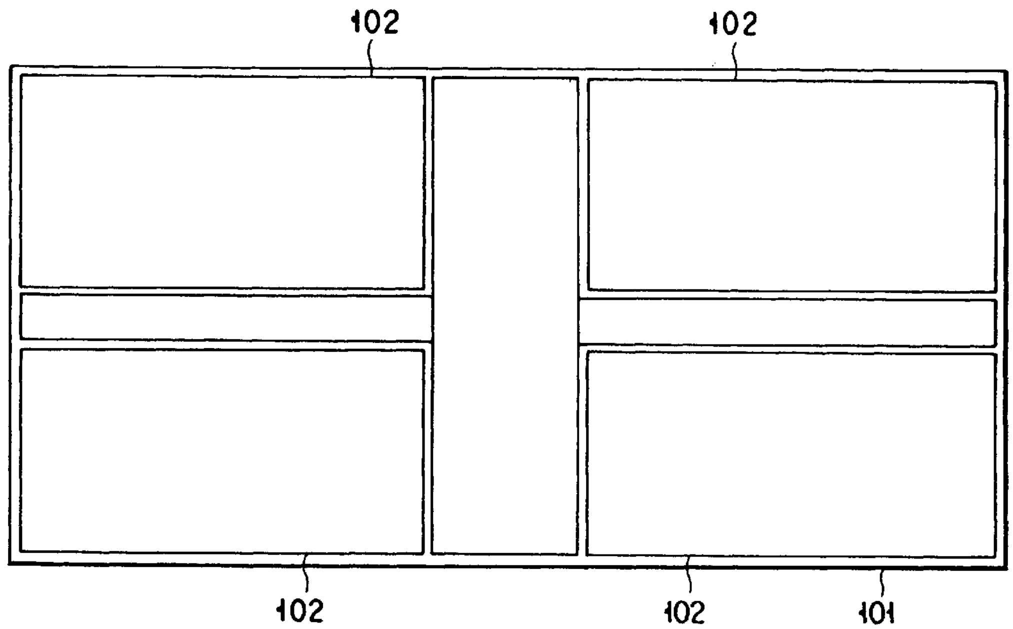
FIG. 71 is a plan view illustrating a DRAM according to a fourth aspect of this invention.
Figure 72:
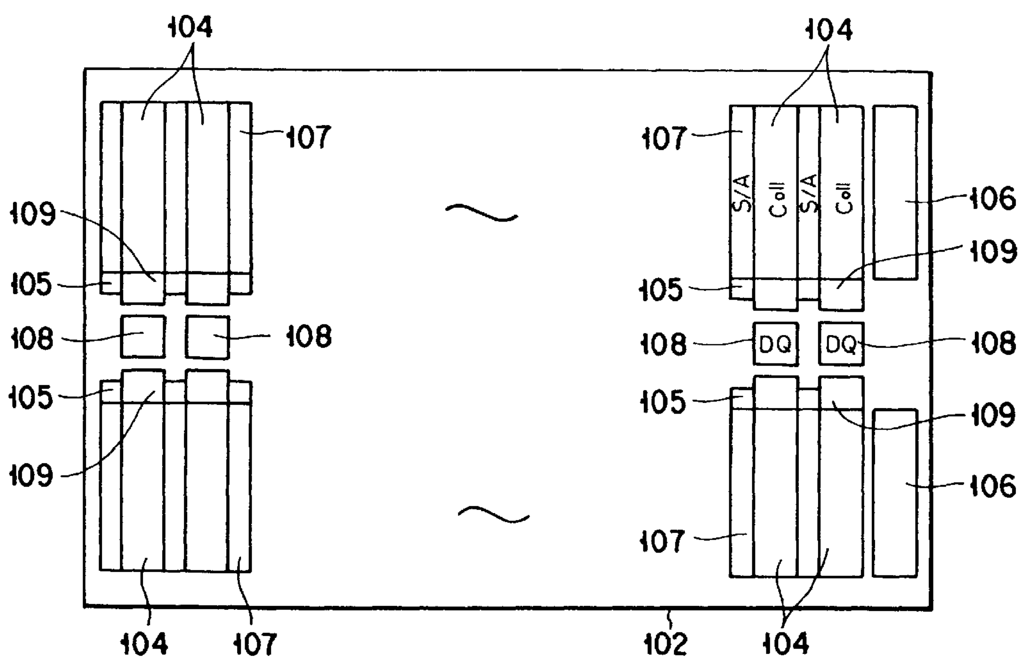
FIG. 72 is a plan view showing in detail the core block 102 shown in FIG. 71.
Figure 73:
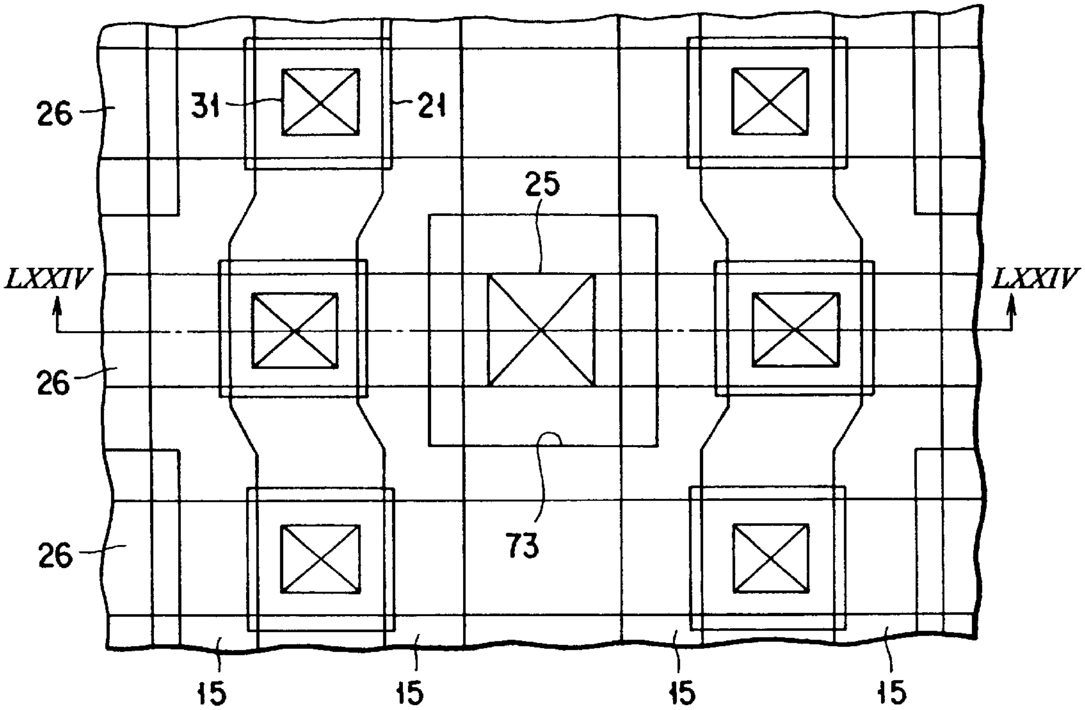
FIG. 73 is a plan view illustrating in detail the memory cell section of the DRAM shown in FIG. 71.
Figure 74:
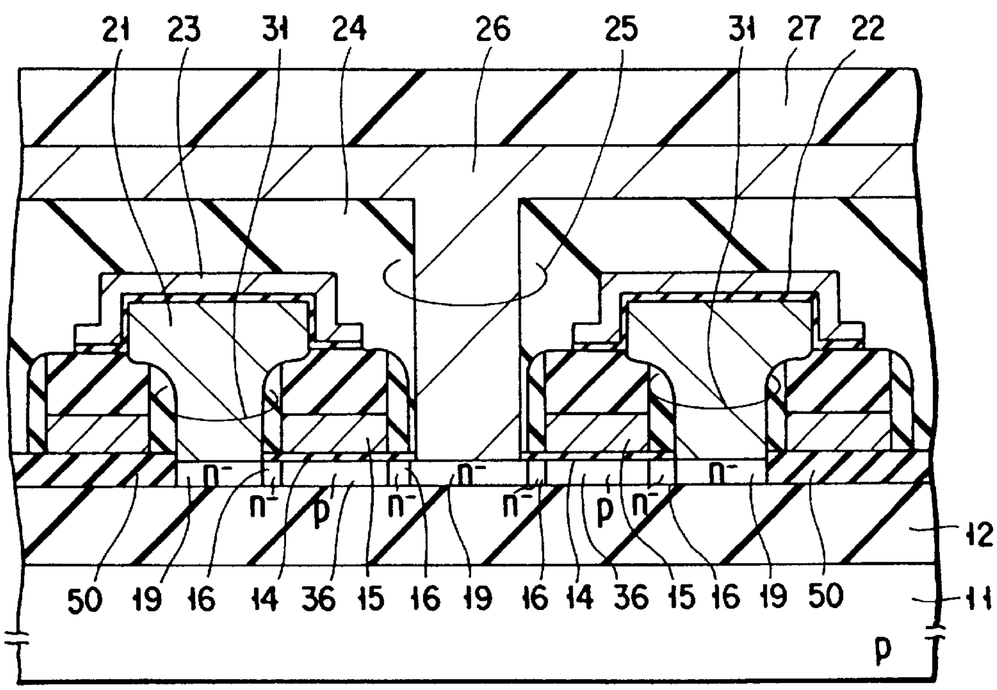
FIG. 74 is a sectional view taken along line LXXIV—LXXIV in FIG. 73.
Figure 75:
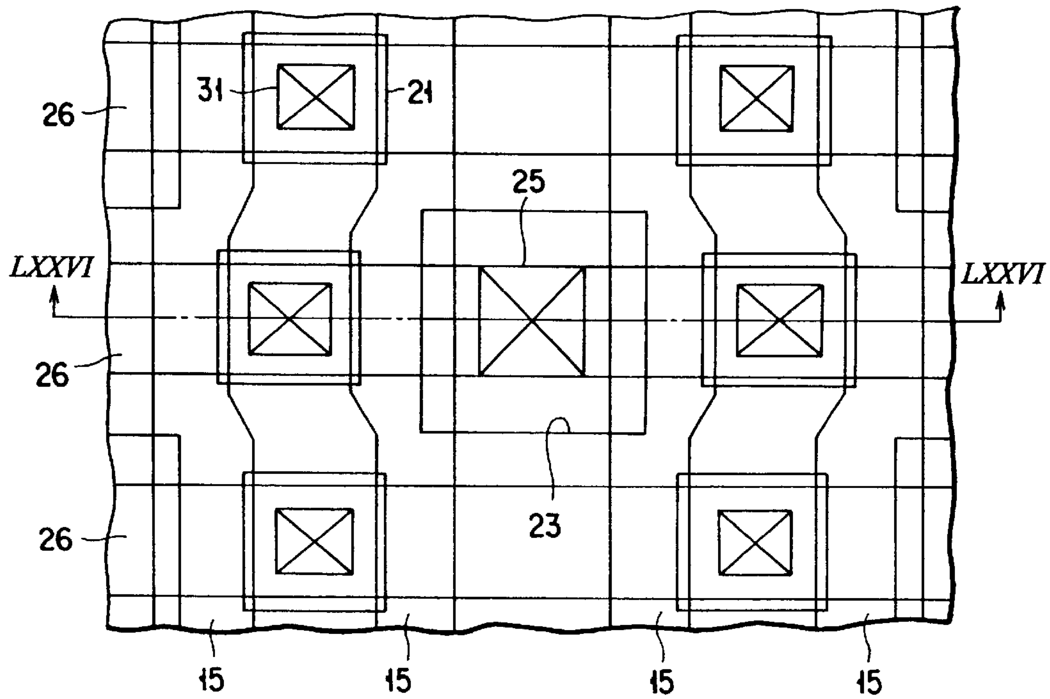
FIG. 75 is a plan view illustrating in detail the memory cell section of the DRAM shown in FIGS. 71 and 72.
Figure 76:
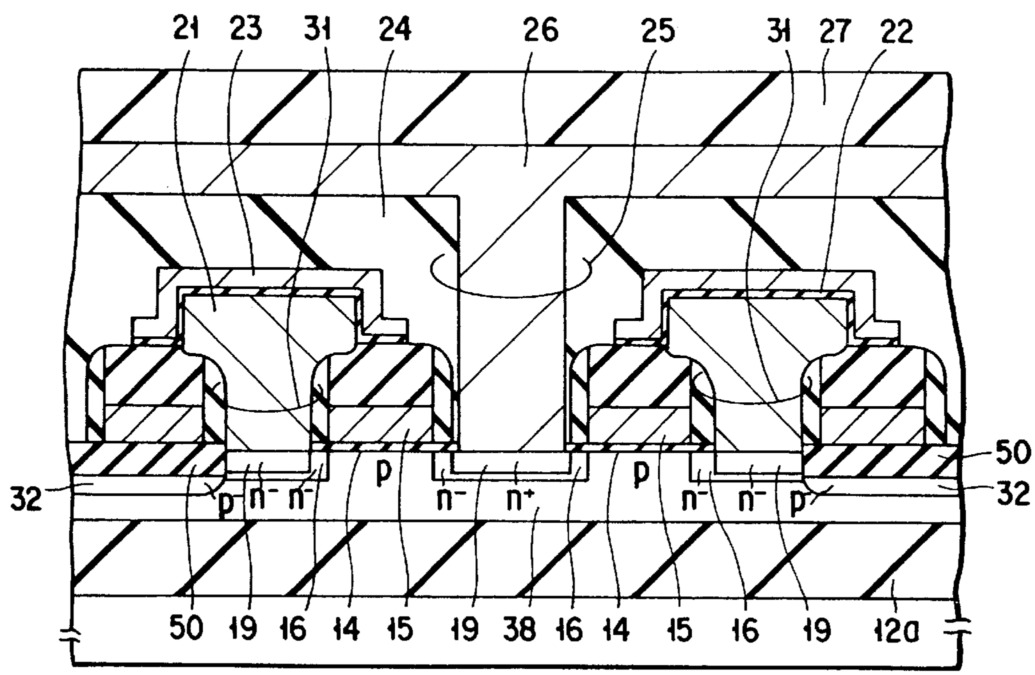
FIG. 76 is a sectional view taken along line LXXVI—LXXVI in FIG. 75.
Figure 79:
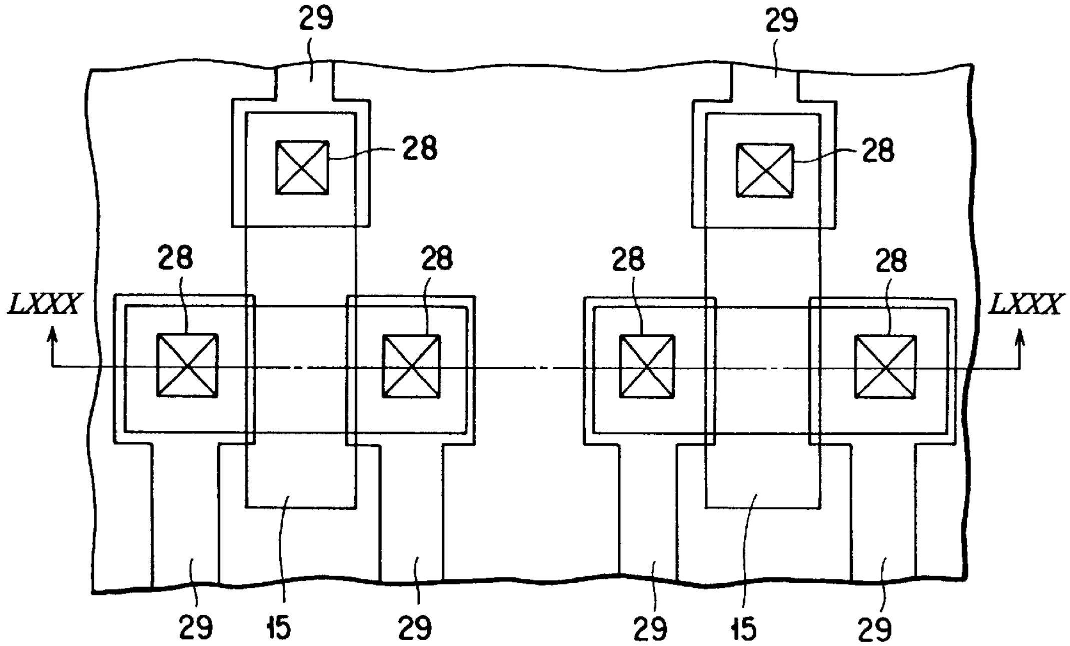
FIG. 79 is another plan view showing in detail the peripheral circuit section of the DRAM shown in FIGS. 71 and 72.
Figure 80:
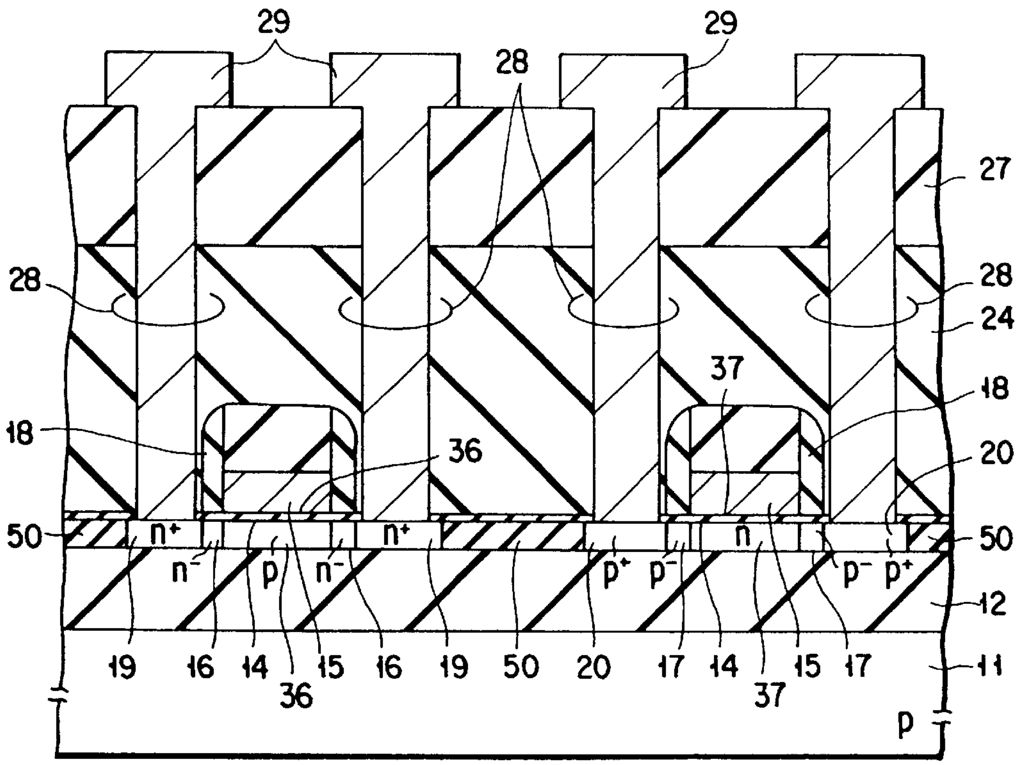
FIG. 80 is a sectional view taken along line LXXX—LXXX in FIG. 79.

FIGS. 71 to 80 show a 64 mega bits (MB) DRAM according to the first embodiment according to the fourth aspect of the present invention. More precisely, FIG. 71 is a floor plan of the 64 MB DRAM, and FIG. 72 is a detailed floor plan view of one of the 16 MB core blocks shown in FIG. 71. FIGS. 73 to 76 illustrate in detail the memory cell section of the memory cell section of the DRAM. Of these figures, FIG. 74 is a sectional view taken along line LXXIV—LXXIV in FIG. 73, and FIG. 76 is a sectional view taken along line LXXVI—LXXVI in FIG. 75. FIGS. 77 to 80 show in detail the peripheral circuit section of the DRAM. Of these figures, FIG. 78 is a sectional view taken along line LXXVIII—LXXVIII in FIG. 77, and FIG. 80 is a sectional view taken along line LXXX—LXXX in FIG. 79.

As shown in FIG. 71, the 64 MB DRAM comprises four core blocks 102 and a peripheral circuit section 103, all provided on a semiconductor chip 101. The section 103 includes an I/O (Input/Output) buffer, a back-gate bias generating circuit, input/output pads and the like. As seen from FIG. 72, each core block 102 is comprised of a memory cell section 104 and a peripheral circuit PC. (The section 104 includes redundant memory cells.) The peripheral circuit section PC includes a row decoder 105, a column decoder 106, a sense amplifier 107, a DQ buffer 108 and a redundant circuit 109. (The DQ buffer 108 includes a circuit for driving the DQ line.)

The memory cell section MC will be described in detail, with reference to FIGS. 73 and 74.

As shown in FIG. 74, a plate-shaped silicon oxide layer 12, having a prescribed thickness t.1. (e.g., about 0.4 μm) is formed in a p-type silicon substrate 11. The layer 12 is provided in the entire memory cell section. The upper surface of the layer 12 is parallel to that of the silicon substrate 11 and located at a predetermined depth t2 (e.g., about 0.1 μm) from the upper surface of the substrate 11. This means that the substrate 11 includes a silicon layer (element regions) which is provided on the silicon oxide layer 12 and which has a thickness of t2.

An oxide film 50 having a prescribed thickness t3 (e.g., 0.2 μm) is formed on the silicon oxide layer 12. That is, the film 50 contacts the silicon oxide layer 12. Thus, the element regions of the memory cell section MC are completely surrounded by the silicon oxide layer 12 and the oxide film 50.

The oxide film 50 is buried in the trenches made in the semiconductor region provided on the silicon oxide layer 12. The film 50 is buried such that its upper surface is in the same plane as the upper surface of the silicon oxide layer 12. In other words, the silicon oxide layer 12 and the oxide film 50 define a flat surface. This renders it easy to form memory cells.

In respect of other features, the memory cell section MC shown in FIGS. 73 and 74 is identical to the memory cells section of the DRAM illustrated in FIGS. 15 and 16.

Since the element regions in which memory cells are provided are completely surrounded by the insulating layers, the parasitic capacitance of the source and drain of any MOS transistor provided in the element regions is low. Hence, the MOS transistor operates at high speed as switching element. In addition, since the element regions are very thin, soft error is hardly made in the memory cell section MC. Since the possibility of soft error is low, it is easy to impart a sufficient capacitance to the capacitor of each memory cell. Having a sufficient capacitance, the capacitor is thin, whereby silicon substrate has but low stepped portions on its surface even if the capacitor is of stacked structure.

FIGS. 75 and 76 show a memory cell section MC of another type. As shown in FIGS. 75 and 76, a plate-shaped silicon oxide layer 12*a* having a thickness t.1. (e.g., about 0.4 $\mu$m) is formed in a p-type silicon substrate 11. The silicon oxide layer 12*a* is provided in the entire memory cell section MC. The upper surface of the layer 12*a* is parallel to the surface of the silicon substrate 11 and located at a predetermined depth t4 (e.g., about 0.25 $\mu$m). Thus, the substrate 11 includes silicon layers (i.e., element regions) which are provided on the silicon oxide layer 12*a* and which have a thickness of t4.

An oxide film 50 having a prescribed thickness t3 (e.g., 0.2 $\mu$m) is formed in the surface of the silicon substrate 11 and located above the silicon oxide layer 12*a*. That is, the film 50 does not contact the silicon oxide layer 12. A $p^-$-type impurity region 32 is provided right below the oxide film 50. The impurity region 32 functions as a channel stop. The oxide film 50 surrounds the element regions provided in the memory cell section MC. Nonetheless, the element regions are electrically connected by a p-type semiconductor region 38.

The oxide film 50 is buried in the trenches made in the p-type semiconductor region 38 provided on the silicon oxide layer 12*a*. The film 50 is buried such that its upper surface is in the same plane as the upper surface of the p-type semiconductor region 38 provided on the silicon oxide layer 12*a*. In other words, the semiconductor region 38 and the oxide film 50 define a flat surface. This makes it easy to form memory cells.

In respect of other features, the memory cell section MC shown in FIGS. 75 and 76 is identical to the memory cells section of the DRAM illustrated in FIGS. 15 and 16.

The element regions are very thin. Therefore, soft error is hardly made in the memory cell section MC shown in FIGS. 75 and 76. Thanks to the low possibility of soft error, it is easy to impart a sufficient capacitance to the capacitor of each memory cell. Having a sufficient capacitance, the capacitor can be thin. Hence, the silicon substrate has but low stepped portions on its surface, even if the capacitor is of stacked structure.

The peripheral circuit section PC will be described, with reference to FIGS. 77 to 80.

As shown in FIGS. 77 to 80, plate-shaped silicon oxide layers 12 and 12*a* having a prescribed thickness t.1. (e.g., about 0.4 $\mu$m) are formed in the p-type silicon substrate 11. The upper surface of the silicon oxide layer 12 is parallel to that of the silicon substrate 11 and located at a predetermined depth t2 (e.g., about 0.1 $\mu$m) from the upper surface of the substrate 11. Hence, the substrate 11 includes silicon layers (element regions) which are provided on the silicon oxide layer 12 and which have a thickness of t2.

The upper surface of the silicon oxide layer 12*a* is parallel to that of the silicon substrate 11 and located at a predetermined depth t4 (e.g., about 0.25 $\mu$m) from the upper surface of the substrate 11. This means that the substrate 11 includes silicon layers (element regions) which are provided on the layer 12*a* and which have a thickness of t4.

An oxide film 50 having a prescribed thickness t3 (e.g., about 0.2 $\mu$m) is formed on the silicon oxide layer 12 and above the silicon oxide layer 12*a*. In other words, the film 50 contacts the silicon oxide layer 12 and does not contact the silicon oxide layer 12*a*. Thus, the peripheral circuit section PC has two types of element regions.

The element regions ER1 of the first type are isolated from one another, completely surrounded by the silicon oxide film 12 and the oxide film 50. Provided in the element region ER1 are MOS transistors to which a back-gate bias need not be applied.

The element regions ER2 of the second type are surrounded by the oxide film 50. Some of the element regions ER2 are provided in a p-type semiconductor (well) region 39. The remaining element regions ER2 are provided in an n-type semiconductor (well) region 40. Provided in the element regions ER2 are MOS transistors to which a back-gate bias must be applied and which constitute sense amplifiers, DQ-Line driving circuits and operational amplifiers.

A $p^-$-type impurity region 32 and an $n^-$-type impurity region 33 are provided near the lower surface of the oxide film 50 formed above the silicon oxide layer 12*a*. Both impurity regions 32 and 33 are used as channel stoppers. The impurity region 33 can be dispensed with.

In some of the element regions provided on the silicon oxide layer 12, there are provided n-channel channel MOS transistors. In the remaining element regions formed on the silicon oxide layer 12, there are provided p-channel MOS transistors.

Each n-channel MOS transistor has a gate electrode 15, source and drain regions 19, and low impurity concentration regions 16. A p-type semiconductor region 36 is provided right below the gate electrode 15. A gate insulating film 14 is interposed between the gate electrode 15 and the semiconductor region 36. The semiconductor region 36 contacts, at its lower surface, the silicon oxide layer 12. So do the source and drain regions 19 and low impurity concentration regions 16.

Similarly, each p-channel MOS transistor has a gate electrode 15, source and drain regions 20 and low impurity concentration regions 17. An n-type semiconductor region 37 is provided right below the gate electrode 15. A gate insulating film 14 is interposed between the gate electrode 15 and the semiconductor region 37. The semiconductor region 37 contacts, at its lower surface, the silicon oxide layer 12. So do the source and drain regions 20 and low impurity concentration regions 17.

The source and drain regions 19 and low impurity concentration regions 16 of the MOS transistor provided in each element region on the silicon oxide layer 12 are very thin. Further, all components of the MOS transistor, but the channel region (the p-type semiconductor region 36) and the contact, have all sides contacting the insulating layers. Therefore, the parasitic capacitance is low, whereby the MOS transistor operates at high speed, consuming only a little power.

The MOS transistors provided in the element regions formed on the silicon oxide layer 12 are of the type to which no back-gate bias need be applied. This is because these MOS transistors are surrounded by the insulating layer and, hence, isolated from one another.

In some of the element regions provided on the silicon oxide layer 12*a*, there are provided n-channel MOS transistors. In the remaining element regions provided on the silicon oxide layer 12*a*, there are provided p-channel MOS transistors.

Each n-channel MOS transistor is provided in the p-type semiconductor (well) region 39. It has a gate electrode 15, source and drain regions 19 and low impurity concentration regions 16. A gate insulating film 14 is provided right below the gate electrode 15. Hence, the source and drain regions 19 and low impurity concentration regions 16, do not contact, at their lower surfaces, the silicon oxide layer 12*a*.

Each p-channel MOS transistor is provided in the n-type semiconductor (well) region 40. It has a gate electrode 15, source and drain regions 20 and low impurity concentration regions 17. A gate insulating film 14 is provided right below the gate electrode 15. Hence, the source and drain regions 20 and low impurity concentration regions 17, do not contact, at their lower surfaces, the silicon oxide layer 12*a*.

Thus, the p-type semiconductor (well) region 39 includes a plurality of n-channel MOS transistors which are provided on the silicon oxide layer 12*a*. To these n-channel MOS transistors there can be applied a backgate bias, because a p+-type impurity region 34 is provided in the p-type semiconductor region 39. Also, the n-type semiconductor (well) region 40 includes a plurality of p-channel MOS transistors which are provided on the silicon oxide layer 12*a*. To these p-channel MOS transistors there can be applied a back-gate bias, because an n+-type impurity region 35 is provided in the n-type semiconductor region 40.

Fifth Aspect of the Invention

A semiconductor device according to the fifth aspect of the invention will be described, with reference to FIGS. 81 and 82. This device is characterized in that the MOS transistors provided in the peripheral circuit section have their sources and drains contacting, at their lower surfaces, an insulating layer.

FIGS. 81 and 82 illustrate the device, which is a 64 mega bits (MB) DRAM. FIG. 82 is a sectional view taken along line LXXXII—LXXXII in FIG. 81. The DRAM has a floor plan identical to that shown in FIGS. 71 and 72.

As shown in FIG. 82, a plate-shaped silicon oxide layer 12 having a thickness t.1. (e.g., about 0.4 μm) is formed in a p-type silicon substrate 11. The upper surface of the layer 12 is parallel to the surface of the silicon substrate 11 and located at a predetermined depth t2 (e.g., about 0.1 μm) of the silicon substrate 11. Thus, the substrate 11 includes silicon layers (element regions) which are provided on the silicon oxide layer 12 and which have a thickness of t2.

A field oxide film 13 having a prescribed thickness t3 (e.g., about 0.2, μm) is formed on the silicon oxide layer 12. Therefore, the field oxide film 13 contacts the silicon oxide layer 12. Hence, the element regions are completely surrounded by the silicon oxide layer 12 and the field oxide film 13 and electrically isolated from one another. In these element regions there are provided MOS transistors to which a back-gate bias need not be applied.

Of these MOS transistors, each n-channel MOS transistor a gate electrode 15, source and drain regions 19 and low impurity concentration regions 16. A p-type semiconductor region 36 is provided right below the gate electrode 15. A gate insulating film 14 is interposed between the gate electrode 15 and the semiconductor region 36. The semiconductor region 36 contacts, at its lower surface, the silicon oxide layer 12. So do the source and drain regions 19 and low impurity concentration regions 16.

Similarly, each p-channel MOS transistor has a gate electrode 15, source and drain regions 20 and low impurity concentration regions 17. An n-type semiconductor region 37 is provided right below the gate electrode 15. A gate insulating film 14 is interposed between the gate electrode 15 and the semiconductor region 37. The semiconductor region 37 contacts, at its lower surface, the silicon oxide layer 12. So do the source and drain regions 20 and low impurity concentration regions 17.

The source and drain regions 19 and low impurity concentration region 16 of the MOS transistor provided in each element region on the silicon oxide layer 12 are very thin. Further, all components of the MOS transistor, but the channel region (the p-type semiconductor region 36) and the contact, have all sides contacting the insulating layers. Therefore, the parasitic capacitance is low, whereby the MOS transistor operates at high speed, consuming only a little power.

Contact holes 28 are filled with high-melting metal masses 52. Metal silicide layers 51 are provided between the high-melting metal masses 52 on the one hand and the source and drain regions 19 and 20 on the other hand. Further, barrier metal layers 53 are provided between the high-melting metal masses 52 on the one hand and metal wires 54 on the other.

To lower the contact resistance sufficiently it suffices to increase the thickness of the metal silicide layers 51. If made thick, the metal silicide layers 51 will not pass through the source and drain regions 19 and 20.

In the DRAM according to the fifth aspect of the invention, it is possible to reduce the contact resistance between the metal wires of the MOS transistors provided in the peripheral circuit section and the source and drain regions 19 and 20 of these MOS transistors. Furthermore, no leakage current flows in the peripheral circuit section since the metal silicide layers 51 do not pass through the source and drain regions 19 and 20.

Sixth Aspect of the Invention

A semiconductor device according to the sixth aspect of the present invention will be described. This semiconductor device is a DRAM having a SOI substrate which comprises an insulating layer and at least two silicon layers different in thickness and provided on the insulating layer.

Figure 83:
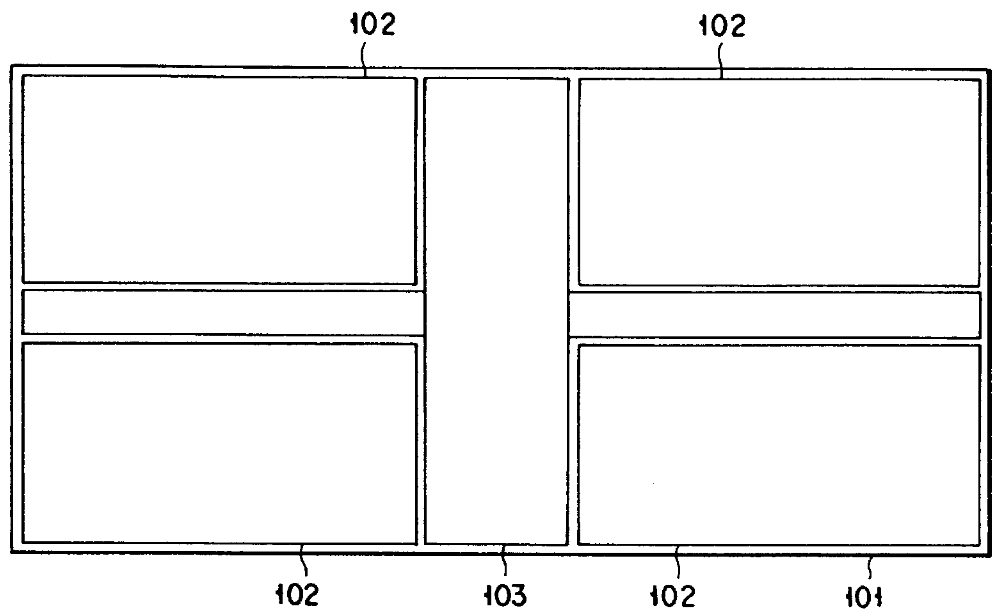
FIG. 83 is a plan view showing a DRAM according to a sixth aspect of the present invention.
Figure 84:
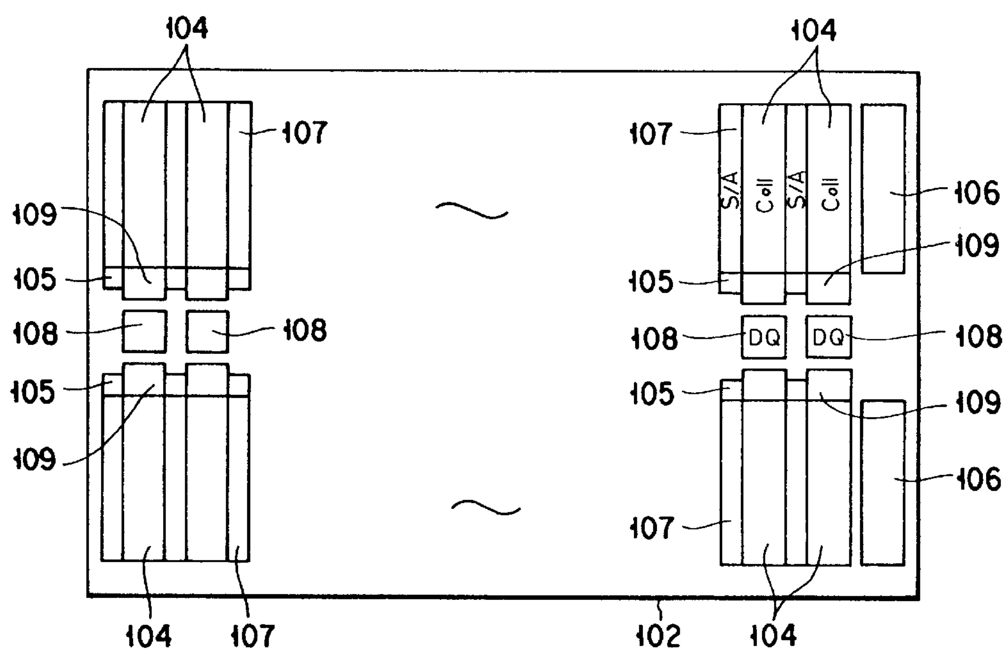
FIG. 84 is a plan view showing in detail the core block 102 shown in FIG. 83.
Figure 87:
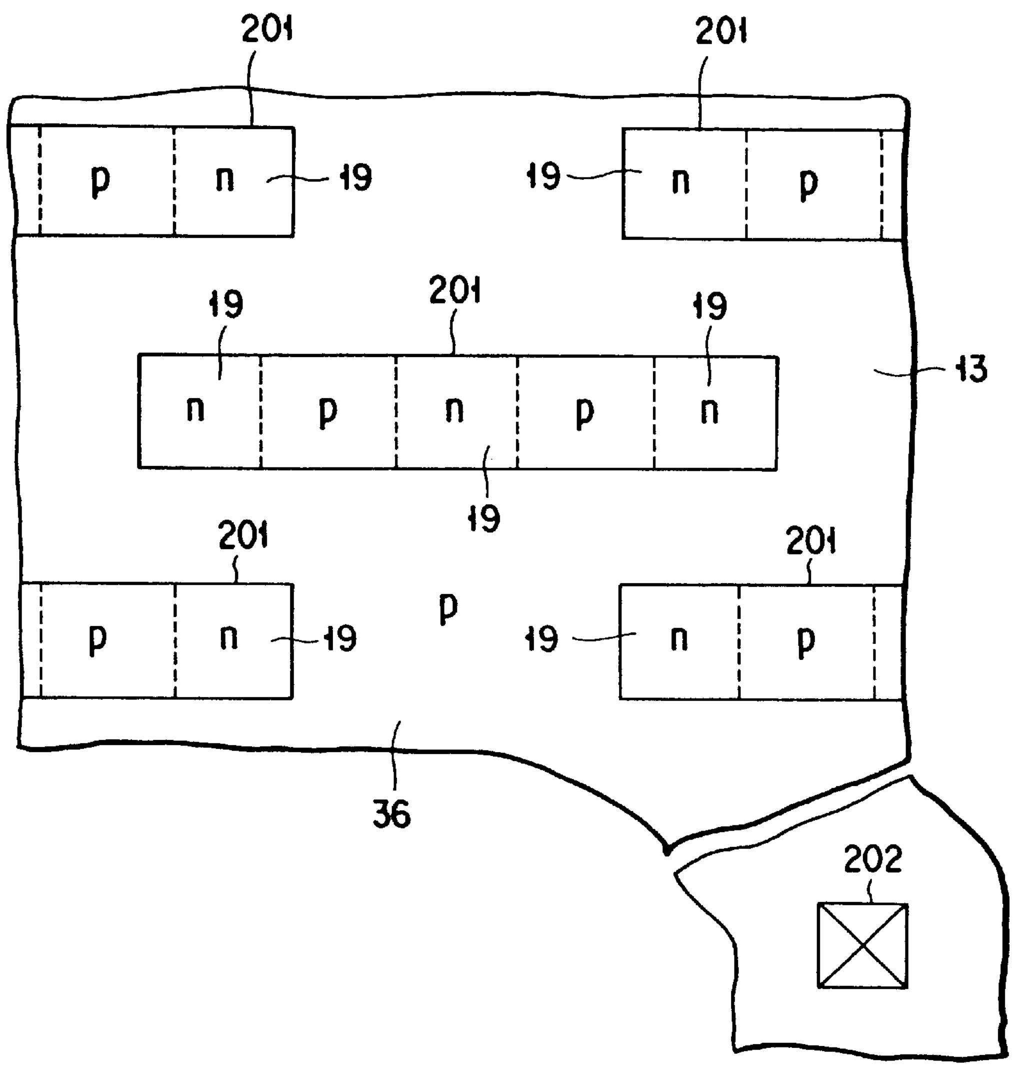
FIG. 87 is a diagram explaining how to apply a back-gate bias to the memory cell section of the DRAM shown in FIGS. 83 and 84.
Figure 88:
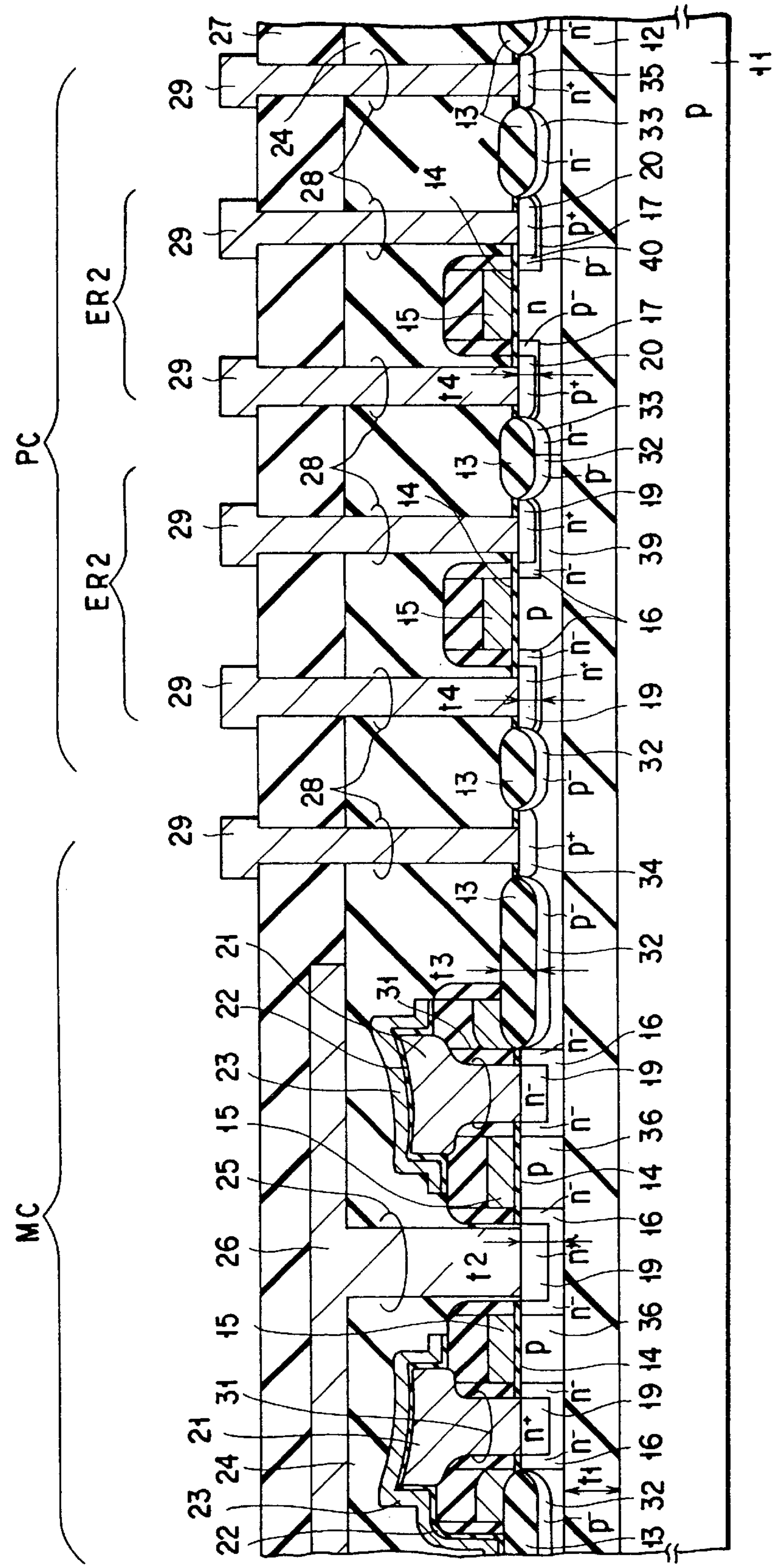
FIG. 88 is a plan view showing in detail the memory cell section and peripheral circuit section of the DRAM according to the sixth aspect of the present invention.

FIGS. 83 to 88 show a 64 mega bits (MB) DRAM according to the first embodiment according to the third aspect of the invention. More precisely, FIG. 83 is a floor plan of the DRAM, and FIG. 84 is a detailed floor plan of one of the 16 MB core blocks incorporated in the DRAM. FIGS. 85 to 87 illustrate in detail the memory cell section shown in FIGS. 83 and 84. FIG. 88 shows the memory cell section and peripheral circuit section of the DRAM.

As shown in FIG. 83, the 64 MB DRAM comprises four core blocks 102 and a peripheral circuit section 103, all provided on a semiconductor chip 101. The section 103 includes an I/O (Input/Output) buffer, a back-gate bias generating circuit, input/output pads and the like. As seen from FIG. 84, each core block 102 is comprised of a memory cell section 104 and a peripheral circuit PC. (The section 104 includes redundant memory cells.) The peripheral circuit section PC includes a row decoder 105, a column decoder 106, a sense amplifier 107, a DQ buffer 108 and a redundant circuit 109. (The DQ buffer 108 includes a circuit for driving the DQ line.)

The memory cell section MC will be described in detail, with reference to FIGS. 85 and 86.

As shown in FIG. 86, a plate-shaped silicon oxide layer 12, having a prescribed thickness t.1. (e.g., about 0.4 μm) is formed in a p-type silicon substrate 11. The layer 12 is provided in the entire memory cell section MC. The upper surface of the layer 12 is parallel to that of the silicon substrate 11 and located at a predetermined depth t2 (e.g., about 0.25 μm) from the upper surface of the substrate 11. This means that the substrate 11 includes a silicon layer (element regions) which is provided on the silicon oxide layer 12 and which has a thickness of t2.

A field oxide film 13 having a prescribed thickness t3 (e.g., about 0.2 μm) is formed above the silicon oxide layer 12. That is, the film 13 does not contact the silicon oxide layer 12. The field oxide film 13 surrounds the element regions of the memory cell section MC. Two memory cells are provided in each element region. Each memory cell has one MOS transistor and one capacitor.

The MOS transistor of each memory cell has a gate electrode 15, source and drain regions 19 and low impurity concentration regions 16. A p-type semiconductor region 36 is provided right below the gate electrode 15. A gate insulating film 14 is interposed between the gate electrode 15 and the semiconductor region 36. The lower surface of the semiconductor region 36 contacts the silicon oxide layer 12. So do the source and drain regions 19 and low impurity concentration regions 16 at their lower surfaces. The two memory cells share a drain region 19.

The capacitor of each memory cell has a storage node 21, a capacitor insulating film 22 and a plate electrode 23. The storage node 21 extends through a contact hole 31 and contacts the source region of the MOS transistor. The plate electrode 23 covers the silicon substrate 11; it has an opening located above the drain region 19, common to the two memory cells formed in each element region.

Bit lines 26 are connected to the drain regions of the MOS transistors. The bit lines 26 extend straight, intersecting at right angles to the word lines (i.e., the gate electrodes 15 of the MOS transistors.

The source and drain regions 19 and low impurity concentration regions 16, at their lower surfaces are very thick. In this DRAM, a junction leakage current will flow, as known in the art, if the impurity concentrations of the regions 19 and 16, are increased to reduce the contact resistance. The junction leakage current deteriorates the pause characteristic of the DRAM. Therefore, in order to reduce the contact resistance in the DRAM it would be most desirable to make the regions 19, and 16 thick. This is why these regions are very thick.

Since the regions 19 and 16 of each memory cell contact, at their lower surfaces, the silicon oxide layer 12, there is little junction capacitance in the memory cell and there flows virtually no junction leakage current in the memory cell. The memory cell section MC therefore operates at high speed, consuming only a little power.

The element regions provided on the silicon oxide layer 12 are very thin. Therefore, soft error is hardly made in the memory cell section MC. Since the possibility of soft error is low, it is easy to impart a sufficient capacitance to the capacitor of each memory cell. Having a sufficient capacitance, the capacitor can be thin. Hence, the silicon substrate has but low stepped portions on its surface, even if the capacitor is of stacked structure.

As shown in FIG. 87, the element regions 201 are each surrounded by the field oxide film 13. Nonetheless, they are electrically connected by the p-type semiconductor region 36. Hence, an electrode 202 provided on a specified part of the semiconductor region 36 can apply a back-gate bias to the MOS transistors which are provided in the element regions 201.

The peripheral circuit section PC will be described, with reference to FIGS. 88 to 90.

Figure 89:
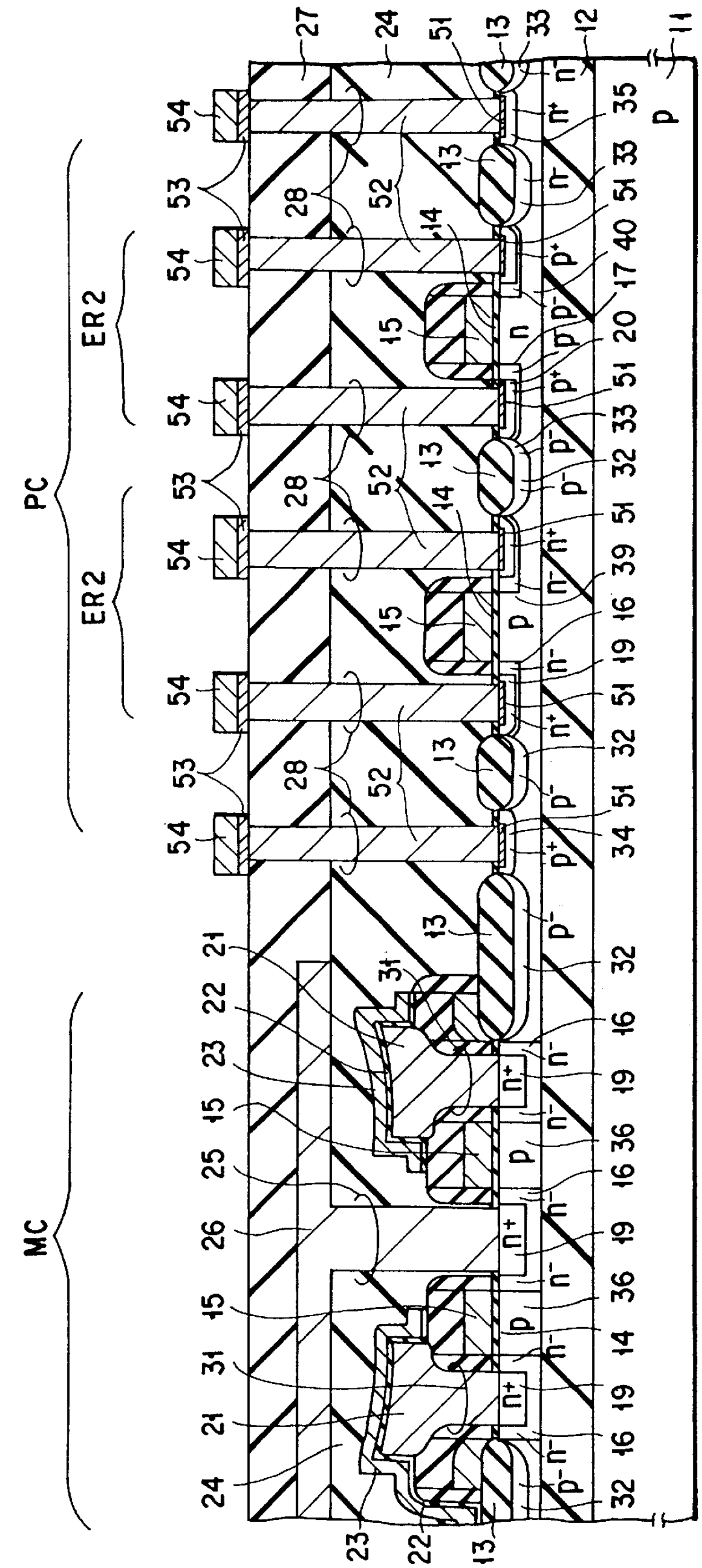
FIG. 89 is a sectional view showing a modification of the DRAM shown in FIG. 88.
Figure 90:
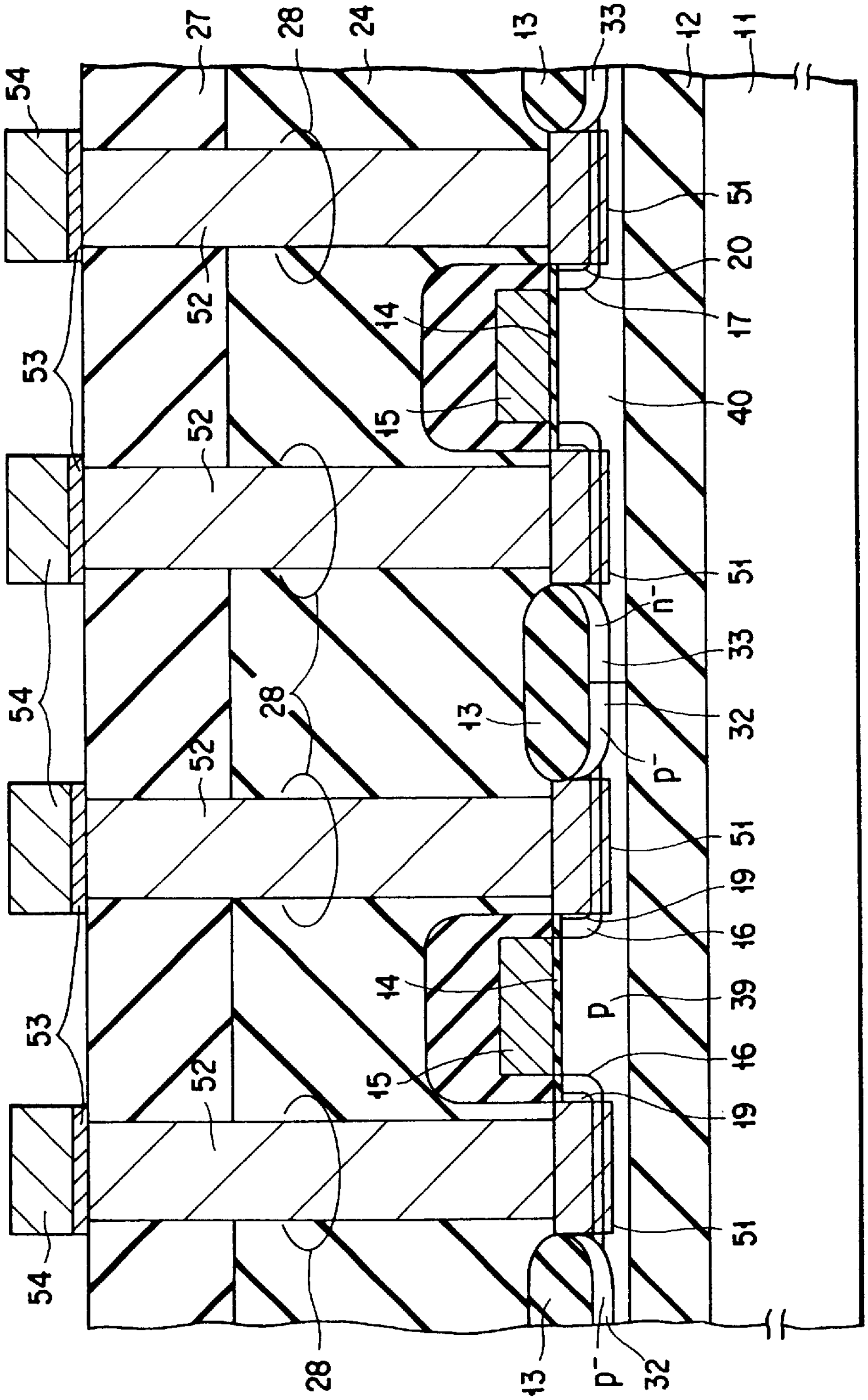
FIG. 90 is a sectional view explaining the drawback of the DRAM illustrated in FIG. 89.

As shown in FIGS. 88 to 90, a plate-shaped silicon oxide layer 12 having a prescribed thickness t.1. (e.g., about 0.4 μm) is formed in the p-type silicon substrate 11. The upper surface of the silicon oxide layer 12 is parallel to that of the silicon substrate 11 and located at a predetermined depth t2 (e.g., about 0.25 μm) from the upper surface of the substrate 11. Hence, the substrate 11 includes silicon layers (element regions) which are provided on the silicon oxide layer 12 and which have a thickness of t2.

A field oxide film 13 having a prescribed thickness t3 (e.g., about 0.2 μm) is formed above the silicon oxide layer 12. That is, the film 13 does not contact the silicon oxide layer 12.

A $p^-$-type impurity region 32 and an $n^-$-type impurity region 33 are provided near the lower surface of the field oxide film 13 formed above the silicon oxide layer 12. Both impurity regions 32 and 33 are used as channel stoppers. The impurity region 33 can be dispensed with.

In some of the element regions provided on the silicon oxide layer 12, there are provided n-channel MOS transistors. In the remaining element regions formed on the silicon oxide layer 12, there are provided p-channel MOS transistors.

Each n-channel MOS transistor is provided in the p-type semiconductor (well) region 39. It has a gate electrode 15, source and drain regions 19 and low impurity concentration regions 16. A gate insulating film 14 is provided right below the gate electrode 15. Hence, the source and drain regions 19 and low impurity concentration regions 16, do not contact, at their lower surfaces, the silicon oxide layer 12.

Each p-channel MOS transistor is provided in the n-type semiconductor (well) region 40. It has a gate electrode 15, source and drain regions 20 and low impurity concentration regions 17. A gate insulating film 14 is provided right below the gate electrode 15. Hence, the source and drain regions 20 and low impurity concentration regions 17, do not contact, at their lower surfaces, the silicon oxide layer 12.

Thus, the p-type semiconductor (well) region 39 includes a plurality of n-channel MOS transistors which are provided above the silicon oxide layer 12. To these n-channel MOS transistors there can be applied a back-gate bias, because a p+-type impurity region 34 is provided in the p-type semiconductor region 39. Also, the n-type semiconductor (well) region 40 includes a plurality of p-channel MOS transistors which are provided above the silicon oxide layer 12. To these p-channel MOS transistors there can be applied a back-gate bias, because an n+-type impurity region 35 is provided in the n-type semiconductor region 40.

How the RAM shown in FIG. 88 is manufactured will be explained.

At first, oxygen ions are implanted into the prescribed parts of the peripheral circuit section PC, in a dose of about $2\times10^{18}$ $cm^{-2}$ under acceleration energy of about 250 KeV.

The structure obtained is annealed in an $N_2$ atmosphere, for example at about 1350° C. for about 30 minutes. A plate-shaped silicon oxide layer 12 having a thickness of about 0.4 μm, is thereby formed in the silicon substrate 11. Hence, a silicon layer having a thickness of about 0.1 μm is provided on the silicon oxide layer 12. Then, field oxide film 13 having a thickness of about 0.2 μm are formed by the LOCOS method above the silicon oxide layer 12. The field oxide films 13 therefore do not contact the silicon oxide film 12.

Then, boron ions are implanted into those parts of the silicon layer which are located on the silicon oxide layers 12, using a resist pattern as a mask. P-type impurity regions 36, 38 and 39 are thereby formed. Further, phosphorus ions are implanted into the silicon layers which are located on the silicon oxide layers 12, using a resist pattern as a mask. N-type impurity regions 37 and 40 are thereby formed.

A gate insulating film 14, a phosphorus-containing polysilicon film, and a TEOS film 30 are formed on the resultant structure, one after another. Using a resist pattern as mask, the TEOS film 30 and the polysilicon film are etched, forming gate electrodes 15.

Further, using the resist pattern and the gate electrodes 15 as masks, phosphorus ions are implanted into the n-channel MOS transistor regions. Similarly, using the resist pattern as a mask, boron ions are implanted into the p-channel MOS transistor regions.

The resultant structure is annealed, forming low impurity concentration regions 16 of $n^-$-type and low impurity concentration regions 17 of $p^-$-type. These regions 16 and 17, have a surface impurity concentration of $1\times10^{18}$ to $1\times10^{20}$ $cm^{-3}$. A spacer 18 is then formed on the sides of each gate electrode 15. Using a resist pattern as a mask, arsenic is ion-implanted into the n-channel MOS transistor regions, and boron is ion-implanted into the p-channel MOS transistor regions.

The structure obtained is subjected to thermal oxidation, thus forming source and drain regions 19 of $n^+$-type and source and drain regions 20 of $p^+$-type. These regions 19 and 20 have a surface impurity concentration of $1\times10^{19}$ to $1\times10^{20}$ $cm^{-3}$.

Contact holes 31 are formed which expose the source regions of the n-channel MOS transistors formed in the memory cell section MC. Storage nodes 21 of capacitors are formed, each having a thickness of about 0.2 μm and extending through the contact holes 31 to the source regions of the n-channel MOS transistors. Then, a capacitor insulating film 22 about 0.01 μm thick is formed on each storage node 21. (The film 22 is, for example, a two-layered film consisting of an oxide film and a nitride film.) A polysilicon layer containing phosphorus and having a thickness of, for example, about 0.1 μm, is formed on the upper surface of the resultant structure. Those parts of the polysilicon layer which are located on the drain regions of the n-channel MOS transistor of the memory cell section MC are removed, thereby forming the plate electrodes 23 of capacitors.

A BPSG film 24 is formed on the upper surface of the structure. Contact holes 25 are made in the BPSG film 24, exposing the drain regions of the n-channel MOS transistors of the memory cell section MC. Bit lines 26 are formed on the BPSG film 24 and in the contact holes 25. The bit lines 26 are connected to the drain regions of the n-channel MOS transistors.

An inter-layer insulating film 27 is formed on the upper surface of the resultant structure. Contact holes 28 ate formed in the BPSG film 24 and inter-layer insulating film 27 of the peripheral circuit section PC. The contact holes 28 expose the source and drain regions 19 and source and drain regions 20 of the MOS transistors of the section PC. Metal wires 29 are formed on the inter-layer insulating film 27 and in the contact holes 28. The wires 29 are therefore connected to the source and drain regions 19 and source and drain regions 20 of the MOS transistors.

Thereafter, an inter-layer insulating film, other metal wires and a passivation film are formed, and pads are then formed. The DRAM is thereby manufactured.

The DRAM thus manufactured, i.e., a semiconductor device according to the sixth aspect of the invention, has MOS transistors whose source and drain regions are thick and contact a silicon oxide layer at their lower surfaces. The DRAM is advantageous in two respects. First, its memory cell section has high integration density, consumes but a little power, and scarcely makes soft error. Second, a back-gate bias can be applied to the MOS transistors provided in the peripheral circuit section, because these MOS transistors are provided in well regions.

FIG. 89 illustrates a modification of the DRAM shown in FIG. 88. The modified DRAM differs from the DRAM shown in FIG. 1 in respect of the connection between the metal wires 54 on the one hand and the regions 19 and 20, on the other. To be more specific, the contact holes 28 are filled with masses 52 of high-melting metal; metal silicide layers 51 are provided between the high-melting metal masses 52 on the one hand and the regions 19 and 20, on the other, thereby reducing the contact resistance; and barrier metal layers 53 are provided between the high-melting metal masses 52 on the one hand and metal wires 54 on the other.

To reduce the contact resistance in the DRAM it suffices to make the metal silicide layers 51 thick. However, the regions 19 and 20 of the MOS transistors do not contact the silicon oxide layer 12 in the peripheral circuit section PC. If made thick as shown in FIG. 90, the metal silicide layers 51 may pass through the source and drain regions 19 and 20. Should this happen, a leakage current would be generated, inevitably much increasing the power consumption.

Seventh Aspect of the Invention

Semiconductor devices according to the seventh aspect of the present invention will be described, in which the contact resistance can be decreased and a leakage current is prevented from being generated. The semiconductor device is a DRAM having a SOI substrate which comprises an insulating layer and a thin silicon layer provided on the insulating layer and in which the source and drain regions of the MOS transistors contact the insulating layer.

Figure 92:
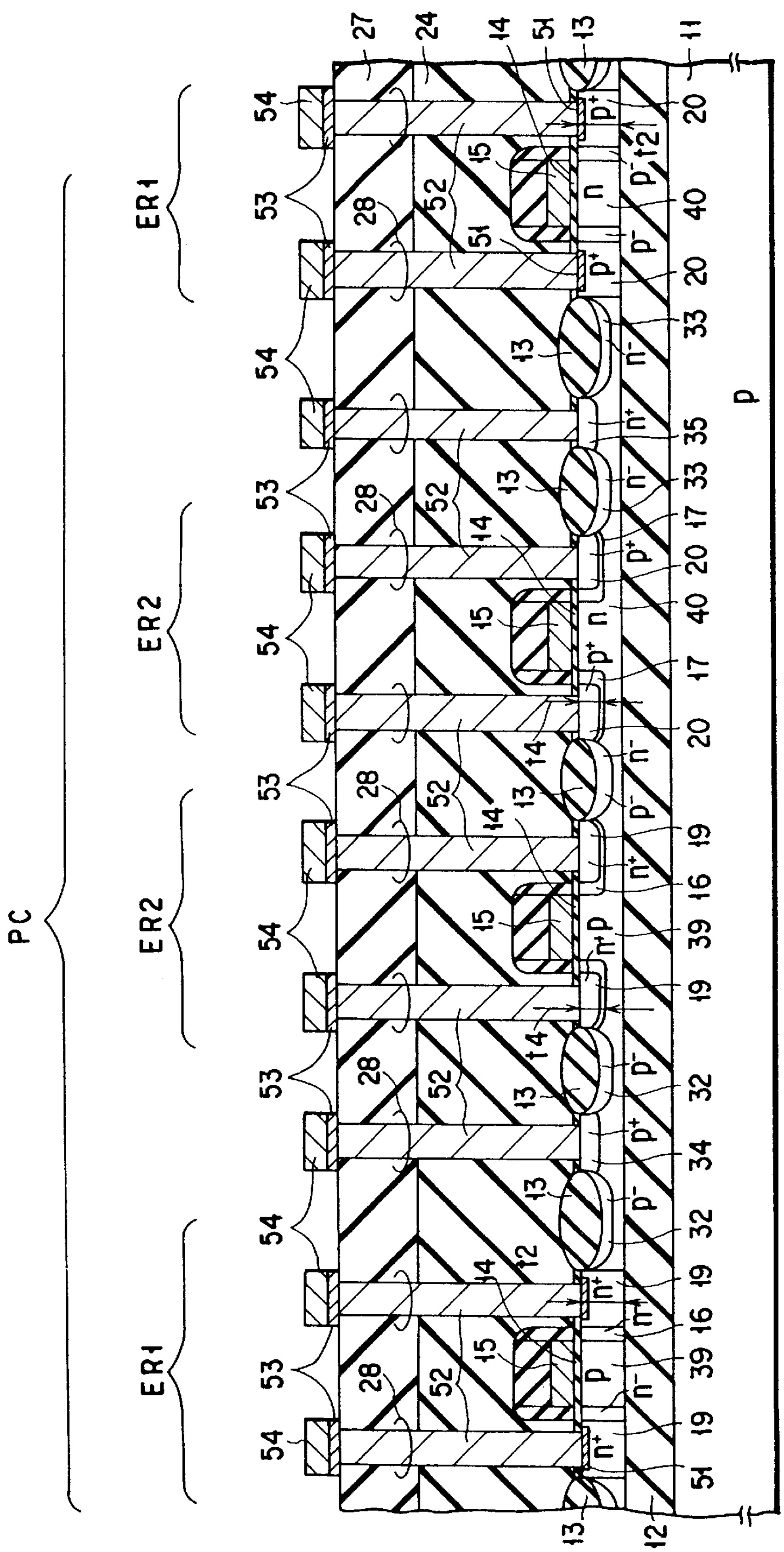
FIG. 92 is a sectional view of the peripheral circuit section of the DRAM according to the seventh aspect of the invention.

FIGS. 91 and 92 illustrate a 64 mega bits (MB) DRAM according to the first embodiment according to the seventh aspect of the invention. The DRAM has a memory cell section MC and a peripheral circuit section PC.

The memory cell section MC will be described in detail, with reference to FIG. 91.

As shown in FIG. 91, a plate-shaped silicon oxide layer 12, having a prescribed thickness t.1. (e.g., about 0.4 μm) is formed in a p-type silicon substrate 11. The layer 12 is provided in the entire memory cell section MC. The upper surface of the layer 12 is parallel to that of the silicon substrate 11 and located at a predetermined depth t2 (e.g., about 0.25 μm) from the upper surface of the substrate 11. This means that the substrate 11 includes a silicon layer (element regions) which is provided on the silicon oxide layer 12 and which has a thickness of t2.

A field oxide film 13 having a prescribed thickness t3 (e.g., about 0.2 μm) is formed above the silicon oxide layer 12. That is, the film 13 does not contact the silicon oxide layer 12. A $p^-$-type impurity region 32 is provided near the lower surface of the field oxide film 13 formed above the silicon oxide layer 12. The impurity region 32 is used as a channel stopper.

The field oxide film 13 surrounds the element regions of the memory cell section MC. Two memory cells are provided in each element region. Each memory cell has one MOS transistor and one capacitor.

The MOS transistor of each memory cell has a gate electrode 15, source and drain regions 19 and low impurity concentration regions 16. A p-type semiconductor region 36 is provided right below the gate electrode 15. A gate insulating film 14 is interposed between the gate electrode 15 and the semiconductor region 36. The lower surface of the semiconductor region 36 contacts the silicon oxide layer 12. So do the source and drain regions 19 and low impurity concentration regions 16, at their lower surfaces. The two memory cells share a drain region 19.

The capacitor of each memory cell has a storage node 21, a capacitor insulating film 22 and a plate electrode 23. The storage node 21 extends through a contact hole 31 and contacts the source region of the MOS transistor. The plate electrode 23 covers the silicon substrate 11; it has an opening located above the drain region 19, common to the two memory cells formed in each element region.

Bit lines 26 are connected to the drain regions of the MOS transistors. The bit lines 26 extend straight, intersecting at right angles to the word lines (i.e., the gate electrodes 15 of the MOS transistors.

The source and drain regions 19 and low impurity concentration regions 16 at their lower surfaces are very thick. In this DRAM, a junction leakage current will flow, as known in the art, if the impurity concentrations of the regions 19 and 16, are increased to reduce the contact resistance. The junction leakage current deteriorates the pause characteristic of the DRAM. Therefore, to reduce the contact resistance in the DRAM it would be most desirable to make the regions 19 and 16, thick. This is why these regions are very thick.

Since the regions 19 and 16 of each memory cell contact, at their lower surfaces, the silicon oxide layer 12, there is little junction capacitance in the memory cell and there flows virtually no junction leakage current in the memory cell. The memory cell section MC therefore operates at high speed, consuming only a little power. Moreover, soft error is hardly made in the memory cell section MC. Thanks to the low possibility of soft error, it is easy to impart a sufficient capacitance to the capacitor of each memory cell. Having a sufficient capacitance, the capacitor can be thin. Hence, the silicon substrate has but low stepped portions on its surface, even if the capacitor is of stacked structure.

The peripheral circuit section PC will be described, with reference to FIGS. 91 and 92.

As shown in FIGS. 91 to 92, a plate-shaped silicon oxide layer 12 having a prescribed thickness t.1. (e.g., about 0.4 μm) is formed in the p-type silicon substrate 11. The upper surface of the silicon oxide layer 12 is parallel to that of the silicon substrate 11 and located at a predetermined depth t2 (e.g., about 0.25 μm) from the upper surface of the substrate 11. Hence, the substrate 11 includes silicon layers (element regions) which are provided on the silicon oxide layer 12 and which have a thickness of t2.

A field oxide film 13 having a prescribed thickness t3 (e.g., about 0.2 μm) is formed above the silicon oxide layer 12. That is, the film 13 does not contact the silicon oxide layer 12. A $p^-$-type impurity region 32 and an $n^-$-type impurity region 33 are provided near the lower surface of the field oxide film 13 formed above the silicon oxide layer 12. Both impurity regions 32 and 33 are used as channel stoppers. The impurity region 33 can be dispensed with.

In some of the element regions provided on the silicon oxide layer 12, there are provided n-channel MOS transistors. In the remaining element regions formed on the silicon oxide layer 12, there are provided p-channel MOS transistors.

Each n-channel MOS transistor is provided in the p-type semiconductor (well) region 39. It has a gate electrode 15, source and drain regions 16 and low impurity concentration regions 16. A gate insulating film 14 is provided right below the gate electrode 15. Hence, the source and drain regions 19 and low impurity concentration regions 16, do not contact, at their lower surfaces, the silicon oxide layer 12. The regions 16 and 19, have the thickness t2 or t4 (<t2).

Each p-channel MOS transistor is provided in the n-type semiconductor (well) region 40. It has a gate electrode 15, source and drain regions 20 and low impurity concentration regions 17. A gate insulating film 14 is provided right below the gate electrode 15. Hence, the source and drain regions 20 and low impurity concentration regions 17, do not contact, at their lower surfaces, the silicon oxide layer 12. The regions 17 and 20 have the thickness t2 or t4 (<t2).

Contact holes 28 exposing the source and drain regions 19 which contact the silicon oxide layer 12 are filled with high-melting metal (e.g., tungsten) masses 52. The high-melting metal masses 52 are connected to barrier metal layers 53 and metal wires 54. Metal silicide layers 51 are provided between the high-melting metal masses 52 on the one hand and the source and drain regions 19 and 20 on the other hand.

The MOS transistors whose source and drain regions 19 and 20 contact the silicon oxide layer 12 have a sufficiently low contact resistance.

Figure 93:
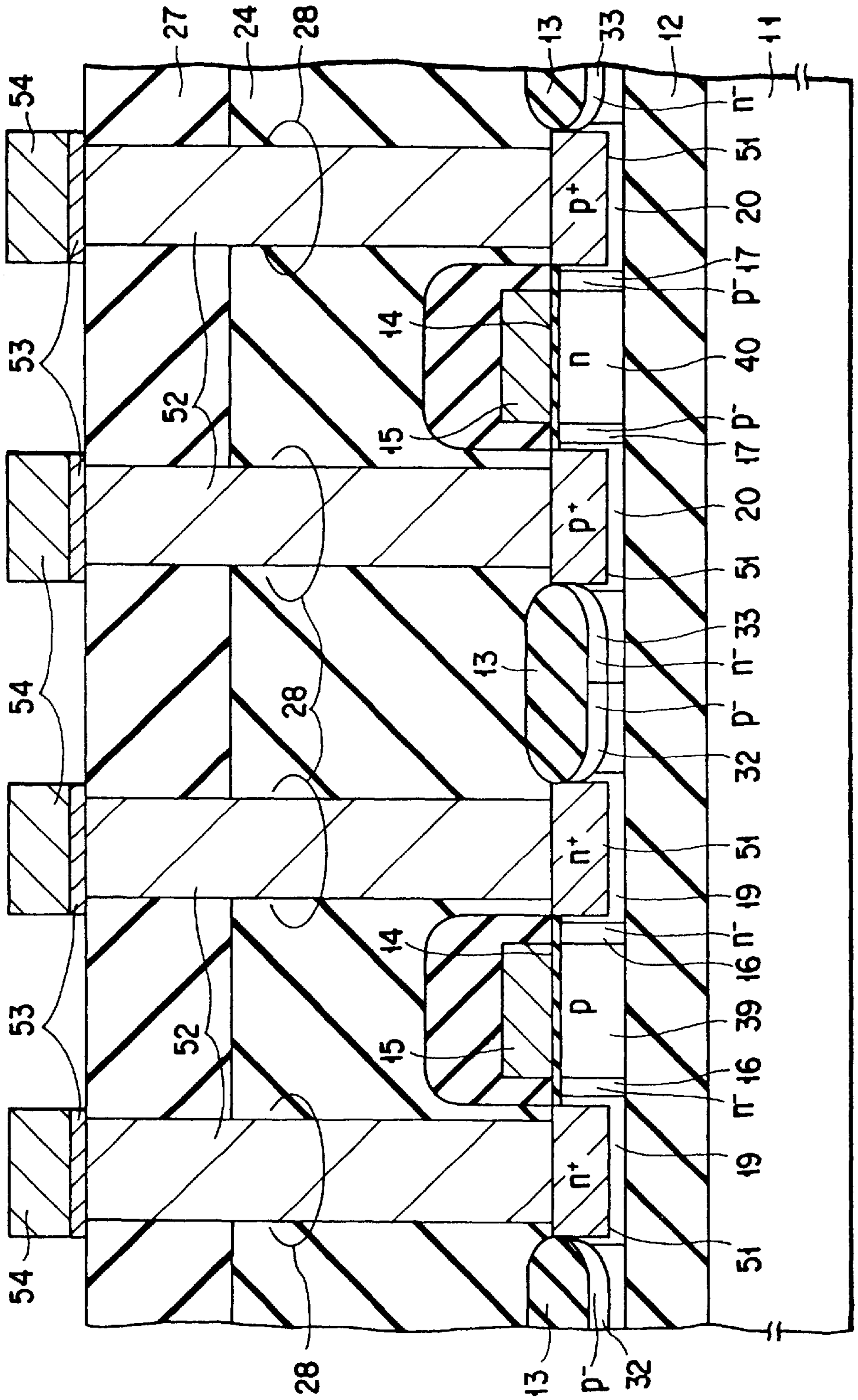
FIG. 93 is a sectional view showing the peripheral circuit section of the DRAM illustrated in FIGS. 91 and 92.

The metal silicide layers 51 extends deep to the source and drain regions as illustrated in FIG. 93. Despite this, the layers 51 would not pass through the source and drain regions to reach the well region, because the source and drain regions contact the silicon oxide layer 12. It follows that a leakage current would not flow to increase the power consumption.

The p-type semiconductor (well) region 39 includes a plurality of n-channel MOS transistors which are provided above the silicon oxide layer 12. To these n-channel MOS transistors there can be applied a backgate bias, because a $p^+$-type impurity region 34 is provided in the p-type semiconductor region 39. Also, the n-type semiconductor (well) region 40 includes a plurality of p-channel MOS transistors which are provided above the silicon oxide layer 12. To these p-channel MOS transistors there can be applied a backgate bias, because an $n^+$-type impurity region 35 is provided in the n-type semiconductor region 40.

How the RAM shown in FIGS. 91 and 92 is manufactured will be explained.

First, oxygen ions are implanted into the prescribed parts of the peripheral circuit section PC, in a dose of about $2\times10^{18}$ $cm^{-2}$ under acceleration energy of about 250 KeV.

The structure obtained is annealed in an $N_2$ atmosphere, for example at about 1350° C. for about 30 minutes. A plate-shaped silicon oxide layer 12 having a thickness of about 0.4 μm, is thereby formed in the silicon substrate 11 at such a depth that a silicon layer having a thickness of about 0.25 μm is provided on the silicon oxide layer 12.

Then, field oxide film 13 having a thickness of about 0.2 μm are formed by the LOCOS method above the silicon oxide layer 12. The field oxide films 13 therefore do not contact the silicon oxide film 12.

Next, boron ions are implanted into those parts of the silicon layer which are located on the silicon oxide layers 12, using a resist pattern as a mask. P-type impurity regions 36, 38 and 39 are thereby formed. Further, phosphorus ions are implanted into the silicon layers which are located on the silicon oxide layers 12, using a resist pattern as a mask. N-type impurity regions 37 and 40 are thereby formed.

A gate insulating film 14, a phosphorus-containing polysilicon film, and a TEOS film 30 are formed on the resultant structure, one after another. Using a resist pattern as a mask, the TEOS film 30 and the polysilicon film are etched, forming gate electrodes 15.

Further, using the resist pattern and the gate electrodes 15 as masks, phosphorus ions are implanted into the n-channel MOS transistor regions. Similarly, using the resist pattern as mask, boron ions are implanted into the p-channel MOS transistor regions.

The resultant structure is annealed, forming low impurity concentration regions 16 of $n^-$-type and low impurity concentration regions 17 of $p^-$-type. These regions 16 and 17 have a surface impurity concentration of $1\times10^{18}$ to $1\times10^{20}$ $cm^{-3}$. A spacer 18 is then formed on the sides of each gate electrode 15. Using a resist pattern as mask, arsenic is ion-implanted into the n-channel MOS transistor regions, and boron is ion-implanted into the p-channel MOS transistor regions.

The structure obtained is subjected to thermal oxidation, thus forming source and drain regions 19 of $n^+$-type and source and drain regions 20 of $p^+$-type. These regions 19 and 20 have a surface impurity concentration of $1\times10^{19}$ to $1\times10^{20}$ $cm^{-3}$.

The ion implantation and the thermal oxidation are carried out such that the source and drain regions 19 and 20 of all MOS transistors provided in the memory cell section MC and those of some of the MOS transistors provided in the peripheral circuit section PC reach the silicon oxide layer 12.

Contact holes 31 are formed which expose the source regions of the n-channel MOS transistors formed in the memory cell section MC. Storage nodes 21 of capacitors are formed, each having a thickness of about 0.2 $\mu$m and extending through the contact holes 31 to the source regions of the n-channel MOS transistors. Then, a capacitor insulating film 22 about 0.01 $\mu$m thick is formed on each storage node 21. (The film 22 is, for example, a two-layered film consisting of an oxide film and a nitride film.) A polysilicon layer containing phosphorus and having a thickness of, for example, about 0.1 $\mu$m, is formed on the upper surface of the resultant structure. Those parts of the poly-silicon layer which are located on the drain regions of the n-channel MOS transistor of the memory cell section MC are removed, thereby forming the plate electrodes 23 of capacitors.

A BPSG film 24 is formed on the upper surface of the structure. Contact holes 25 are made in the BPSG film 24, exposing the drain regions of the n-channel MOS transistors of the memory cell section MC. Bit lines 26 are formed on the BPSG film 24 and in the contact holes 25. The bit lines 26 are connected to the drain regions of the n-channel MOS transistors.

An inter-layer insulating film 27 is formed on the upper surface of the resultant structure. Contact holes 28 are formed in the BPSG film 24 and inter-layer insulating film 27 of the peripheral circuit section PC. The contact holes 28 expose the source and drain regions 19 and source and drain regions 20 of the MOS transistors of the section PC.

Metal silicide layers 51 are formed in the contact holes 28, covering the exposed parts of the source and drain regions 19 source and drain regions 20. Instead, the metal silicide layers 51 may be formed on the entire regions 19 and 20, before the capacitors of the memory cells are formed.

Thereafter, high-melting metal layers (e.g., tungsten layers) 52 are formed in the contact holes 28 by means of selective growth method. Barrier metal layers 53 (made of, for example, a two-layered film consisting of a titanium film and a titanium nitride film) and metal wires 54 (made of, for example, aluminum) are formed on the inter-layer insulating film 27.

Further, an inter-layer insulating film, other metal wires and a passivation film are formed, and pads are then formed. The DRAM is thereby manufactured.

The DRAM thus manufactured, i.e., a semiconductor device according to the first embodiment of the seventh aspect of the invention, has a memory cell section having MOS transistors whose source and drain regions are thick and contact a silicon oxide layer at their lower surfaces. The memory cell section therefore has high integration density, consumes but a little power, and a low contact resistance. In addition, since the semiconductor regions provided on the silicon oxide layer are very thin, soft error is scarcely made in the memory cell section.

Moreover, in the peripheral circuit section of the DRAM, a back-gate bias can be applied to the MOS transistors because these MOS transistors are provided in well regions. Since metal silicide layers are provided on the source and drain regions of the MOS transistors, the MOS transistors have but a low contact resistance, and a leakage current is not generated in the MOS transistors.

Figure 94:
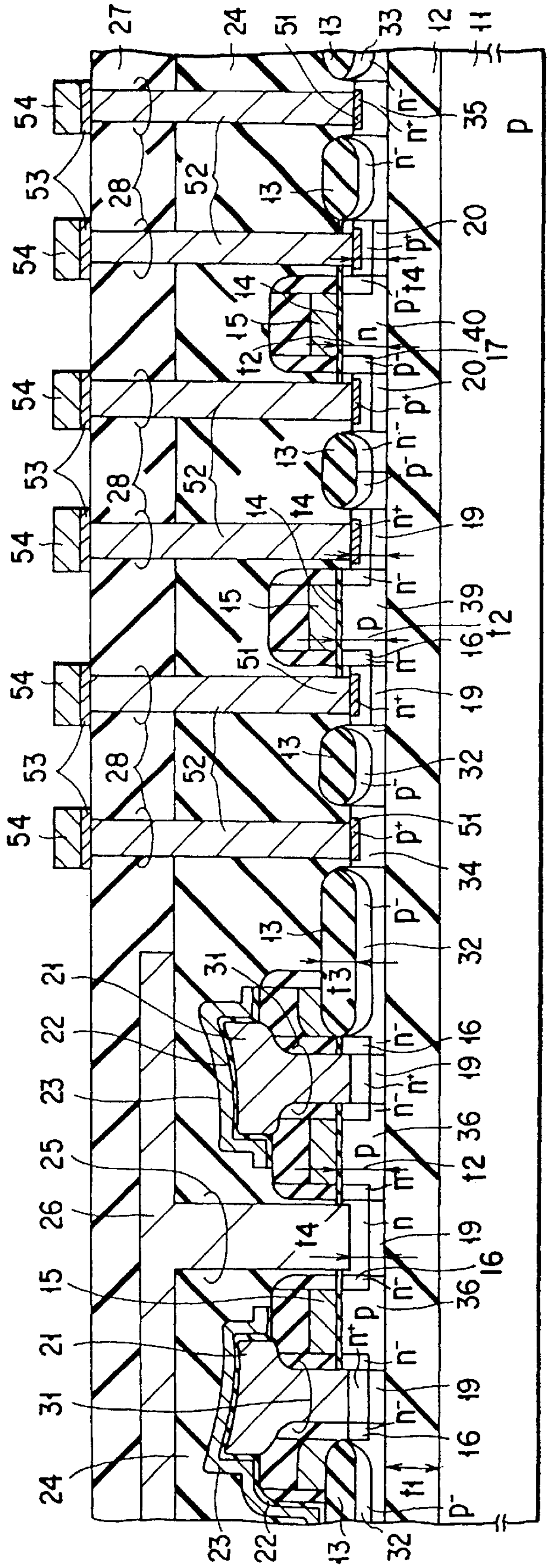
FIG. 94 is a sectional view illustrating both the memory cell section and peripheral circuit section of the DRAM according to the eighth aspect of the present invention.
Figure 95:
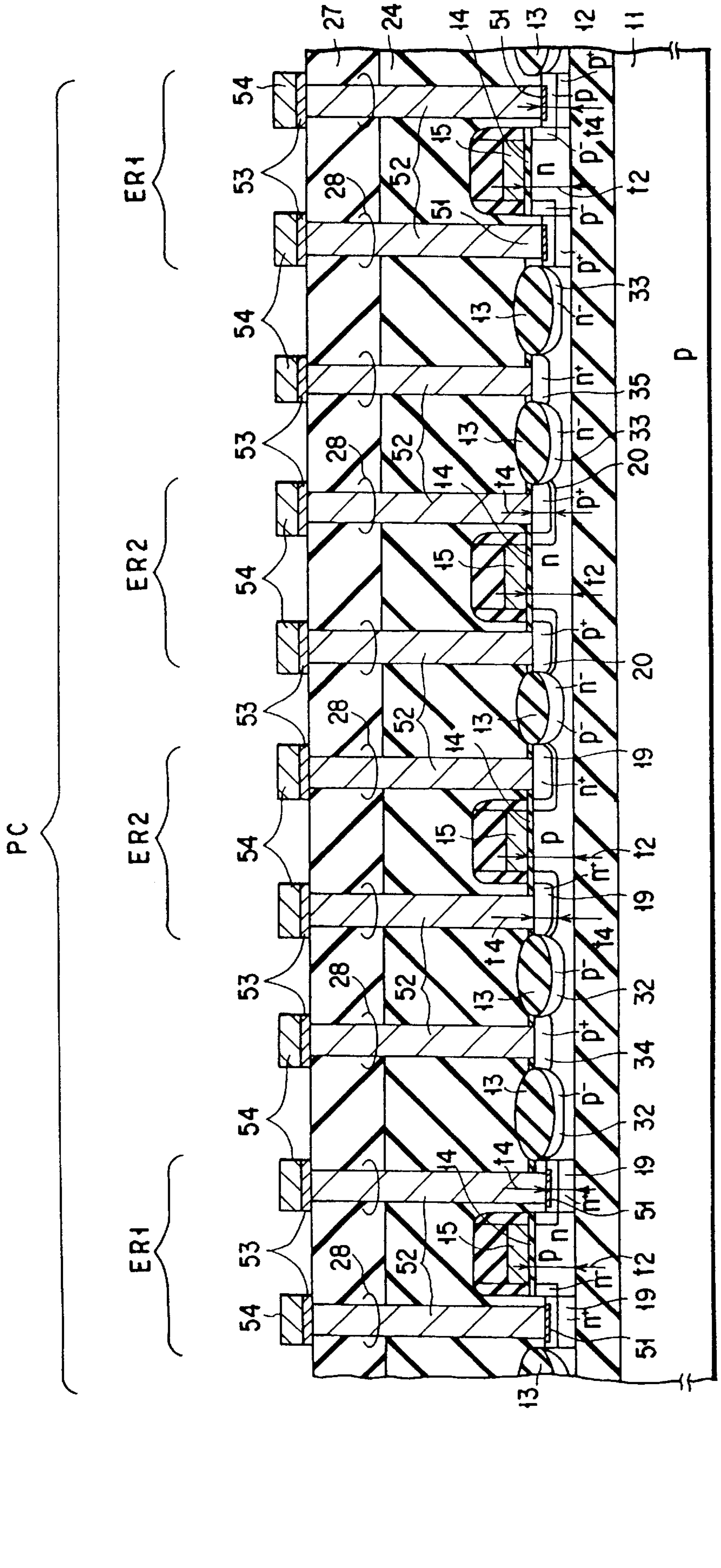
FIG. 95 is another sectional view showing the peripheral circuit section of the DRAM according to the eighth aspect.

FIGS. 94 and 95 show a DRAM according to the second embodiment according to the seventh aspect of the present invention. The DRAM has a memory cell section MC and a peripheral circuit section PC.

The memory cell section MC will be described first, with reference to FIG. 94.

As shown in FIG. 94, a plate-shaped silicon oxide layer 12 having a thickness t.1. (e.g., about 0.4 $\mu$m) is formed in a p-type silicon substrate 11. The silicon oxide layer 12 is provided in the entire memory cell section MC. The upper surface of the layer 12 is parallel to the surface of the silicon substrate 11 and located at a predetermined depth t2. This means that the substrate 11 includes silicon layers (element regions) which are provided on the silicon oxide layer 12 and which have a thickness of t2.

A field oxide film 13 having a prescribed thickness t3 (e.g., about 0.2 $\mu$m) is formed above the silicon oxide layer 12. The film 13 therefore does not contact the silicon oxide layer 12. A $p^-$-type impurity region 32 is provided near the lower surface of the field oxide film 13 formed above the silicon oxide layer 12. The impurity region 32 is used as a channel stopper.

The field oxide film 13 surrounds the element regions of the memory cell section MC. Two memory cells are provided in each element region. Each memory cell has one MOS transistor and one capacitor.

The MOS transistor of each memory cell has a gate electrode 15, source and drain regions 19 and low impurity concentration regions 16. A p-type semiconductor region 36 is provided right below the gate electrode 15. A gate insulating film 14 is interposed between the gate electrode 15 and the semiconductor region 36. The lower surface of the semiconductor region 36 contacts the silicon oxide layer 12. So do the source and drain regions 19 and low impurity concentration regions 16 at their lower surfaces. The upper surfaces of the regions 16 and 19 are at a level below the upper surface of the silicon substrate 11. Hence, the regions 16 and 19 have the thickness t4 (e.g., about 0.15 $\mu$m, t4<t2). The two memory cells share a drain region 19.

The capacitor of each memory cell has a storage node 21, a capacitor insulating film 22 and a plate electrode 23. The storage node 21 extends through a contact hole 31 and contacts the source region of the MOS transistor. The plate electrode 23 covers the silicon substrate 11; it has an opening located above the drain region 19 common to the two memory cells formed in each element region.

Bit lines 26 are connected to the drain regions of the MOS transistors. The bit lines 26 extend straight, intersecting at right angles to the word lines (i.e., the gate electrodes 15 of the MOS transistors.

The source and drain regions 19 and low impurity concentration regions 16 at their lower surfaces are relatively thick. In this DRAM, a junction leakage current will flow, as known in the art, if the impurity concentrations of the regions 19 and 16, are increased to reduce the contact resistance. The junction leakage current deteriorates the pause characteristic of the DRAM. Therefore, to reduce the contact resistance in the DRAM it would be most desirable to make the regions 19 and 16 thick. This is why these regions are very thick.

Since the regions 19 and 16 of each memory cell contact, at their lower surfaces, the silicon oxide layer 12, there is little junction capacitance in the memory cell and there flows virtually no junction leakage current in the memory cell. The memory cell section MC therefore operates at high speed, consuming only a little power. Moreover, soft error is hardly made in the memory cell section MC. Thanks to the low possibility of soft error, it is easy to impart a sufficient capacitance to the capacitor of each memory cell. Having a sufficient capacitance, the capacitor can be thin. Hence, the silicon substrate has but low stepped portions on its surface, even if the capacitor is of stacked structure.

The peripheral circuit section PC will be described, with reference to FIGS. 94 and 95.

As shown in FIGS. 94 to 95, a plate-shaped silicon oxide layer 12 having a prescribed thickness t.1. (e.g., about 0.4 $\mu$m) is formed in the p-type silicon substrate 11. The upper surface of the silicon oxide layer 12 is parallel to that of the silicon substrate 11 and located at a predetermined depth t2 (e.g., about 0.25 $\mu$m) from the upper surface of the substrate 11. Hence, the substrate 11 includes silicon layers (element regions) which are provided on the silicon oxide layer 12 and which have a thickness of t2.

A field oxide film 13 having a prescribed thickness t3 (e.g., about 0.2 $\mu$m) is formed above the silicon oxide layer 12. That is, the film 13 does not contact the silicon oxide layer 12. A $p^-$-type impurity region 32 and an $n^-$-type impurity region 33 are provided near the lower surface of the field oxide film 13 formed above the silicon oxide layer 12. Both impurity regions 32 and 33 are used as channel stoppers. The impurity region 33 can be dispensed with.

In some of the element regions provided on the silicon oxide layer 12, there are provided n-channel MOS transistors. In the remaining element regions formed on the silicon oxide layer 12, there are provided p-channel MOS transistors.

The n-channel MOS transistors are provided in the p-type semiconductor (well) region 39. Each has a gate electrode 15, source and drain regions 16 and low impurity concentration regions 16. A gate insulating film 14 is provided right below the gate electrode 15. The n-channel MOS transistors are classified into two types. Each n-channel MOS transistors of the first type has its regions 16 and 19 contacting the silicon oxide layer 12 at their lower surfaces. Each n-channel MOS transistor of the second type has its regions 16 and 19 not contacting the layer 12 at their lower surfaces.

In the each n-channel MOS transistor of the first type, the regions 16 and 19 have their upper surfaces located lower than the upper surface of the silicon substrate 11. In the each n-channel MOS transistor of the second type, the regions 16 and 19 have their upper surfaces located at the same level as the upper surface of the silicon substrate 11. Therefore, the regions 16 and 19 of every n-type MOS transistor can be provided at the same depth t4 (e.g., about 0.15 $\mu$m) or at similar depths.

The p-channel MOS transistors are provided in the p-type semiconductor (well) region 40. Each has a gate electrode 15, source and drain regions 20 and low impurity concentration regions 17. A gate insulating film 14 is provided right below the gate electrode 15. The p-channel MOS transistors are classified into two types. Each p-channel MOS transistor of the first type has its regions 17 and 20 contacting the silicon oxide layer 12 at their lower surfaces. Each p-channel MOS transistor of the second type has its regions 17 and 20 bit contacting the layer 12 at their lower surfaces.

In the each p-channel MOS transistor of the first type, the regions 17 and 20 have their upper surfaces located lower than the upper surface of the silicon substrate 11. In the each p-channel MOS transistor of the second type, the regions 17 and 20 have their upper surfaces located at the same level as the upper surface of the silicon substrate 11. Therefore, the regions 17 and 20 of every p-type MOS transistor can be provided at the same depth t4 (e.g., about 0.15 $\mu$m) or at similar depths.

In each MOS transistor whose source and drain regions contact the silicon oxide layer 12, the contact hole 28 exposing the source and drain regions is filled with a mass 52 of high-melting metal. The high-melting metal mass 52 is connected to a barrier metal layer 53 and a metal wire 54. A metal silicide layer 51 is interposed between the high-melting metal mass 52 and the source and drain regions. Hence, each MOS transistor whose source and drain regions contact the silicon oxide layer 12 can have a sufficiently low contact resistance.

Figure 96:
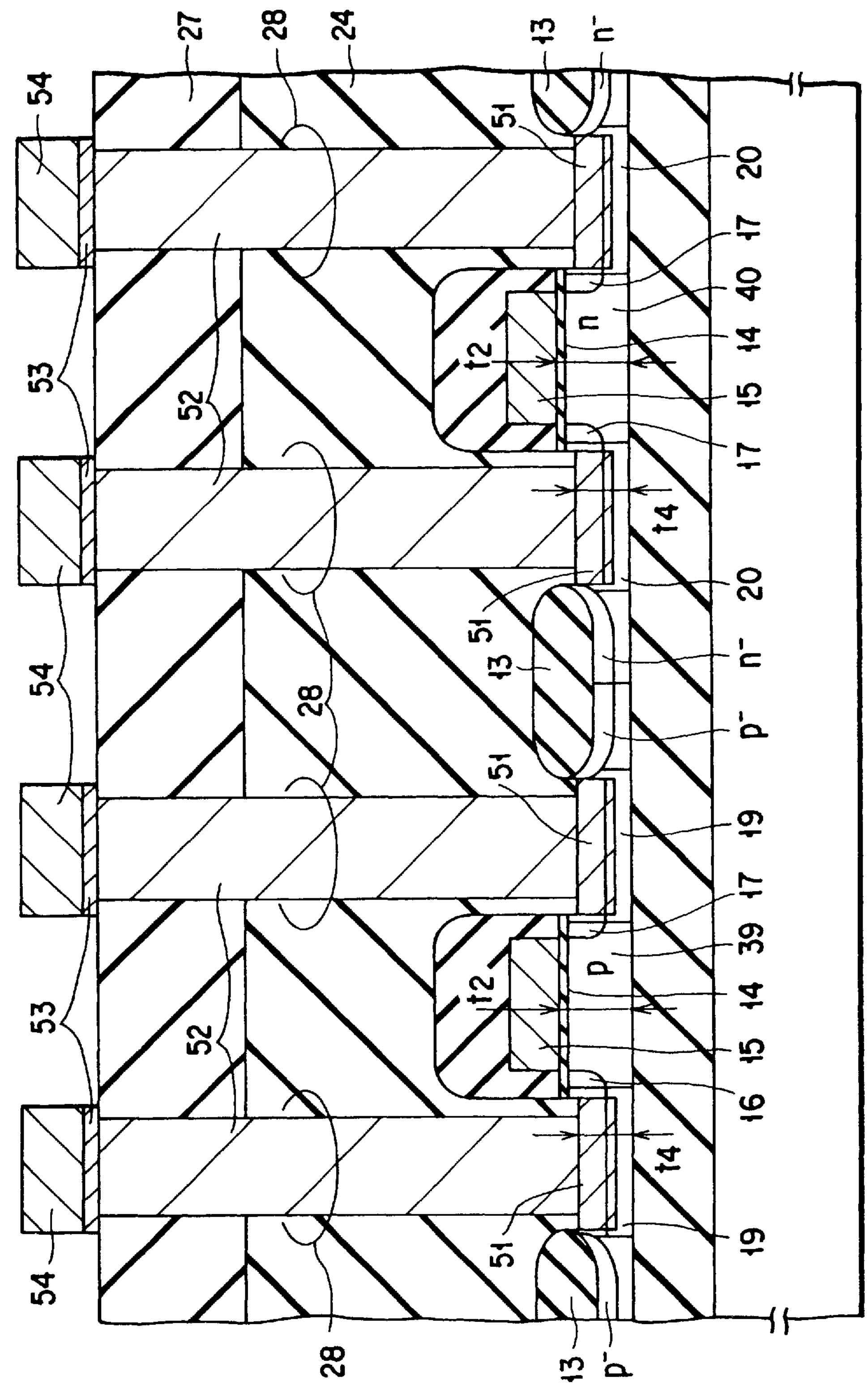
FIG. 96 is another sectional view showing in detail the peripheral circuit section of the DRAM illustrated in FIGS. 94 and 95.
Figure 97:
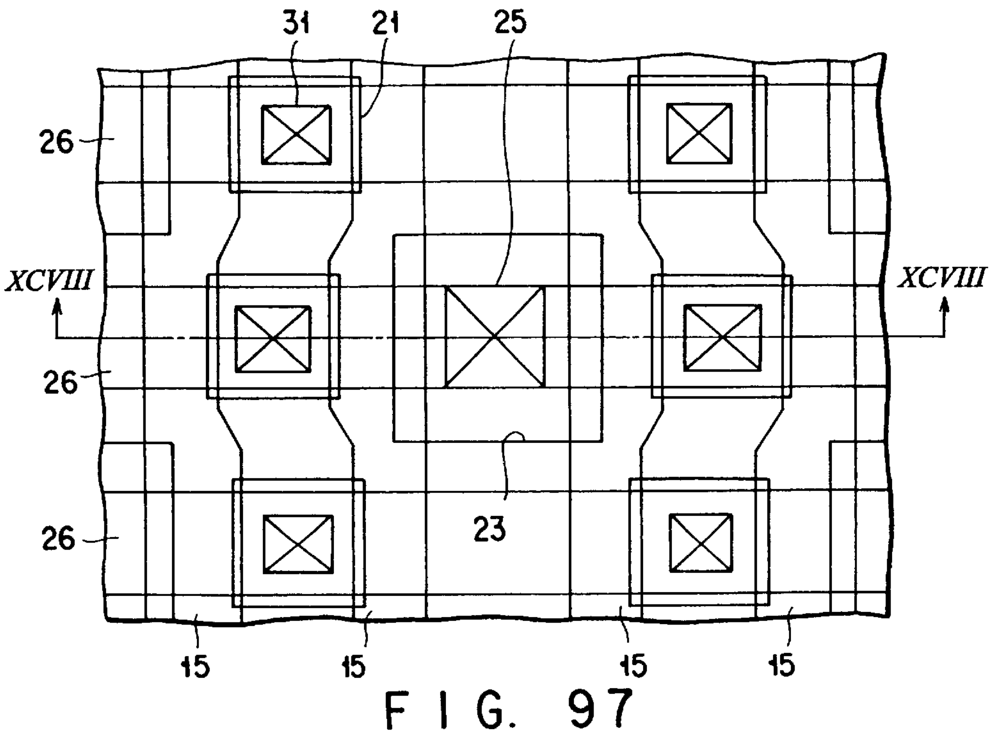
FIG. 97 is a plan view of the memory cell section of a conventional DRAM.
Figure 98:
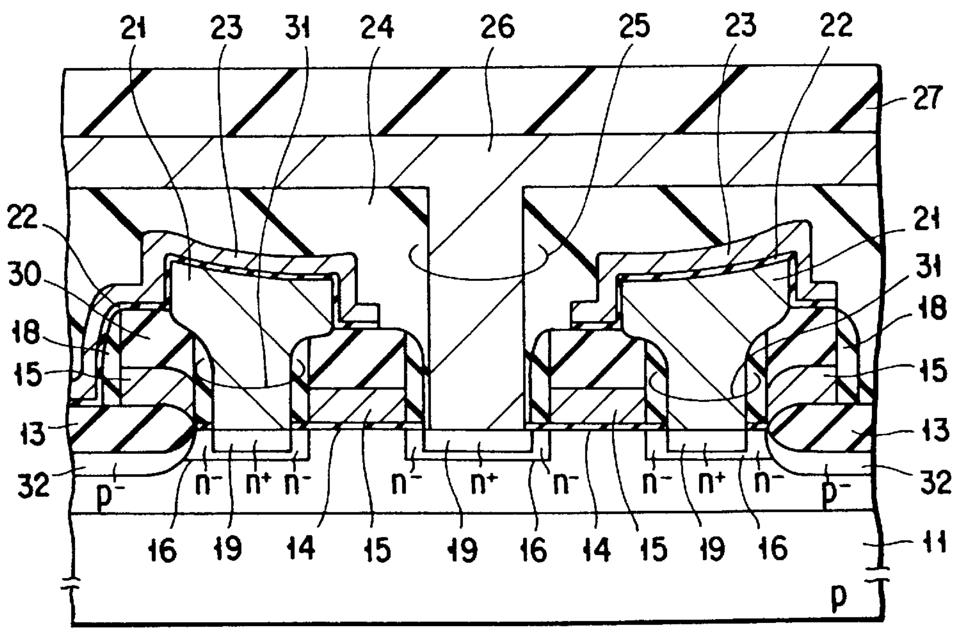
FIG. 98 is a sectional view taken along line XCVIII—XCVIII in FIG. 97.
Figure 99:
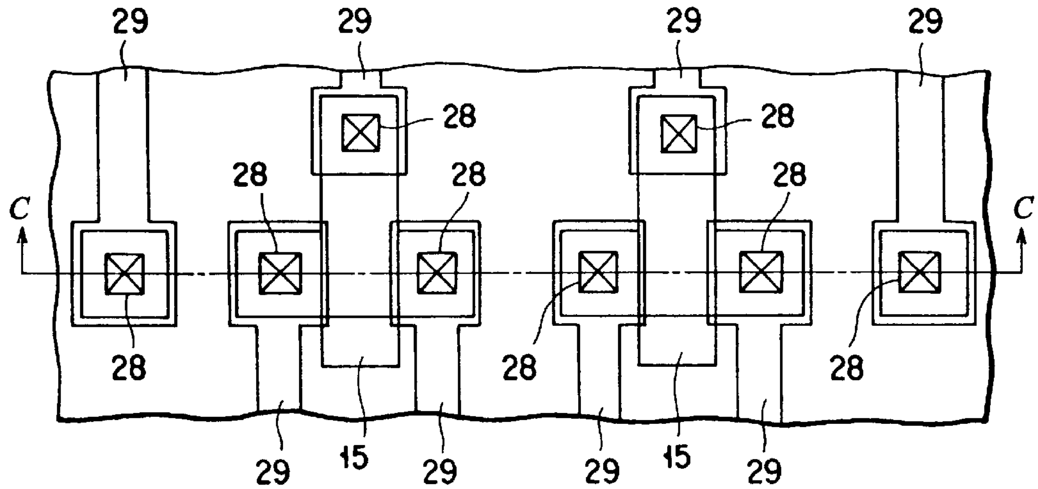
FIG. 99 is a plan view of the peripheral circuit section of the conventional DRAM.
Figure 100:
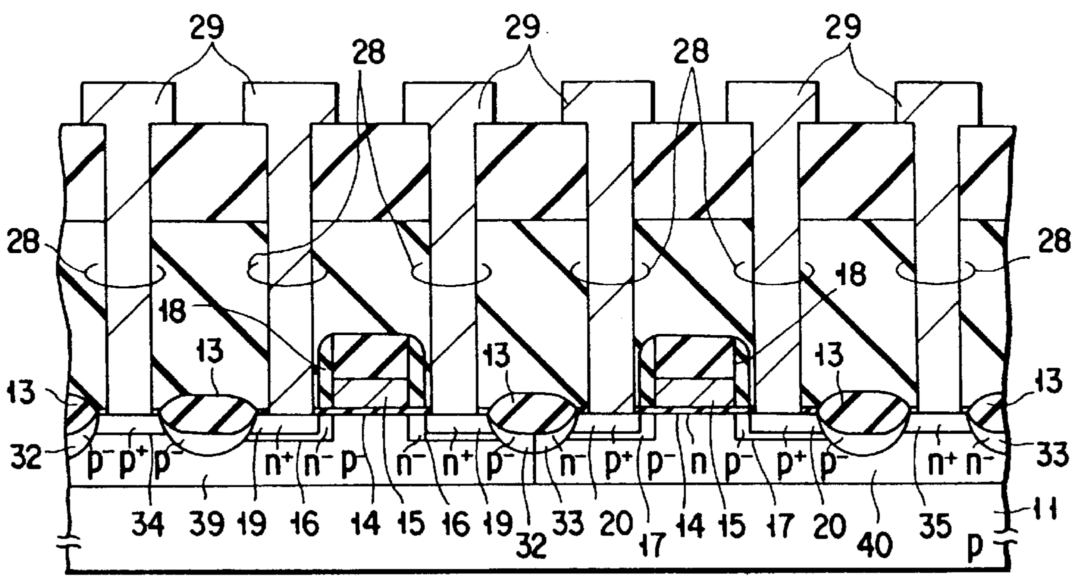
FIG. 100 is a sectional view taken along line C—C in FIG. 99.
Figure 101:
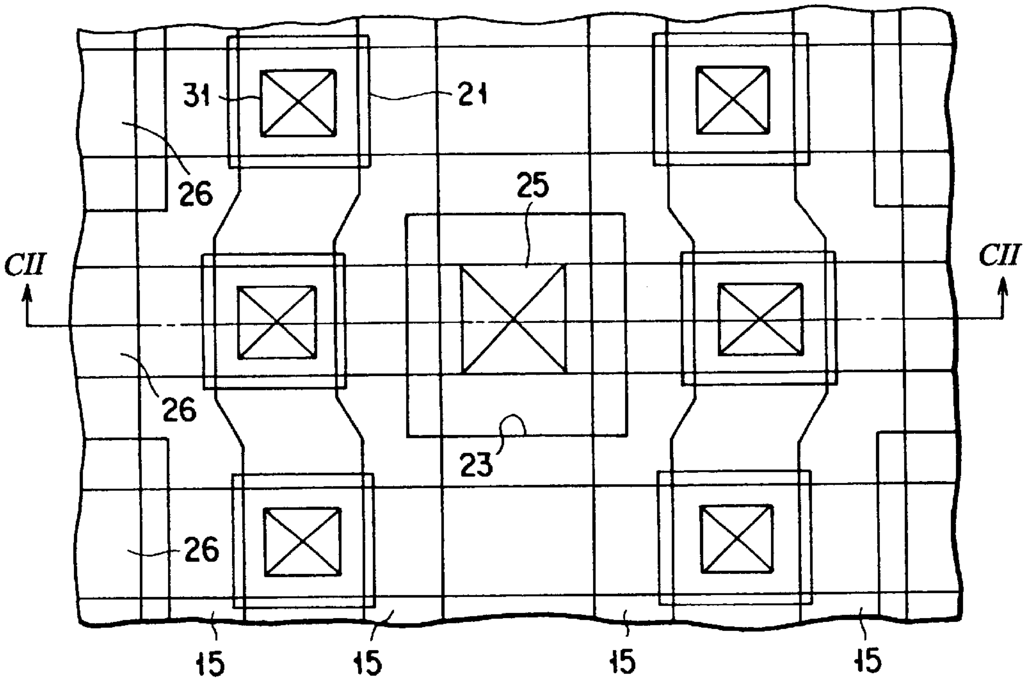
FIG. 101 is a plan view explaining how soft error may be occur in the memory cell section of the conventional DRAM.
Figure 102:
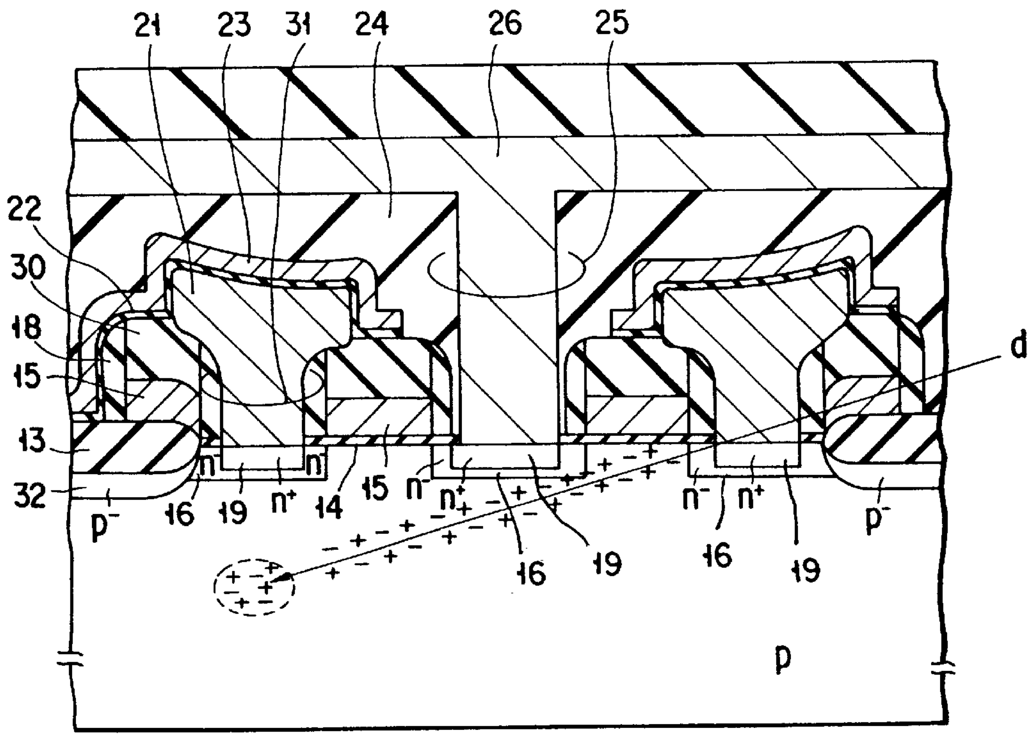
FIG. 102 is a sectional view taken along line CII—CII in FIG. 101.

The metal silicide layer 51 extends deep to the source and drain regions as illustrated in FIG. 96. Despite this, the layer 51 would not pass through the source region or drain region to reach the well region, because the source and drain regions contact the silicon oxide layer 12. It follows that a leakage current would not flow to increase the power consumption.

The p-type semiconductor (well) region 39 includes a plurality of n-channel MOS transistors which are provided above the silicon oxide layer 12. To these n-channel MOS transistors there can be applied a backgate bias, because a $p^+$-type impurity region 34 is provided in the p-type semiconductor region 39. Also, the n-type semiconductor (well) region 40 includes a plurality of p-channel MOS transistors which are provided above the silicon oxide layer 12. To these p-channel MOS transistors there can be applied a backgate bias, because an $n^+$-type impurity region 35 is provided in the n-type semiconductor region 40.

How the RAM shown in FIGS. 94 and 95 is manufactured will be explained.

At first, oxygen ions are implanted into the prescribed parts of the peripheral circuit section PC, in a dose of about $2\times10^{18}$ $cm^{-2}$ under acceleration energy of about 250 KeV.

The structure obtained is annealed in an $N_2$ atmosphere, for example at about 1350° C. for about 30 minutes. A plate-shaped silicon oxide layer 12 having a thickness of about 0.4 $\mu$m, is thereby formed in the silicon substrate 11 at such a depth that a silicon layer having a thickness of about 0.25 $\mu$m is provided on the silicon oxide layer 12.

Then, field oxide films 13 having a thickness of about 0.2 $\mu$m are formed by the LOCOS method above the silicon oxide layer 12. The field oxide films 13 therefore do not contact the silicon oxide film 12.

Next, boron ions are implanted into those parts of the silicon layer which are located on the silicon oxide layers 12, using a resist pattern as mask. P-type impurity regions 36, 38 and 39 are thereby formed. Further, phosphorus ions are implanted into the silicon layers which are located on the silicon oxide layers 12, using a resist pattern as mask. N-type impurity regions 37 and 40 are thereby formed.

A gate insulating film 14, a phosphorus-containing polysilicon film, and a TEOS film 30 are formed on the resultant structure, one after another. Using a resist pattern as a mask, the TEOS film 30 and the polysilicon film are etched, forming gate electrodes 15.

Further, using the resist pattern and the gate electrodes 15 as masks, phosphorus ions are implanted into the n-channel MOS transistor regions. Similarly, using the resist pattern as a mask, boron ions are implanted into the p-channel MOS transistor regions.

The resultant structure is annealed, forming low impurity concentration regions 16 of $n^-$-type and low impurity concentration regions 17 of $p^-$-type. These regions 16 and 17 have a surface impurity concentration of $1\times10^{18}$ to $1\times10^{20}$ $cm^{-3}$. A spacer 18 is then formed on the sides of each gate electrode 15. Using a resist as a mask, the silicon layers in which all regions 16 in the memory cell region MC and in some of the regions 16 and 17 in the peripheral circuit section PC are etched by about 0.05 $\mu$m. As a result, the upper surfaces of these regions are located lower by about 0.01 $\mu$m than the upper surface of the silicon substrate 11.

Thereafter, using a resist pattern as a mask, arsenic is ion-implanted into the n-channel MOS transistor regions under prescribed conditions, and boron is ion-implanted into the p-channel MOS transistor regions under prescribed conditions.

The structure obtained is subjected to thermal oxidation, simultaneously forming source and drain regions 19 of $n^+$-type and source and drain regions 20 of $p^+$-type. These regions 19 and 20 have a surface impurity concentration of $1\times10^{19}$ to $1\times10^{20}$ $cm^{-3}$ and located at a depth of about, 0.2 $\mu$m.

At this time, the all MOS transistors provided in the memory cell section MC and those of some of the MOS transistors provided in the peripheral circuit section PC reach the silicon oxide layer 12. The source and drain regions 19 and 20 of the remaining MOS transistors provided in the section PC do not reach the silicon oxide layer 12.

Contact holes 31 are formed which expose the source regions of the n-channel MOS transistors formed in the memory cell section MC. Storage nodes 21 of capacitors are formed, each having a thickness of about 0.2 $\mu$m. Then, a capacitor insulating film 22 about 0.01 $\mu$m thick is formed on each storage node 21. (The film 22 is, for example, a two-layered film consisting of an oxide film and a nitride film.) A polysilicon layer containing phosphorus and having a thickness of, for example, about 0.1 $\mu$m, is formed on the upper surface of the resultant structure. Those parts of the polysilicon layer which are located on the drain regions of the n-channel MOS transistor of the memory cell section MC are removed, thereby forming the plate electrodes 23 of capacitors.

A BPSG film 24 is formed on the upper surface of the structure. Contact holes 25 are made in the BPSG film 24, exposing the drain regions of the n-channel MOS transistors of the memory cell section MC. Bit lines 26 are formed on the BPSG film 24 and in the contact holes 25. The bit lines 26 are connected to the drain regions of the n-channel MOS transistors.

An inter-layer insulating film 27 is formed on the upper surface of the resultant structure. Contact holes 28 are formed in the BPSG film 24 and inter-layer insulating film 27 of the peripheral circuit section PC. The contact holes 28 expose the source and drain regions 19 and source and drain regions 20 of the MOS transistors of the section PC.

Metal silicide (e.g., titanium silicide) layers 51 are formed in the contact holes 28, covering the exposed parts of the source and drain regions 19 source and drain regions 20. Instead, the metal silicide layers 51 may be formed on the entire regions 19 and 20, before the capacitors of the memory cells are formed.

Thereafter, high-melting metal layers (e.g., tungsten layers) 52 are formed in the contact holes 28 by means of selective growth method. Barrier metal layers 53 (made of, for example, a two-layered film consisting of a titanium film and a titanium nitride film) and metal wires 54 (made of, for example, aluminum) are formed on the inter-layer insulating film 27.

Further, an inter-layer insulating film, other metal wires and a passivation film are formed, and pads are then formed. The DRAM is thereby manufactured.

The DRAM thus manufactured, i.e., a semiconductor device according to the second embodiment of the seventh aspect of the invention, has a memory cell section having MOS transistors whose source and drain regions are thick and contact a silicon oxide layer at their lower surfaces. The memory cell section therefore has high integration density, consumes but a little power, and a low contact resistance. In addition, since the semiconductor regions provided on the silicon oxide layer are very thin, soft error is scarcely made in the memory cell section.

Moreover, in the peripheral circuit section of the DRAM, a back-gate bias can be applied to the MOS transistors because these MOS transistors are provided in well regions. Since metal silicide layers are provided on the source and drain regions of the MOS transistors, the MOS transistors have but a low contact resistance, and a leakage current is not generated in the MOS transistors.

The semiconductor devices according to the first to seventh aspects of the invention, described above, are all DRAMs. Nonetheless, the first to seventh aspects can be applied to other types of memories, such as static RAMS, EPROMs and EEPROMS.

Moreover, the first to seventh aspects of the invention can be applied to semiconductor devices other than memories, such as microprocessors and gate arrays.

The advantages attained by the first to seventh aspects of the present invention will be summarized as follows.

The semiconductor device according to the first aspect is a DRAM formed on an SOI substrate. Therefore, soft error is scarcely made in the memory cells. The silicon layers on the insulating layer formed in the SOI substrate are thin, and the source and drain regions of some of the MOS transistors contact the insulating layer at their lower surfaces. These structural features help to increase the operating speed of the MOS transistors and reduce the power consumption thereof. The other MOS transistors have source and drain regions which are relatively thick and which do not contact the insulating layer. A back-gate bias can therefore be applied to the other MOS transistors.

The semiconductor device according to the second aspect is a DRAM formed on an SOI substrate, in which the memory cell section has a thin silicon layer provided on a silicon oxide layer and the peripheral circuit section has a silicon layer provided on the silicon oxide layer and consisting of thin portions and thick portions.

Therefore, the memory cells can be completely surrounded by an insulating film in the memory cell section. This helps to increase the integration density, minimize the power consumption, and reduce the possibility of soft error.

In the peripheral circuit section, some of the elements are completely surrounded by an insulating film, while the remaining elements are provided in a well region. Hence, a back-gate bias can be applied to some of the MOS transistors, and the other MOS transistors to which a back-gate bias need not be applied can has their junction capacitance decreased. Further, the performance of the input protecting circuit can be improved in the peripheral circuit section.

The semiconductor device according to the third aspect is a DRAM formed on an SOI substrate, in which the memory cell section has a thick silicon layer provided on a silicon oxide layer and the peripheral circuit section has a silicon layer provided on the silicon oxide layer and consisting of thin portions and thick portions.

Hence, in the memory cell section, the element regions can be electrically connected to one another. A back-gate bias can be applied to the MOS transistors constituting the memory cells.

In the peripheral circuit section, some of the elements are completely surrounded by an insulating film, while the remaining elements are provided in a well region. Hence, a back-gate bias can be applied to some of the MOS transistors, and the other MOS transistors to which a back-gate bias need not be applied can have their junction capacitance decreased.

The semiconductor device according to the fourth aspect is a DRAM formed on an SOI substrate, in which the elements are isolated from one another by means of STI technique. The upper surface of the silicon substrate can therefore be made flat and smooth. In addition, it is easy to form semiconductor elements in the silicon layer provided on the SOI substrate.

The semiconductor device according to the fifth aspect is a DRAM similar to those of the first to fourth aspects, which is characterized in that a metal silicide layer is interposed between a metal wiring layer and the source and drain regions of each MOS transistor provided in the peripheral circuit section. The contact resistance between the source and drain regions and the metal wiring layer is therefore sufficiently. Further, the leakage current can be minimized.

The semiconductor device according to the sixth aspect is a DRAM formed on an SOI substrate, in which the source and drain regions of the MOS transistors of the peripheral circuit section are less deep than the source and drain regions of the MOS transistors of the memory cell section. Since the source and drain regions are deep in the memory cell section, the contact resistance is relatively low. Additionally, the source and drain regions may contact the silicon oxide layer at their lower surfaces. In this case, the MOS transistors constituting the memory cells can operate faster and consume but less power.

In the memory cell section, the silicon layer on the insulating layer of the SOI substrate is thin, soft error are hardly made. Further, since the element regions in the memory cell section are electrically connected to one another, a back-gate bias can be applied to the MOS transistors provided in the memory cell section. Still further, since the MOS transistors in the peripheral circuit section are provided in well regions, a back-gate bias can be applied to these MOS transistors.

The semiconductor device according to the seventh aspect is a DRAM similar to that of the sixth aspect, which is characterized in that a metal silicide layer is interposed between a metal wiring layer and the source and drain regions of each MOS transistor provided in the peripheral circuit section. The contact resistance between the source and drain regions and the metal wiring layer is therefore sufficiently. Further, the leakage current can be minimized.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:

insulating layer having flat upper surface;

a semiconductor layer provided on said insulating layer and comprised of at least a first part having a first thickness and a second part having a second thickness, the first part defining a recess and the second part defining a projection;

memory cells provided in the first part of said semiconductor layer; and a peripheral circuit including a sense amplifier provided in the second part of said semiconductor layer, wherein said peripheral circuit comprises MOS transistors, each of which has a source region and a drain region which have lower surfaces spaced apart from the insulating layer, and the insulating layer is located directly under the MOS transistors in the second part of said semiconductor layer.

2. The device according to claim 1, wherein each of said memory cells comprises a MOS transistor and a stacked capacitor, said MOS transistors each having a source region and a drain region, each source region and each drain region having a lower surface which contacts said insulating layer.

3. The device according to claim 1, wherein each of said memory cells comprises a MOS transistor and a stacked capacitor, and said peripheral circuit comprises MOS transistors.

4. The device according to claim 1, further comprising a well region provided in the second part of said semiconductor layer, and a plurality of element regions provided in said well region.

5. The device according to claim 4, wherein an electrode is provided for applying a predetermined potential to said well region, and a back-gate bias is applied to MOS transistors provided in said element regions.

6. The device according to claim 1, further comprising an input protecting circuit provided in said semiconductor layer.

7. A semiconductor device comprising:

an insulating layer having a flat upper surface;

a semiconductor layer provided on said insulating layer and comprised of at least a first part having a first thickness and a second part having a second thickness, the first part defining a recess and the second part defining a projection;

memory cells and a sense amplifier provided in said second part of said semiconductor layer; and a peripheral circuit other than said sense amplifier provided in the first part of said semiconductor layer.

8. The device according to claim 7, wherein each of said memory cells comprises a MOS transistor and a stacked capacitor, and said sense amplifier comprises MOS transistors, each MOS transistor of said memory cells including a source region and a drain region which have lower surfaces spaced apart from said insulating layer, and each MOS transistor of said sense amplifier including a source region and a drain region which have lower surfaces spaced apart from said insulating layer.

9. The device according to claim 7, wherein said peripheral circuit comprises MOS transistors, each MOS transistor having a source region and a drain region which have lower surfaces contacting said insulating layer.

10. The device according to claim 7, wherein each of said memory cells comprises a MOS transistor and a stacked capacitor, said sense amplifier comprises MOS transistors, and said peripheral circuit comprises MOS transistors.

11. The device according to claim 7, further comprising a well region provided in the second part of said semiconductor layer, and a plurality of element regions provided in said well region.

12. The device according to claim 11, wherein an electrode is provided for applying a predetermined potential to said well region, and a back-gate bias is applied to MOS transistors provided in said element regions.

13. A semiconductor device comprising:

an insulating layer having a flat upper surface;

a semiconductor layer provided on said insulating layer and comprised of at least a first part having a first thickness and a second part having a second thickness, the first part defining a recess and the second part defining a projection;

a first peripheral circuit provided in the first part of said semiconductor layer; and a second peripheral circuit including a sense amplifier provided in said second part of said semiconductor layer.

14. The device according to claim 13, wherein said first peripheral circuit comprises MOS transistors, each MOS transistor having a source region and a drain region which have lower surfaces contacting said insulating layer.

15. The device according to claim 13, wherein said second peripheral circuit comprises MOS transistors, each MOS transistor having a source region and a drain region which have lower surfaces spaced apart from said insulating layer.

16. The device according to claim 13, wherein said first and second peripheral circuits each comprise MOS transistors.

17. The device according to claim 13, further comprising a well region provided in the second part of said semiconductor layer, and a plurality of element regions provided in said well region.

18. The device according to claim 17, wherein an electrode is provided for applying a predetermined potential to said well region, and a back-gate bias is applied to MOS transistors provided in said element regions.

19. A semiconductor device comprising:

an insulating layer having a recess and a projection;

a semiconductor layer having a flat upper surface provided on said insulating layer and comprised of at least a first part having a first thickness and a second part having a second thickness, the projection being located below the first part of said semiconductor layer and the recess being located below the second part of said semiconductor layer;

memory cells provided in the first part of said semiconductor layer; and a peripheral circuit comprising MOS transistors, each MOS transistor having a source region and a drain region each of which has a lower surface spaced apart from said insulating layer, said peripheral circuit including a sense amplifier provided in the second part of said semiconductor layer.

20. The device according to claim 19, wherein each of said memory cells comprises a MOS transistor and a stacked capacitor, said MOS transistors each having a source region and a drain region, each source region and each drain region having a lower surface which contacts said insulating layer.

21. The device according to claim 19, wherein each of said memory cells comprises a MOS transistor and a stacked capacitor, and said peripheral circuit comprises MOS transistors.

22. A semiconductor device comprising:

an insulating layer having a recess and a projection;

a semiconductor layer having a flat upper surface provided on said insulating layer and comprised of at least a first part having a first thickness and a second part having a second thickness, the projection being located below the first part of said semiconductor layer and the recess being located below the second part of said semiconductor layer;

memory cells and a sense amplifier provided in said second part of said semiconductor layer; and a peripheral circuit other than said sense amplifier provided in the first part of said semiconductor layer.

23. The device according to claim 22, wherein each of said memory cells comprises a MOS transistor and a stacked capacitor, and said sense amplifier comprises MOS transistors, each MOS transistor of said memory cells including a source region and a drain region which have lower surfaces spaced apart from said insulating layer, and each MOS transistor of said sense amplifier including a source region and a drain region which have lower surfaces spaced apart from said insulating layer.

24. The device according to claim 22, wherein said peripheral circuit comprises MOS transistors, each MOS transistor having a source region and a drain region which have lower surfaces contacting said insulating layer.

25. The device according to claim 22, wherein each of said memory cells comprises a MOS transistor and a stacked capacitor, said sense amplifier comprises MOS transistors, and said peripheral circuit comprises MOS transistors.

26. The device according to claim 22, further comprising a well region provided in the second part of said semiconductor layer, and a plurality of element regions provided in said well region.

27. The device according to claim 26, wherein an electrode is provided for applying a predetermined potential to said well region, and a back-gate bias is applied to MOS transistors provided in said element regions.

28. A semiconductor device comprising:

an insulating layer having a recess and a projection;

a semiconductor layer having a flat upper surface provided on said insulating layer and comprised of at least a first part having a first thickness and a second part having a second thickness, the projection being located below the first part of said semiconductor layer and the recess being located below the second part of said semiconductor layer;

a first peripheral circuit provided in the first part of said semiconductor layer; and a second peripheral circuit including a sense amplifier is provided in said second part of said semiconductor layer.

29. The device according to claim 28, wherein said first peripheral circuit comprises MOS transistors, each MOS transistor having a source region and a drain region which have lower surfaces contacting said insulating layer.

30. The device according to claim 28, wherein said second peripheral circuit comprises MOS transistors, each MOS transistor having a source region and a drain region which have lower surfaces spaced apart from said insulating layer.

31. The device according to claim 28, wherein said first and second peripheral circuits each comprise MOS transistors.

32. The device according to claim 28, further comprising a well region provided in the second part of said semiconductor layer, and a plurality of element regions provided in said well region.

33. The device according to claim 32, wherein an electrode is provided for applying a predetermined potential to said well region, and a back-gate bias is applied to MOS transistors provided in said element regions.

34. A semiconductor device comprising:

a semiconductor substrate comprised of at least a first part and a second part;

an insulating layer formed in said semiconductor substrate, said insulating layer being located below the first part of said semiconductor substrate, but not below the second part of said semiconductor substrate;

at least memory cells and a sense amplifier provided in the second part of said semiconductor substrate; and a peripheral circuit other than said sense amplifier provided in the first part of said semiconductor substrate.

35. A semiconductor device comprising:

an insulating layer;

a semiconductor layer of a first conductivity type provided on said insulating layer;

a first MOS transistor of a second conductivity type provided on said semiconductor layer and having a source region and a drain region each of which is located at a first depth; and a second MOS transistor of the second conductivity type provided on said semiconductor layer and having a source region and a drain region each of which is located at a second depth different from said first depth;

wherein the source and drain regions of said first MOS transistor each have a lower surface which contacts said insulating layer, and the source and drain regions of said second MOS transistor each have a lower surface which is spaced apart from said insulating layer;

wherein said first MOS transistor constitutes a part of a memory cell, and said second MOS transistor constitutes part of a peripheral circuit including a sense amplifier.

36. The device according to claim 35, wherein said memory cell has a stacked capacitor.

37. A semiconductor device comprising:

an insulating layer;

a semiconductor layer provided on said insulating layer and having a recess;

a first MOS transistor provided on said semiconductor layer and having a source region and a drain region each of which has an upper surface located in said recess and each of which has a lower surface contacting said insulating layer, said first MOS transistor constituting a part of a memory cell; and a second MOS transistor provided on said semiconductor layer and having a source region and a drain region each of which has a lower surface spaced apart from said insulating layer, said second MOS transistor constituting a peripheral circuit including a sense amplifier.

38. The device according to claim 37, wherein said memory cell has a stacked capacitor.

39. A semiconductor device comprising:

a semiconductor substrate comprised of at least a first part and a second part;

an insulating layer formed in said semiconductor substrate, said insulating layer being located below the first part of said semiconductor substrate, but not below the second part of said semiconductor substrate;

a first peripheral circuit including a sense amplifier provided in the second part of said semiconductor substrate; and a second peripheral circuit other than said sense amplifier provided in the first part of said semiconductor substrate.

40. A semiconductor device comprising:

an insulating layer;

a semiconductor layer of a first conductivity type provided on said insulating layer;

a first MOS transistor of a second conductivity type provided on said semiconductor layer and having a source region and a drain region each of which is located at a first depth; and a second MOS transistor of the second conductivity type provided on said semiconductor layer and having a source region and a drain region each of which is located at a second depth different from said first depth;

wherein the source and drain regions of said first MOS transistor each have a lower surface which contacts said insulating layer, and the source and drain regions of said second MOS transistor each have a lower surface which is spaced apart from said insulating layer;

wherein said first MOS transistor constitutes a part of a peripheral circuit other than a sense amplifier, and said second MOS transistor constitutes one of a memory cell and said sense amplifier.

41. The device according to claim 40, wherein said memory cell has a stacked capacitor.

42. A semiconductor device comprising:

an insulating layer;

a semiconductor layer of a first conductivity type provided on said insulating layer;

a first MOS transistor of a second conductivity type provided on said semiconductor layer and having a source region and a drain region each of which is located at a first depth; and a second MOS transistor of the second conductivity type provided on said semiconductor layer and having a source region and a drain region each of which is located at a second depth different from said first depth;

wherein the source and drain regions of said first MOS transistor each have a lower surface which contacts said insulating layer, and the source and drain regions of said second MOS transistor each have a lower surface which is spaced apart from said insulating layer;

wherein said first MOS transistor constitutes a part of a first peripheral circuit, and said second MOS transistor constitutes a part of a second peripheral circuit including a sense amplifier.

* * * * *